US011846884B2

(12) United States Patent
Hatakeyama et al.

(10) Patent No.: US 11,846,884 B2
(45) **Date of Patent: *Dec. 19, 2023**

(54) CHEMICALLY AMPLIFIED RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Takeshi Nagata, Joetsu (JP); Chuanwen Lin, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 17/349,014

(22) Filed: Jun. 16, 2021

(65) Prior Publication Data

US 2022/0004101 A1 Jan. 6, 2022

(30) Foreign Application Priority Data

Jun. 25, 2020 (JP) ................................ 2020-109847

(51) Int. Cl.

| | |
|---|---|
| ***G03F 7/039*** | (2006.01) |
| ***G03F 7/004*** | (2006.01) |
| ***G03F 7/20*** | (2006.01) |
| ***G03F 7/32*** | (2006.01) |

(52) U.S. Cl.

CPC .......... *G03F 7/0392* (2013.01); *G03F 7/0045* (2013.01); *G03F 7/2004* (2013.01); *G03F 7/325* (2013.01)

(58) Field of Classification Search

CPC .................................................... G03F 7/0045

See application file for complete search history.

(56) References Cited

U.S. PATENT DOCUMENTS

| | | | | |
|---|---|---|---|---|
| 8,921,026 | B2 | 12/2014 | Hatakeyama et al. | |
| 2015/0044617 | A1* | 2/2015 | Sugawara ............. | G03F 7/0397 430/325 |
| 2017/0184962 | A1* | 6/2017 | Hatakeyama ......... | G03F 7/0045 |
| 2020/0319551 | A1 | 10/2020 | Tsuchimura et al. | |
| 2021/0405528 | A1* | 12/2021 | Hatakeyama ........ | C09D 125/18 |

FOREIGN PATENT DOCUMENTS

| | | | |
|---|---|---|---|
| JP | 2001-166476 | A | 6/2001 |
| JP | 2001-194776 | A | 7/2001 |
| JP | 2002-6499 | A | 1/2002 |
| JP | 2002-226470 | A | 8/2002 |
| JP | 2002-363148 | A | 12/2002 |
| JP | 2012-137729 | A | 7/2012 |
| JP | 2013-83957 | A | 5/2013 |
| JP | 2018-97356 | A | 6/2018 |
| WO | 2008/066011 | A1 | 6/2008 |
| WO | 2019/123842 | A1 | 6/2019 |

OTHER PUBLICATIONS

Hutchinson, "The Shot Noise Impact on Resist Roughness in EUV Lithography" SPIE, 1998, vol. 3331, pp. 531-536. (7 pages).

Lio, "EUV Resists: What's Next?", SPIE, 2016, vol. 9776, pp. 97760V-1-97760V-14. (14 pages).

* cited by examiner

*Primary Examiner* — Duane Smith

*Assistant Examiner* — Nicholas E Brown

(74) *Attorney, Agent, or Firm* — WHDA, LLP

(57) ABSTRACT

A chemically amplified resist composition is provided comprising an acid generator and a quencher comprising a salt compound consisting of a nitrogen-containing cation and a 1,1,1,3,3,3-hexafluoro-2-propoxide anion having a trifluoromethyl, hydrocarbylcarbonyl or hydrocarbyloxycarbonyl group bonded thereto. The resist composition has a high sensitivity and forms a pattern with improved LWR or CDU, independent of whether it is of positive or negative tone.

14 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. § 119(a) on Patent Application No. 2020-109847 filed in Japan on Jun. 25, 2020, the entire contents of which are hereby incorporated by reference.

TECHNICAL FIELD

This invention relates to a chemically amplified resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smart phones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

With the progress of miniaturization in logic devices, the flash memory now takes the form of devices having stacked layers of gate, known as 3D-NAND. The capacity is increased by increasing the number of stacked layers. As the number of stacked layers increases, the hard mask used in processing of layers becomes thicker and the photoresist film also becomes thicker. While the resist for logic devices becomes thinner, the resist for 3D-NAND becomes thicker.

As the pattern feature size is reduced, approaching to the diffraction limit of light, light contrast lowers. In the case of positive resist film, a lowering of light contrast leads to reductions of resolution and focus margin of hole and trench patterns. The trend of the resist toward thicker films suggests that the thickness of resist film for previous generation devices is resumed. As more dimensional uniformity (CDU) is required, the previous photoresist cannot accommodate the requirements. For preventing a reduction of resolution of resist pattern due to a lowering of light contrast as a result of size reduction, or for improving CDU in the trend toward thicker resist film, an attempt is made to enhance the dissolution contrast of resist film.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein polarity switch or crosslinking reaction takes place under the action of acid. Quenchers are often added to these resist compositions for the purpose of controlling the diffusion of the acid to unexposed region to improve the contrast. The addition of quenchers is fully effective to this purpose. A number of amine quenchers were proposed as disclosed in Patent Documents 1 and 2.

There are known amine quenchers for inviting a polarity switch under the action of acid catalyst. Patent Document 3 proposes an amine quencher having an acid labile group. This amine compound generates a carboxylic acid via the acid-aided deprotection reaction of a tertiary ester having a carbonyl group positioned on the nitrogen atom side whereby alkaline solubility increases. In this case, however, since the molecular weight on the nitrogen atom side is not increased, the acid diffusion controlling ability is low, and the contrast improving effect is faint. Patent Document 4 describes a quencher having a tert-butoxycarbonyl group which undergoes deprotection reaction with the aid of acid, to generate an amino group. This mechanism is adapted to generate a quencher upon light exposure, achieving a reverse effect to contrast enhancement. The contrast is enhanced by the mechanism that the quencher disappears or loses its quenching ability upon light exposure or under the action of acid. Patent Document 5 discloses a quencher in the form of an amine compound which cyclizes under the action of acid to form a lactam structure. The conversion of the strong base amine compound to the weak base lactam compound causes the acid to change its activity whereby the contrast is improved.

With respect to the acid labile group used in (meth) acrylate polymers for the ArF lithography resist material, deprotection reaction takes place when a photoacid generator capable of generating a sulfonic acid having fluorine substituted at α-position (referred to "α-fluorinated sulfonic acid") is used, but not when an acid generator capable of generating a sulfonic acid not having fluorine substituted at α-position (referred to "α-non-fluorinated sulfonic acid") or carboxylic acid is used. If a sulfonium or iodonium salt capable of generating an α-fluorinated sulfonic acid is combined with a sulfonium or iodonium salt capable of generating an α-non-fluorinated sulfonic acid, the sulfonium or iodonium salt capable of generating an α-non-fluorinated sulfonic acid undergoes ion exchange with the α-fluorinated sulfonic acid. Through the ion exchange, the α-fluorinated sulfonic acid thus generated by light exposure is converted back to the sulfonium or iodonium salt while the sulfonium or iodonium salt of an α-non-fluorinated sulfonic acid or carboxylic acid functions as a quencher. Patent Document 6 discloses a resist composition comprising a sulfonium or iodonium salt capable of generating carboxylic acid as a quencher.

Sulfonium and iodonium salt type quenchers are photo-decomposable like photoacid generators. That is, the amount of quencher in the exposed region is reduced. Since acid is generated in the exposed region, the reduced amount of quencher leads to a relatively increased concentration of acid and hence, an improved contrast. However, the acid diffusion in the exposed region is not suppressed, indicating the difficulty of acid diffusion control.

Since a sulfonium or iodonium salt type quencher absorbs ArF radiation of wavelength 193 nm, a resist film in which the quencher is combined with a sulfonium or iodonium salt type acid generator has a reduced transmittance to that radiation. As a result, in the case of a positive resist film having a thickness of at least 100 nm, the cross-sectional profile of a pattern as developed becomes tapered. For resist films having a thickness of at least 100 n, especially at least 150 nm, a highly transparent quencher is necessary.

Amine quenchers are effective for suppressing acid diffusion and improving a contrast and highly transparent at wavelength 193 nm, but poor in edge roughness (LWR) as compared with the sulfonium and iodonium salts of α-non-fluorinated sulfonic acid and carboxylic acid.

Quenchers of ammonium salt type are also under study. Patent Document 7 discloses tetramethylammonium salts and betaine carboxylic acid salts. Patent Document 8 describes ammonium salts of carboxylic acids. These quenchers of ammonium salt type are yet poor in LWR.

CITATION LIST

Patent Document 1: JP-A 2001-194776
Patent Document 2: JP-A 2002-226470
Patent Document 3: JP-A 2002-363148
Patent Document 4: JP-A 2001-166476
Patent Document 5: JP-A 2012-137729 (U.S. Pat. No. 8,921,026)
Patent Document 6: WO 2008/066011
Patent Document 7: JP-A 2002-006499
Patent Document 8: WO 2019/123842

DISCLOSURE OF INVENTION

For the acid-catalyzed chemically amplified resist material, it is desired to develop a quencher capable of reducing the LWR of line patterns or improving the CDU of hole patterns and increasing sensitivity. To this end, it is necessary to reduce the distance of acid diffusion significantly and to increase the contrast at the same time, that is, to improve ambivalent properties at the same time.

An object of the invention is to provide a chemically amplified resist composition which exhibits a high sensitivity and a reduced LWR or improved CDU, independent of whether it is of positive tone or negative tone; and a pattern forming process using the same.

The inventors have found that when a salt compound consisting of a nitrogen-containing cation and a 1,1,1,3,3,3-hexafluoro-2-propoxide anion having a trifluoromethyl, hydrocarbylcarbonyl or hydrocarbyloxycarbonyl group bonded thereto is used as a quencher in a chemically amplified resist composition comprising an acid generator, the salt compound is effective for suppressing acid diffusion, is uniformly distributed in a resist film, and causes no resist film thickness loss after development. A resist film having a reduced LWR or improved CDU is thus obtainable.

In one aspect, the invention provides a chemically amplified resist composition comprising a quencher and an acid generator, the quencher comprising a salt compound consisting of a nitrogen-containing cation and a 1,1,1,3,3,3-hexafluoro-2-propoxide anion having bonded thereto a group selected from trifluoromethyl, hydrocarbylcarbonyl and hydrocarbyloxycarbonyl.

Preferably, the salt compound has the formula (1) or (2).

(1)

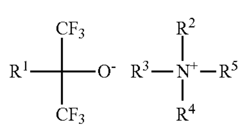

(2)

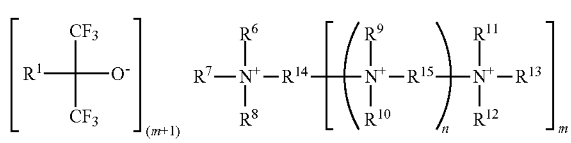

Herein m is an integer of 1 to 4, n is an integer of 0 to 4. $R^1$ is a trifluoromethyl, $C_2$-$C_{21}$ hydrocarbylcarbonyl or $C_2$-$C_{21}$ hydrocarbyloxycarbonyl group, the hydrocarbyl moiety in the hydrocarbylcarbonyl or hydrocarbyloxycarbonyl group may contain at least one moiety selected from ether bond, ester bond, thiol, cyano, nitro, hydroxy, sultone, sulfonate bond, amide bond and halogen. $R^2$ to $R^3$ are each independently hydrogen or a $C_1$-$C_{24}$ hydrocarbyl group which may contain a halogen atom, hydroxy, carboxy, ether bond, ester bond, thioether bond, thioester bond, thionoester bond, dithioester bond, amino, nitro, cyano, sulfone or ferrocenyl moiety, at least two of $R^2$ to $R^5$ or at least two of $R^6$ to $R^{13}$ may bond together to form a ring with the nitrogen atom to which they are attached or the nitrogen atom to which they are attached and an intervening atom, $R^2$ and $R^3$ may bond together to form $=C(R^{2A})(R^{3A})$, wherein $R^{2A}$ and $R^{3A}$ are each independently hydrogen or a $C_1$-$C_{16}$ hydrocarbyl group which may contain oxygen, sulfur or nitrogen, $R^{2A}$ and $R^4$ may bond together to form a ring with the carbon and nitrogen atoms to which they are attached, the ring may contain a double bond, oxygen, sulfur or nitrogen. $R^{14}$ is a $C_1$-$C_{12}$ (m+1)-valent saturated hydrocarbon group when n is 0, and a $C_2$-$C_{12}$ saturated hydrocarbylene group when n is an integer of 1 to 4, the hydrocarbon and hydrocarbylene groups may contain an ether bond, ester bond, carboxy moiety, thioester bond, thionoester bond or dithioester bond. $R^{15}$ is a $C_2$-$C_{12}$ saturated hydrocarbylene group which may contain an ether bond, ester bond, carboxy moiety, thioester bond, thionoester bond or dithioester bond.

In a preferred embodiment, the acid generator generates a sulfonic acid, imide acid or methide acid.

The resist composition may further comprise a base polymer.

In a preferred embodiment, the base polymer comprises repeat units having the formula (a1) or repeat units having the formula (a2).

(a1)

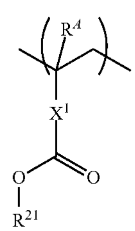

(a2)

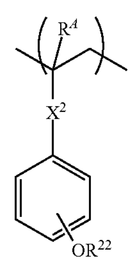

Herein $R^A$ is each independently hydrogen or methyl, $R^{21}$ and $R^{22}$ are each independently an acid labile group, $X^1$ is a single bond, phenylene, naphthylene, or a $C_1$-$C_{12}$ linking group containing an ester bond and/or lactone ring, and $X^2$ is a single bond or ester bond. The resist composition is typically a chemically amplified positive resist composition.

In another preferred embodiment, the base polymer is free of an acid labile group. The resist composition is typically a chemically amplified negative resist composition.

In a preferred embodiment, the base polymer comprises repeat units of at least one type selected from repeat units having the formulae (f1) to (f3).

(f1)

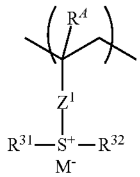

(f2)

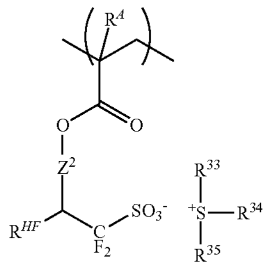

(f3)

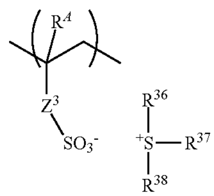

Herein $R^A$ is each independently hydrogen or methyl. $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(=O)—O—$Z^{11}$— or —C(=O)—NH—$Z^{11}$—, wherein $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond, —$Z^{21}$—C(=O)—O—, —$Z^{21}$—O— or —$Z^{21}$—O—C(=O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —O—$Z^{31}$—, —C(=O)—O—$Z^{3-}$, or —C(=O)—NH—$Z^{3-}$—, wherein $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety. $R^{31}$ to $R^{38}$ are each independently halogen or a $C_1$-$C_{20}$ hydrocarbyl group which may contain a heteroatom, a pair of $R^{33}$ and $R^{34}$ or $R^{36}$ and $R^{37}$ may bond together to form a ring with the sulfur atom to which they are attached. $R^{HF}$ is hydrogen or trifluoromethyl. $M^-$ is a non-nucleophilic counter ion.

The resist composition may further comprise an organic solvent and/or a surfactant.

In another aspect, the invention provides a pattern forming process comprising the steps of applying the chemically amplified resist composition defined above to form a resist film on a substrate, exposing the resist film to high-energy radiation, and developing the exposed resist film in a developer.

Preferably, the high-energy radiation is i-line of wavelength 365 nm, ArF excimer laser of wavelength 193 nm, KrF excimer laser of wavelength 248=n EB, or EUV of wavelength 3 to 15 nm.

Advantageous Effects of Invention

Since the salt compound contains a 1,1,1,3,33-hexafluoro-2-propoxide anion having a trifluoromethyl, hydrocarbylcarbonyl or hydrocarbyloxycarbonyl group bonded thereto, it does not agglomerate together by virtue of the electric repulsion of fluorine atoms and is effective for controlling acid diffusion uniformly within a minute range of nanometer order. The resist pattern as developed has reduced LWR or improved CDU. The quencher comprising the salt compound is highly effective independent of whether the resist composition is of positive tone or negative tone.

DESCRIPTION OF EMBODIMENTS

As used herein, the singular forms "a," "an" and "the" include plural referents unless the context clearly dictates otherwise. The notation ($C_n$-$C_m$) means a group containing from to m carbon atoms per group. The term "group" and "moiety" are interchangeable. In chemical formulae, the broken line ( ---- ) designates a valence bond, and Ac stands for acetyl.

The abbreviations and acronyms have the following meaning.

EB: electron beam
EUV: extreme ultraviolet
Mw: weight average molecular weight
Mn: number average molecular weight
Mw/Mn: molecular weight dispersity
GPC: gel permeation chromatography
PEB: post-exposure bake
PAG: photoacid generator
LWR: line width roughness
CDU: critical dimension uniformity

Resist Composition

The chemically amplified resist composition of the invention is defined as comprising a quencher and an acid generator, the quencher comprising a salt compound consisting of a nitrogen-containing cation and a 1,1,1,3,3,3-hexafluoro-2-propoxide anion having bonded thereto a group selected from trifluoromethyl, hydrocarbylcarbonyl and hydrocarbyloxycarbonyl. The salt compound undergoes an ion exchange with an acid generated by the acid generator to form another salt compound and release a compound having a 1,1,1,3,3,3-hexafluoro-2-propanol group, referred to as HFA compound, hereinafter. By virtue of the electric repulsion of fluorine atoms, the quencher is uniformly distributed in a resist film whereby the diffusion distance of acid is made uniform within a minute range of nanometer order. A pattern with reduced LWR or improved CDU is formed after development.

The salt compound has an acid diffusion controlling effect, a contrast improving effect and a LWR reducing or CDU improving effect, which are exerted in any of positive pattern formation and negative pattern formation via aqueous alkaline development, and negative pattern formation via organic solvent development.

Quencher

The quencher used herein comprises a salt compound consisting of a nitrogen-containing cation and a 1,1,1,3,3,3-hexafluoro-2-propoxide anion having bonded thereto a group selected from trifluoromethyl, hydrocarbylcarbonyl and hydrocarbyloxycarbonyl. Preferably the salt compound has the formula (1) or (2).

(1)

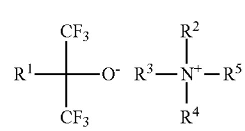

-continued (2)

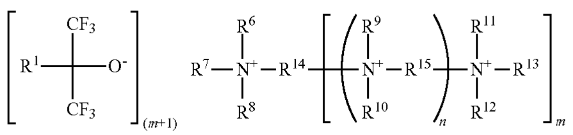

In formulae (I) and (2), m is an integer of 1 to 4, and n is an integer of 0 to 4.

In formulae (1) and (2), $R^1$ is a trifluoromethyl, $C_2$-$C_{24}$ hydrocarbylcarbonyl or $C_2$-$C_{21}$ hydrocarbyloxycarbonyl group. The hydrocarbyl moiety in the hydrocarbylcarbonyl or hydrocarbyloxycarbonyl group may contain at least one moiety selected from ether bond, ester bond, thiol, cyano, nitro, hydroxy, sultone, sulfonate bond, amide bond and halogen.

The hydrocarbyl moiety in the hydrocarbylcarbonyl or hydrocarbyloxycarbonyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, isopentyl, sec-pentyl, 3-pentyl, tert-pentyl, neopentyl, n-hexyl, n-octyl, n-nonyl, n-decyl, undecyl, dodecyl, tridecyl, tetradecyl, pentadecyl, heptadecyl, octadecyl, nonadecyl, and icosyl; $C_3$-$C_{20}$ cyclic saturated hydrocarbyl groups such as cyclopropyl, cyclobutyl, cyclopentyl, cyclohexyl, adamantyl, norbornyl, cyclopropylmethyl, cyclopropylethyl, cyclobutylmethyl, cyclobutylethyl, cyclopentylmethyl, cyclopentylethyl, cyclohexyhnethyl, cyclohexylethyl, methylcyclopropyl, methylcyclobutyl, methylcyclopentyl, methylcyclohexyl, ethylcyclopropyl, ethylcyclobutyl, ethylcyclopentyl, and ethylcyclohexyl; $C_2$-$C_{20}$ alkenyl groups such as vinyl, 1-propenyl, 2-propenyl, butenyl, pentenyl, hexenyl, heptenyl, nonenyl, decenyl, undecenyl, dodecenyl, tridecenyl, tetradecenyl, pentadecenyl, hexadecenyl, heptadecenyl, octadecenyl, nonadecenyl, and icosenyl; $C_2$-$C_{20}$ alkynyl groups such as ethynyl, propynyl, butynyl, pentynyl, hexynyl, heptynyl, octynyl, nonynyl, decynyl, undecynyl, dodecynyl, tridecynyl, tetradecynyl, pentadecynyl, hexadecynyl, heptadecynyl, octadecynyl, nonadecynyl, and icocynyl; $C_3$-$C_{20}$ cyclic unsaturated aliphatic hydrocarbyl groups such as cyclopentenyl, cyclohexenyl, methylcyclopentenyl, methylcyclohexenyl, ethylcyclopentenyl, ethylcyclohexenyl, and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methyhnaphthyl, ethylnaphthyl, n-propynaphthyL isopropylnaphthyl, n-butylnaphthyl, isobutyhnaphthyL sec-butylnaphthyl, and tert-butyhnaphthyl; $C_7$-$C_{20}$ aralkyl groups such as benzyl, phenethyl, phenylpropyl, phenylbutyl, 1-naphthyhnethyl, 2-naphthylmethyl, 9-fluorenylmethyl, 1-naphthylethyl, 2-naphthylethyl, and 9-fluorenylethyl; and combinations thereof.

In formulae (1) and (2), $R^2$ to $R^{13}$ are each independently hydrogen or a $C_1$-$C_{24}$ hydrocarbyl group which may contain a halogen atom, hydroxy, carboxy, ether bond, ester bond, thioether bond, thioester bond, thionoester bond, dithioester bond, amino, nitro, cyano, sulfone or ferocenyl group. The hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cylohexylmethyl, norbornyl, and adamantyl; $C_2$-$C_{20}$ alkenyl groups such as vinyl, propenyl, butenyl, and hexenyl; $C_2$-$C_{20}$ alkynyl groups such as ethynyl, propynyl, butynyl, 2-cyclohexylethynyl, and 2-phenylethynyl; $C_3$-$C_{20}$ cyclic unsaturated aliphatic hydrocarbyl groups such as cyclohexenyl and norbomenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; and $C_7$-$C_{20}$ aralkyl groups such as benzyl and phenethyl.

At least two of $R^2$ to $R^5$ or at least two of $R^6$ to $R^{13}$ may bond together to form a ring with the nitrogen atom to which they am attached or the nitrogen atom to which they are attached and an intervening atom or atoms. $R^2$ and $R^3$, taken together, may form $=C(R^{2A})(R^{A})$. $R^2$ and $R^3$ are each independently hydrogen or a $C_1$-$C_{16}$ hydrocarbyl group which may contain oxygen, sulfur or nitrogen, and examples of the hydrocarbyl group are as exemplified above. $R^{2A}$ and $R^4$ may bond together to form a ring with the carbon and nitrogen atoms to which they are attached, the ring may contain a double bond, oxygen, sulfur or nitrogen.

In formula (2), $R^{14}$ is a $C_1$-$C_{12}$ (m+1)-valent saturated hydrocarbon group when n is 0, and a $C_2$-$C_{12}$ saturated hydrocarbylene group when n is an integer of 1 to 4, the hydrocarbon and hydrocarbylene groups may contain an ether bond, ester bond, carboxy moiety, thioester bond, thionoester bond or dithioester bond. $R^{15}$ is a $C_2$-$C_{12}$ saturated hydrocarbylene group which may contain an ether bond, ester bond, carboxy moiety, thioester bond, thionoester bond or dithioester bond.

The $C_2$-$C_{12}$ saturated hydrocarbylene group may be straight, branched or cyclic. Examples thereof include alkanediyl groups such as ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, hexane-1,6-diyl, heptane-1,7-diyl, octane-1,8-diyl, nonane-1,9-diyl, decane-1,10-diyl, undecane-1,11-diyl, and dodecane-1,12-diyl; cycloalkanediyl groups such as cyclopropane-1,1-diyl, cyclopropane-1,2-diyl, cyclobutane-1,1-diyl, cyclobutane-1,2-diyl, cyclobutane-1,3-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, and cyclohexane-1,4-diyl; divalent polycyclic saturated hydrocarbon groups such as norbonane-2,3-diyl and norbornane-2,6-diyl; and alkanediyl groups substituted with a cycloaliphatic hydrocarbon moiety such as cyclopentylmethanediyl, cyclohexylmethanediyl, 2-cyclopentenylmethanediyl, 3-cyclopentenylmethanediyl, 2-cyclohexenyhnethanediyl, and 3-cyclohexenylmethanediyl. Examples of the (m+1)-valent saturated hydrocarbon group include groups obtained by removing (m-1) number of hydrogen atoms from the $C_1$-$C_{12}$ saturated hydrocarbylene groups.

Examples of the anion in the salt compound having formula (1) or (2) we shown below, but not limited thereto.

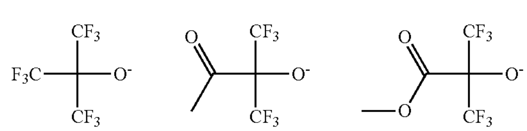

-continued
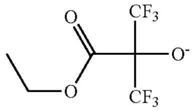
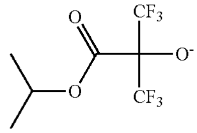
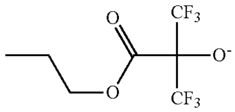
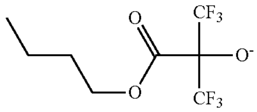
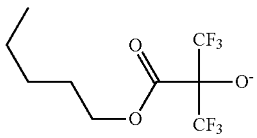
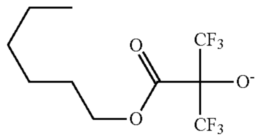
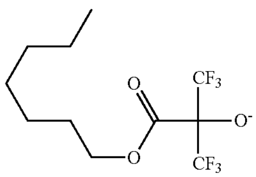
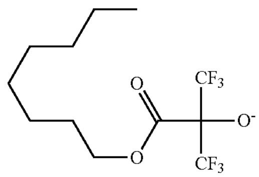
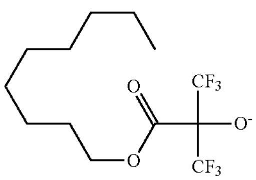
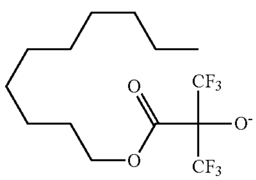
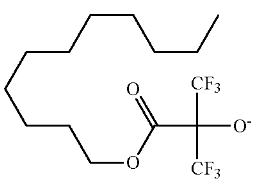
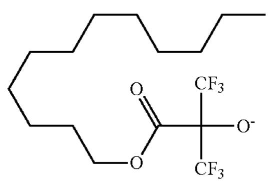
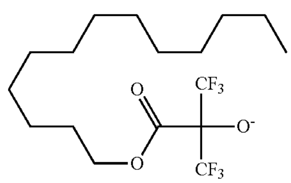
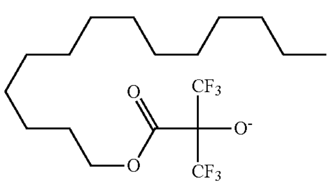
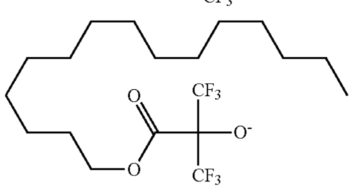
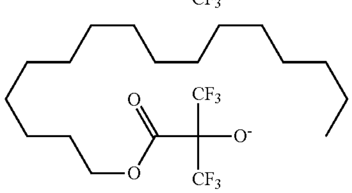
-continued
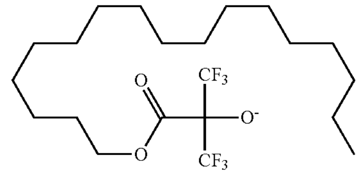
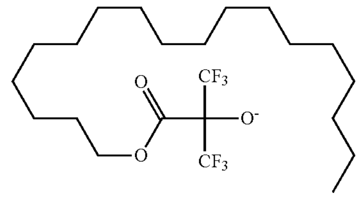
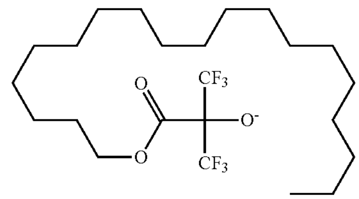
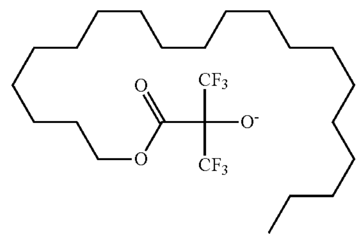
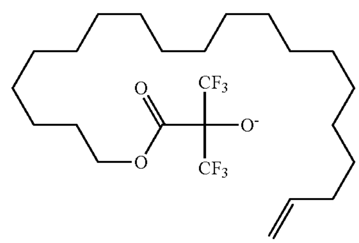
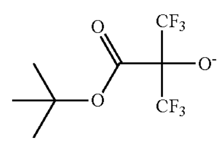
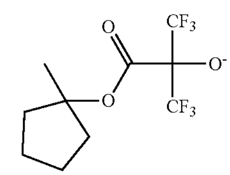
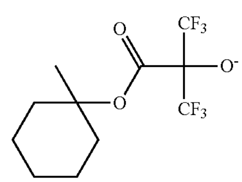
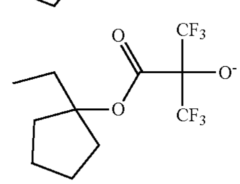
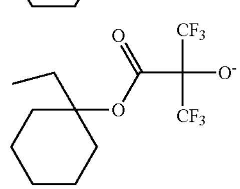
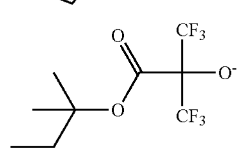
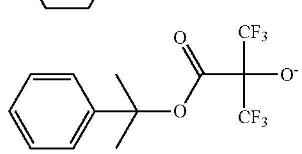
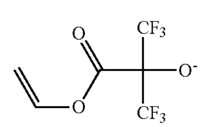

-continued
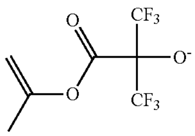
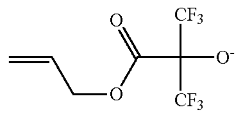
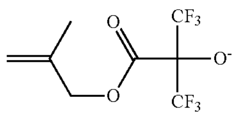
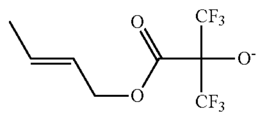
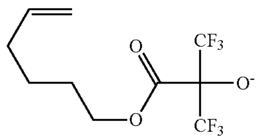
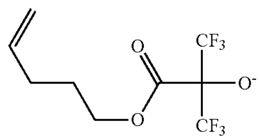
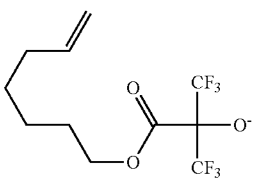
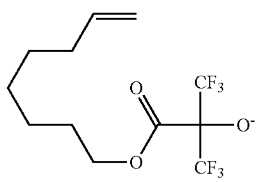
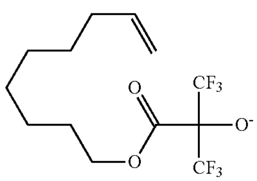
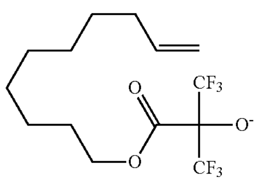
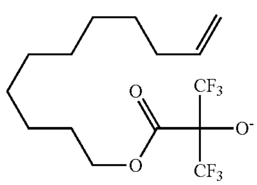
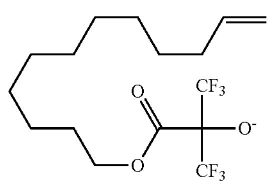
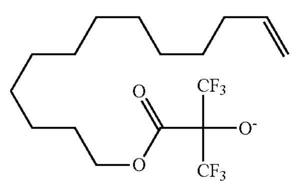
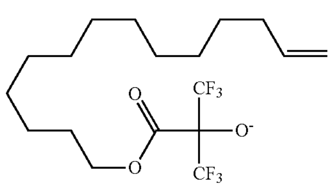
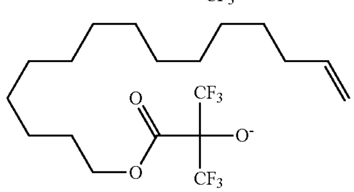
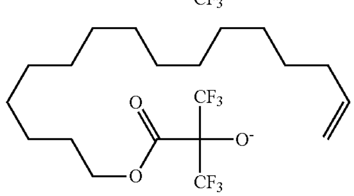
-continued
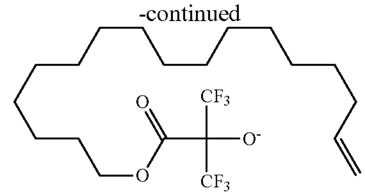
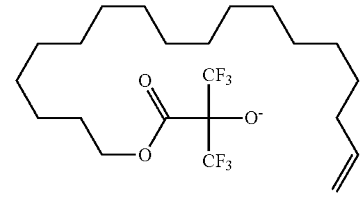
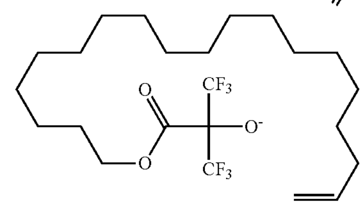
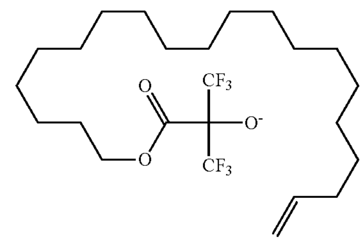
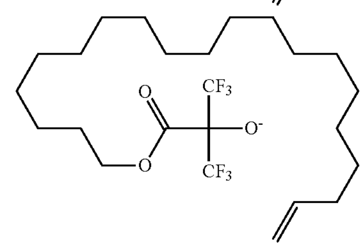
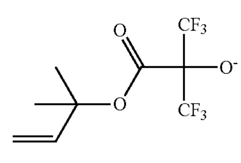
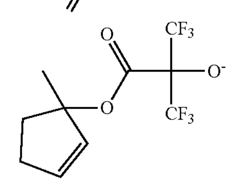
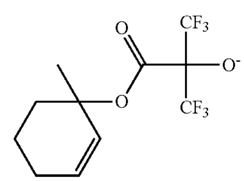
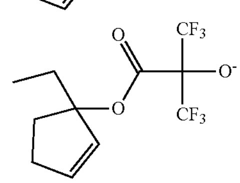
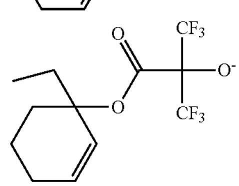
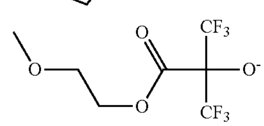
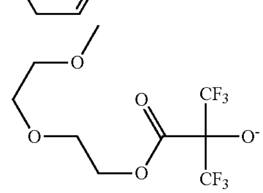
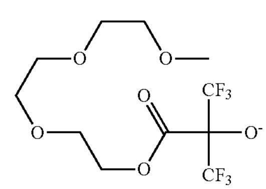

-continued
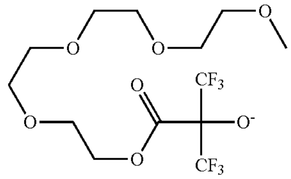
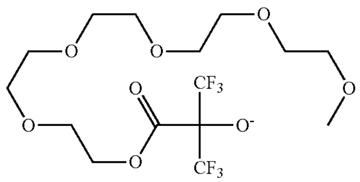
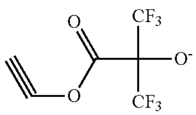
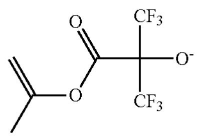
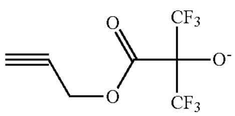
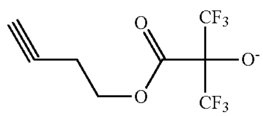
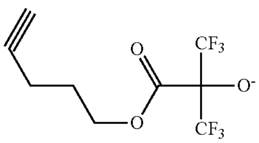
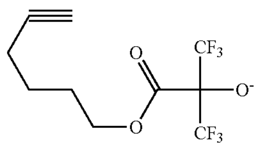
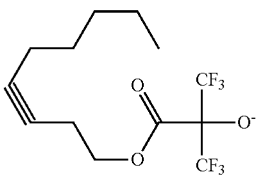
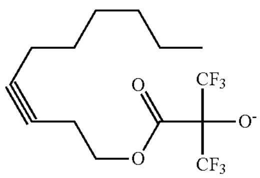
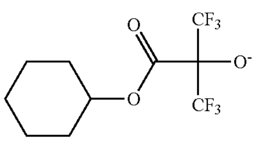
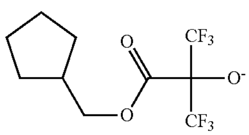
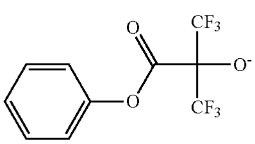
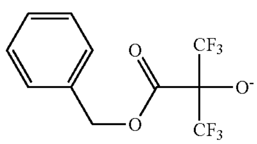
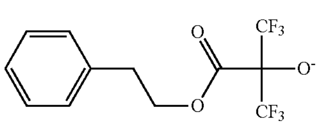
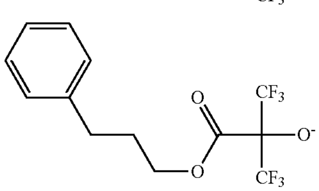
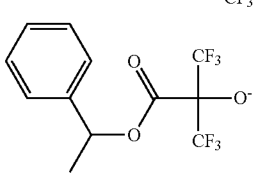
-continued
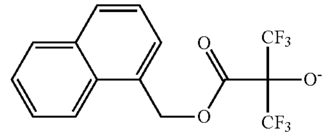
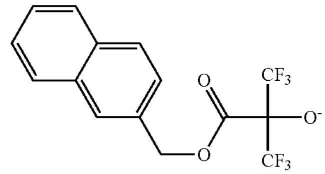
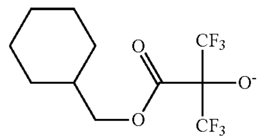
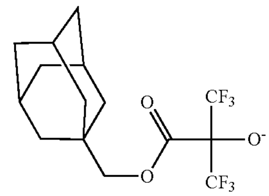
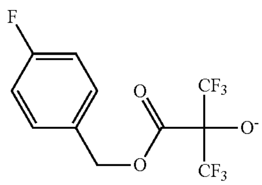
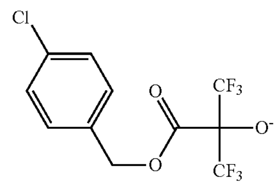
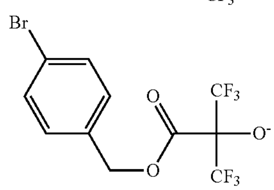
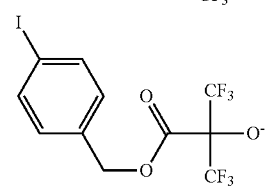
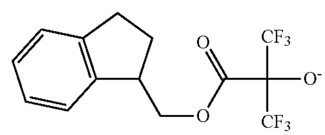
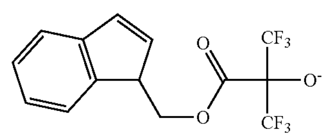
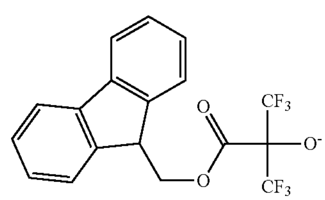
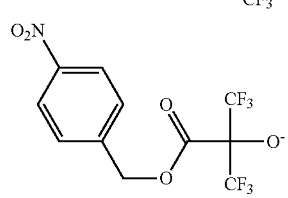
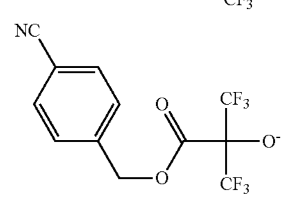

-continued
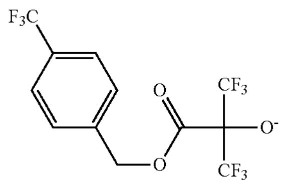
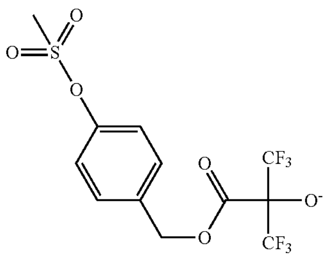
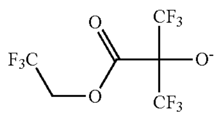
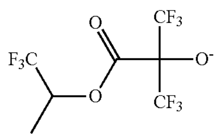
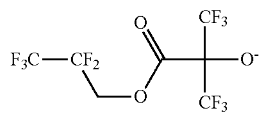
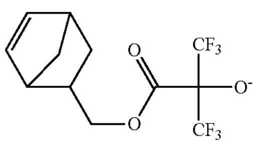
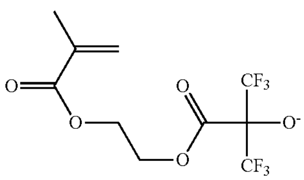
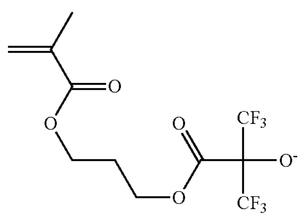
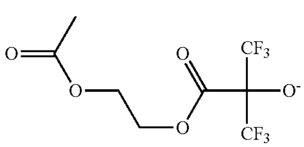
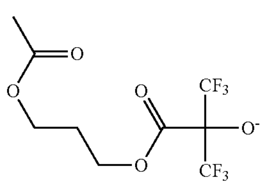
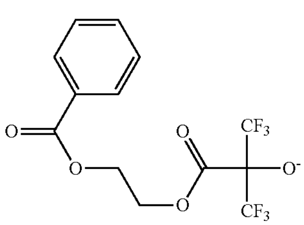
-continued
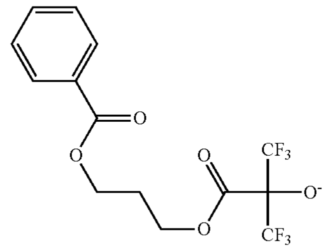
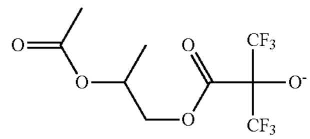
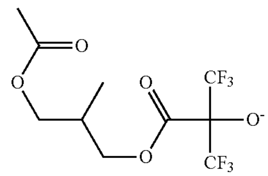
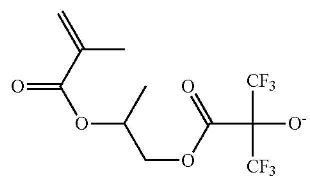
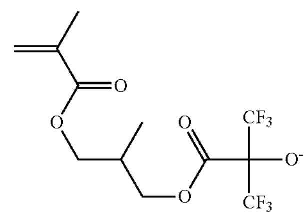
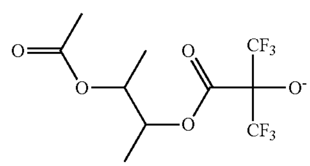
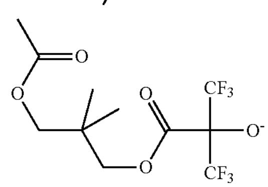
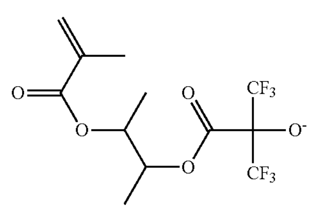
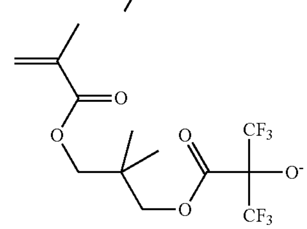

-continued
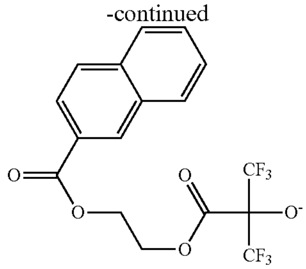
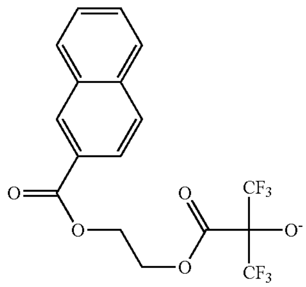
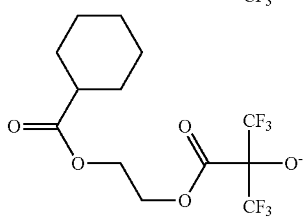
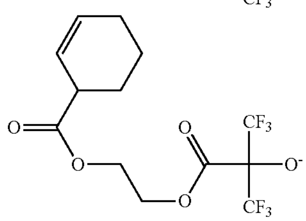
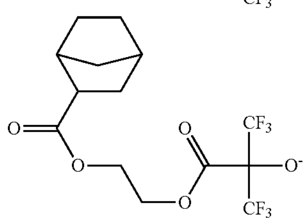
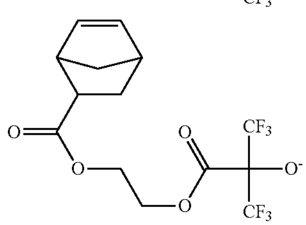
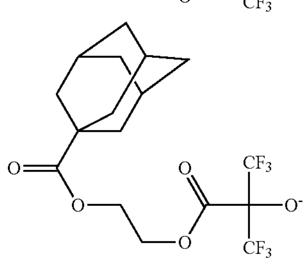
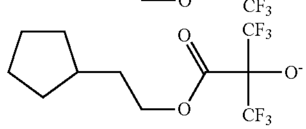
-continued
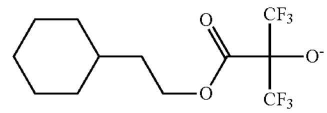
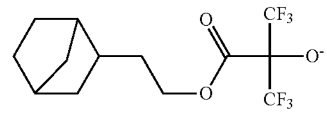
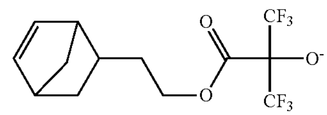
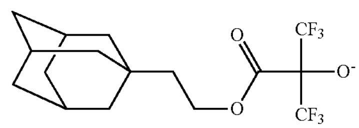
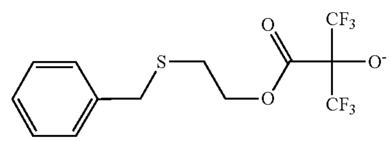
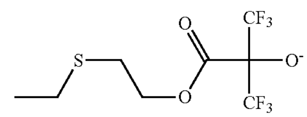
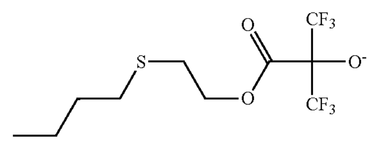
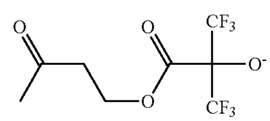
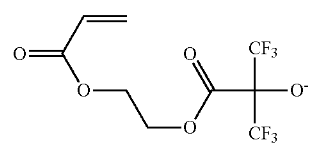
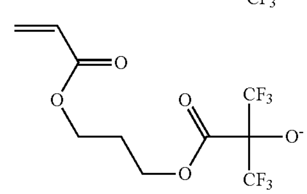
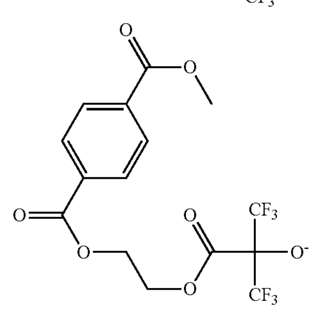

-continued
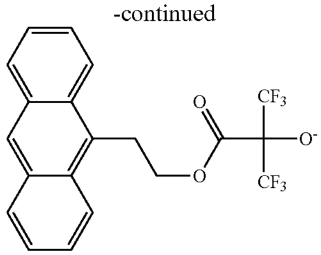
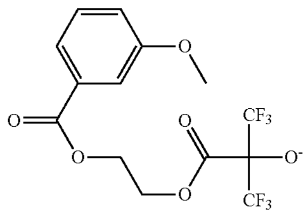
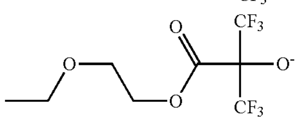
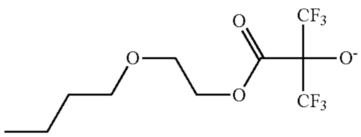
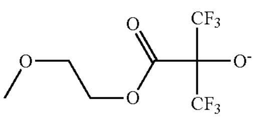
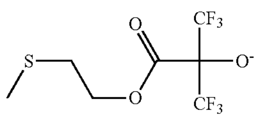
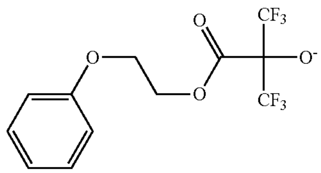
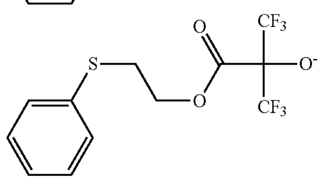
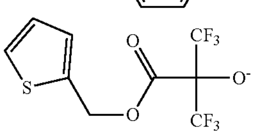
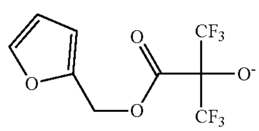
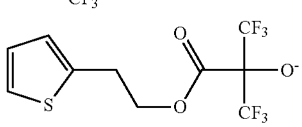
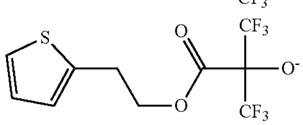
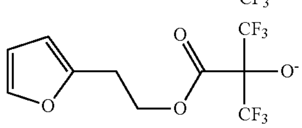
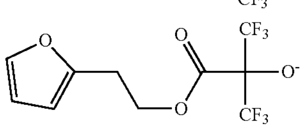
-continued
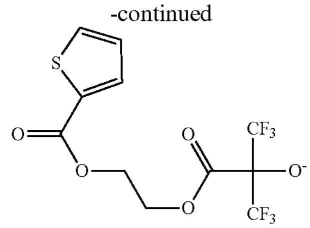
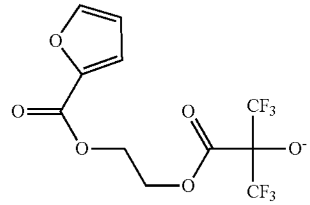
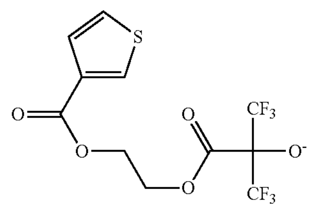
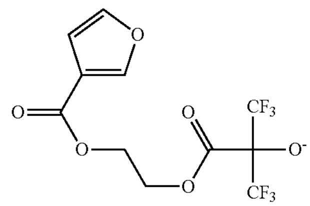
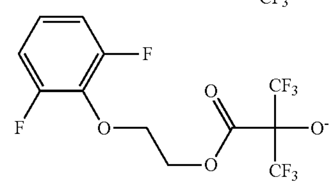
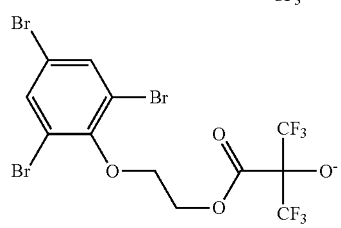
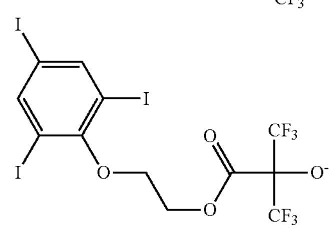
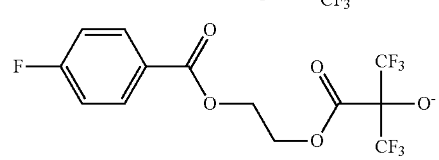
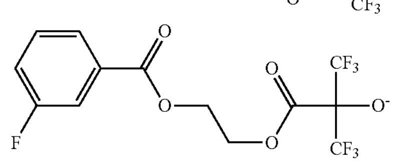

-continued
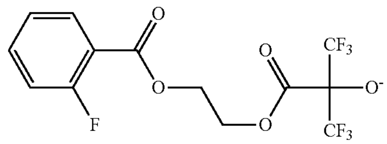
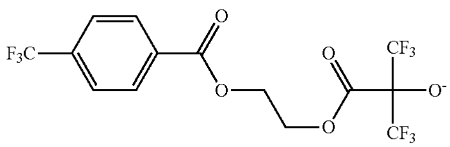
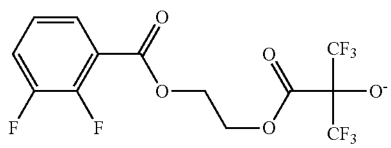
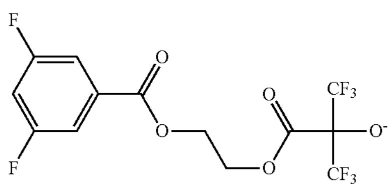
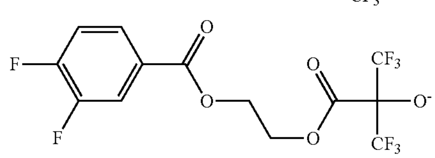
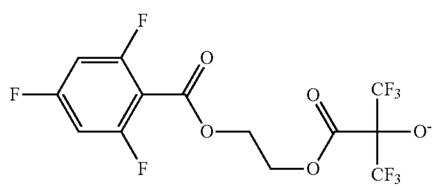
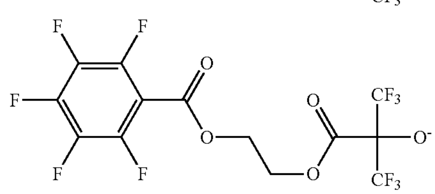
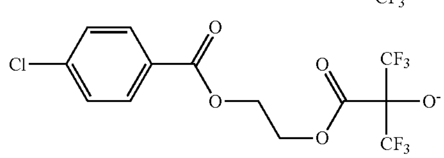
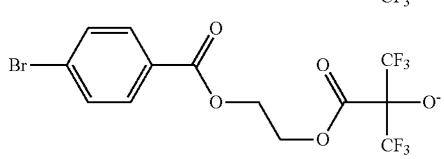
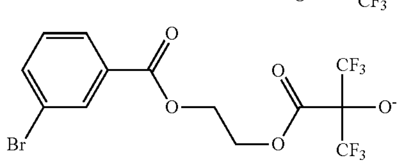
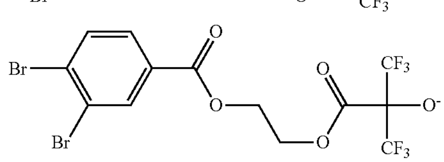
-continued
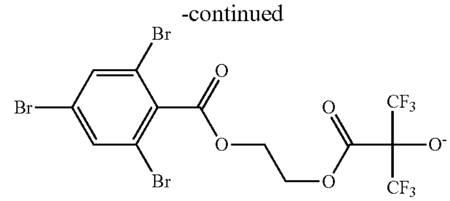
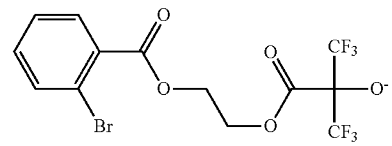
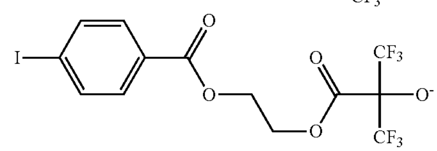
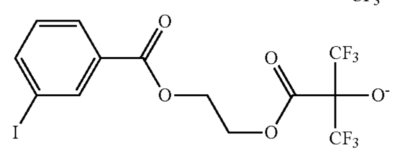
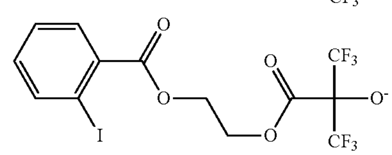
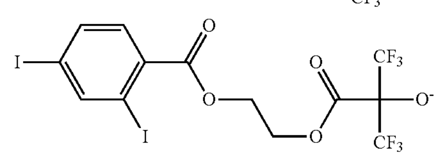
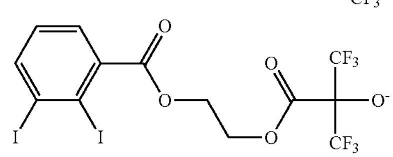
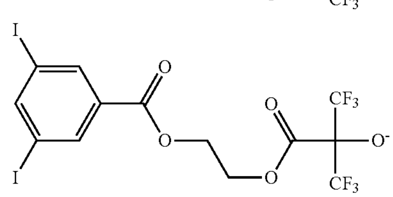
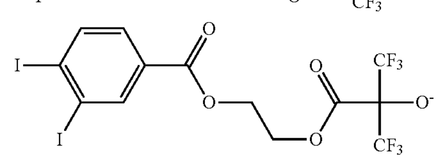
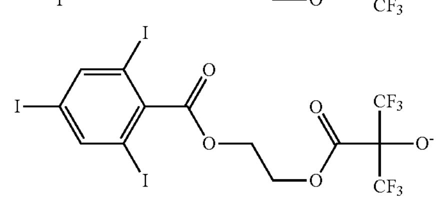
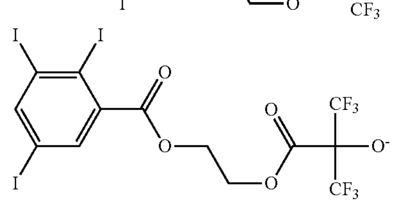

-continued
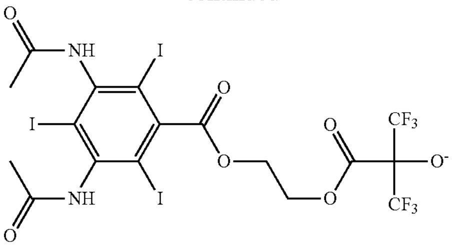
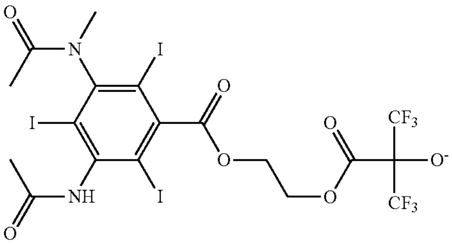
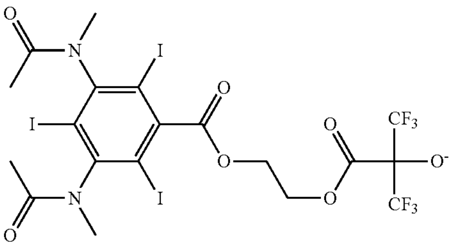
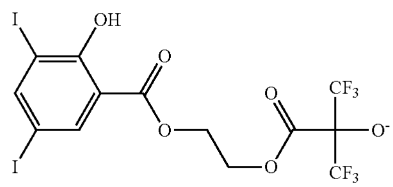
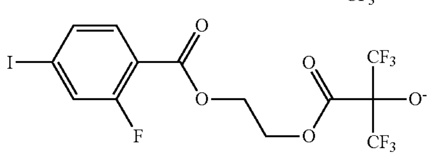
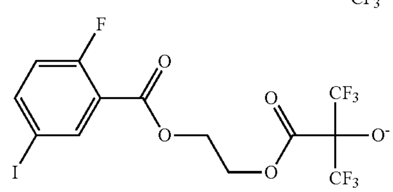
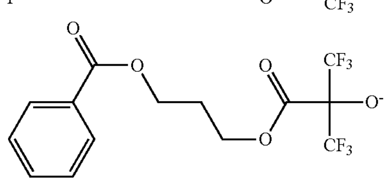
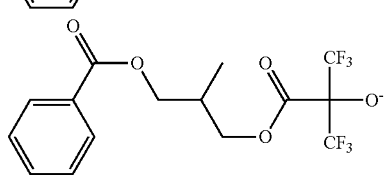
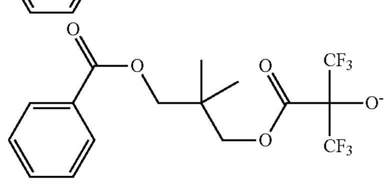
-continued
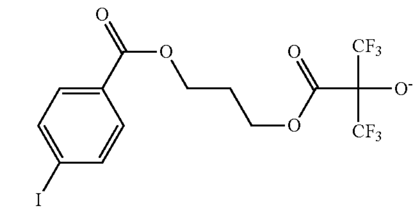
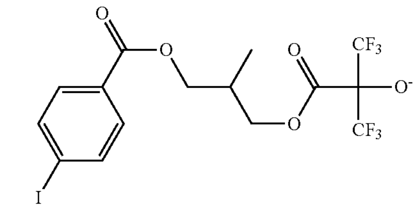
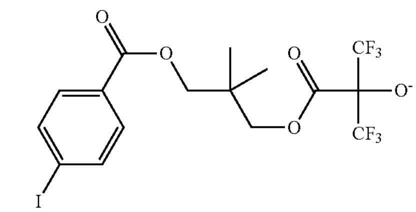
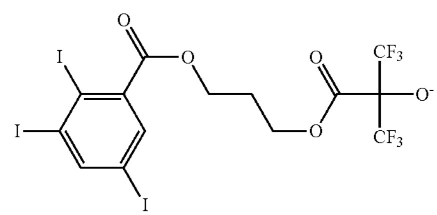
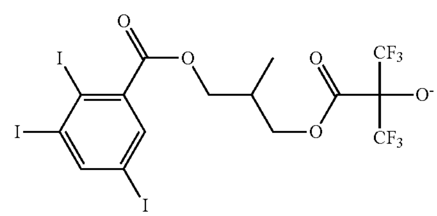
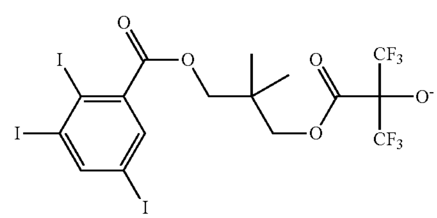
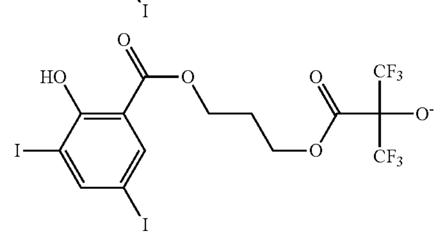
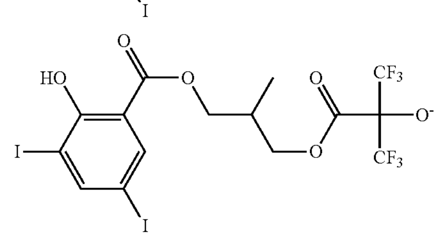

-continued
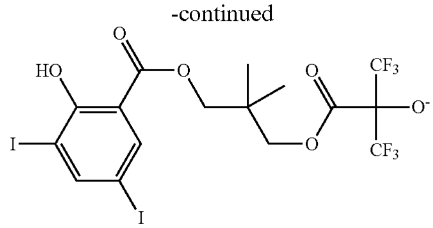
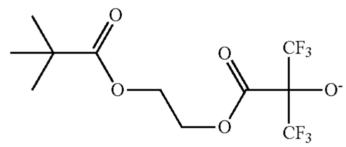
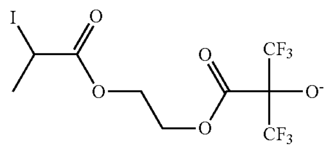
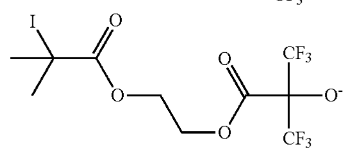
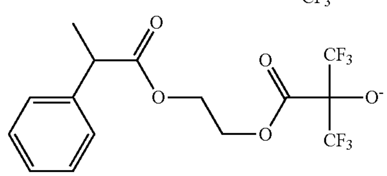
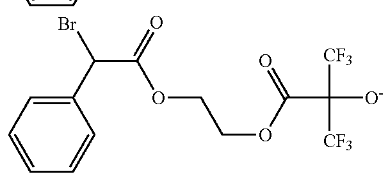
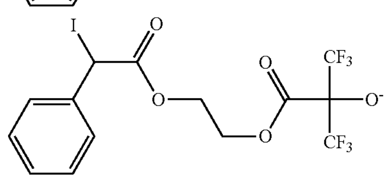
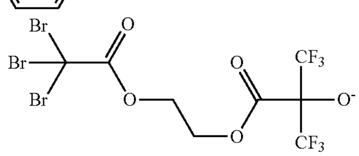
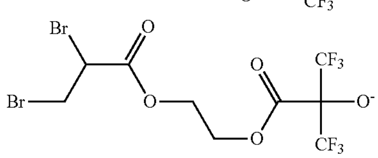
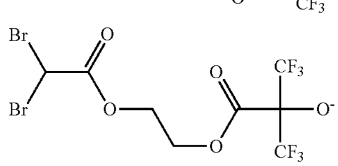
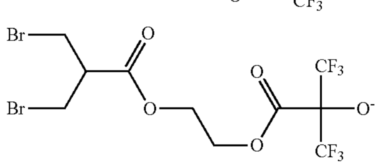
-continued
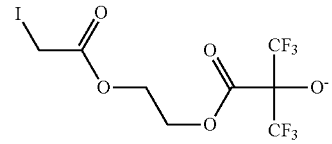
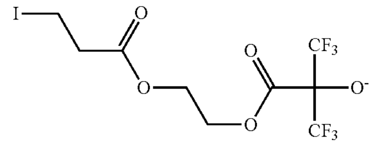
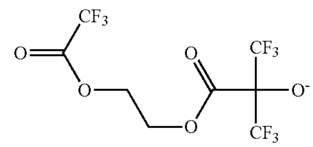
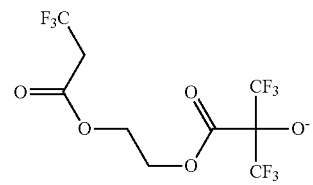
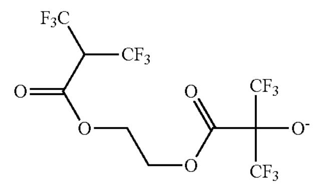
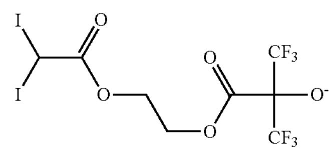
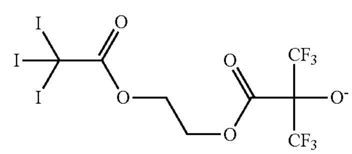
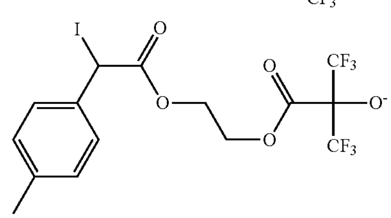
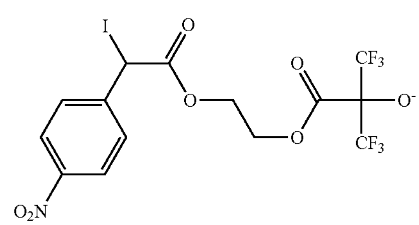
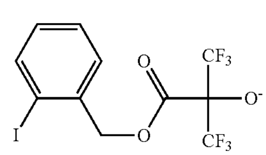

-continued
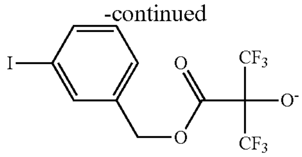
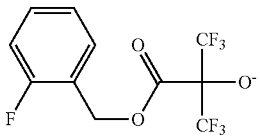
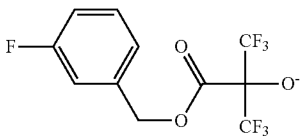
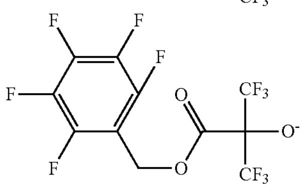
-continued
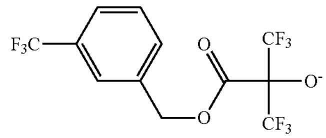
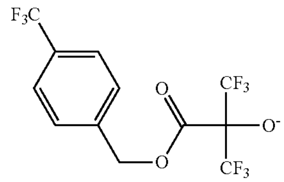
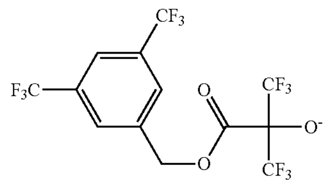
Examples of the cation in the salt compound having formula (1) are shown below, but not limited thereto.
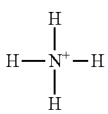
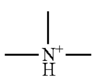
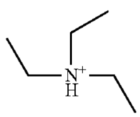
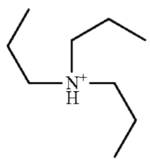
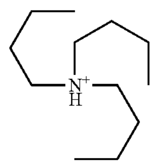
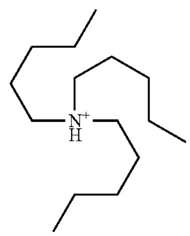
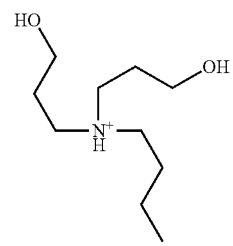
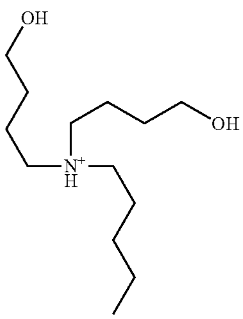
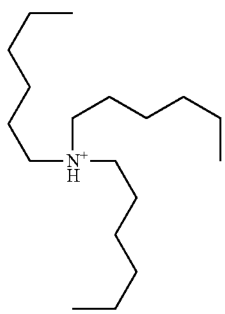
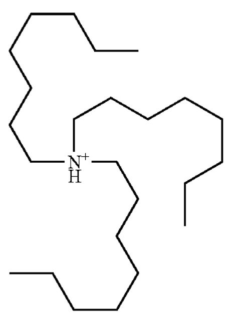
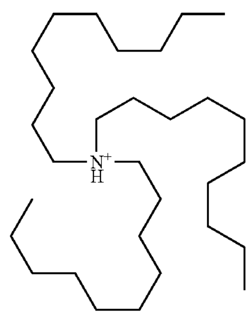
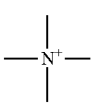
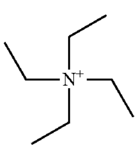
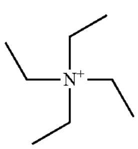
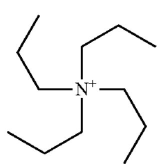
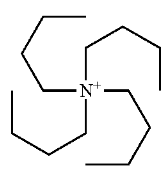
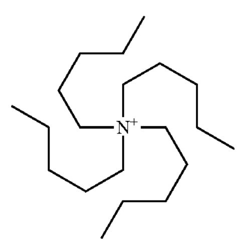
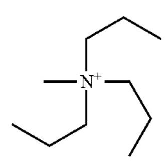
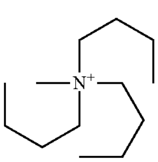
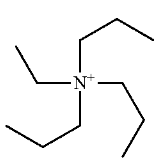
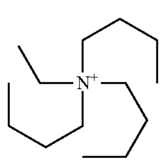
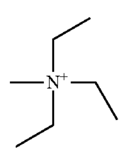
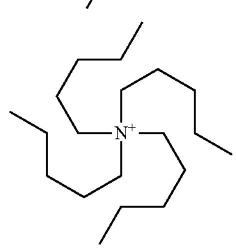

-continued
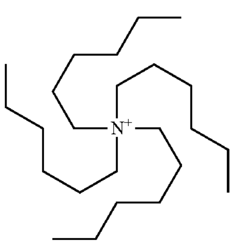
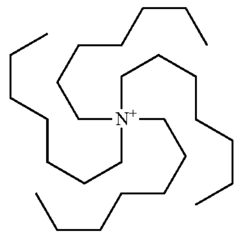
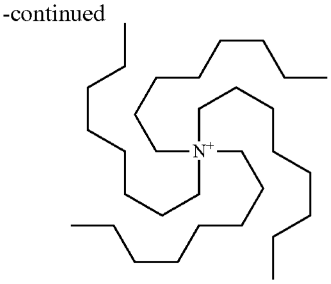
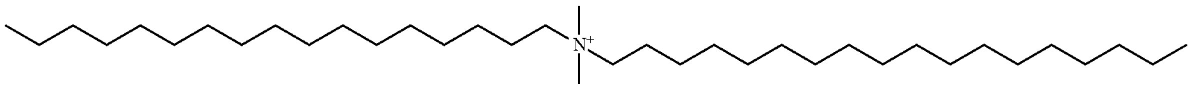
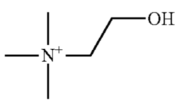
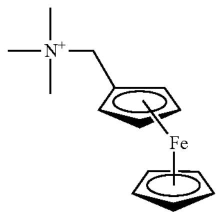
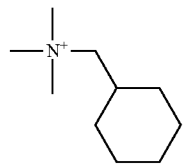
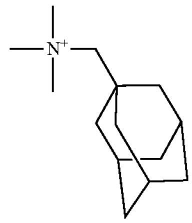
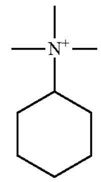
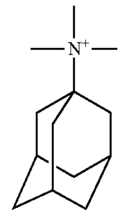
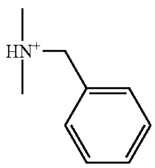
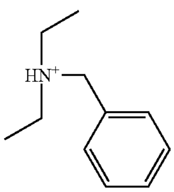
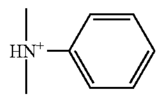
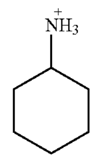
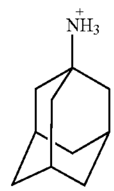
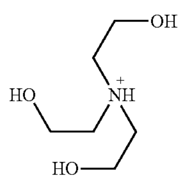
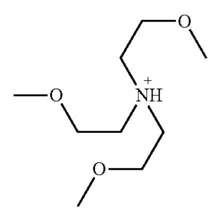
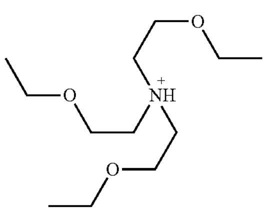
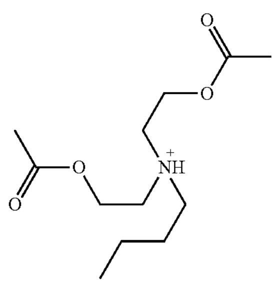
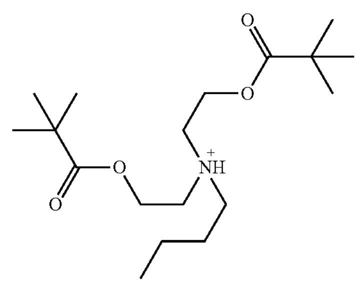
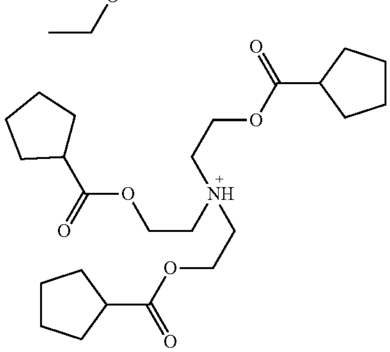
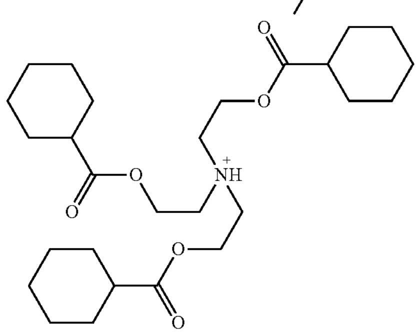
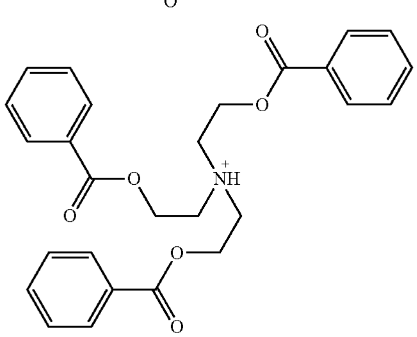
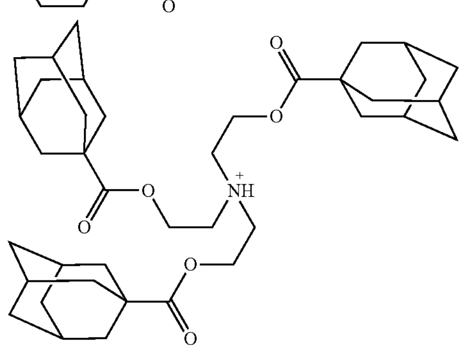
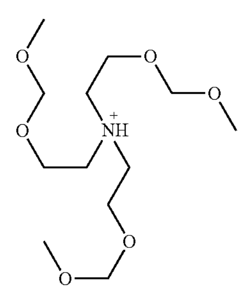

-continued
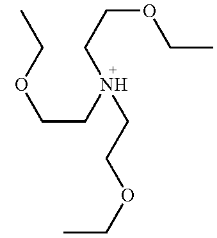
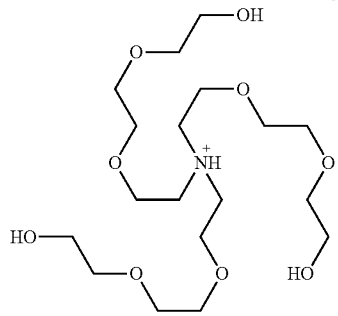
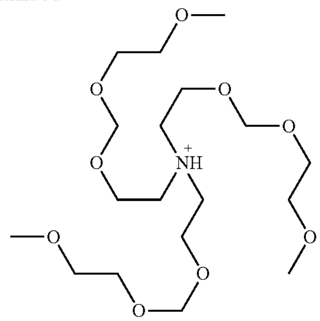
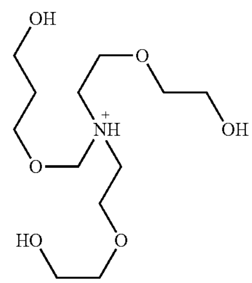
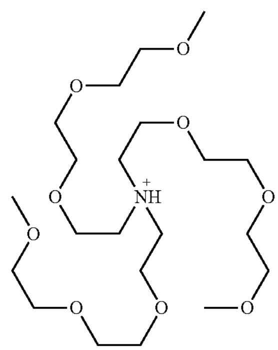
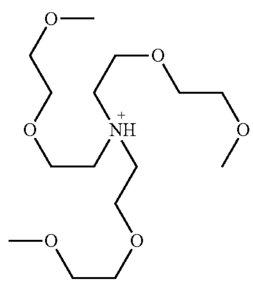
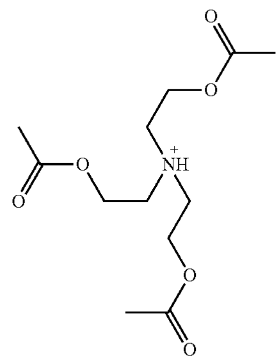
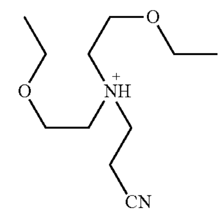
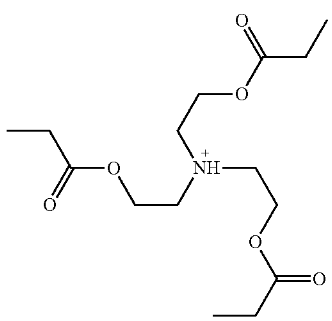
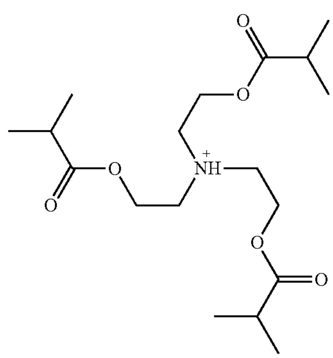
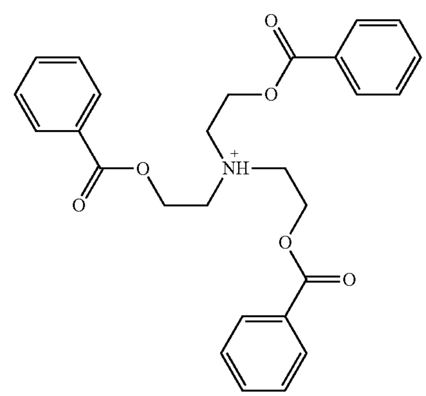
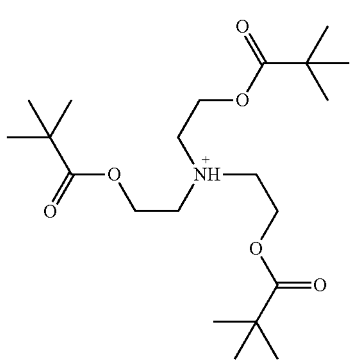
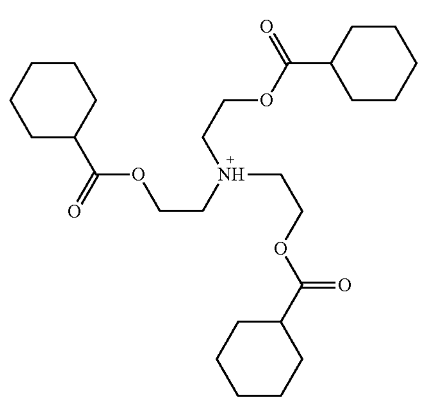
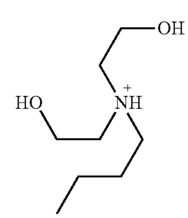
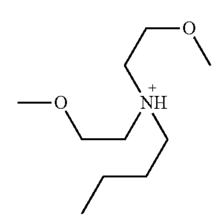

-continued
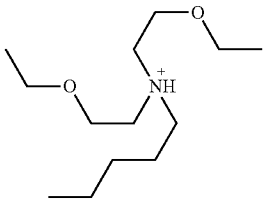
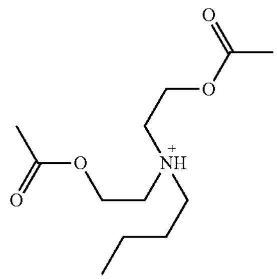
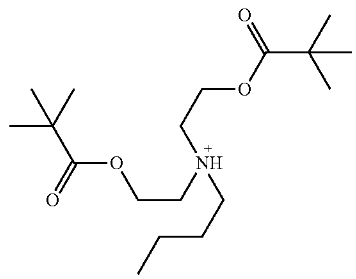
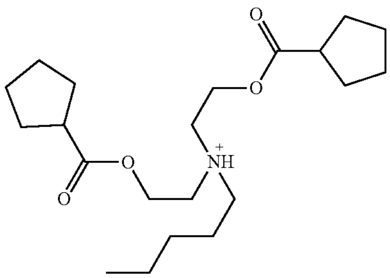
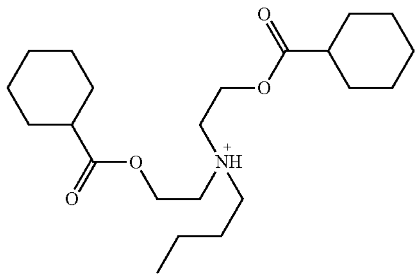
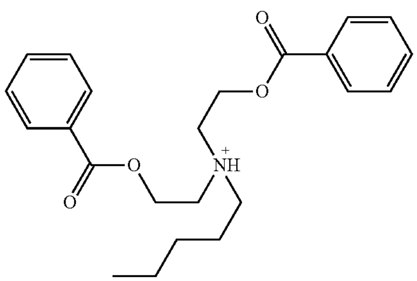
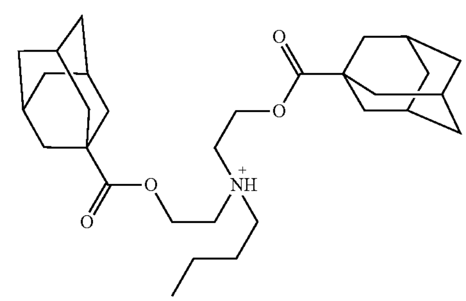
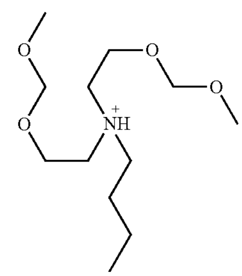
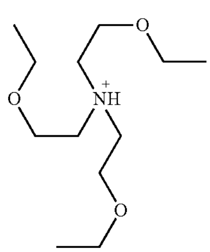
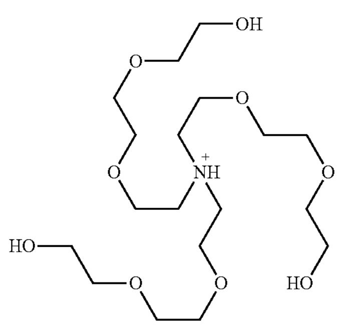
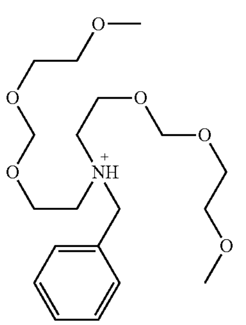
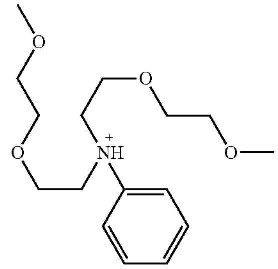
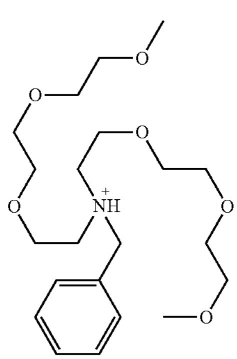
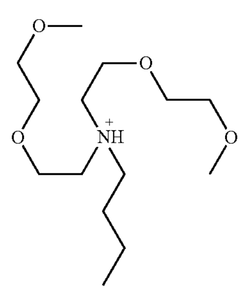
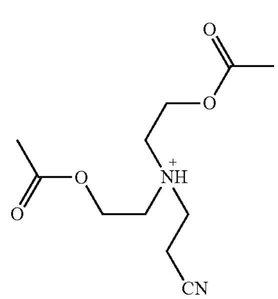
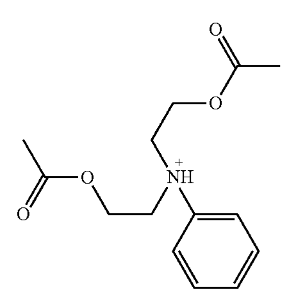

-continued
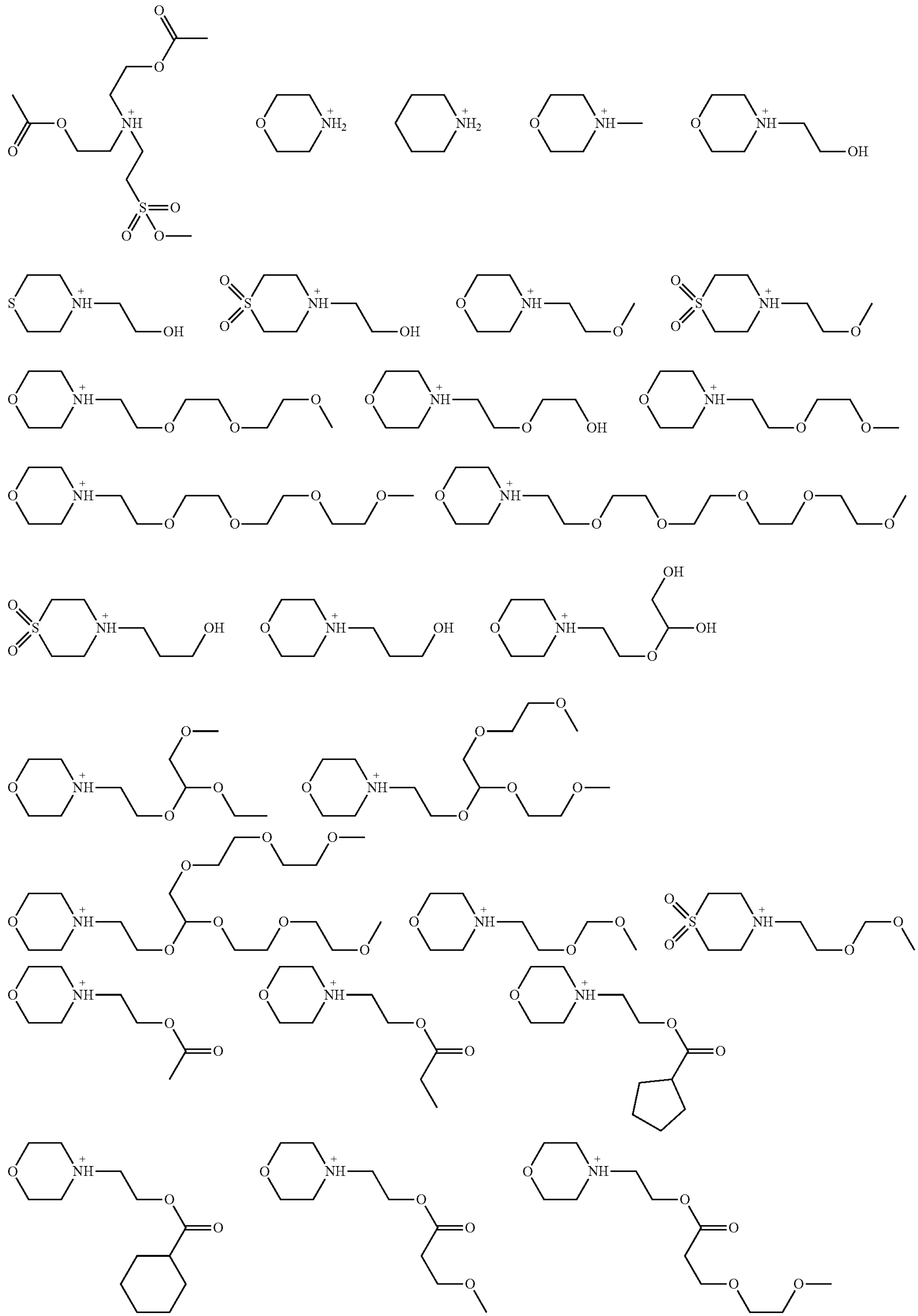

-continued
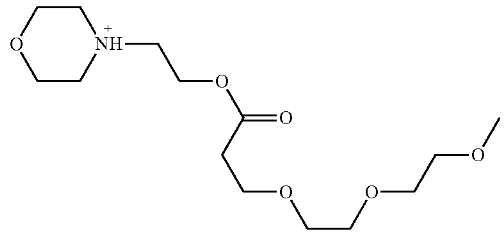
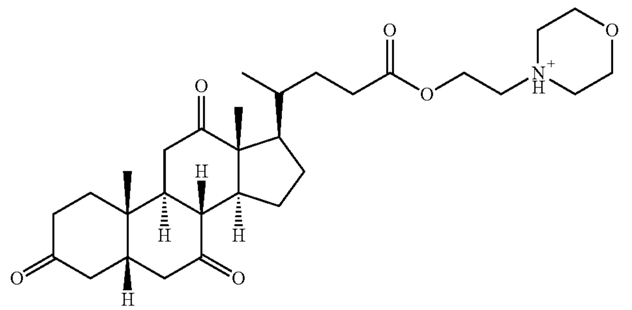
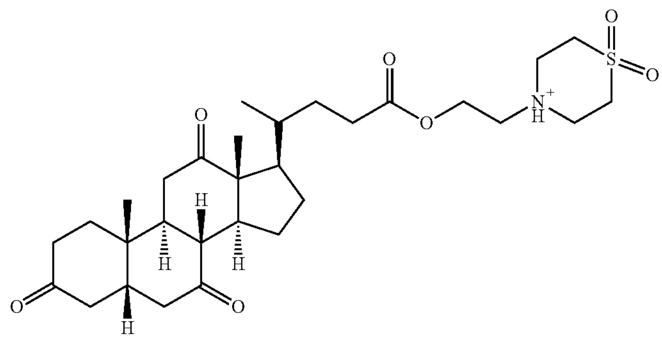
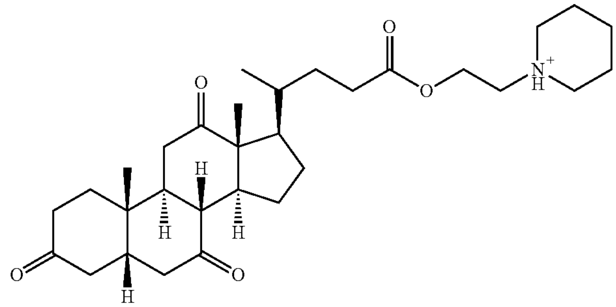
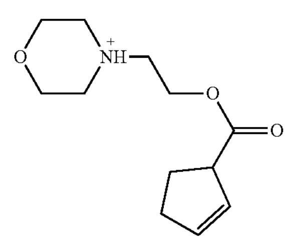
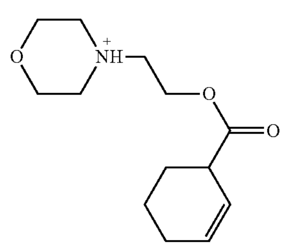
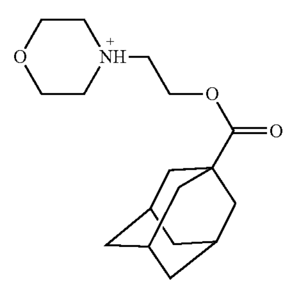
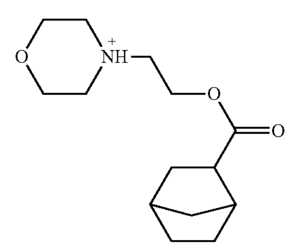
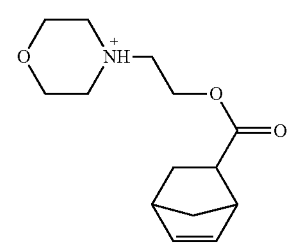
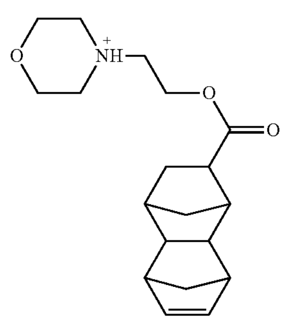
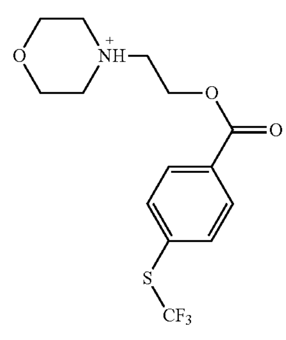
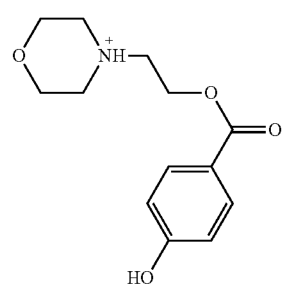
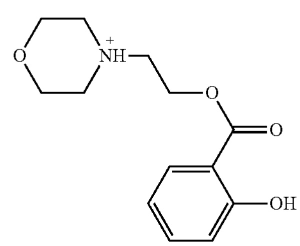

-continued
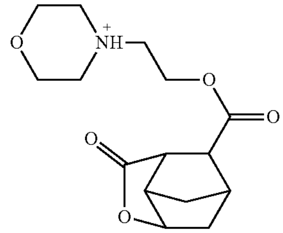
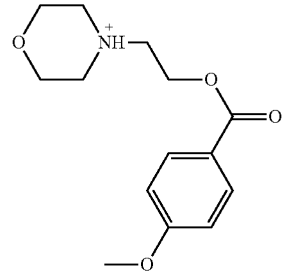
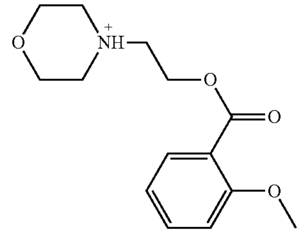
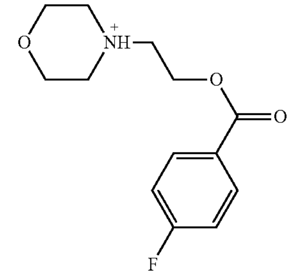
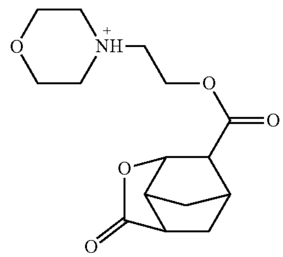
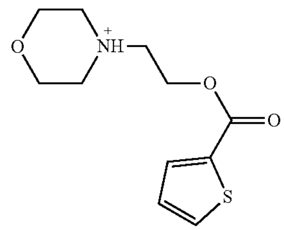
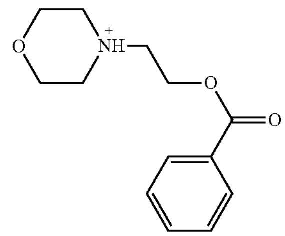
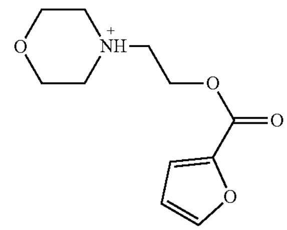
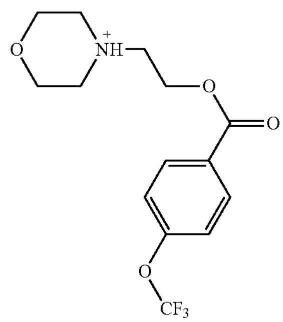
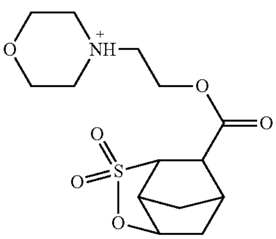
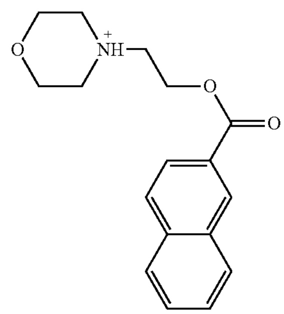
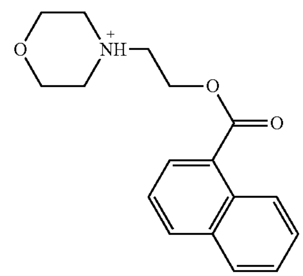
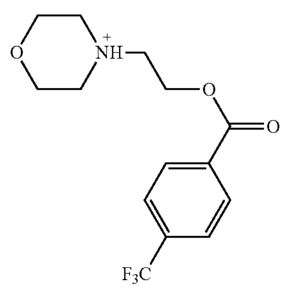
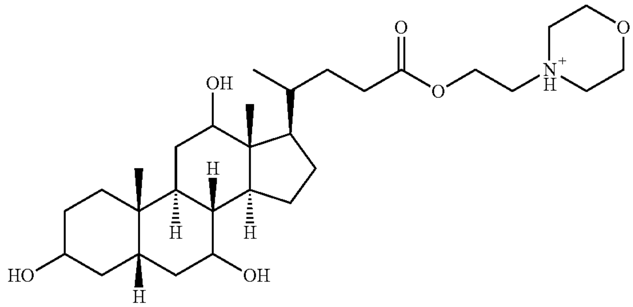
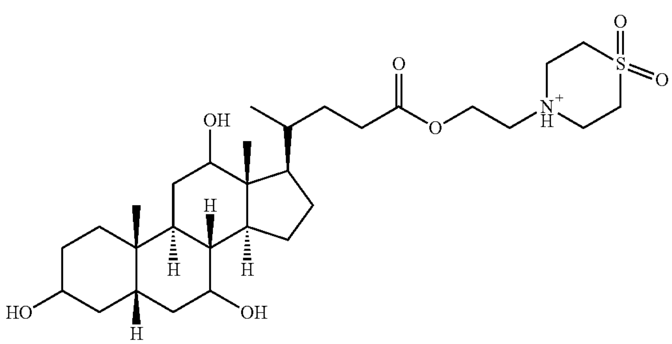

-continued
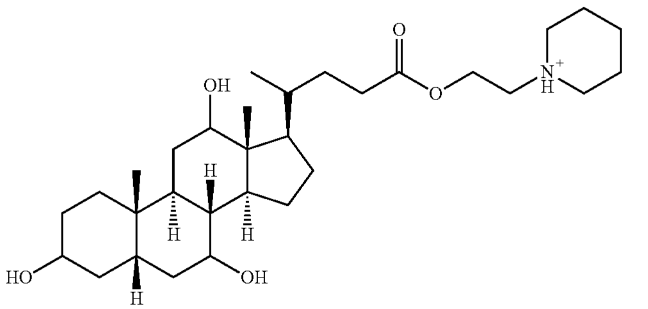
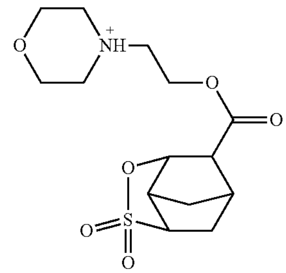
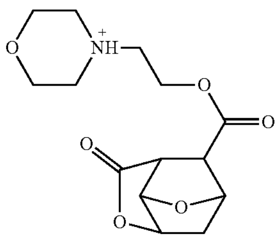
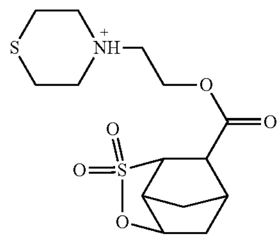
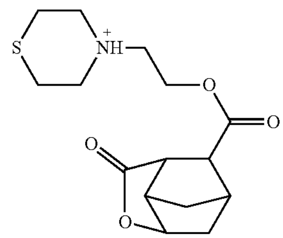
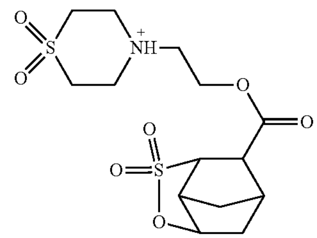
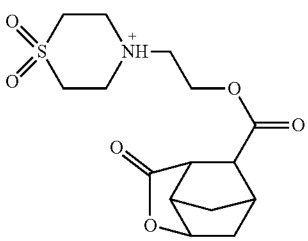
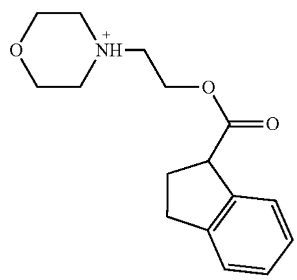
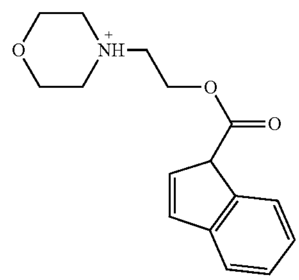
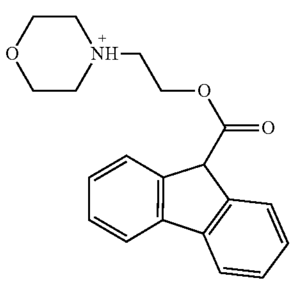
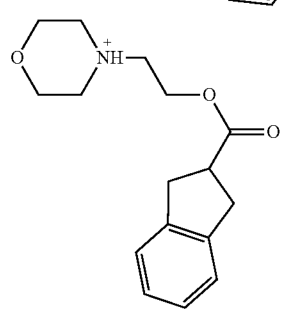
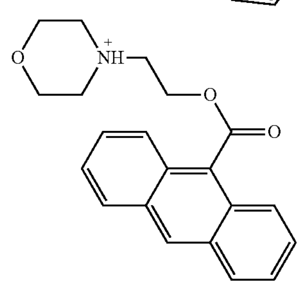
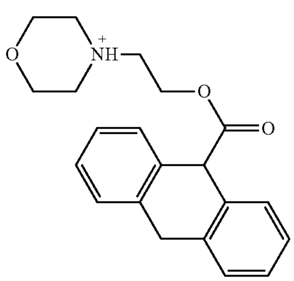
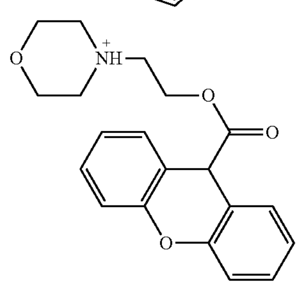
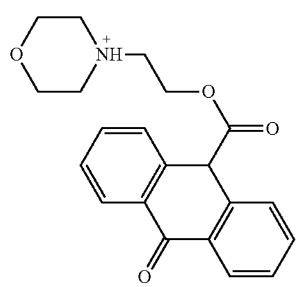
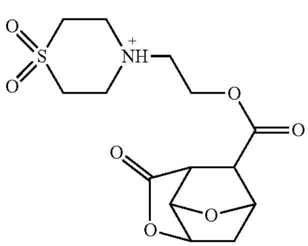
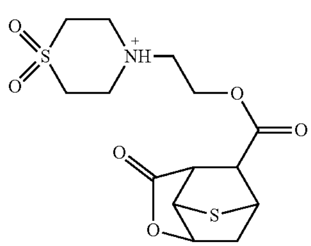
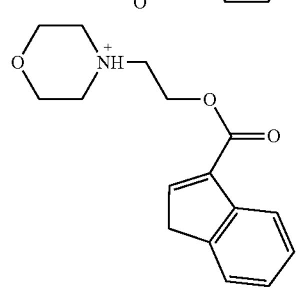

-continued
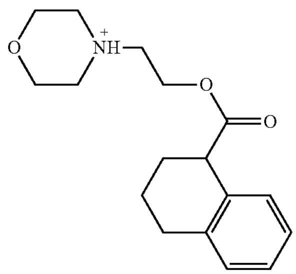
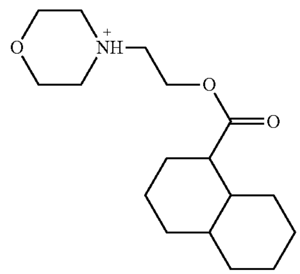
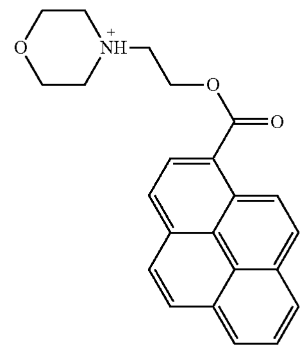
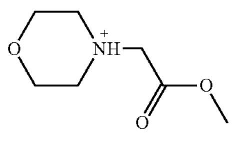
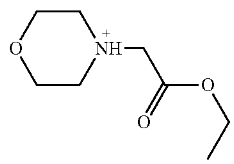
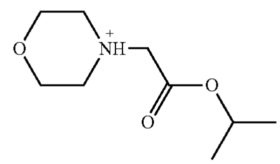
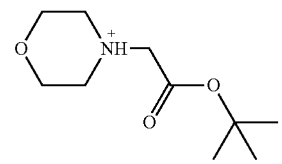
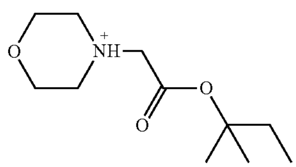
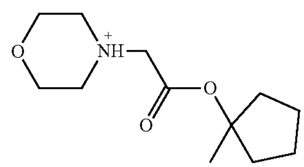
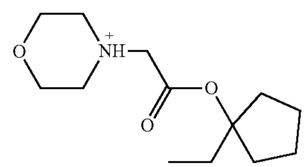
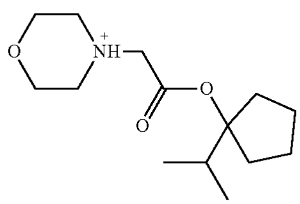
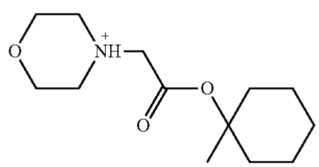
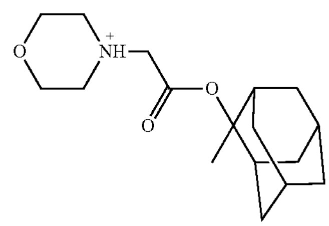
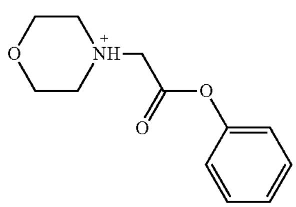
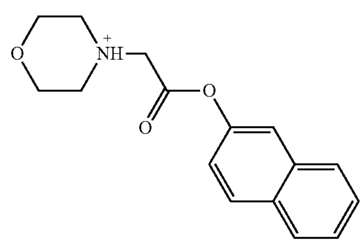
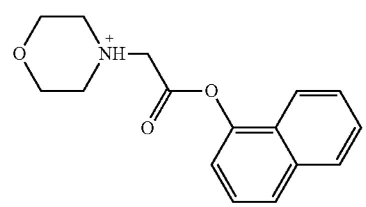
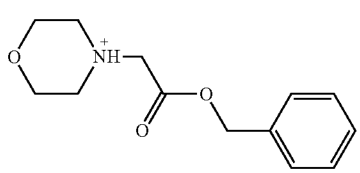
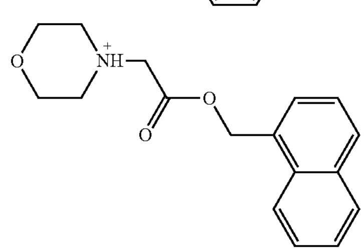
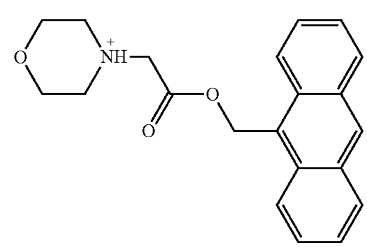
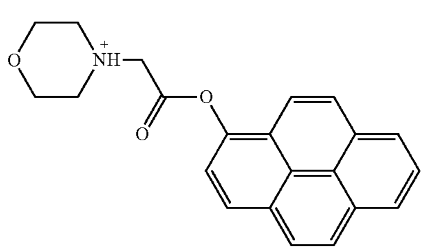
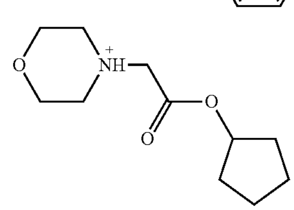
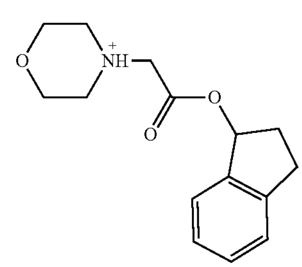

-continued
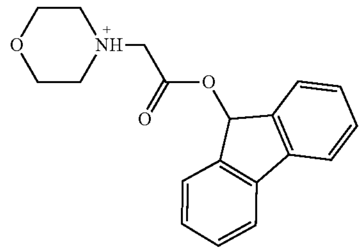
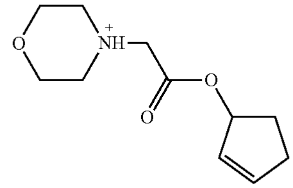
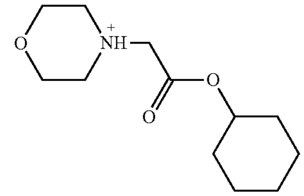
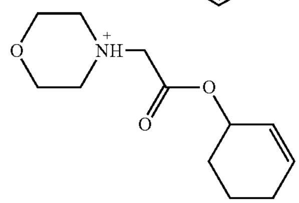
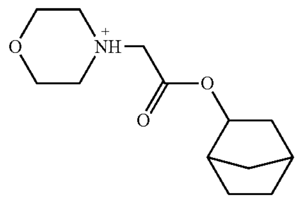
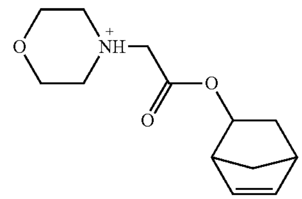
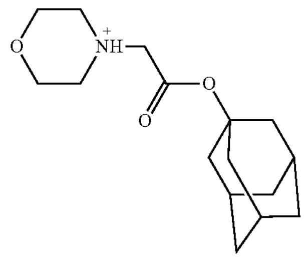
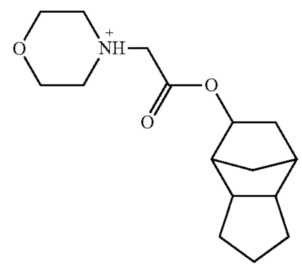
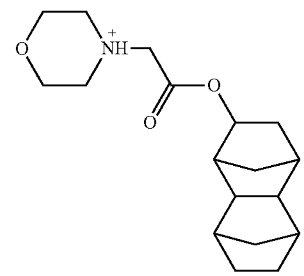
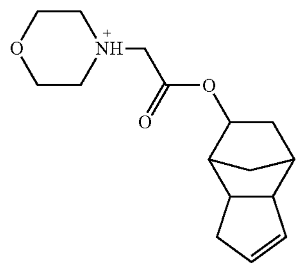
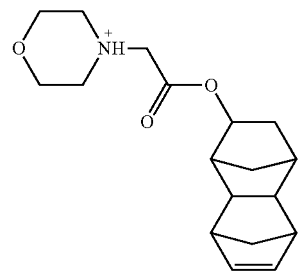
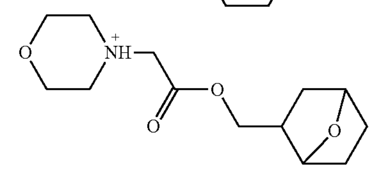
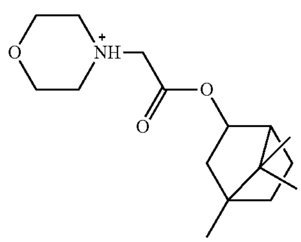
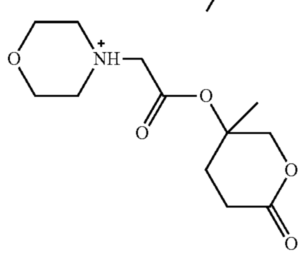
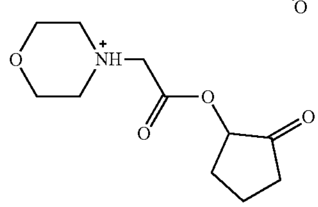
-continued
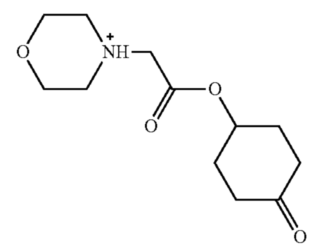
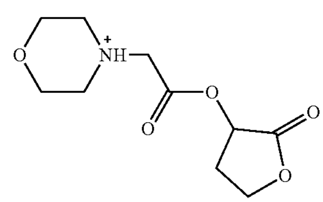
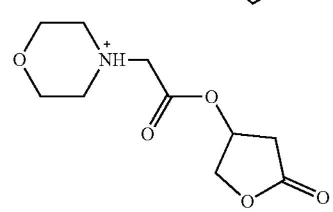

-continued
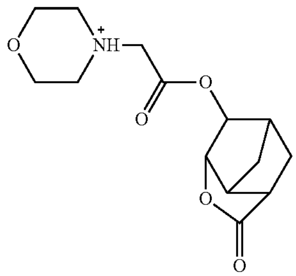
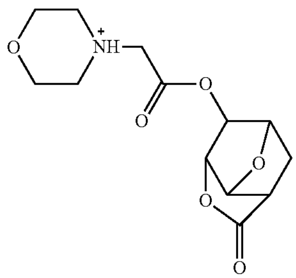
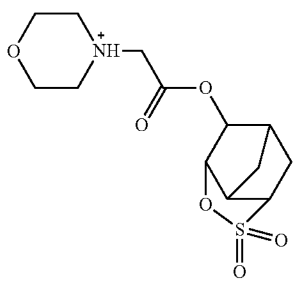
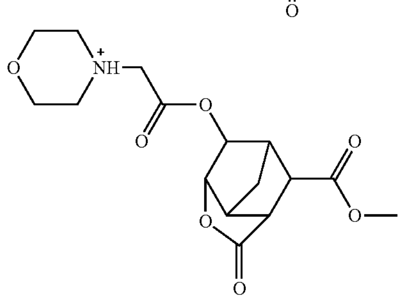
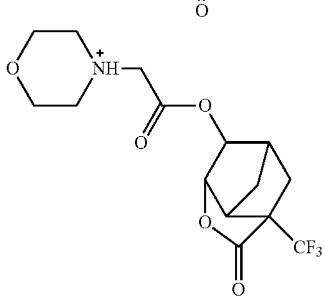
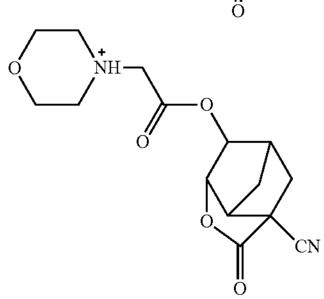
-continued
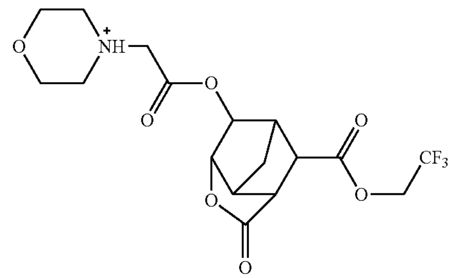
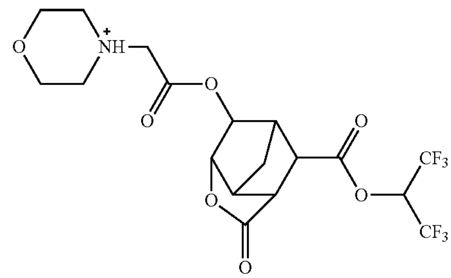
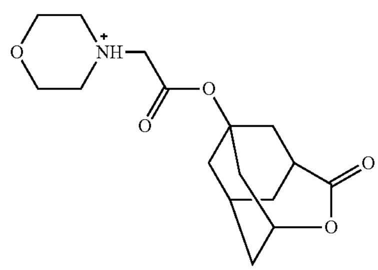
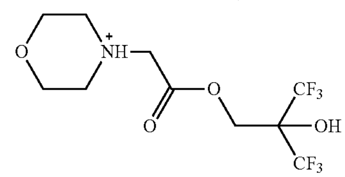
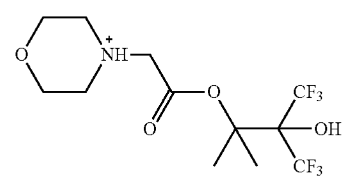
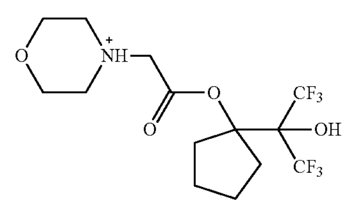
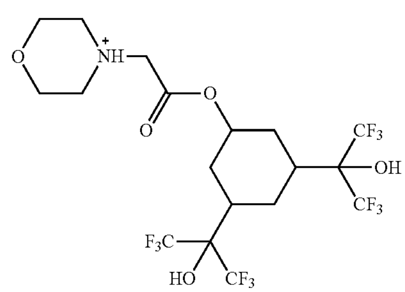

-continued
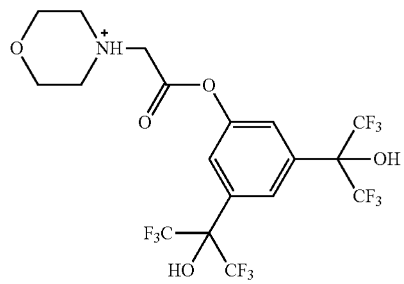
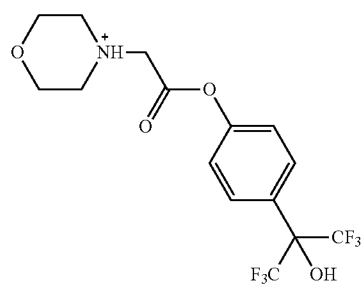
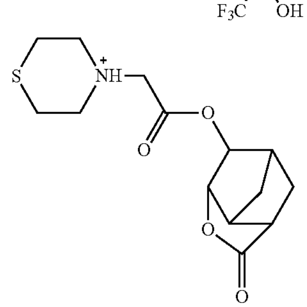
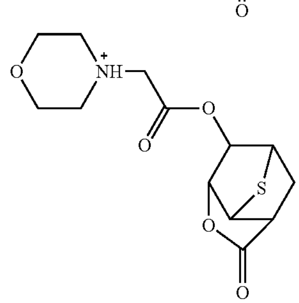
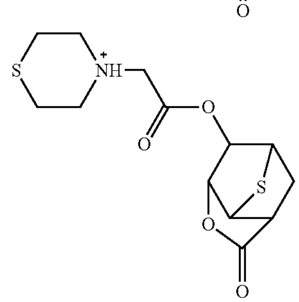
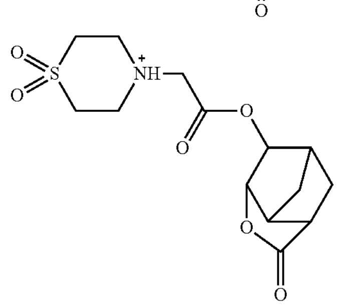
-continued
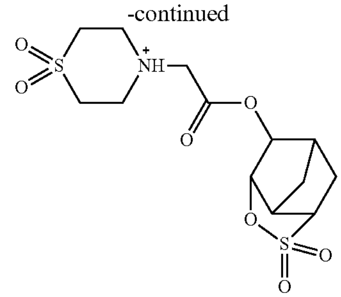
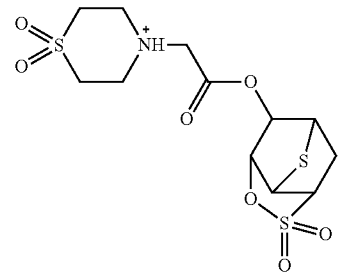
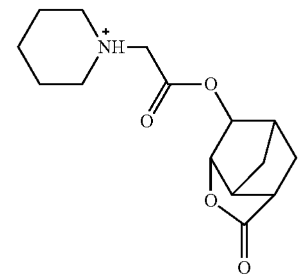
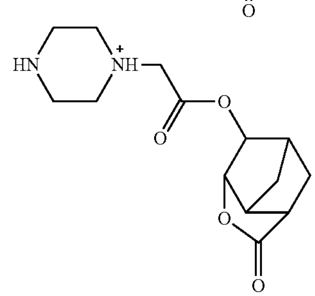
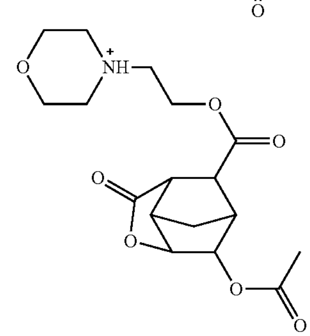
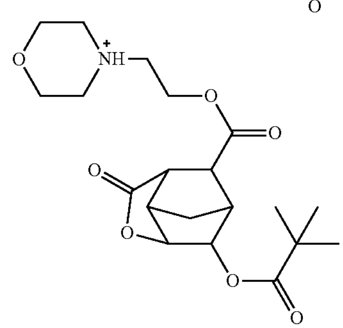

-continued
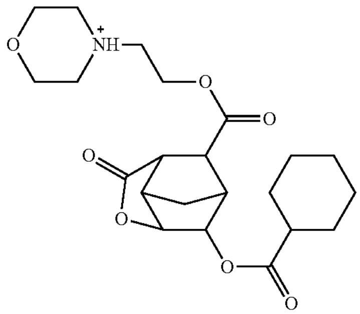
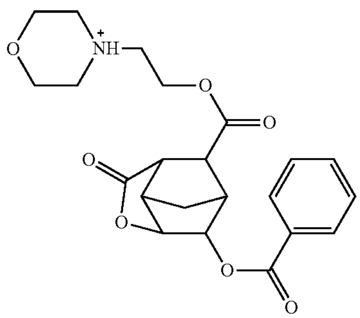
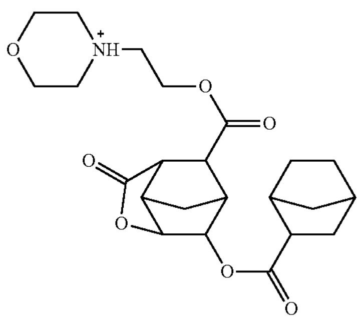
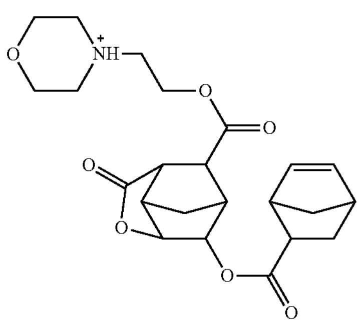
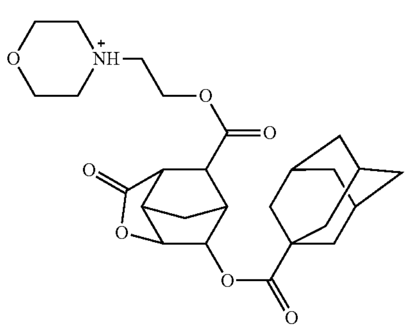
-continued
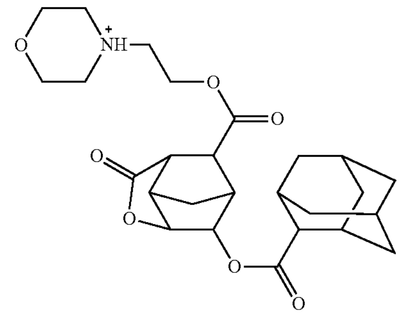
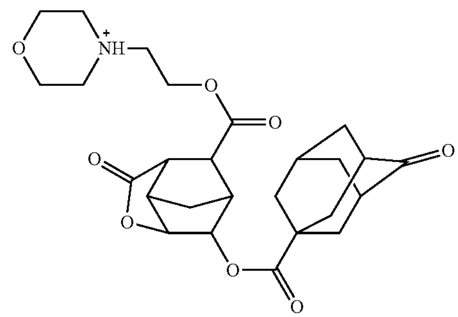
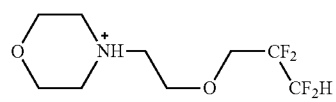
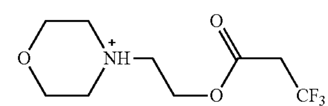
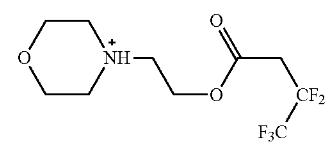
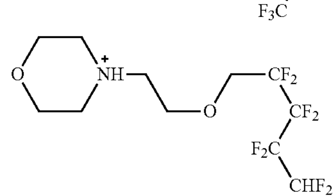
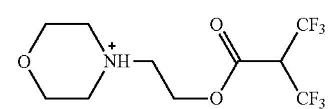
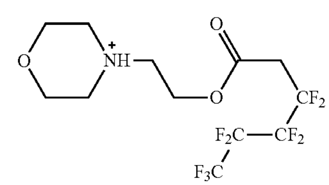
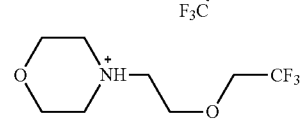
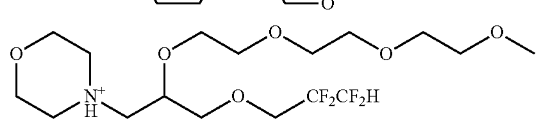

-continued
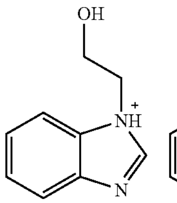
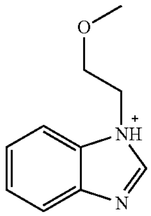
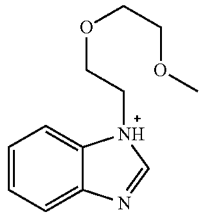
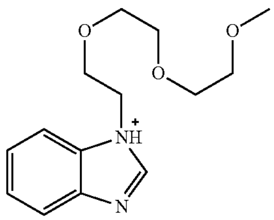
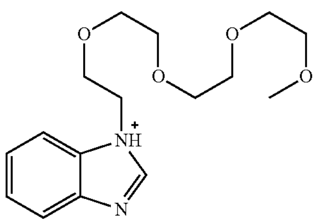
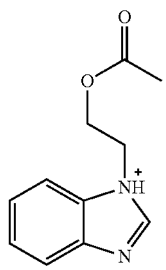
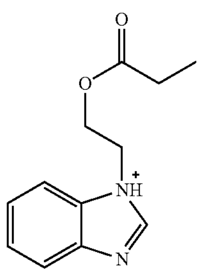
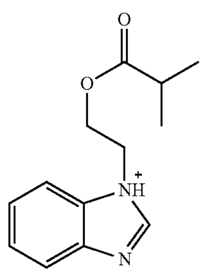
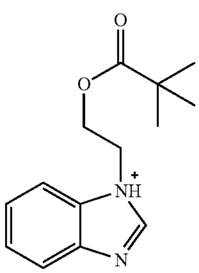
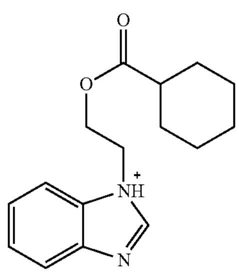
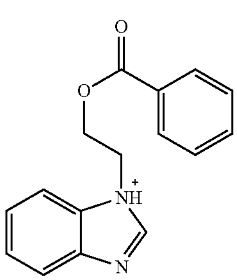
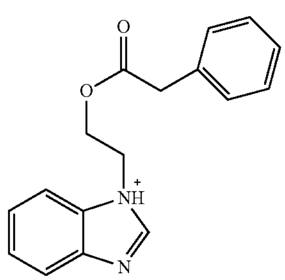
-continued
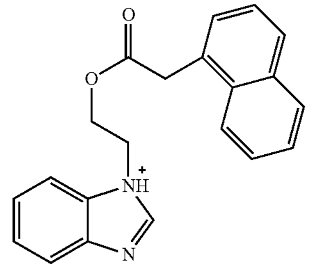
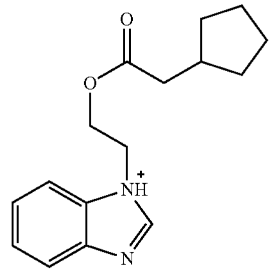
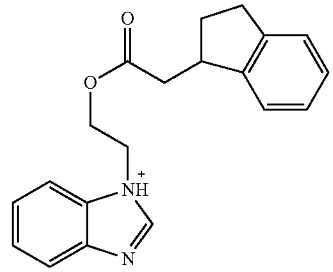
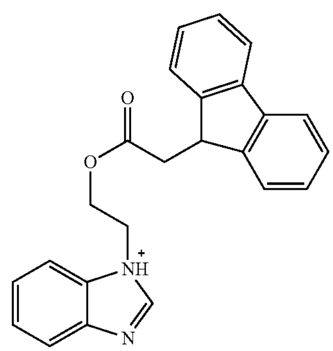
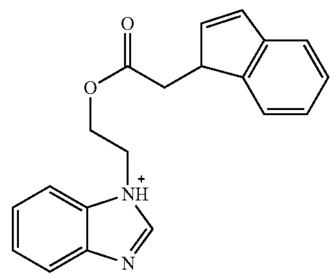
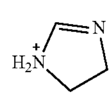
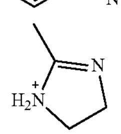
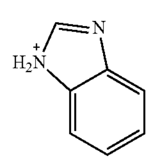
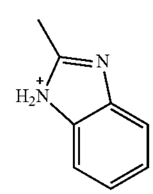

-continued
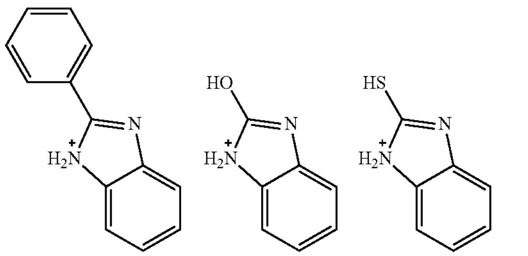
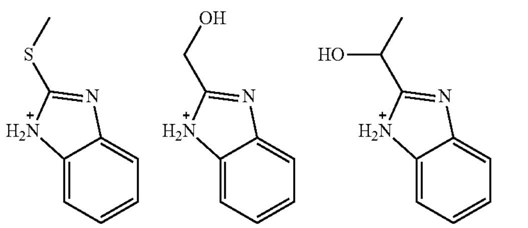
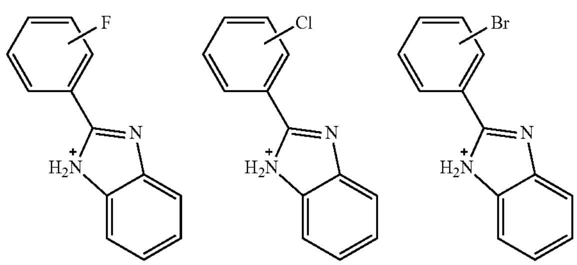
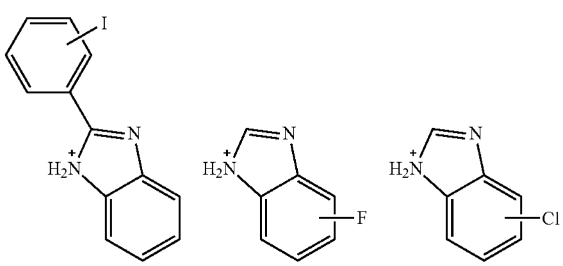
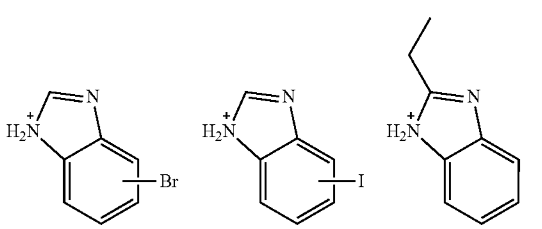
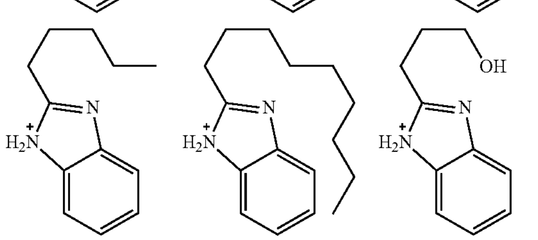
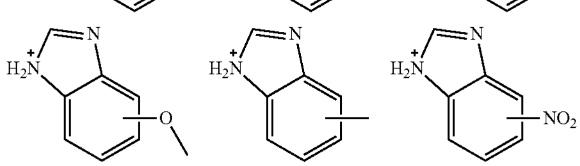
-continued
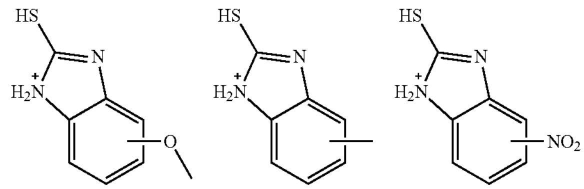
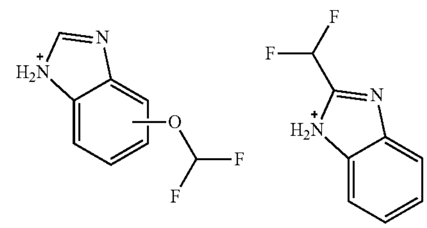
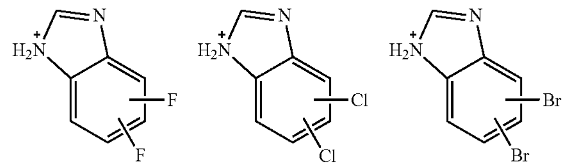
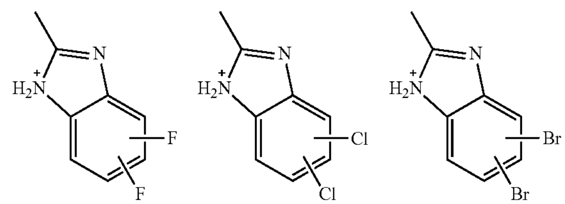
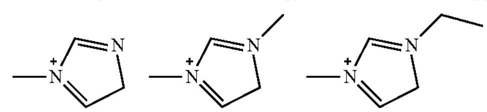
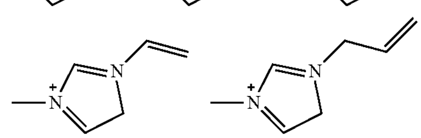
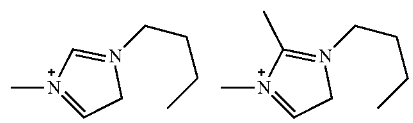
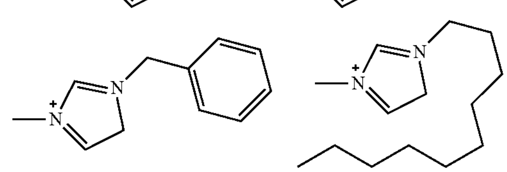
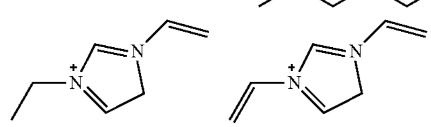
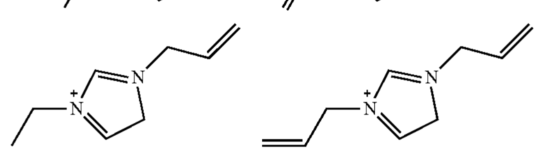
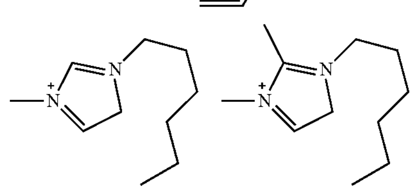

-continued
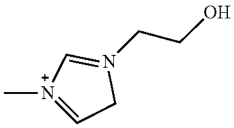
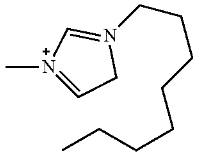
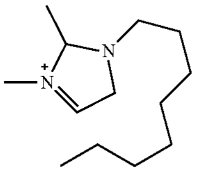
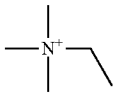
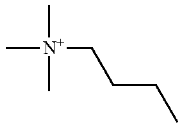
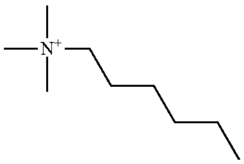
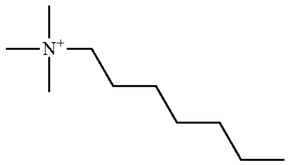
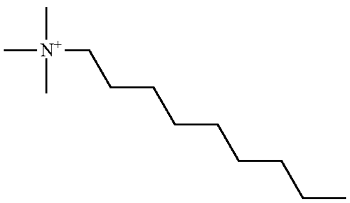
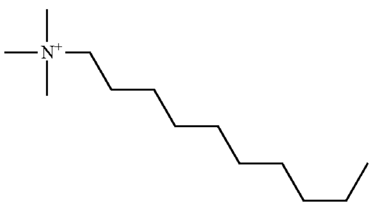
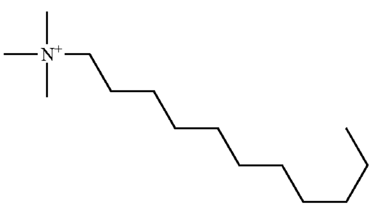
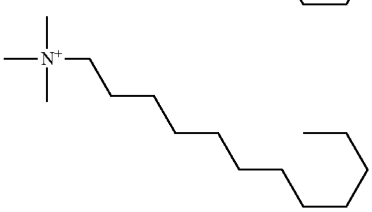
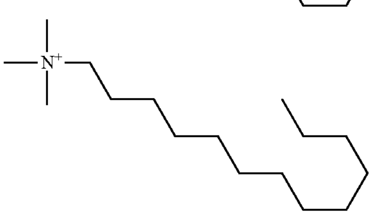
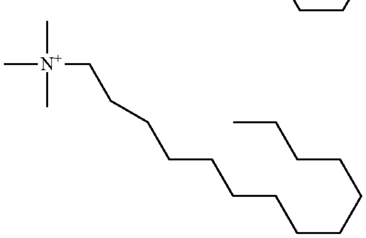
-continued
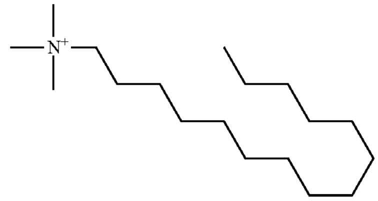
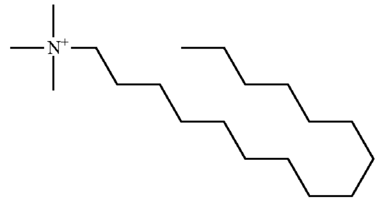
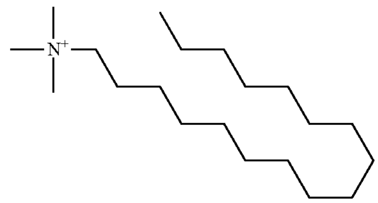
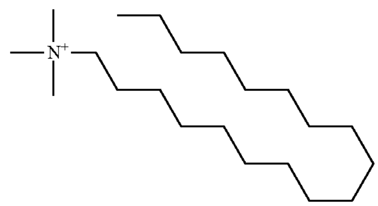
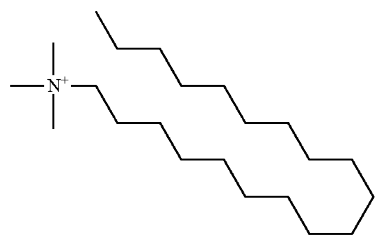
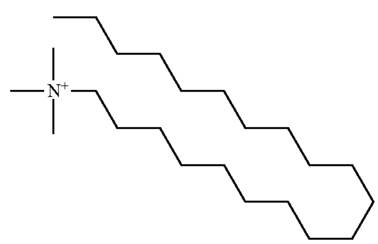
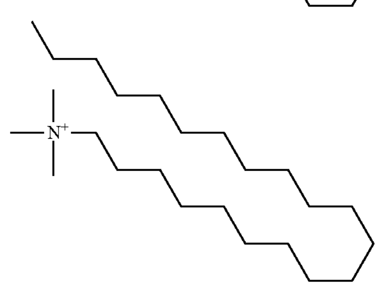

-continued
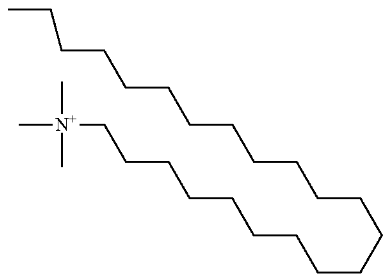
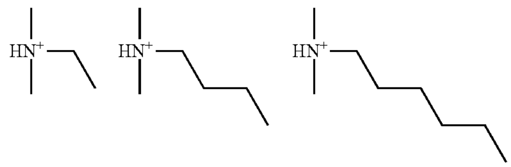
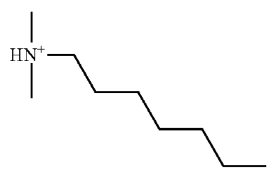
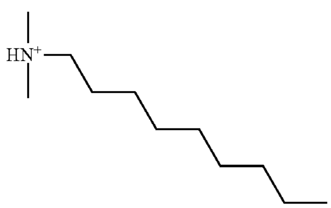
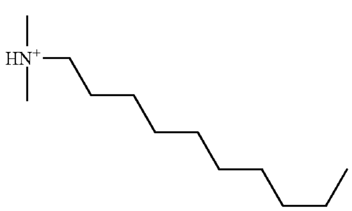
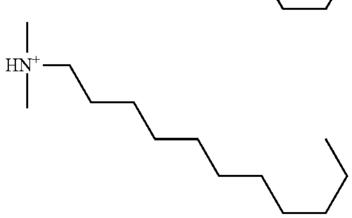
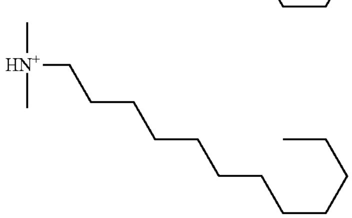
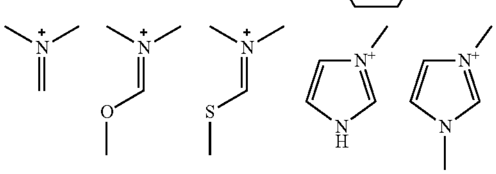
-continued
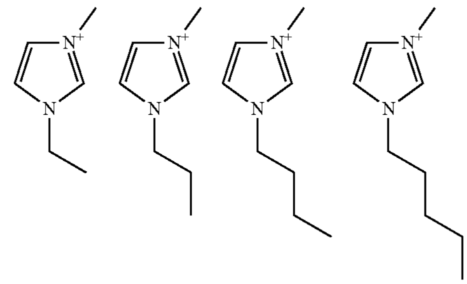
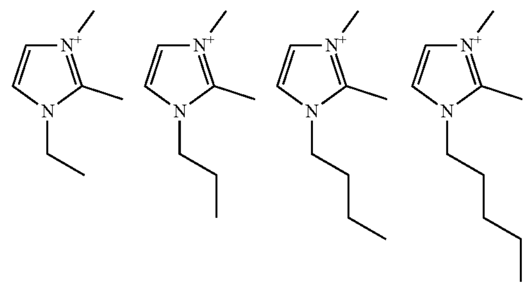
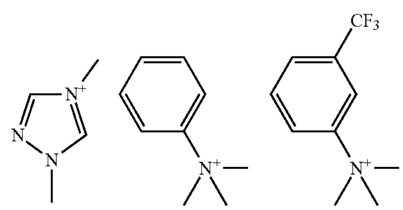
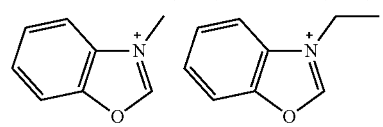
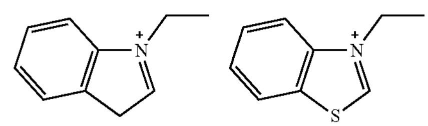
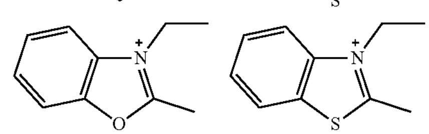
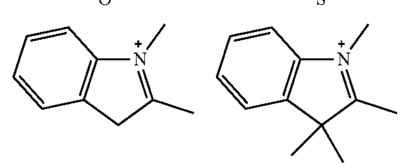
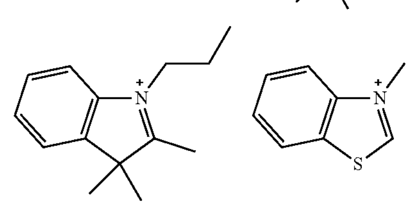
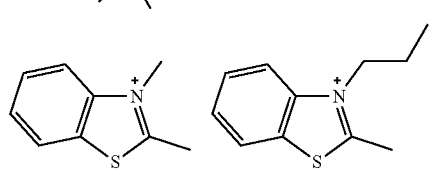

-continued
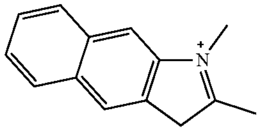
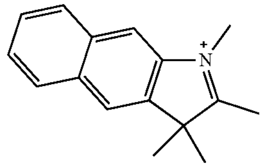
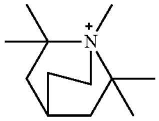
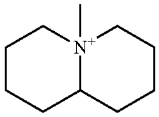
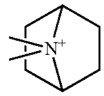
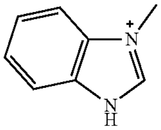
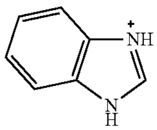
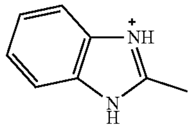
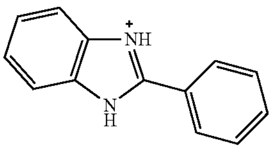
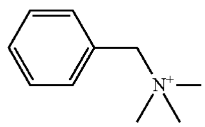
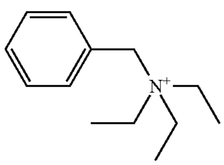
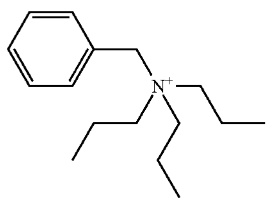
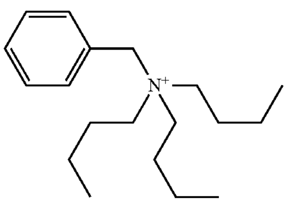
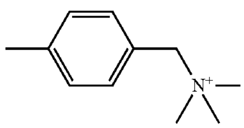
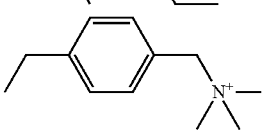
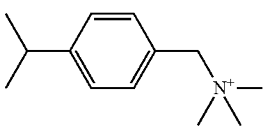
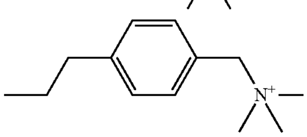
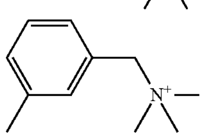
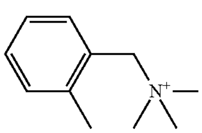
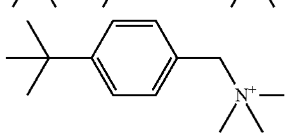
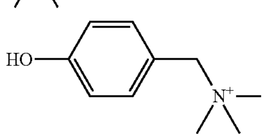
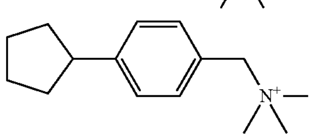
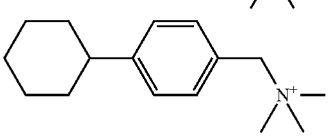
-continued
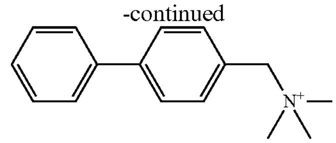
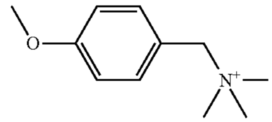
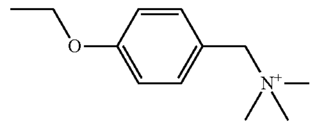
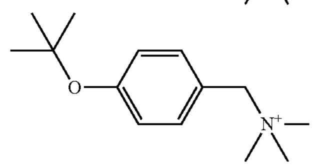
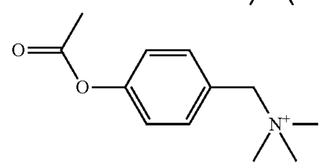
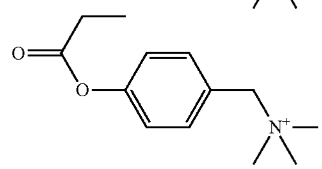
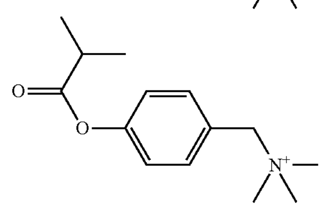
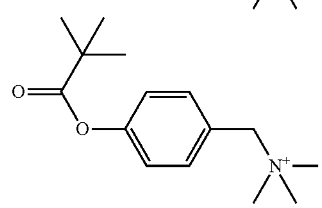
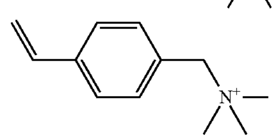
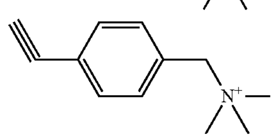
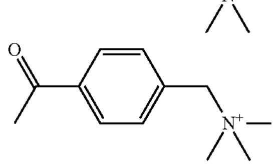
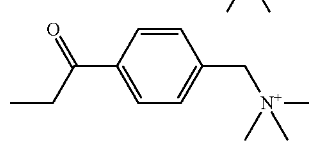

-continued
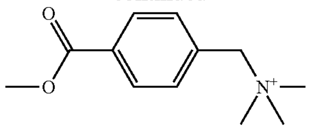
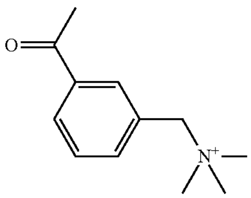
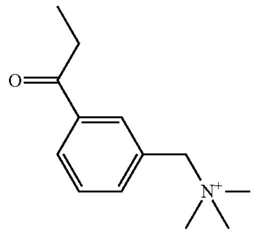
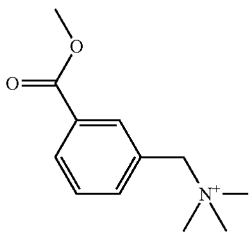
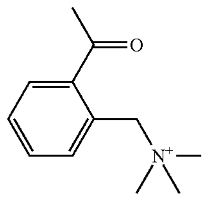
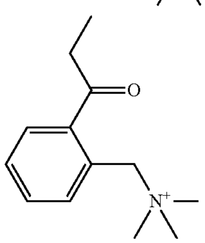
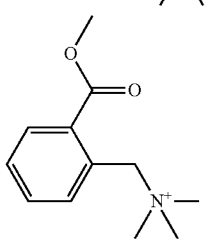
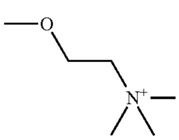
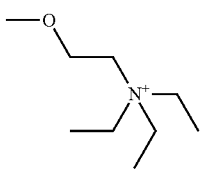
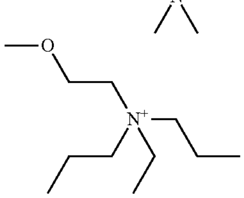
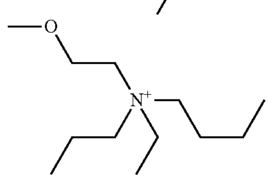
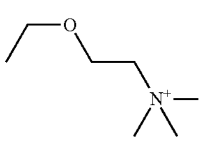
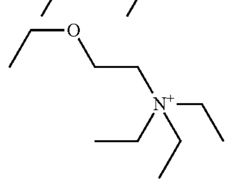
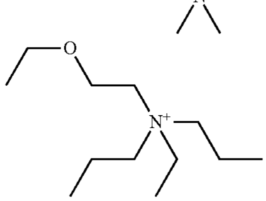
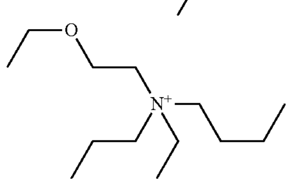
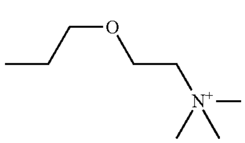
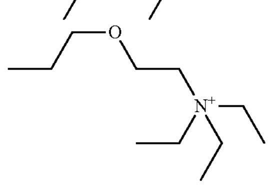
-continued
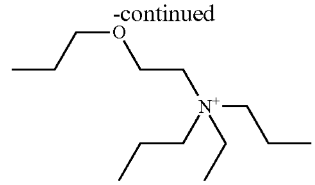
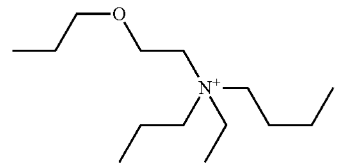
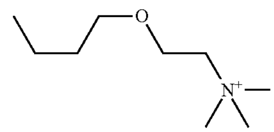
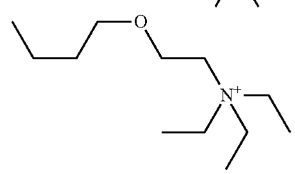
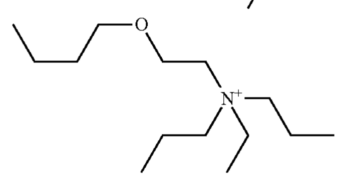
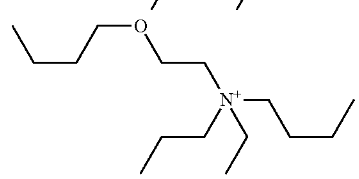
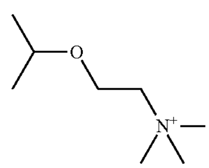
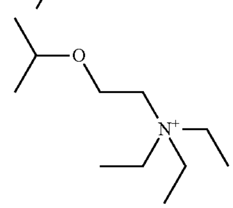
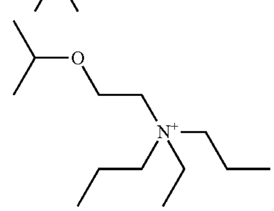
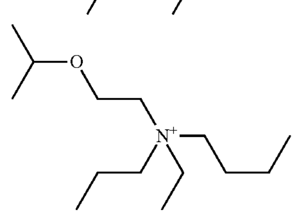
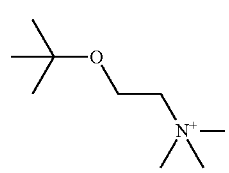
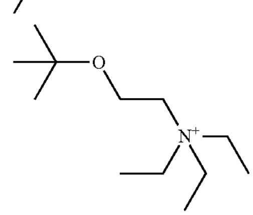

-continued
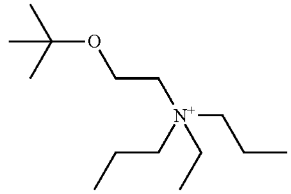
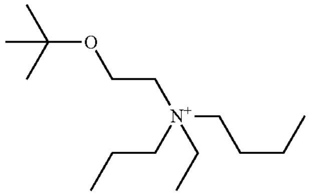
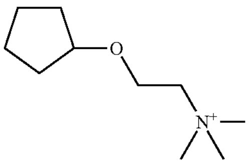
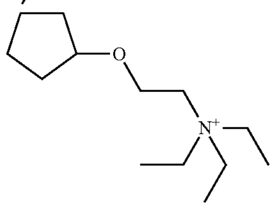
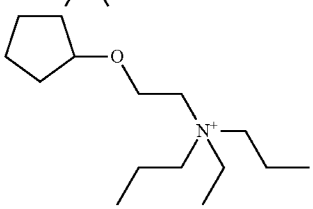
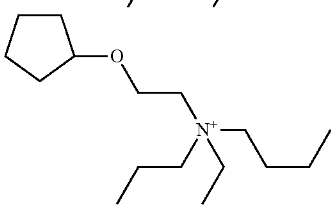
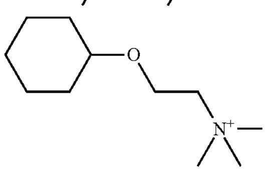
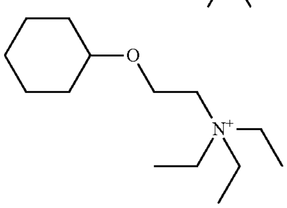
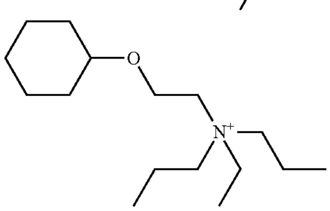
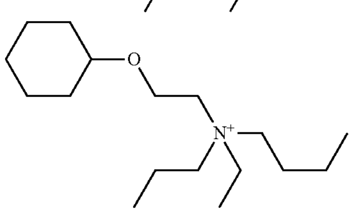
-continued
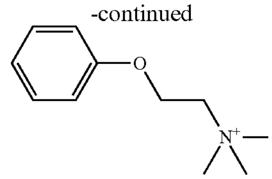
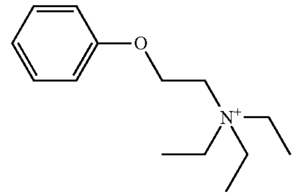
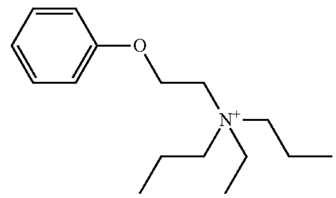
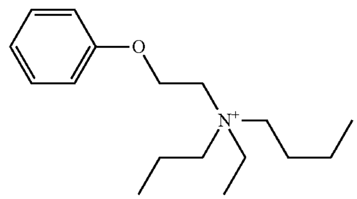
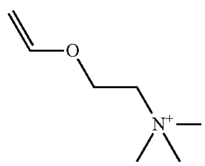
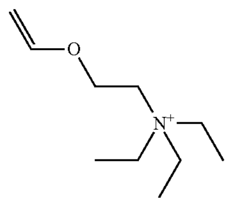
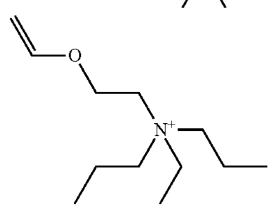
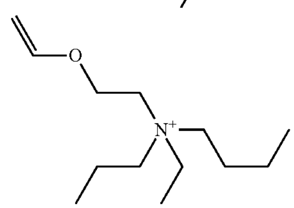
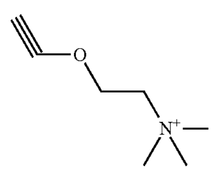
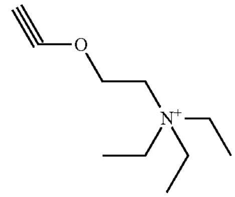
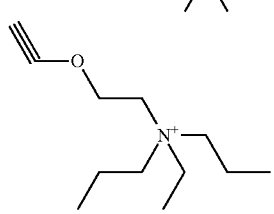
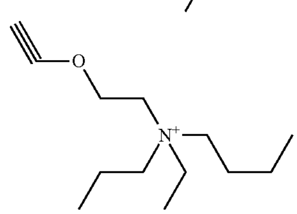
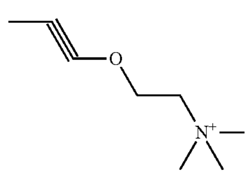
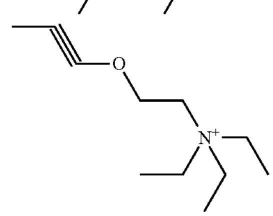

-continued
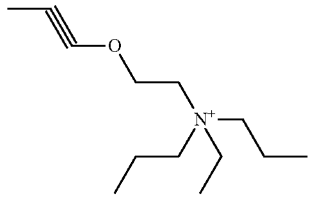
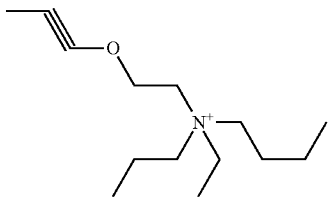
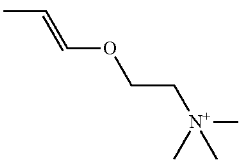
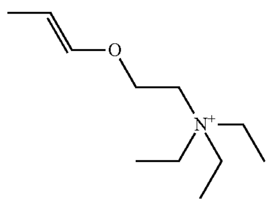
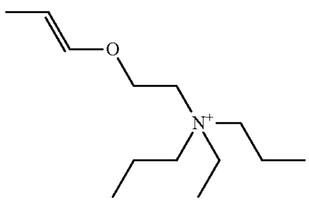
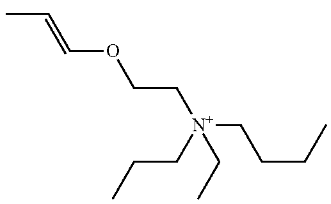
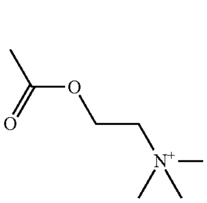
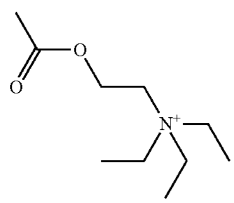
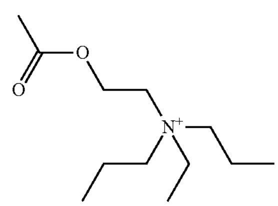
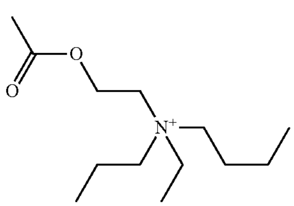
-continued
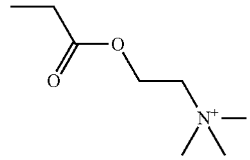
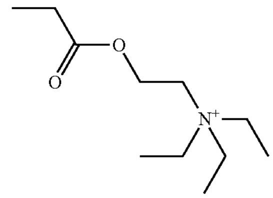
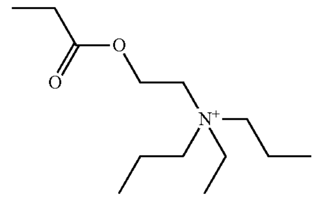
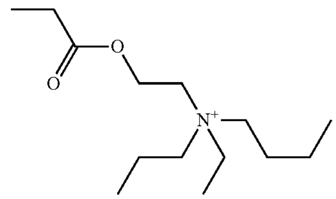
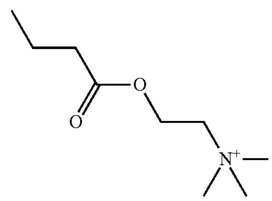
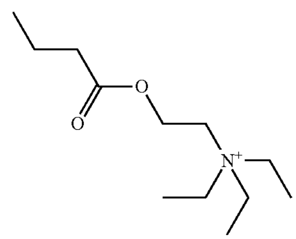
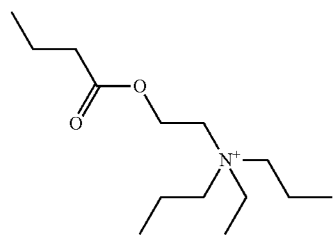
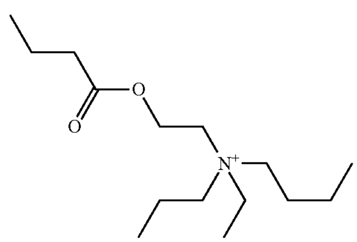
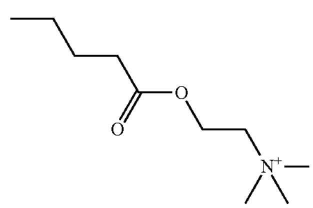

-continued
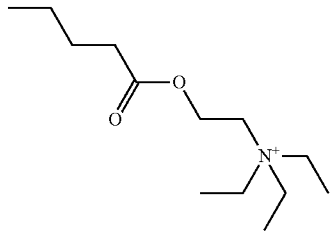
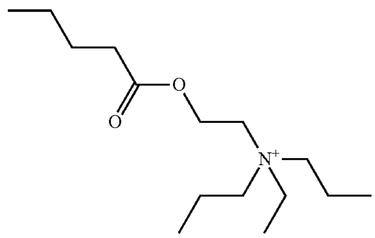
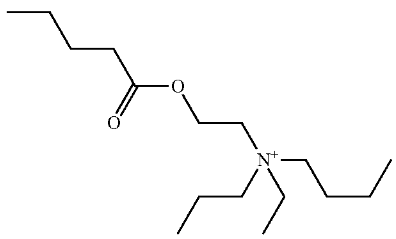
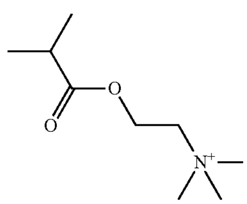
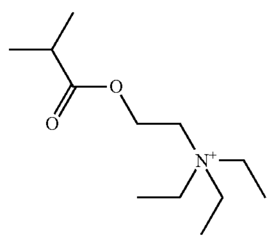
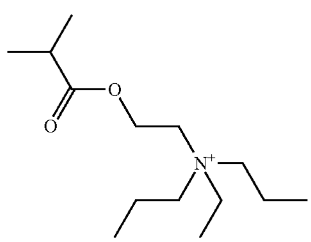
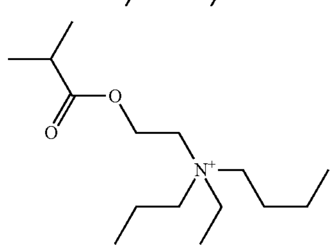
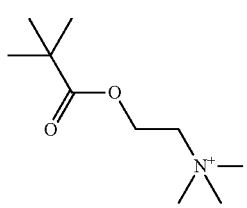
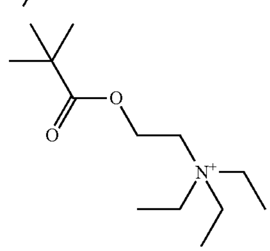
-continued
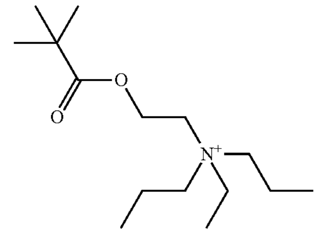
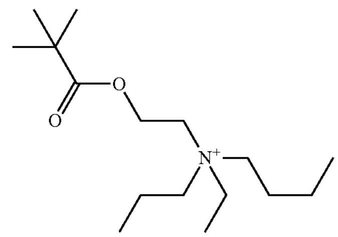
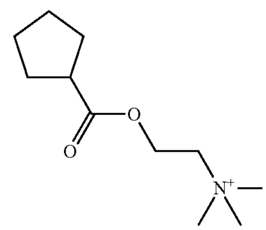
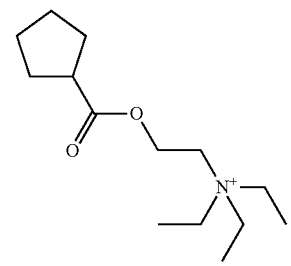
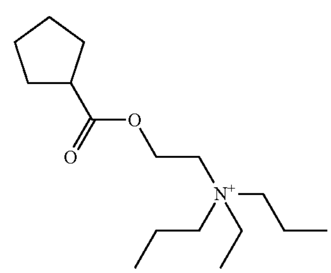
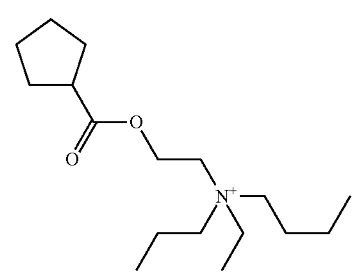
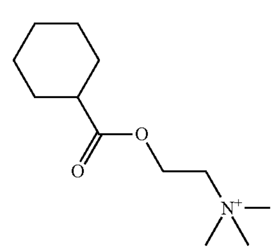
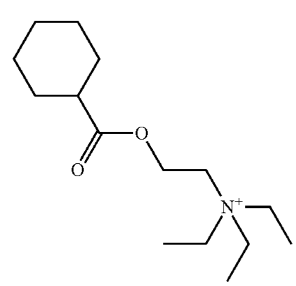

-continued
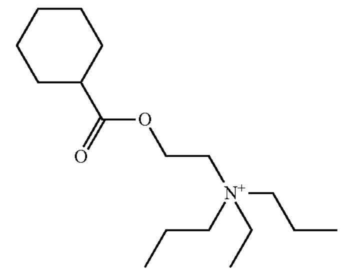
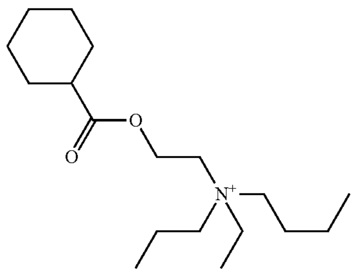
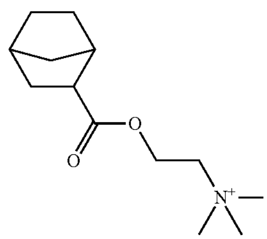
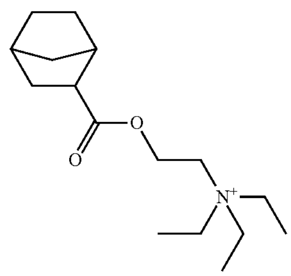
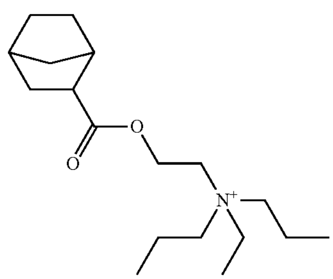
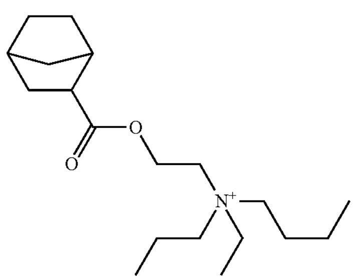
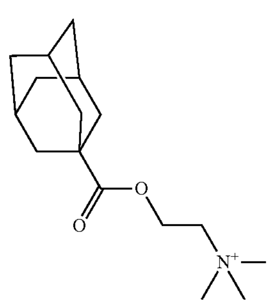
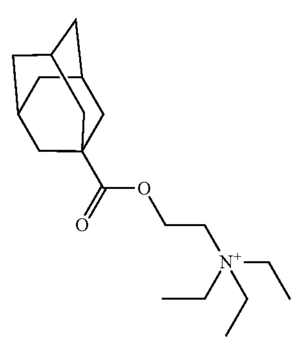
-continued
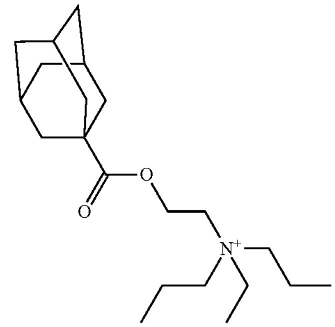
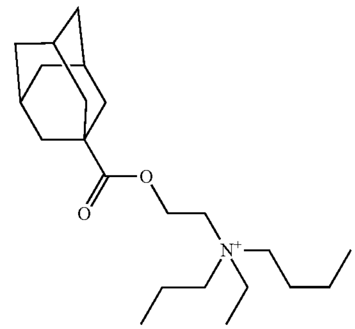
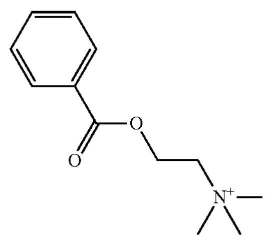
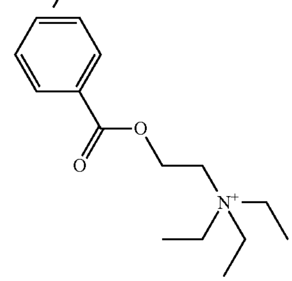
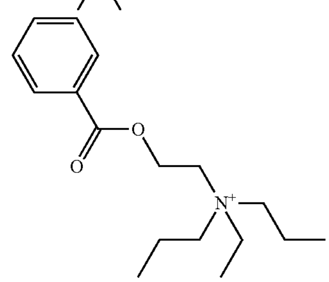
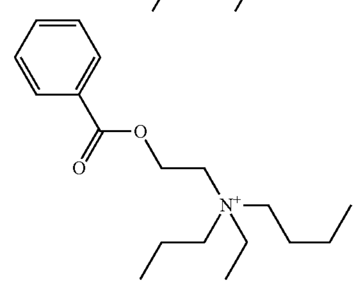
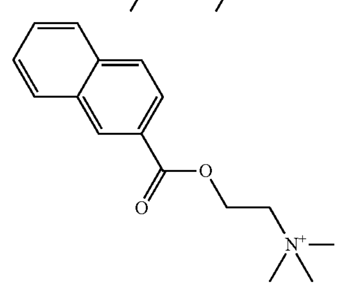

-continued
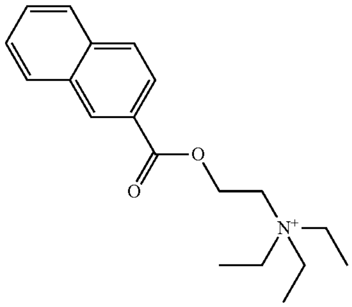
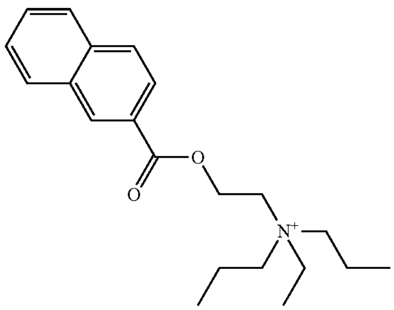
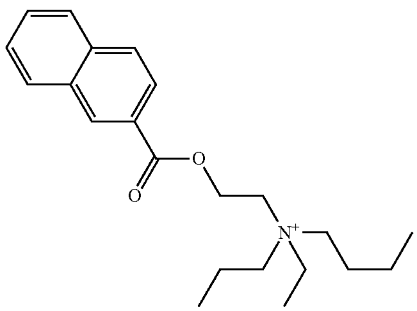
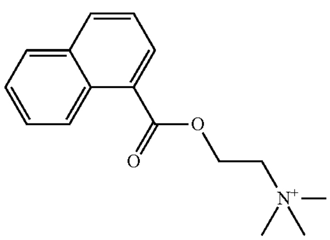
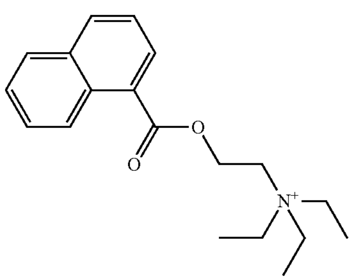
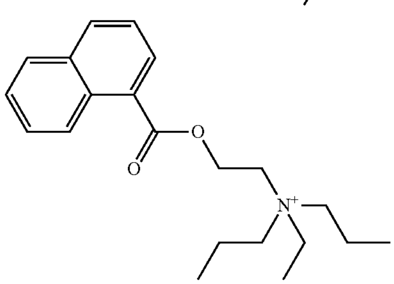
-continued
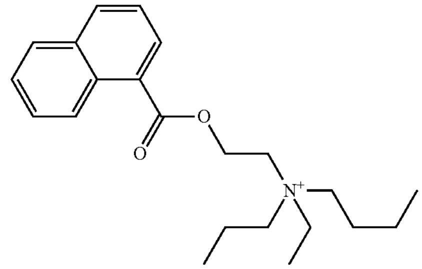
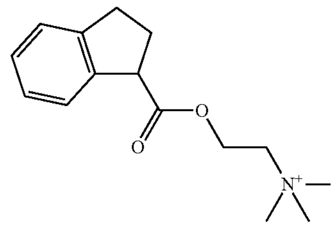
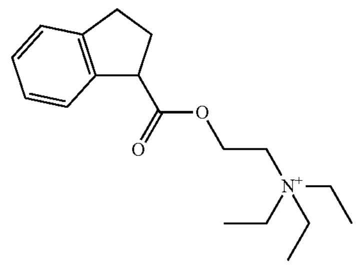
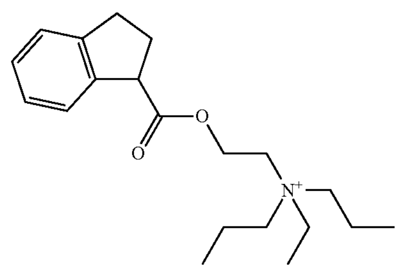
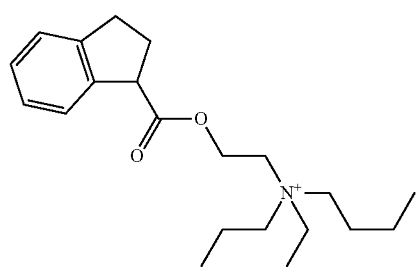
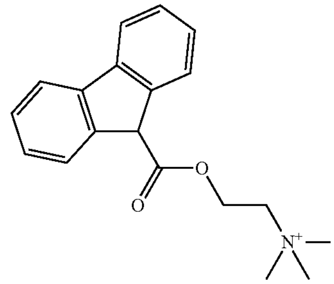

-continued
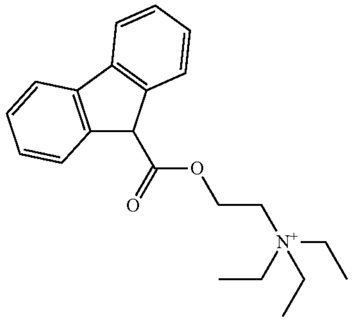
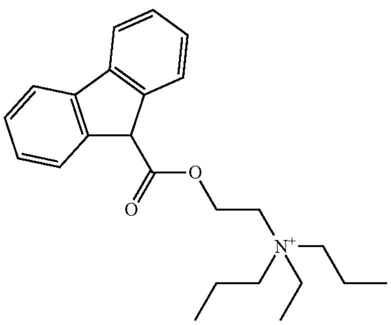
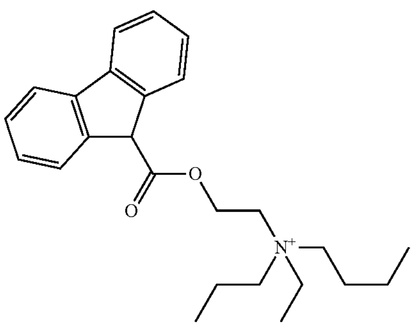
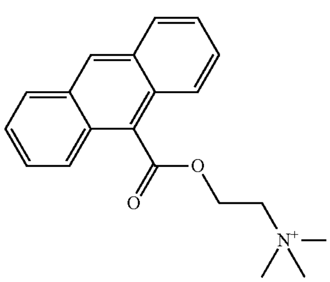
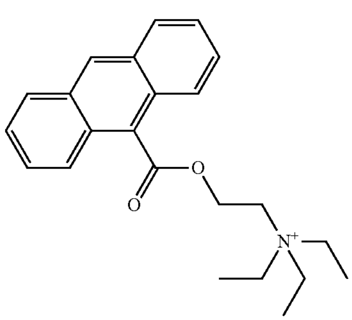
-continued
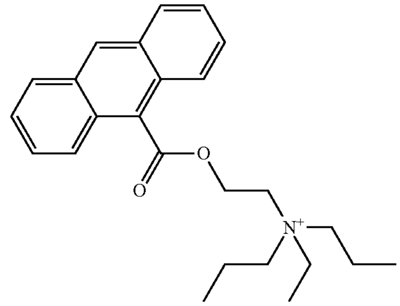
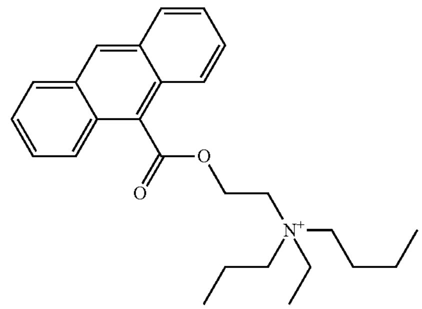
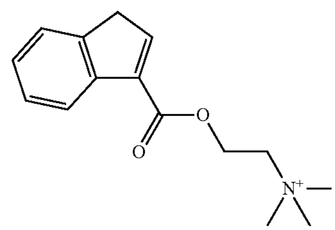
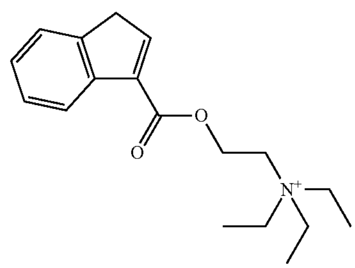
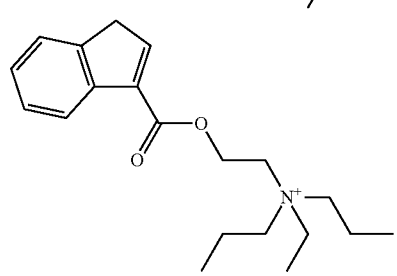
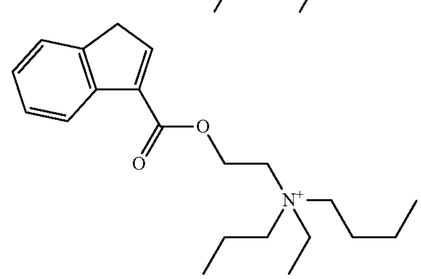

-continued
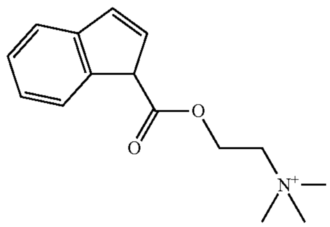
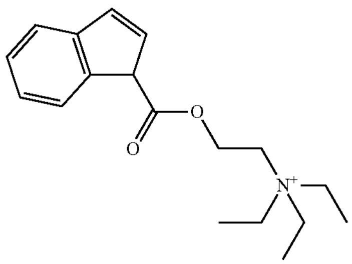
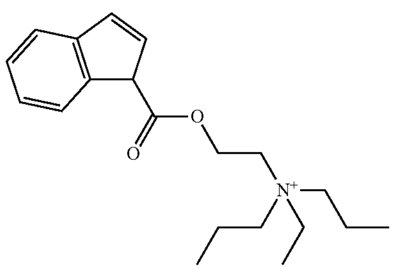
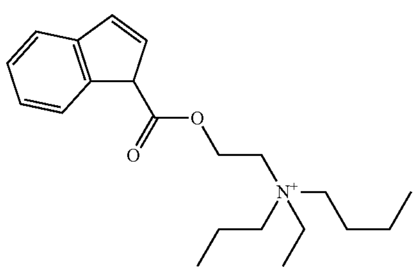
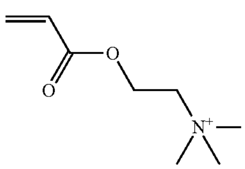
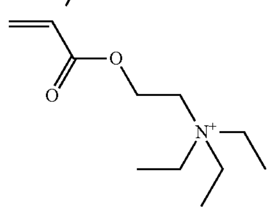
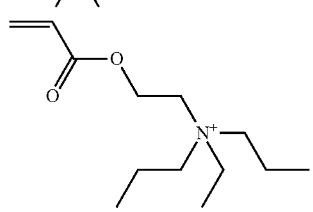
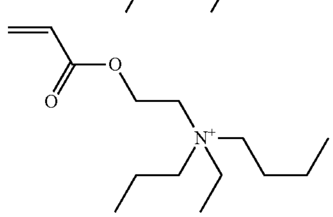
-continued
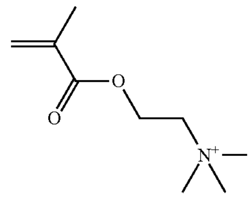
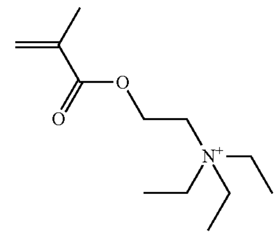
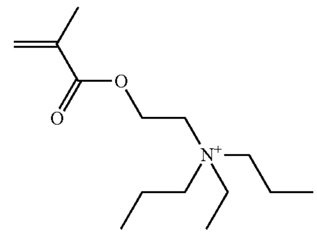
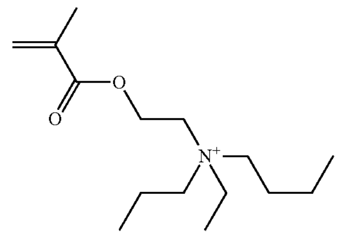
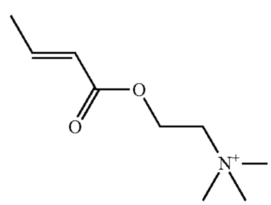
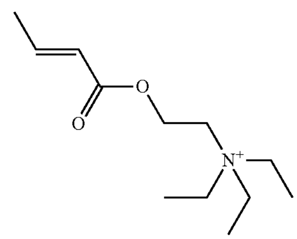
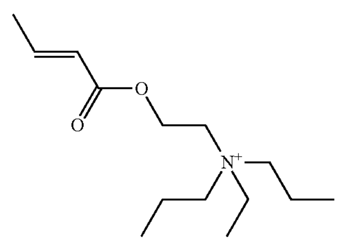
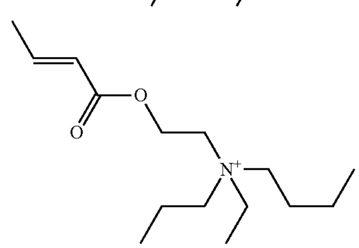
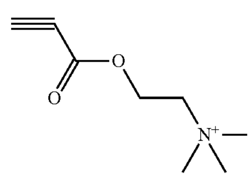
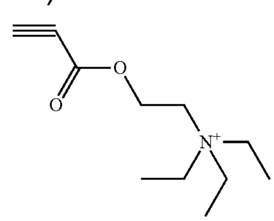

-continued
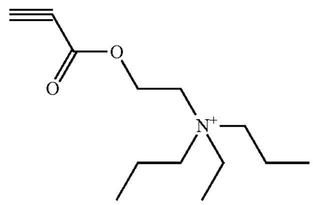
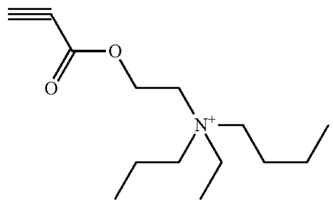
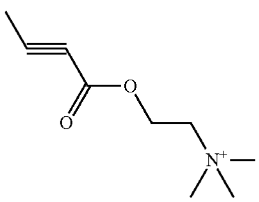
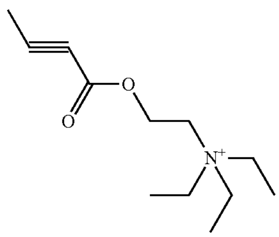
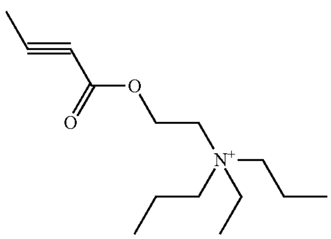
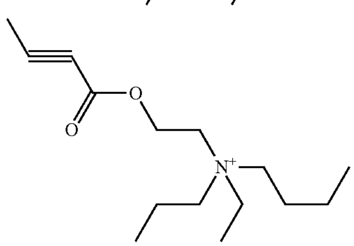
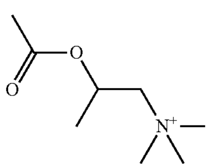
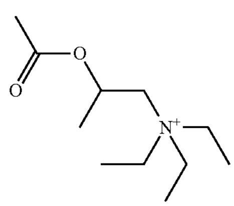
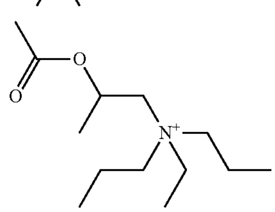
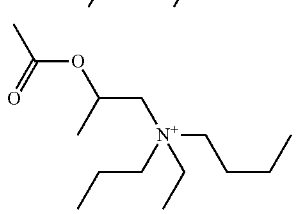
-continued
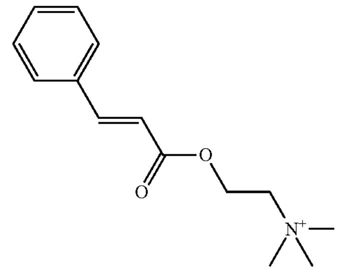
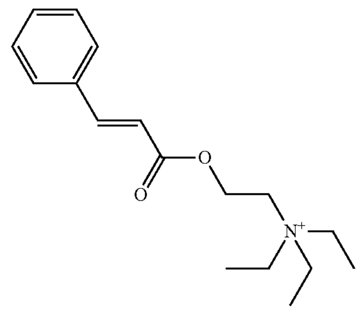
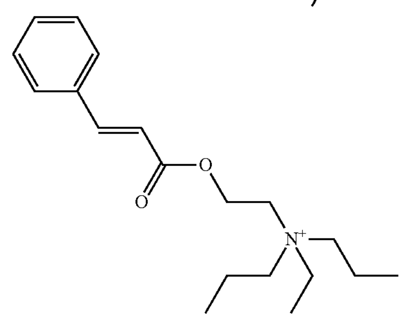
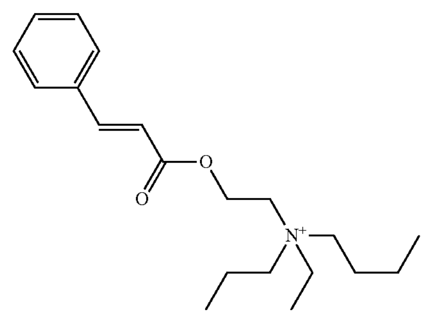
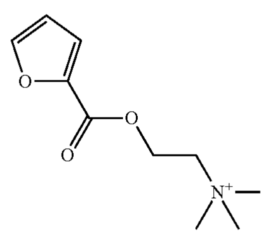
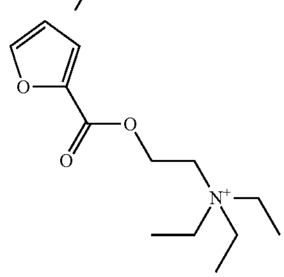
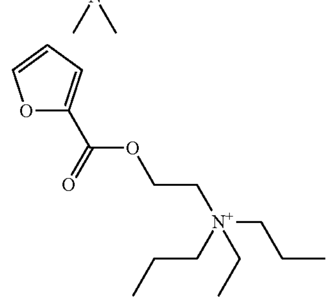

-continued
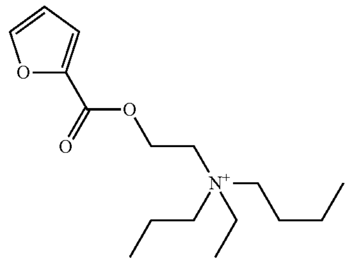
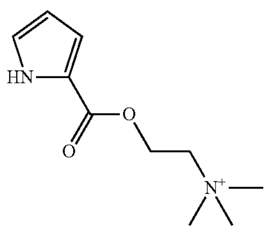
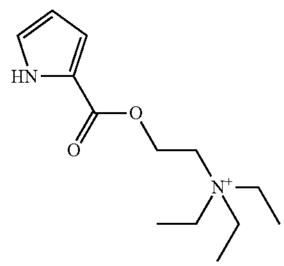
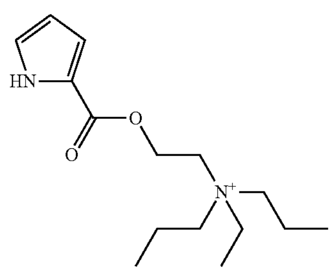
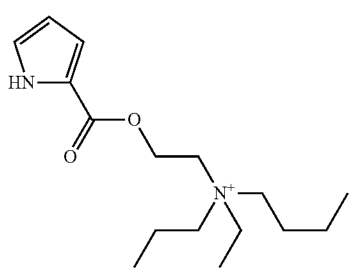
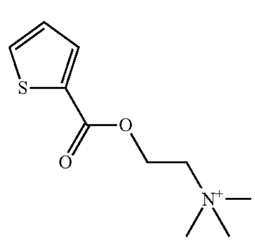
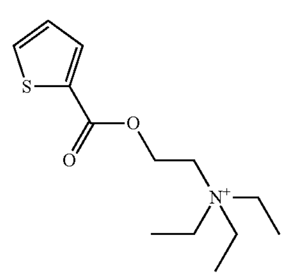
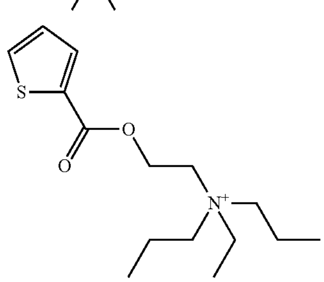
-continued
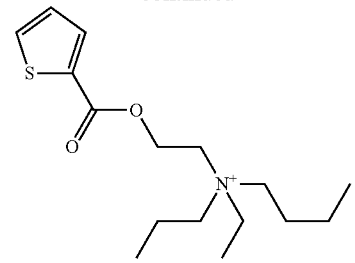
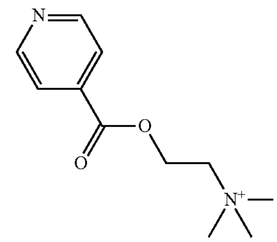
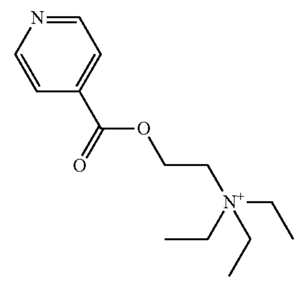
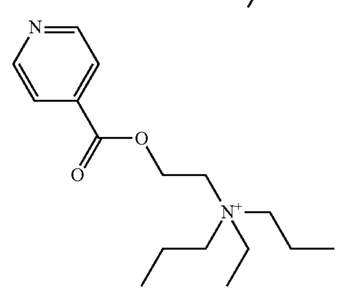
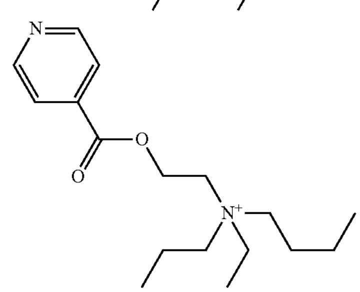
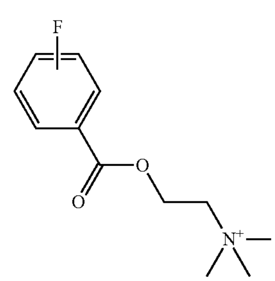
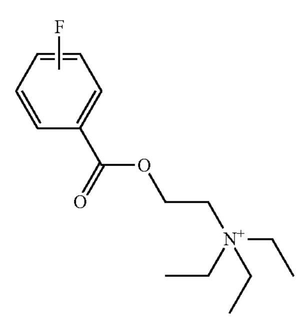

-continued
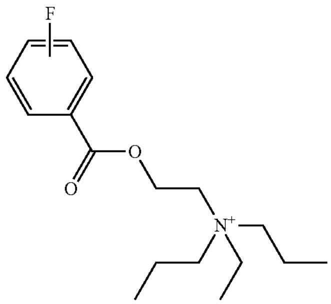
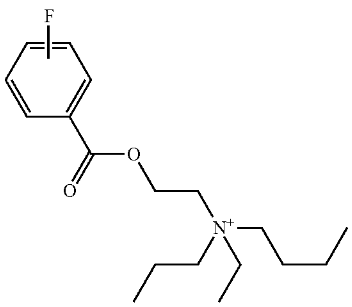
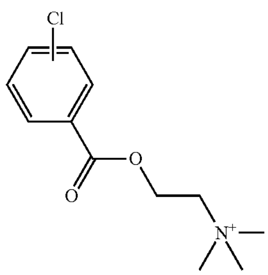
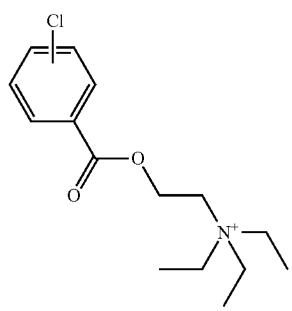
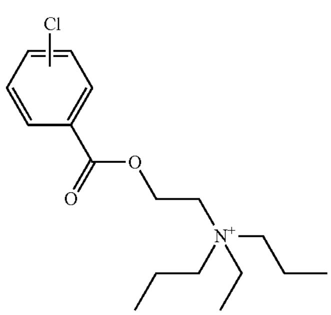
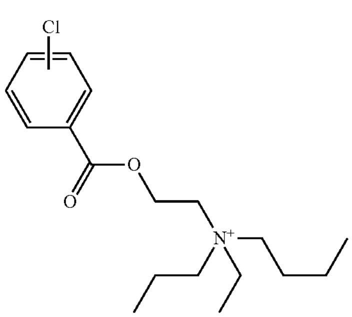
-continued
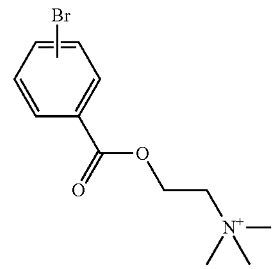
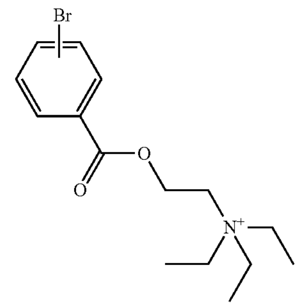
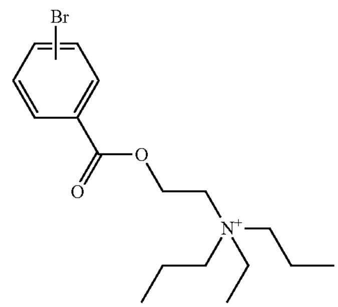
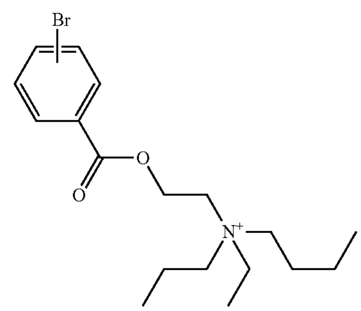
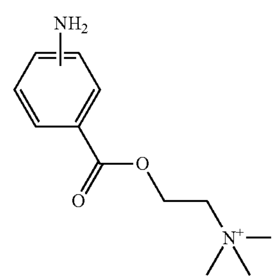
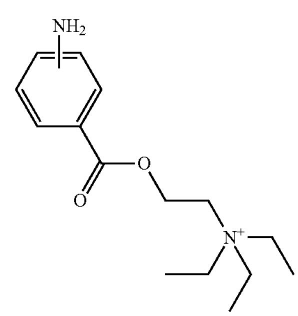
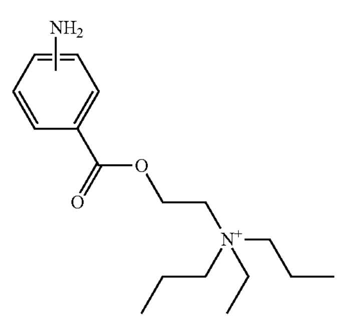

-continued
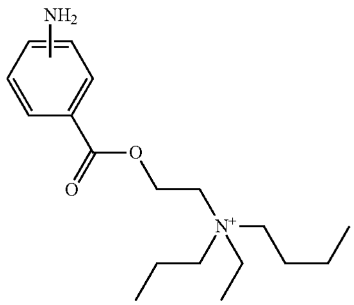
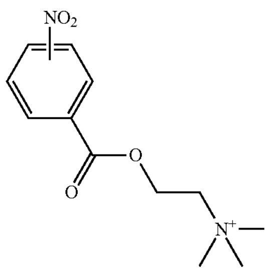
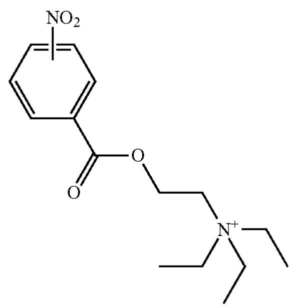
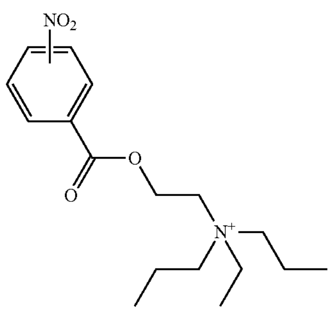
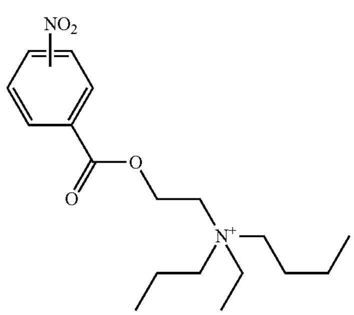
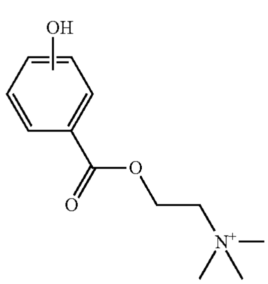
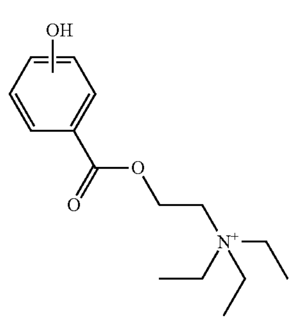
-continued
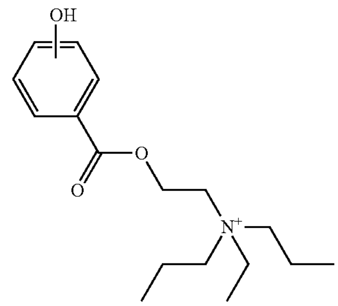
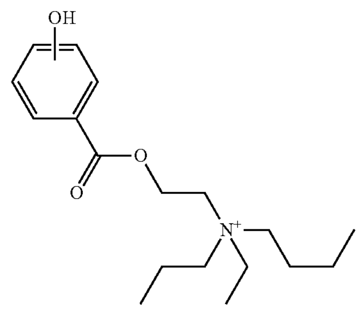
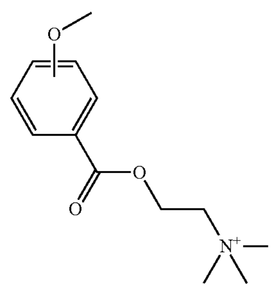
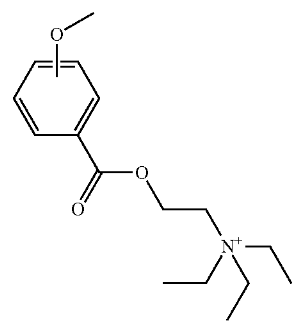
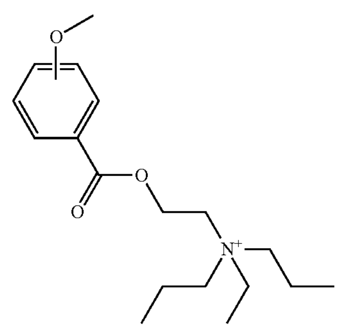
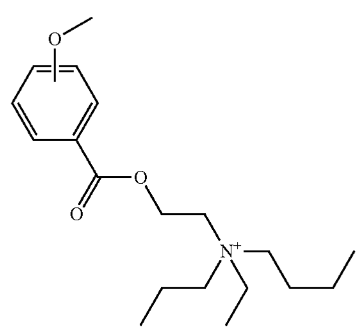

-continued
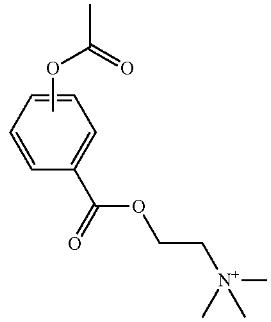
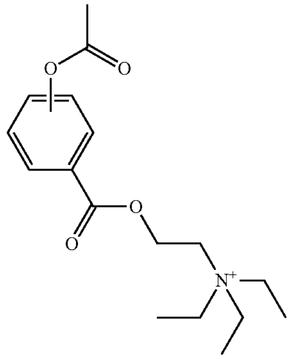
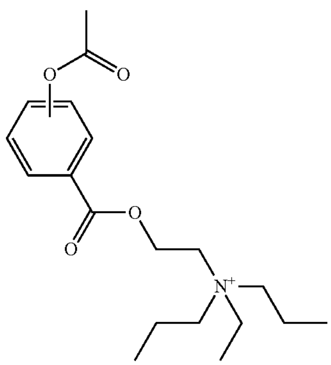
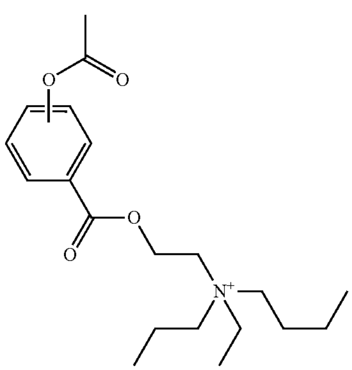
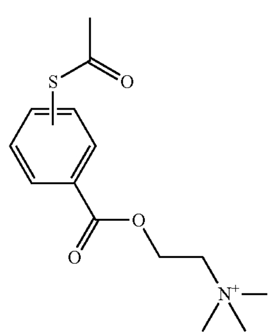
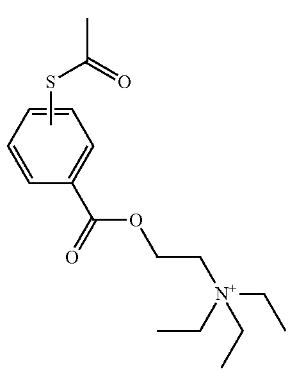
-continued
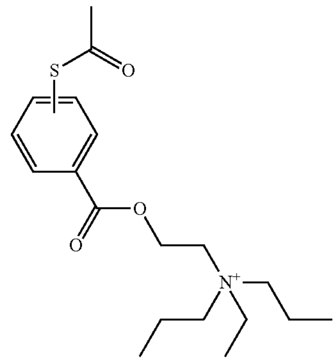
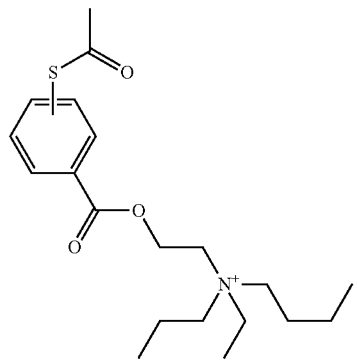
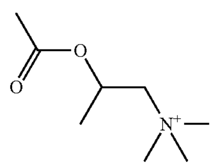
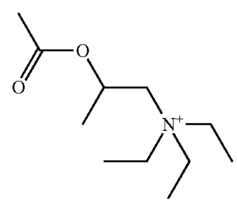
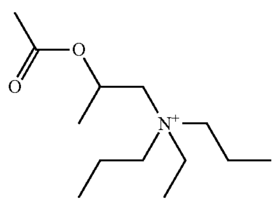
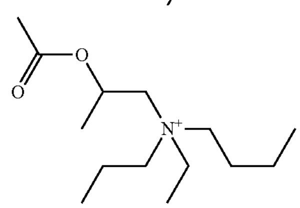
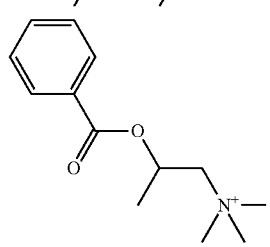
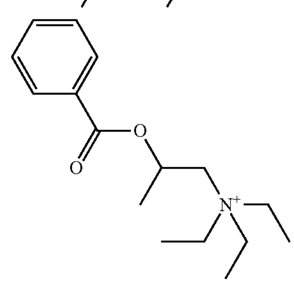
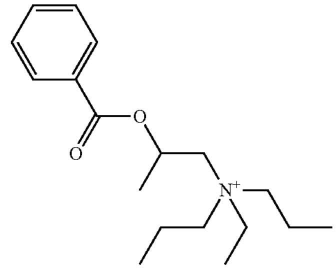

-continued
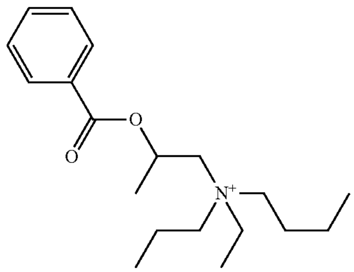
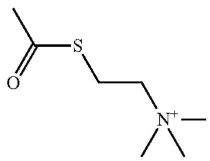
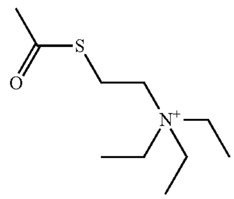
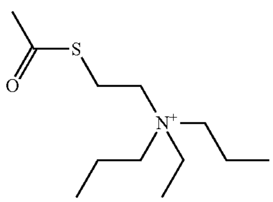
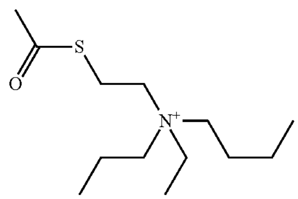
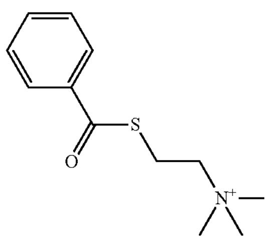
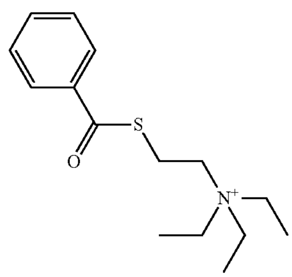
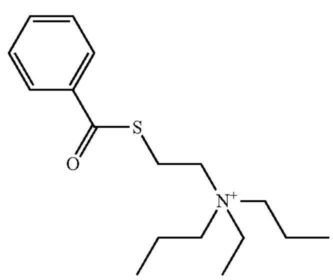
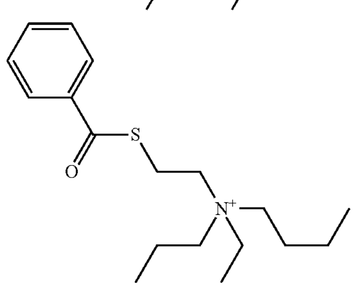
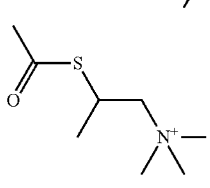
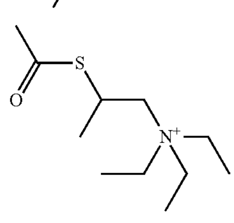
-continued
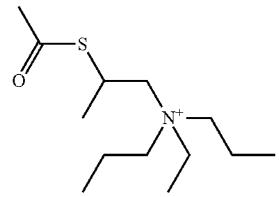
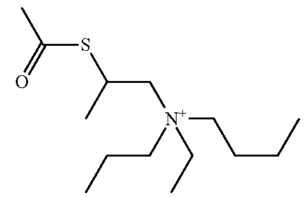
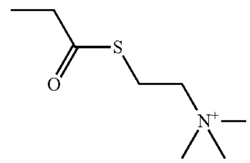
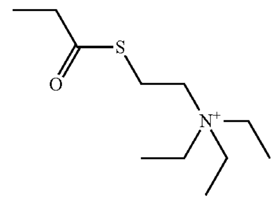
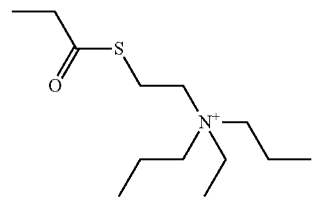
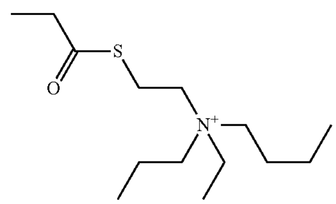
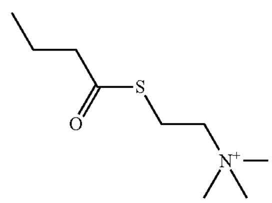
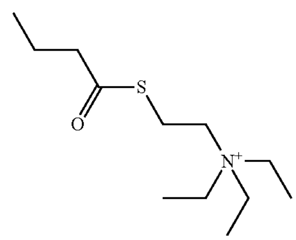
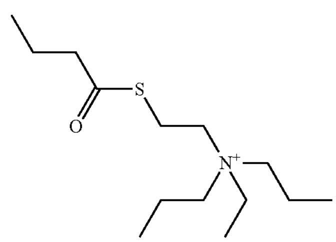
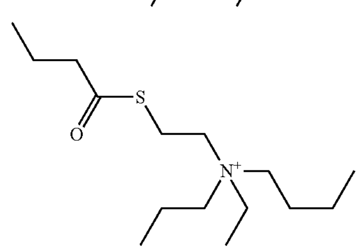
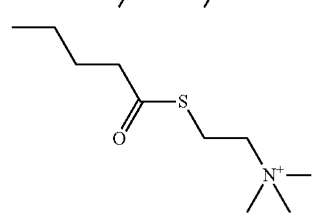

-continued
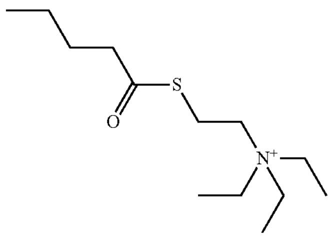
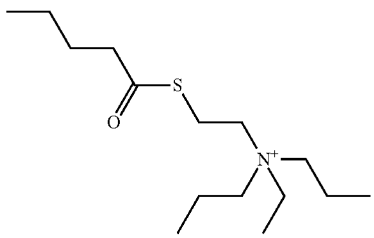
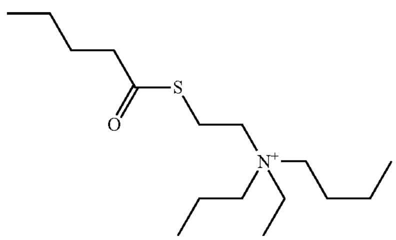
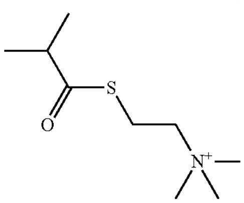
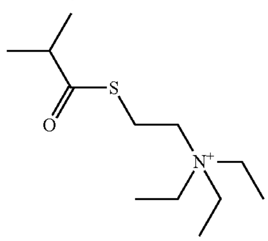
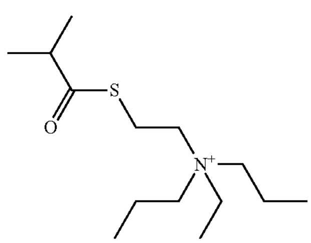
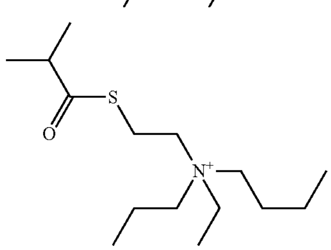
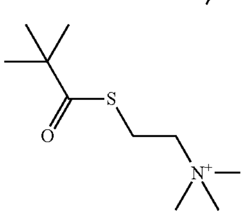
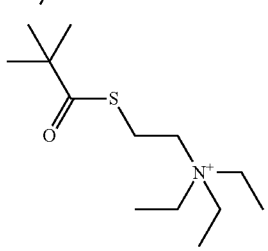
-continued
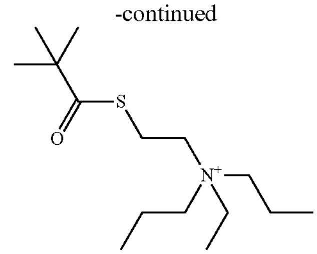
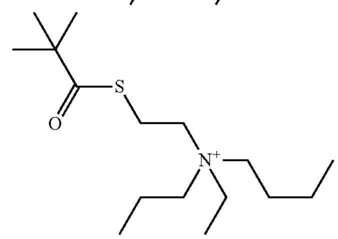
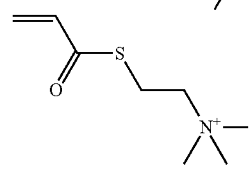
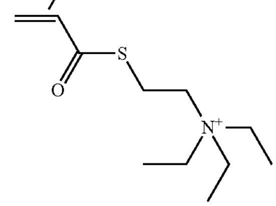
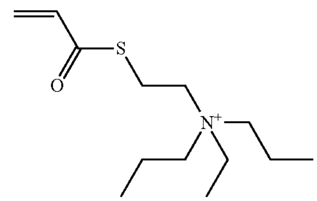
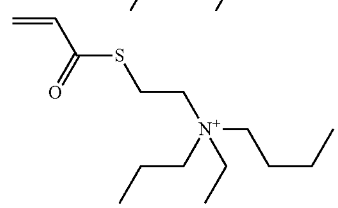
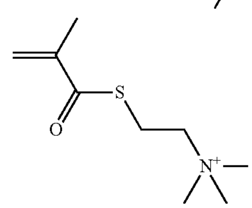
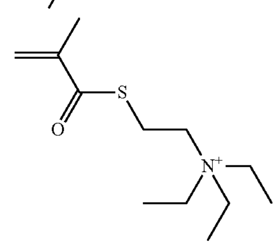
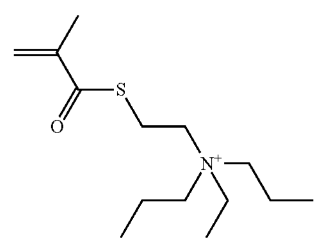
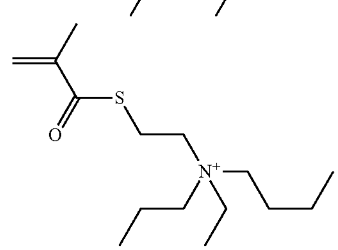

-continued
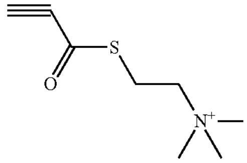
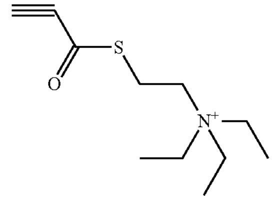
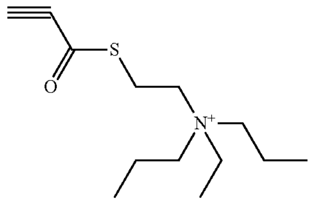
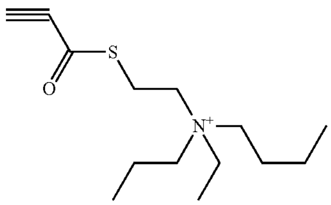
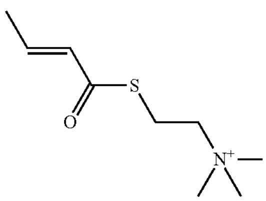
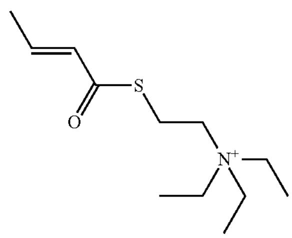
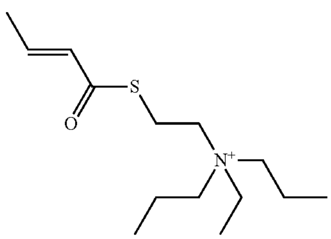
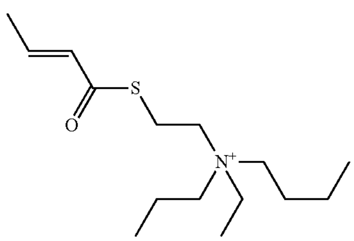
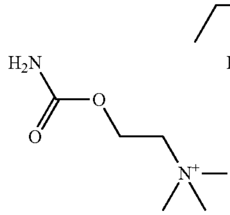
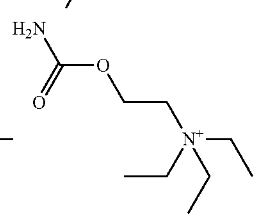
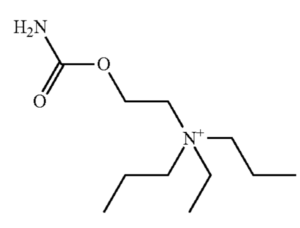
-continued
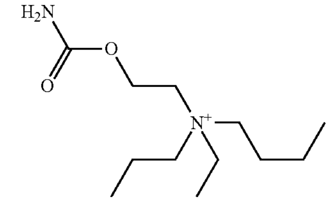
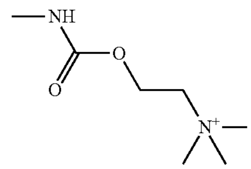
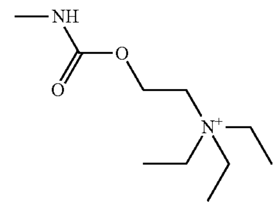
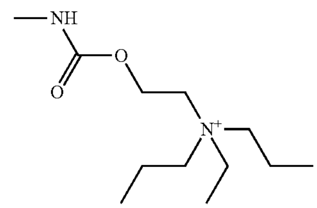
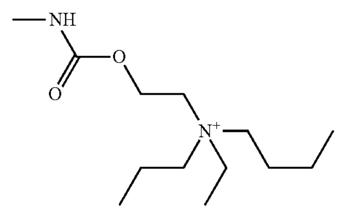
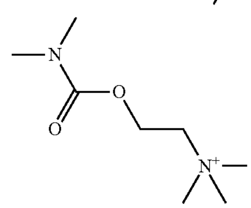
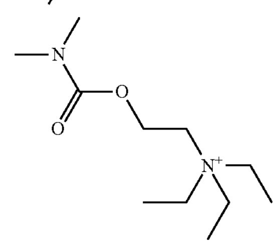
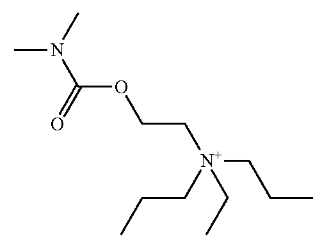
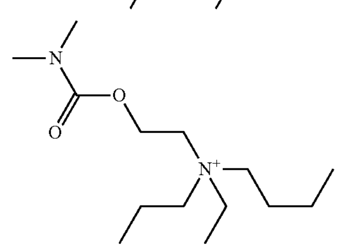
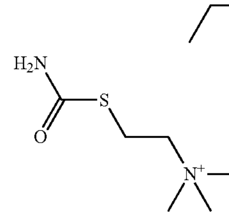
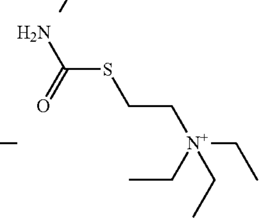

-continued
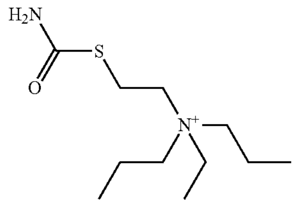
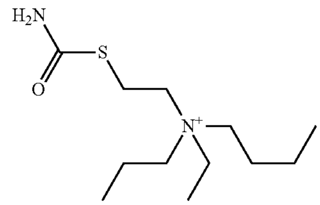
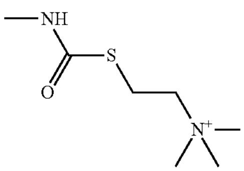
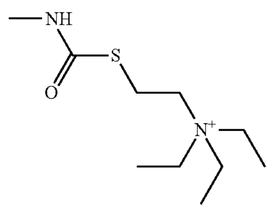
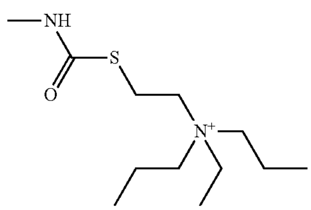
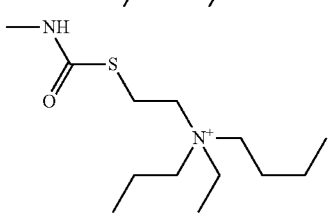
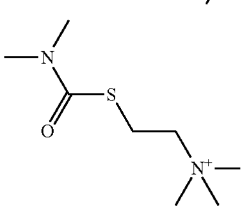
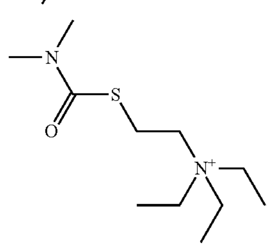
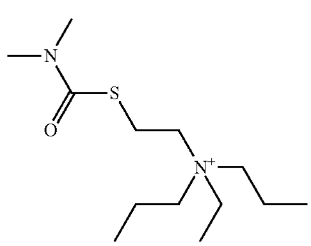
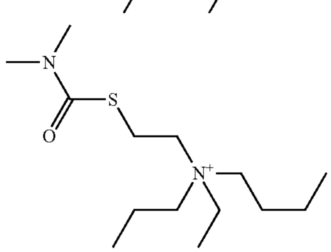
-continued
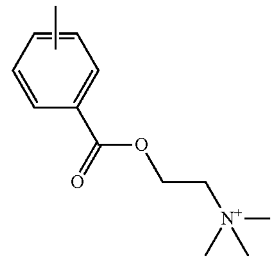
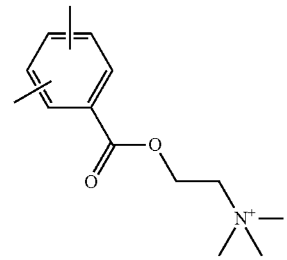
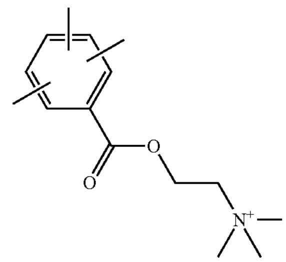
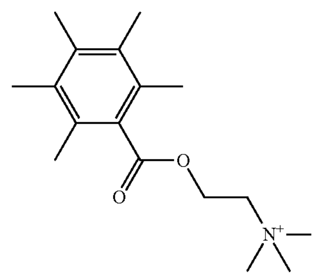
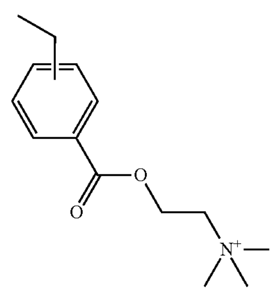
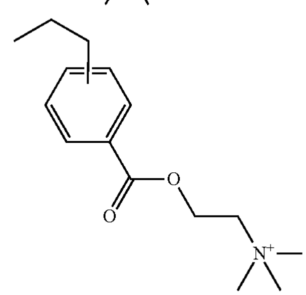
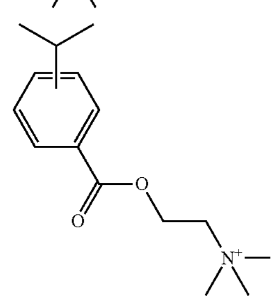
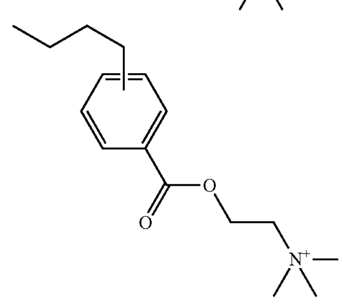

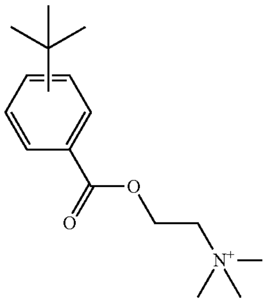
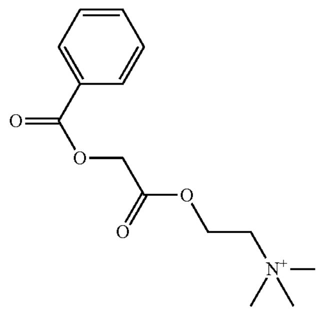
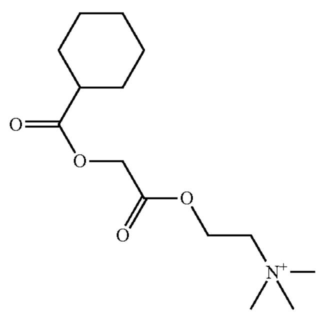
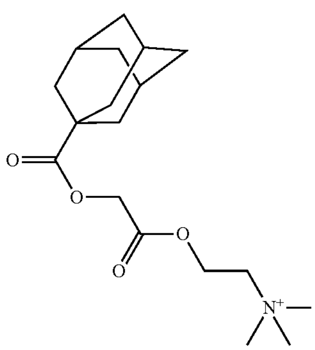
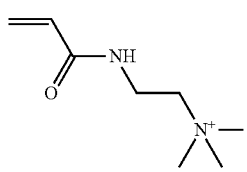
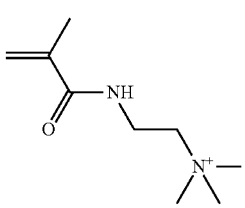
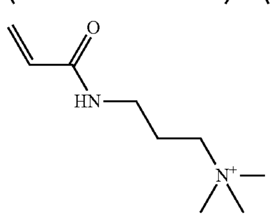
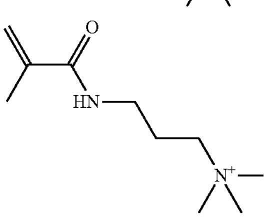
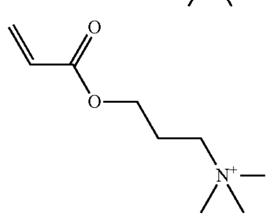
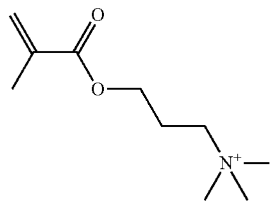
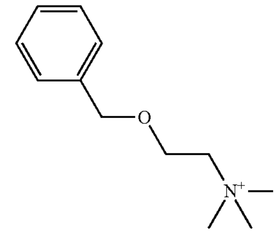
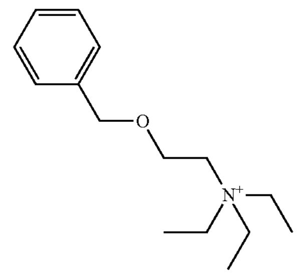
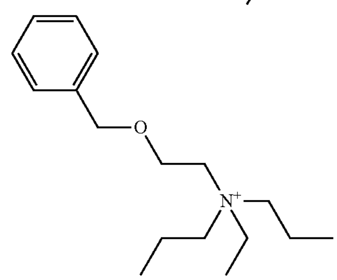
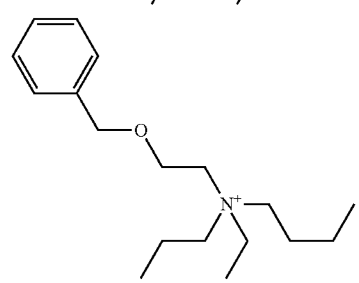
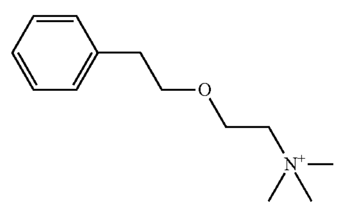
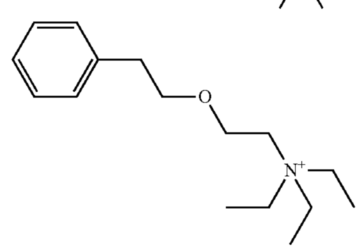
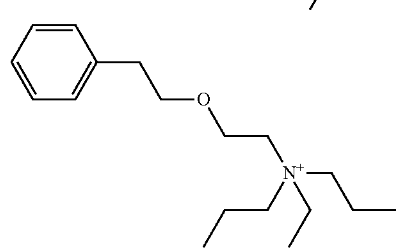

-continued
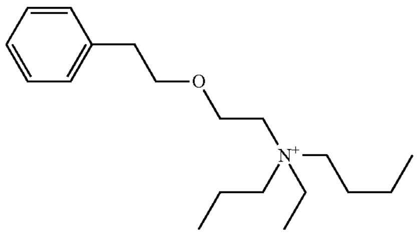
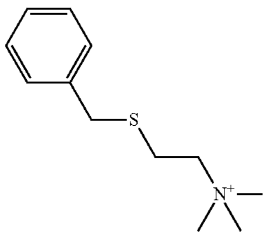
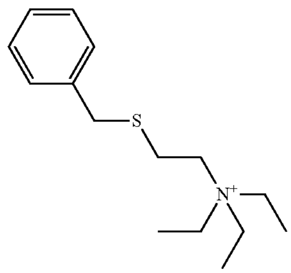
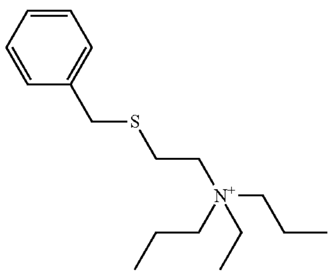
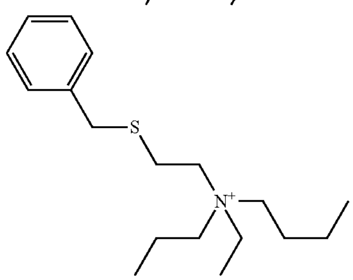
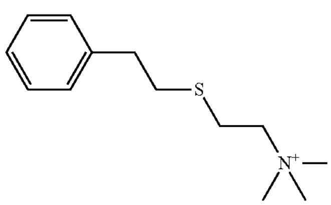
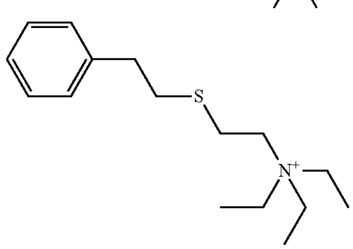
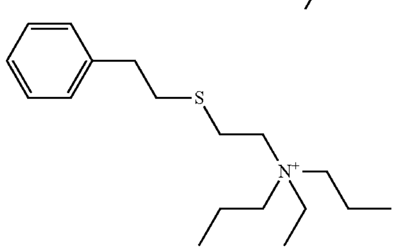
-continued
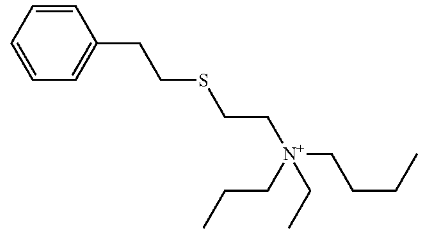
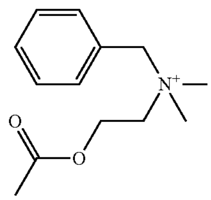
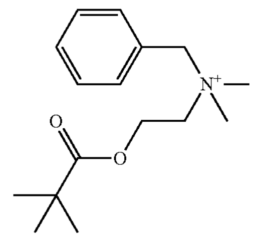
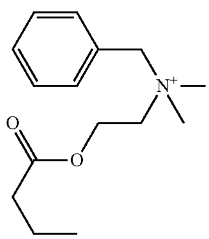
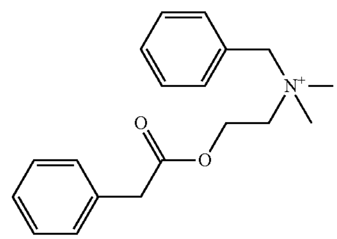
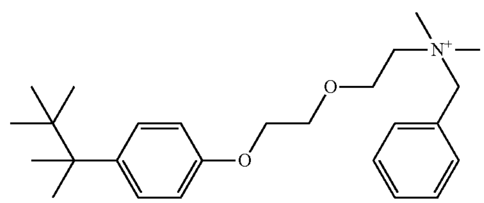
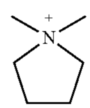
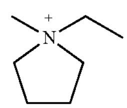
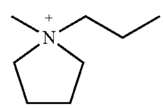
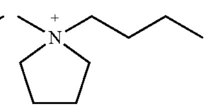
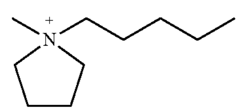
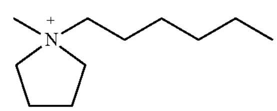
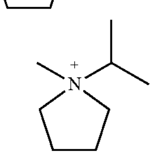
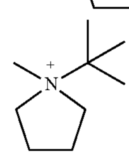
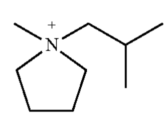
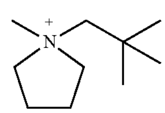
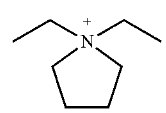
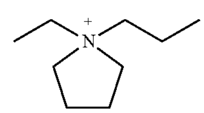
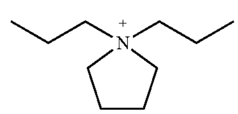
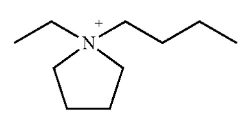
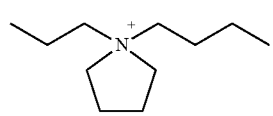
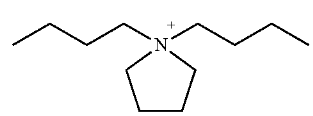
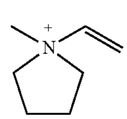
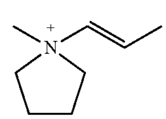
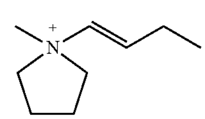

-continued
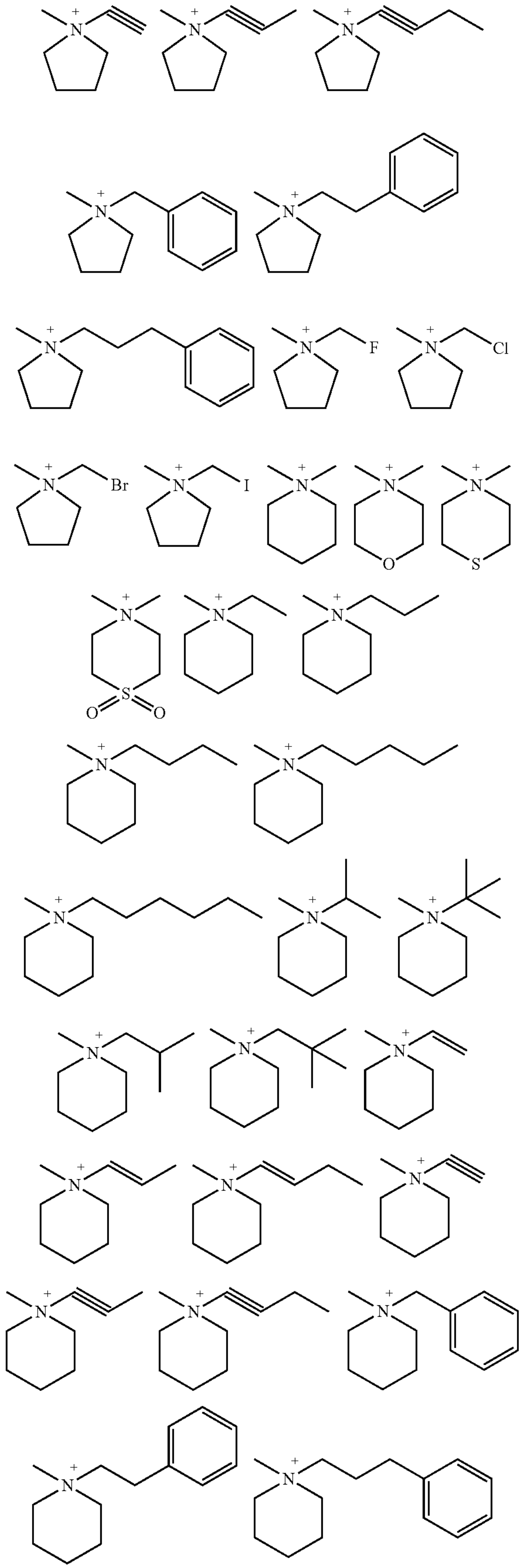
-continued
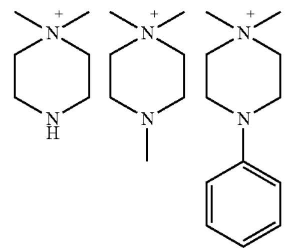
Examples of the cation in the salt compound having formula (2) are shown below, but not limited thereto.
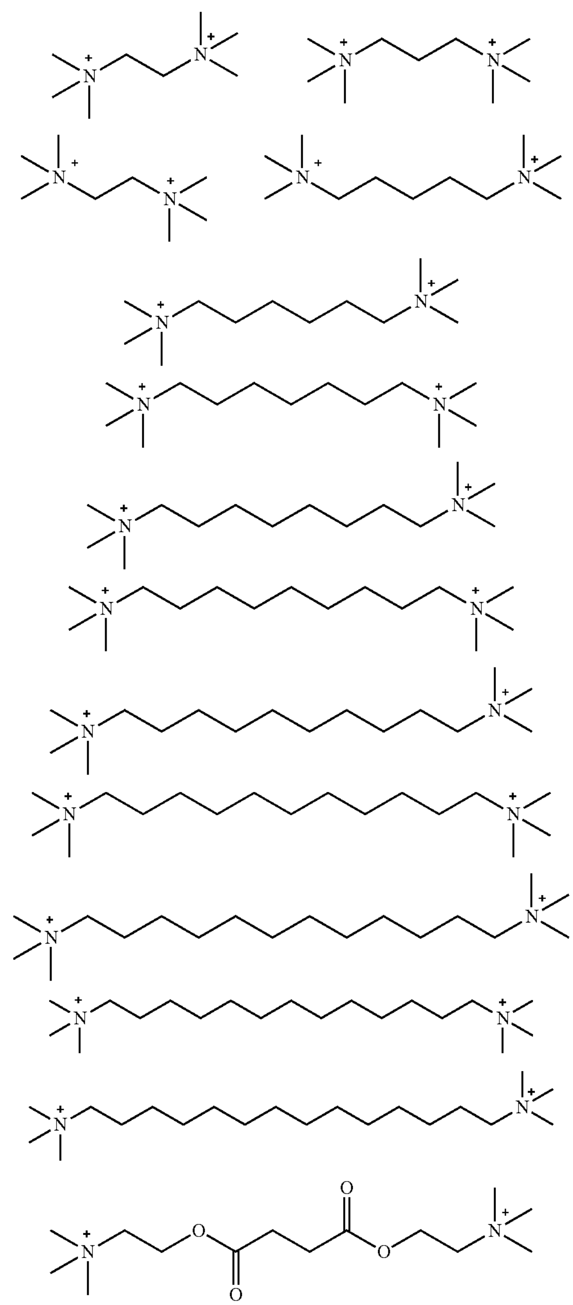

-continued
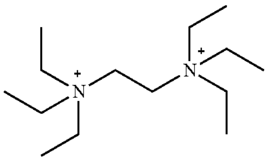
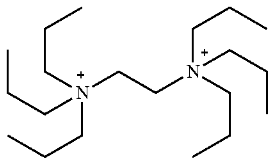
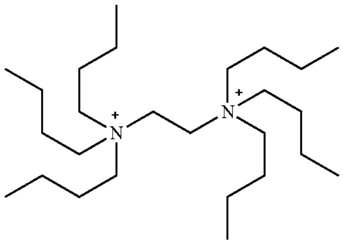
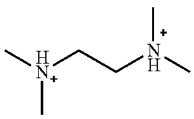
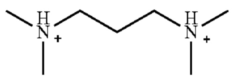
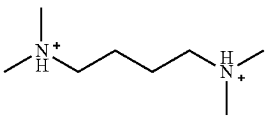
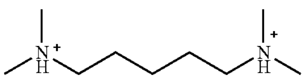
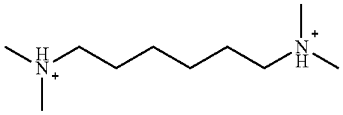
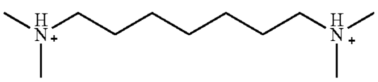
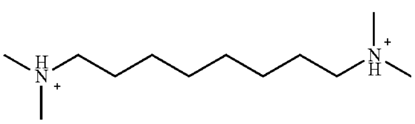
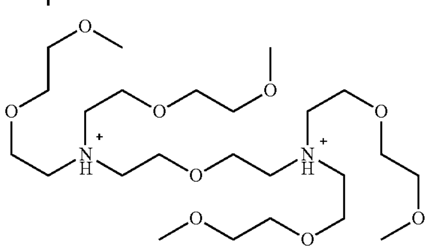
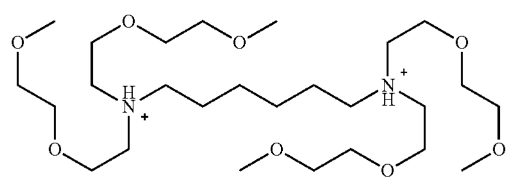
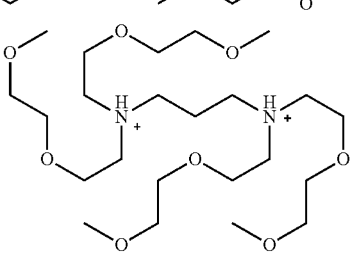
-continued
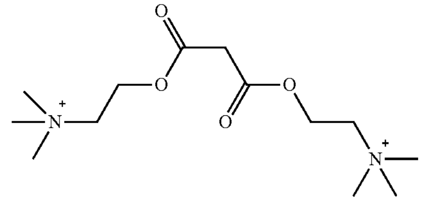
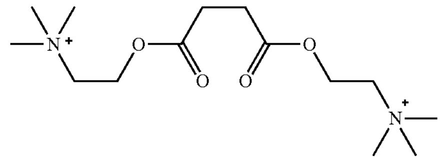
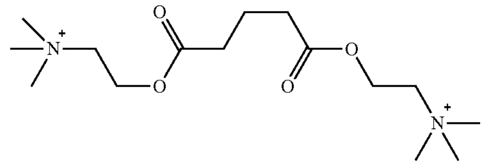
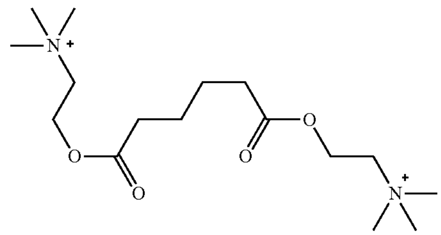
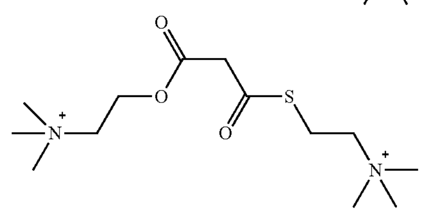
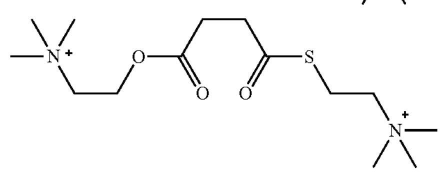
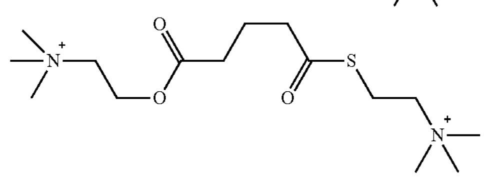
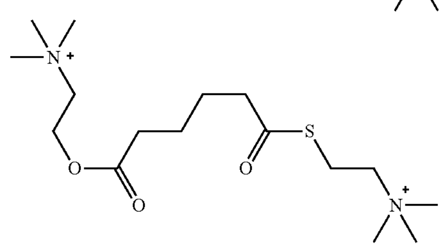
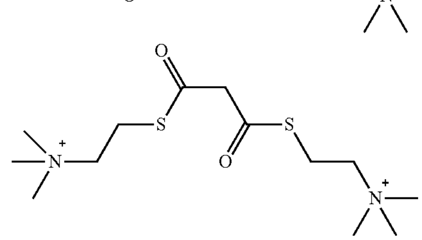

-continued

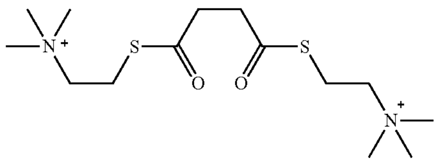

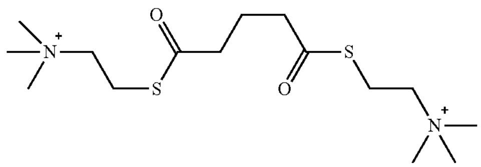

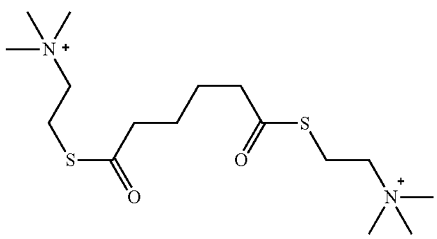

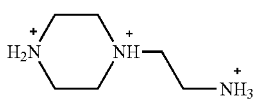

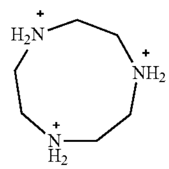

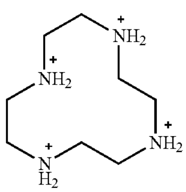

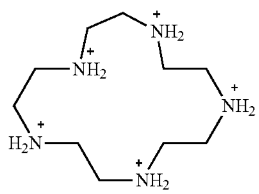

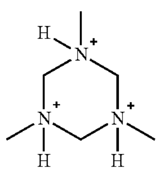

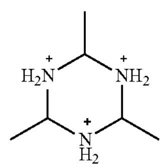

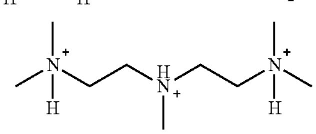

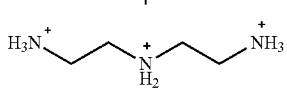

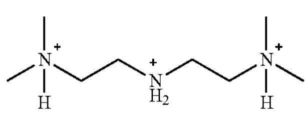

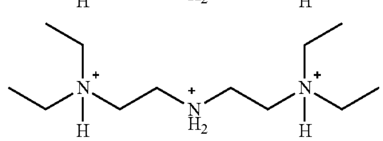

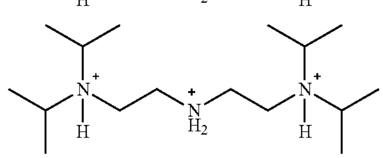

-continued

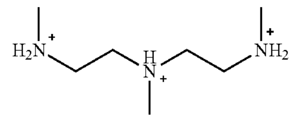

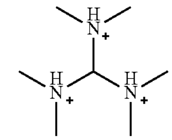

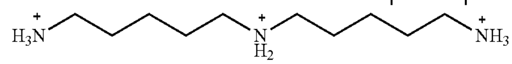

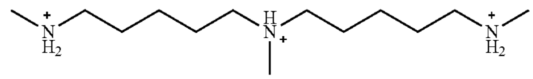

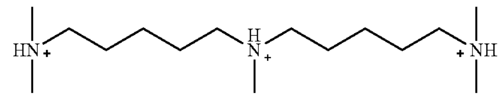

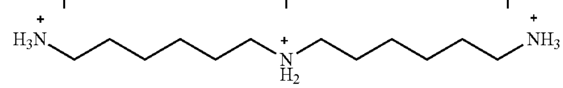

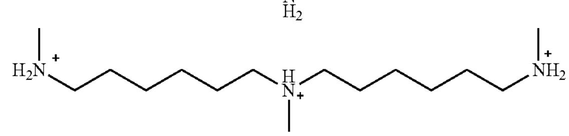

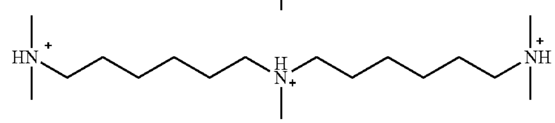

The salt compound contains a 1,1,1,3,3,3-hexafluoro-2-propanol (HFA) group within its molecule. By virtue of the electric repulsion of fluorine atoms, the salt compound is uniformly distributed in a resist film without agglomerating together. The diffusion distance of the acid generated by the acid generator upon exposure is uniform within a minute range of nanometer order. The resist pattern is thus improved in LWR or CDU. Since the salt compound which does not possess an aromatic group is little absorptive to light of wavelength 193 nm, it is also effective in the pattern forming process by ArF excimer laser lithography using a thick resist film having a thickness of at least 100 nm.

The salt compound may be synthesized, for example, by neutralization reaction of a nitrogen-containing compound (e.g., ammonium hydroxide or amine compounds) with a HFA compound. The neutralization reaction is most preferably performed under the conditions that the nitrogen-containing compound and the HFA compound are in a molar ratio of 1:1 although either one of the compounds may be in excess.

The neutralization reaction may be performed in a resist solution. Specifically, the nitrogen-containing compound and the HFA compound are added to a solution containing various components to be described later where neutralization reaction takes place. The HFA compound is preferably added in an amount of 0.5 to 1.5 moles, more preferably 0.7 to 1.3 moles per mole of ammonium hydroxide or amine compound.

In the chemically amplified resist composition, the salt compound is preferably present in an amount of 0.001 to 50 parts by weight, more preferably 0.01 to 20 parts by weight per 100 parts by weight of a base polymer (to be described later), as viewed from sensitivity and acid diffusion suppressing effect. The salt compound may be used alone or in admixture.

In the chemically amplified resist composition, a quencher other than the above salt compound may be blended. The other quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy group, ether bond, ester bond, lactone ring, cyano group, or sulfonic acid ester bond as described in U.S. Pat. No. 7,537,880 (JP-A 2008-111103, paragraphs [0146]-[0164]), and compounds having a carbamate group as described in JP 3790649. Addition of a basic compound may be effective for further suppressing the diffusion rate of acid in the resist film or correcting the pattern profile.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

Ammonium salts, sulfonium salts, and iodonium salts may also be added as the other quencher. Suitable ammonium salts, sulfonium salts, and iodonium salts to be added as the quencher are salts with carboxylic acids, sulfonic acids, sulfone imide and saccharin. The carboxylic acids may or may not be fluorinated at α-position.

The other quencher is preferably added in an amount of 0 to 5 parts, more preferably 0 to 4 parts by weight per 100 parts by weight of the base polymer. The other quencher may be used alone or in admixture.

Acid Generator

The resist composition comprises an acid generator. The acid generator may be either an acid generator of addition type which is different from the salt compound and other components in the resist composition or a polymer-bound acid generator which has both the functions of base polymer and acid generator.

The acid generator of addition type is typically a compound (PAG) capable of generating an acid in response to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, salts having the formula (3) are also preferred.

(3)

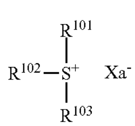

In formula (3). $R^{101}$ to $R^{103}$ are each independently halogen or a $C_1$-$C_{20}$ hydrocarbyl group which may contain a heteroatom.

Suitable halogen atoms include fluorine, chlorine, bromine and iodine.

The $C_1$-$C_{20}$ hydrocarbyl group represented by $R^{101}$ to $R^{103}$ may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl. $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl and adamantyl; $C_2$-$C_{20}$ alkenyl groups such as vinyl, propenyl, butenyl and hexenyl; $C_2$-$C_{20}$ alkynyl groups such as ethynyl, propynyl and butynyl; $C_3$-$C_{20}$ cyclic unsaturated aliphatic hydrocarbyl groups such as cyclohexenyl and norbomenyl; $C_4$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl and tert-butylnaphthyl; $C_7$-$C_{20}$ aralkyl groups such as benzyl and phenethyl; and combinations thereof.

Also included are substituted forms of the foregoing groups in which some or all of the hydrogen atoms are substituted by a moiety containing a heteroatom such as oxygen, sulfur, nitrogen or halogen, or some carbon is replaced by a moiety containing a heteroatom such as oxygen, sulfur or nitrogen, so that the group may contain a hydroxy moiety, cyano moiety, nitro moiety, mercapto moiety, carbonyl moiety, ether bond, ester bond, sulfonic acid ester bond, carbonate moiety, lactone ring, sultone ring, carboxylic anhydride or haloalkyl moiety.

A pair of $R^{101}$ and $R^{102}$ may bond together to form a ring with the sulfur atom to which they are attached. Preferred are those rings of the structure shown below.

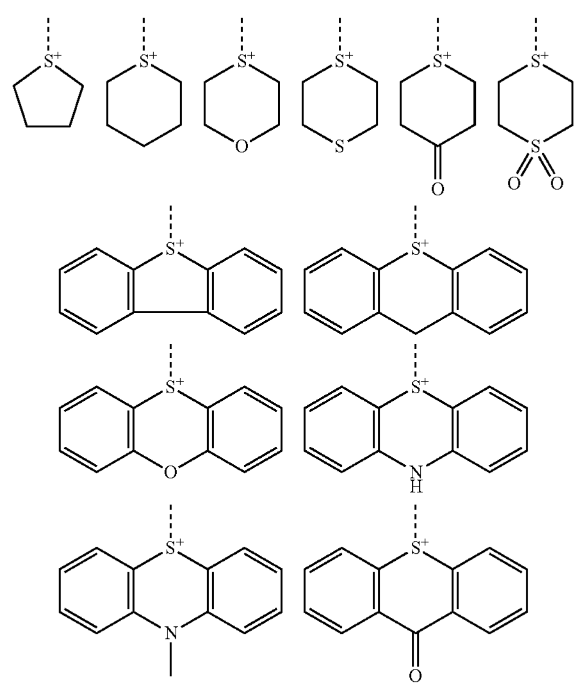

-continued
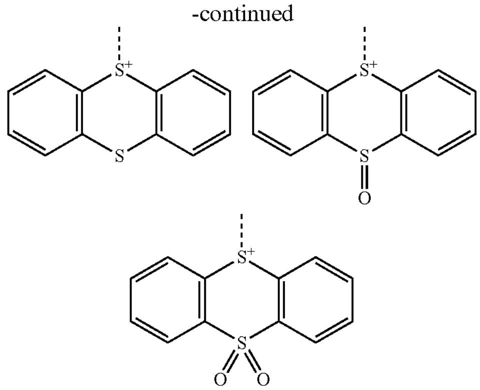
Herein, the broken line denotes a point of attachment to $R^{103}$.
Examples of the cation in the sulfonium salt having formula (3) are shown below, but not limited thereto.
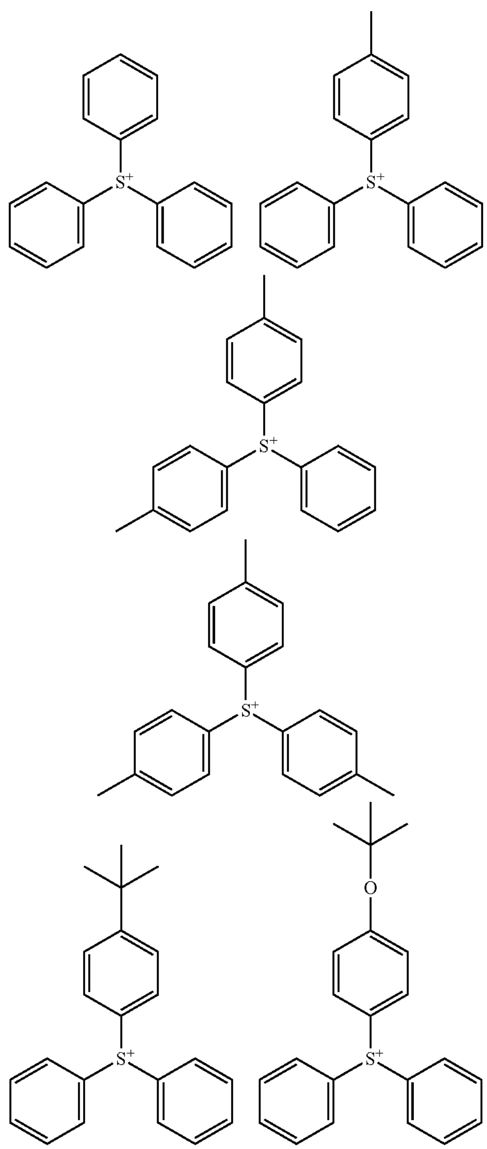
-continued
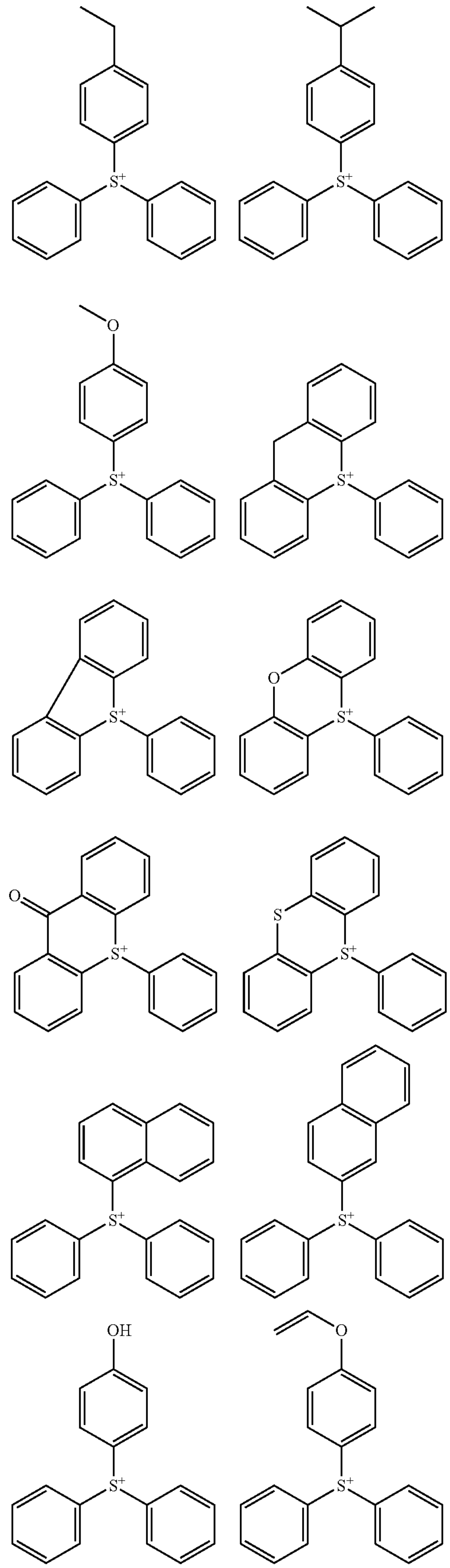

-continued
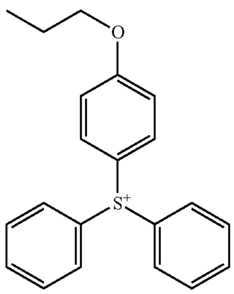
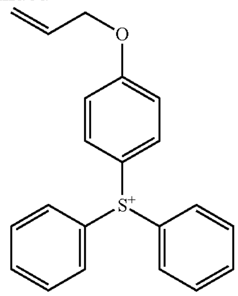
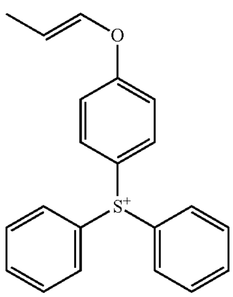
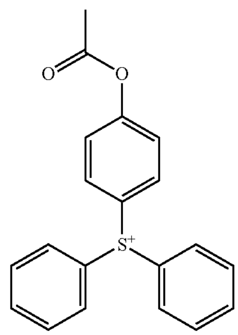
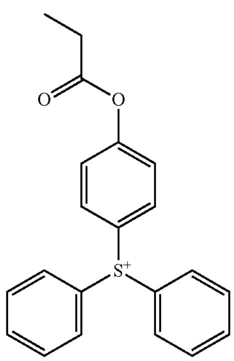
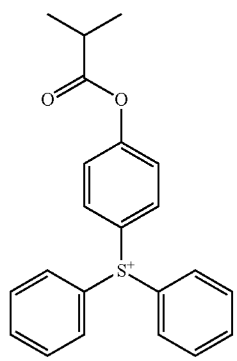
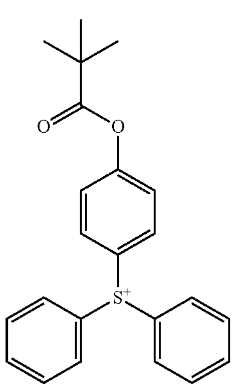
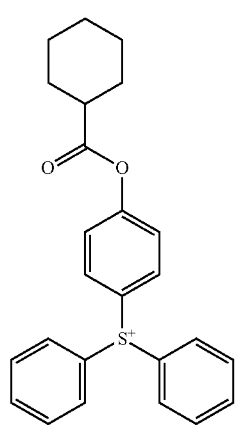
-continued
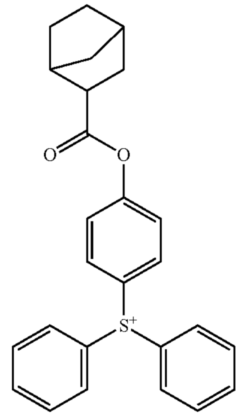
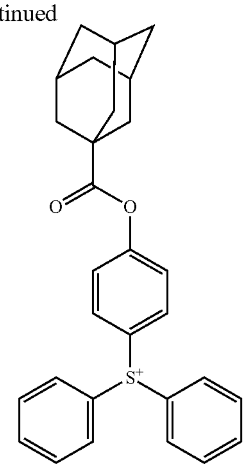
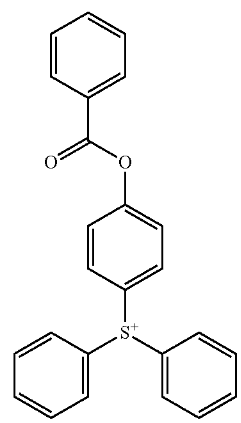
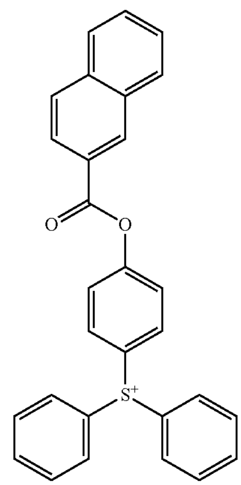
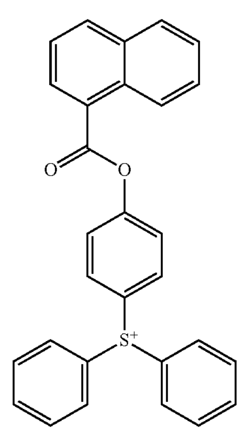
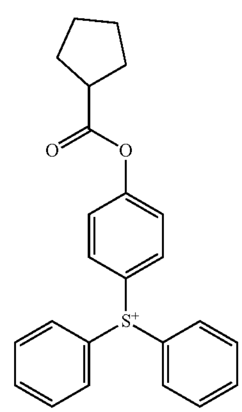

-continued
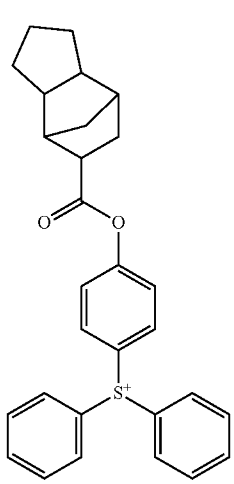
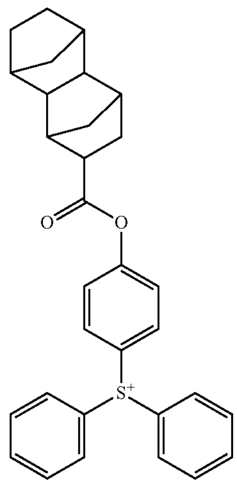
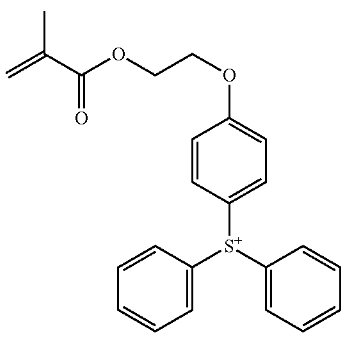
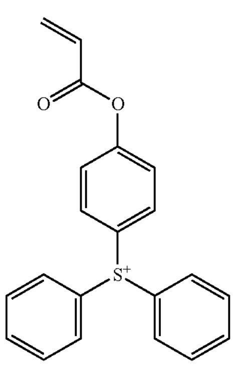
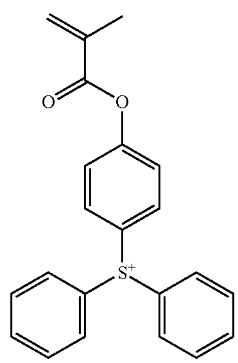
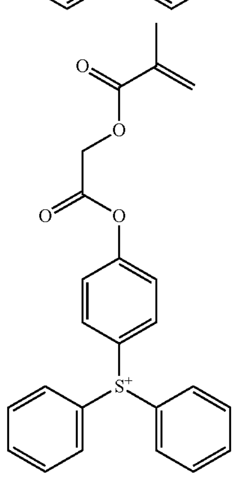
-continued
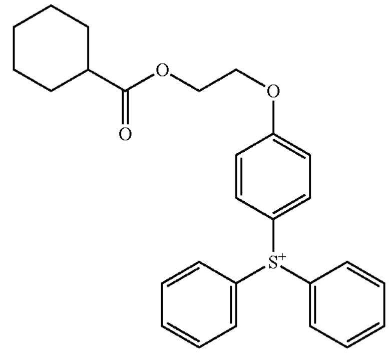
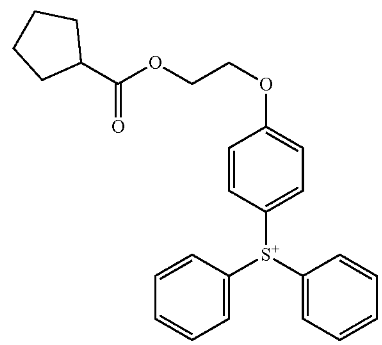
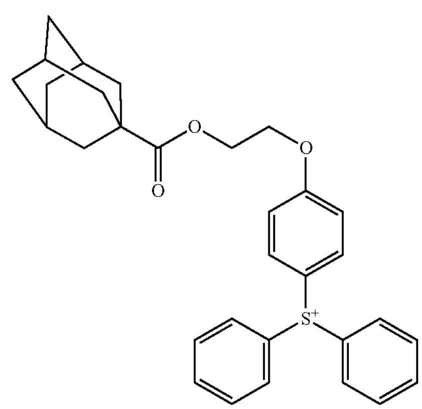
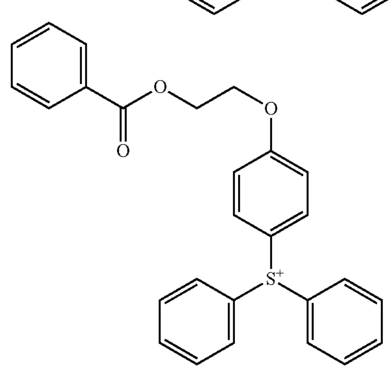

-continued
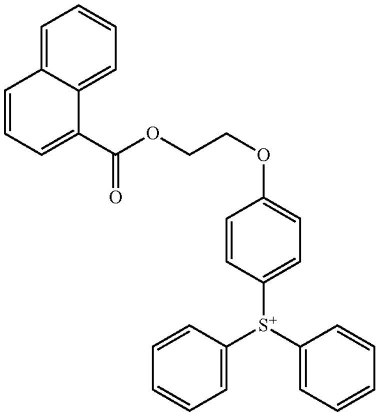
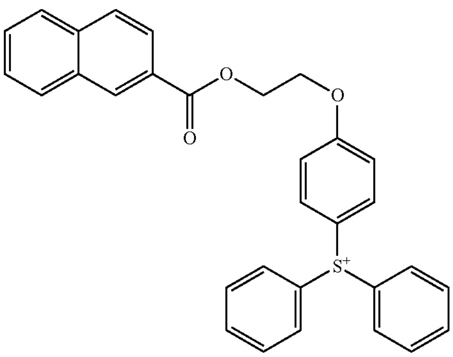
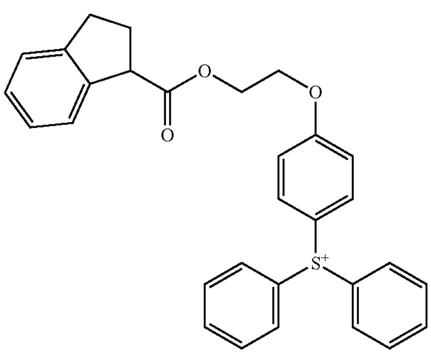
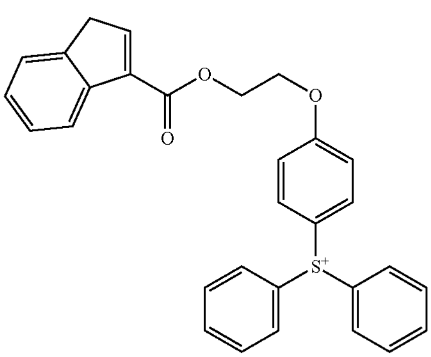
-continued
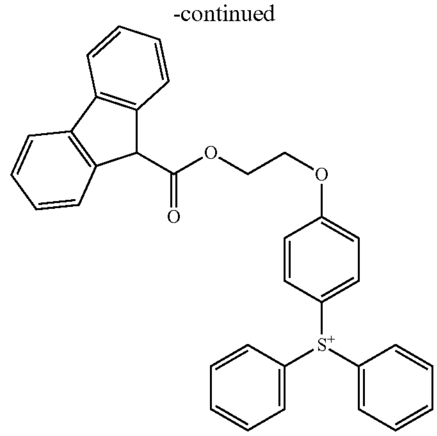
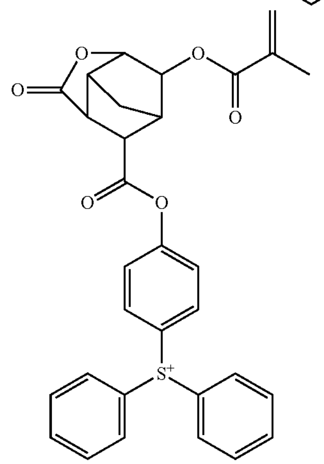
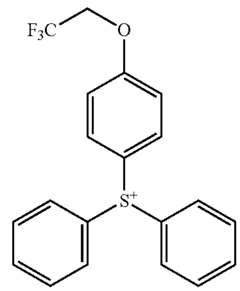
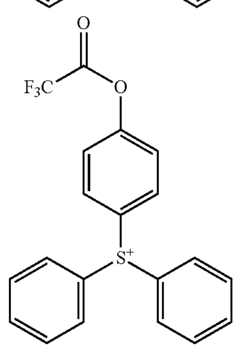
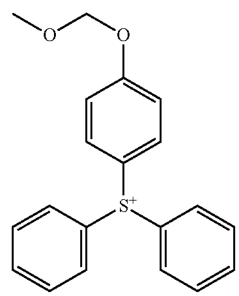
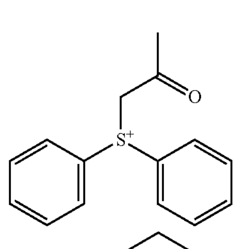
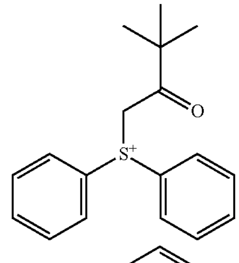
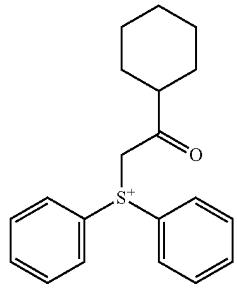
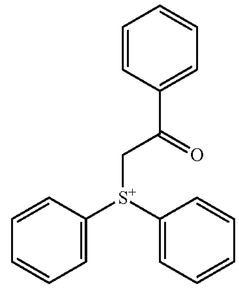

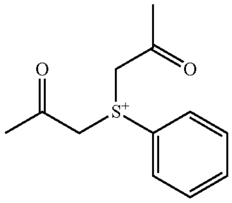
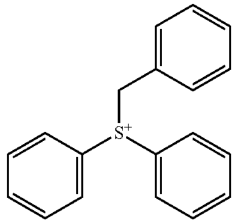
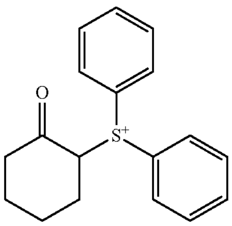
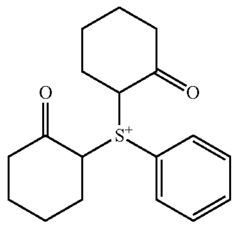
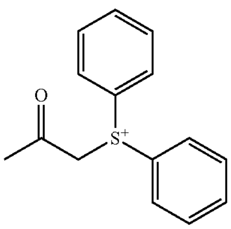
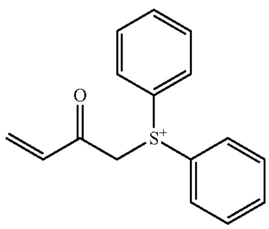
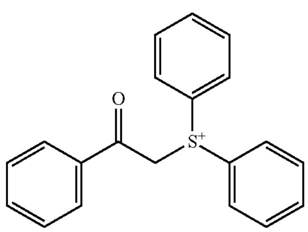
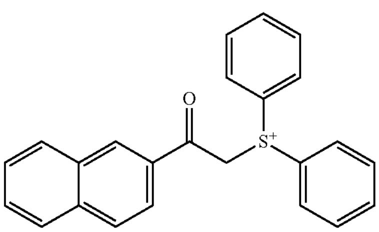
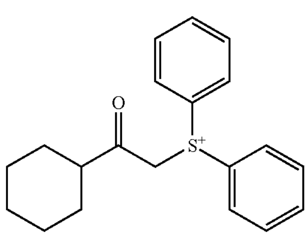
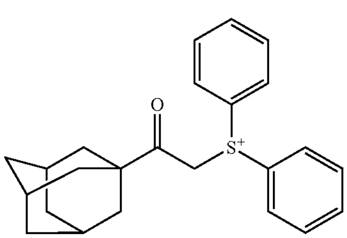
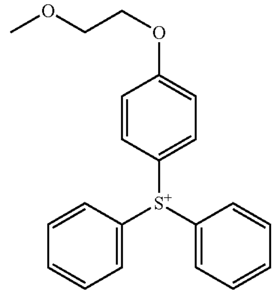
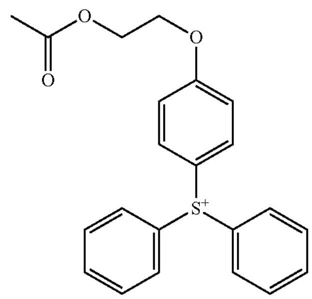
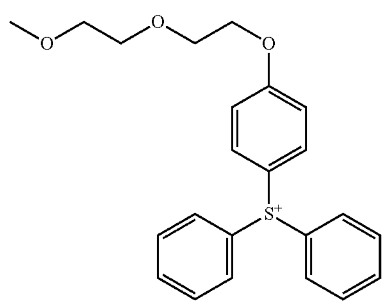
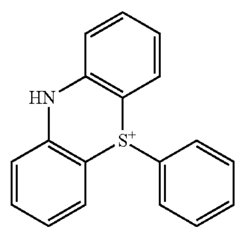
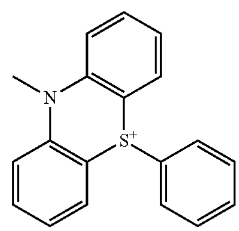
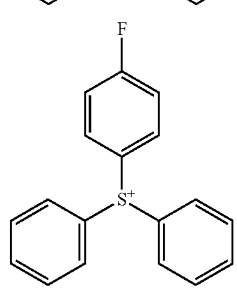
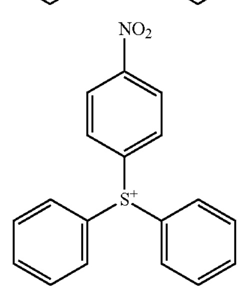
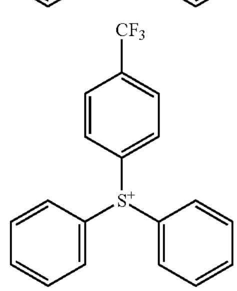
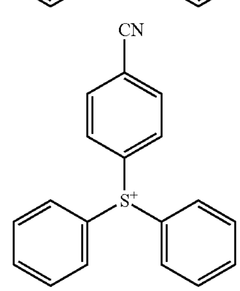

-continued
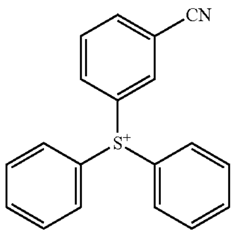
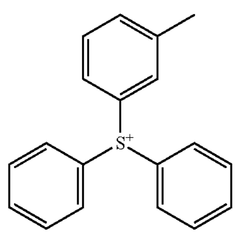
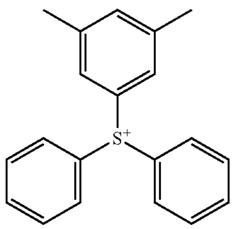
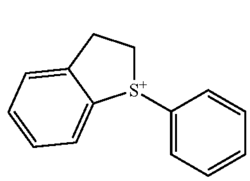
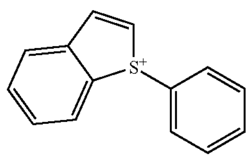
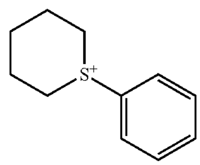
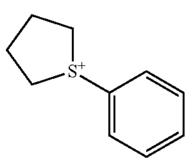
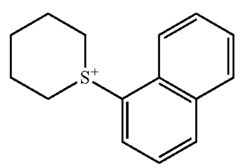
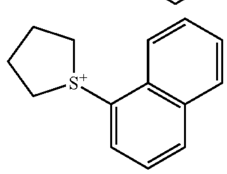
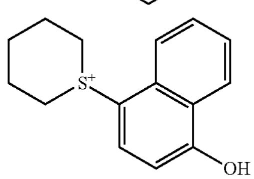
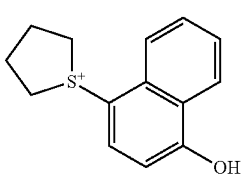
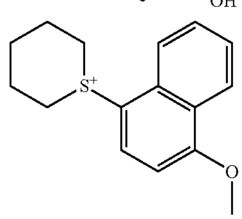
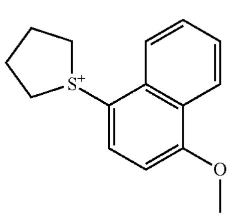
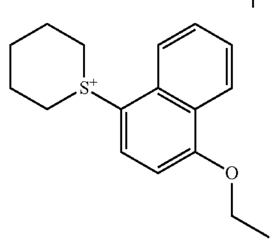
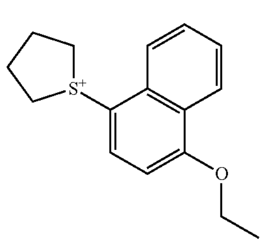
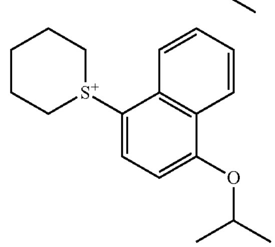
-continued
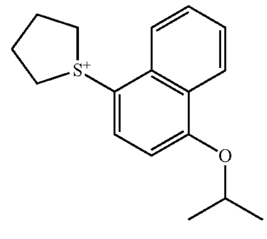
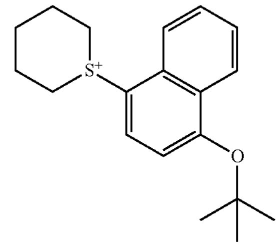
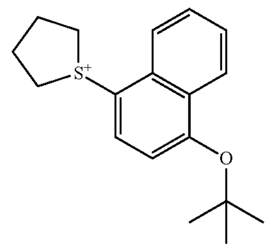
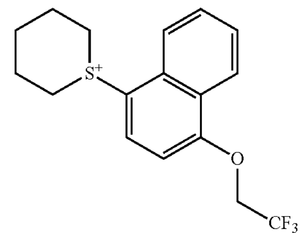
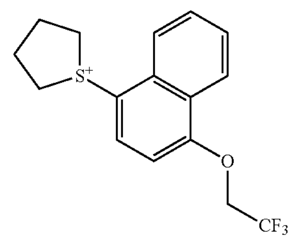
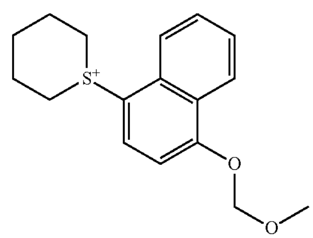
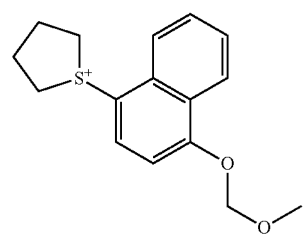
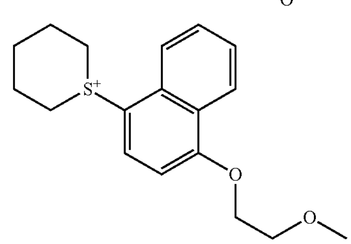
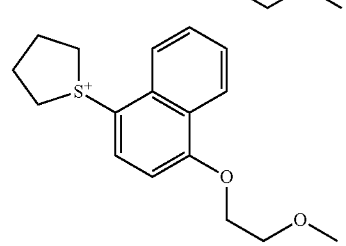

-continued
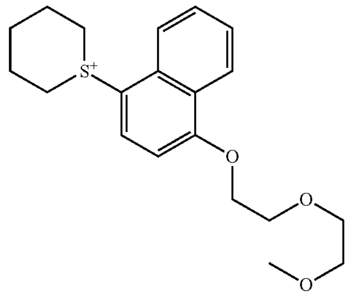
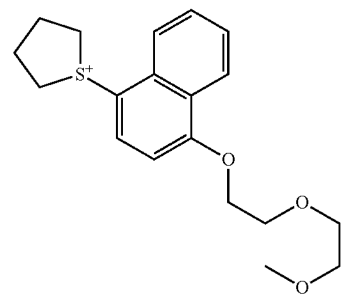
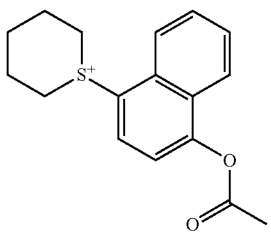
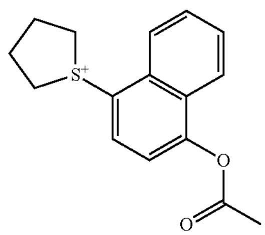
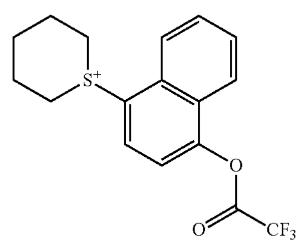
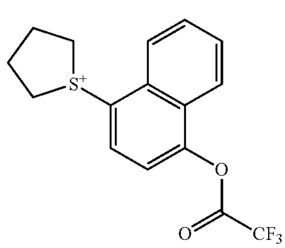
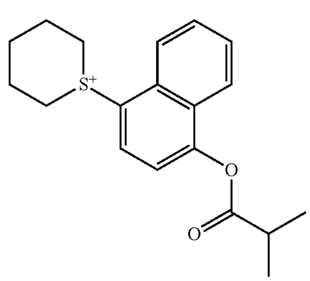
-continued
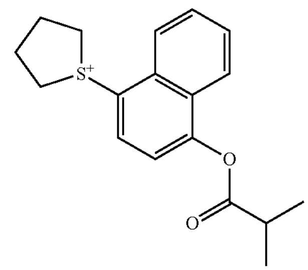
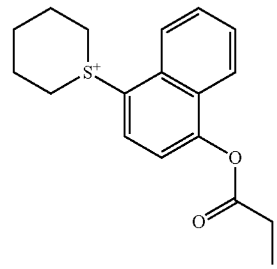
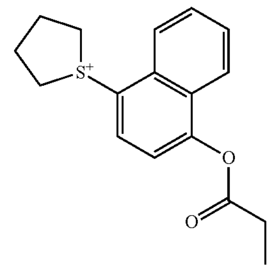
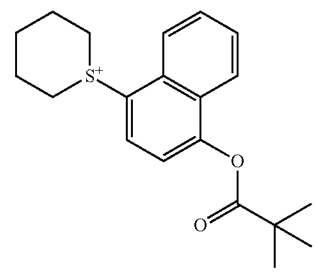
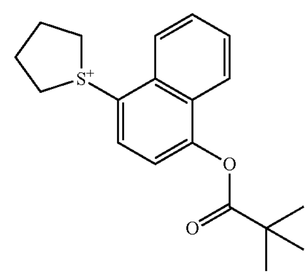
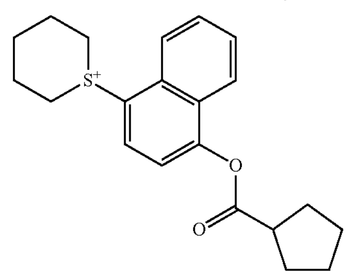
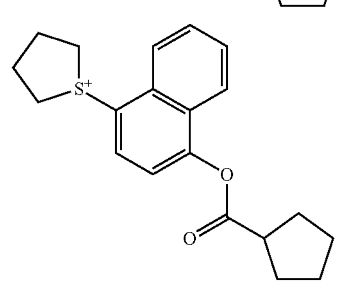

-continued
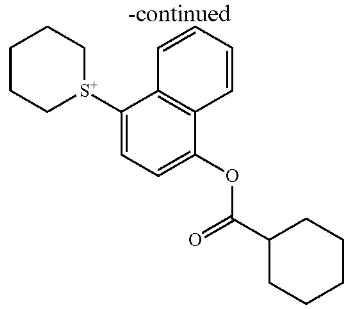
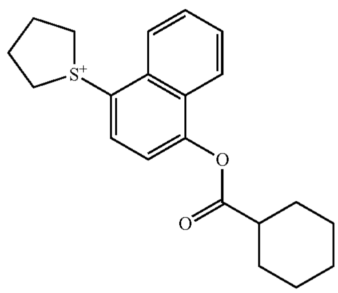
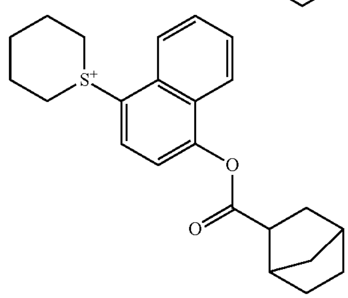
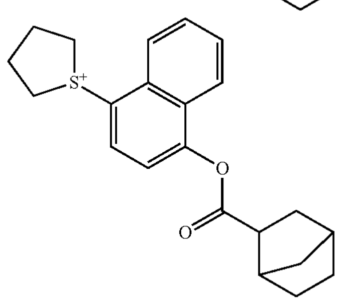
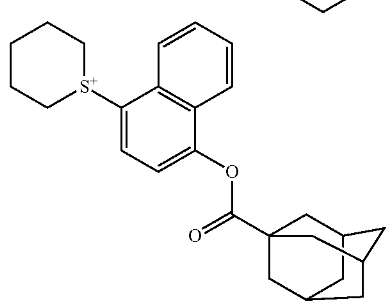
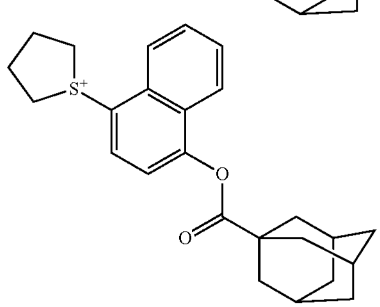
-continued
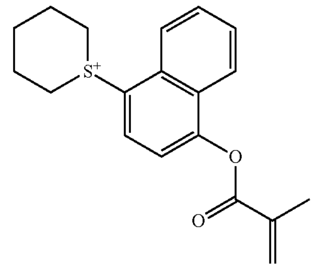
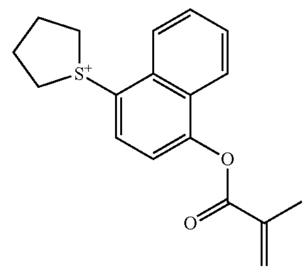
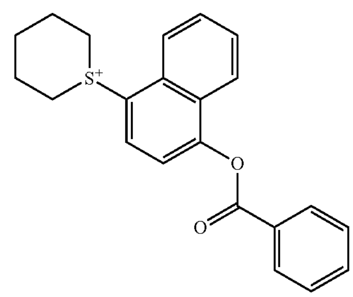
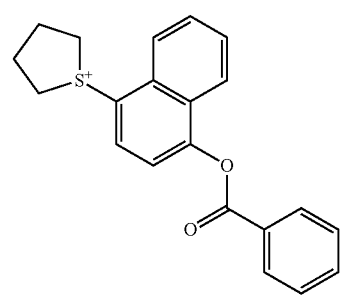
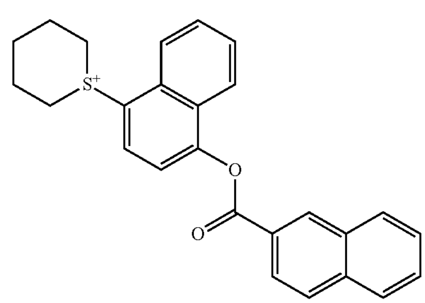

-continued
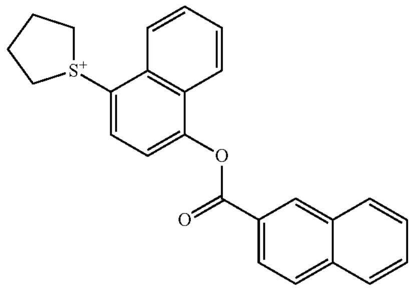
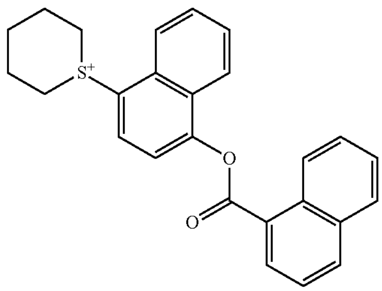
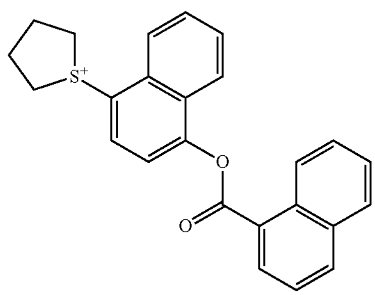
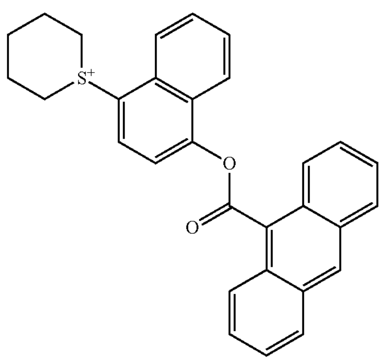
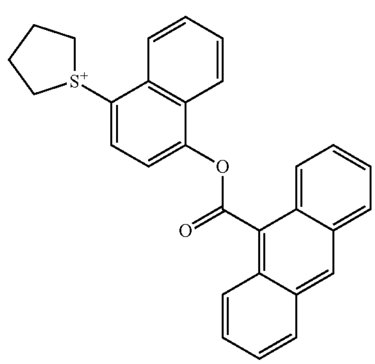
-continued
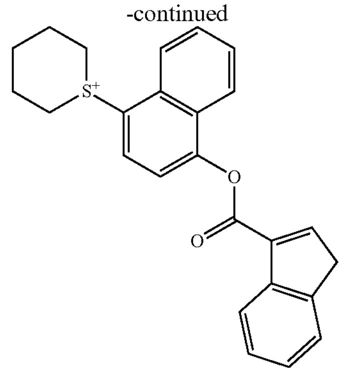
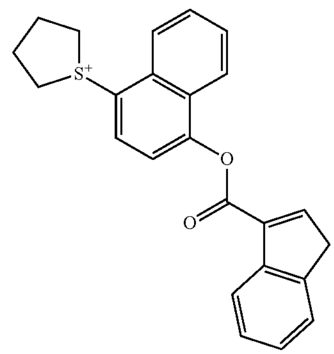
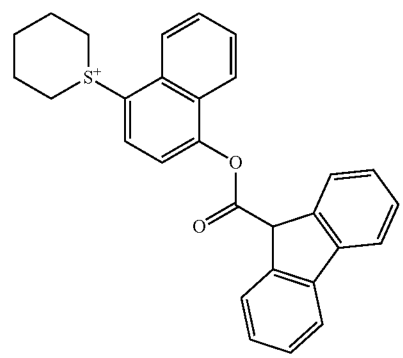
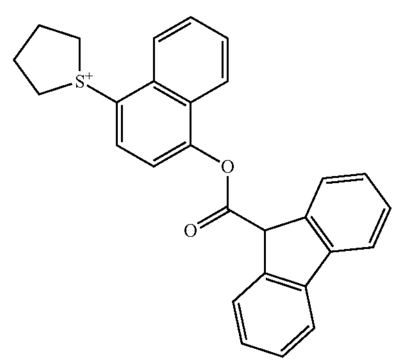
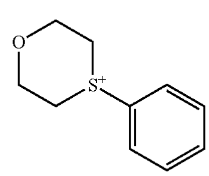
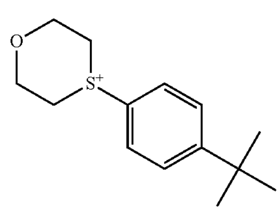

-continued
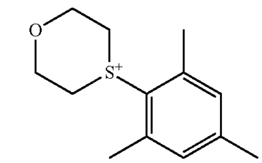
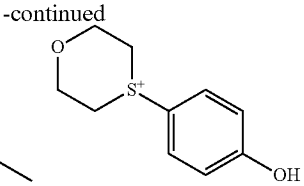
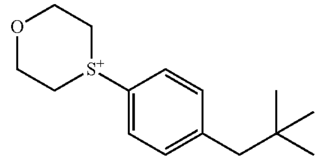
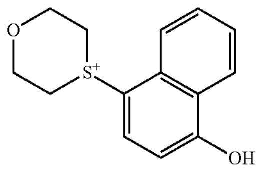
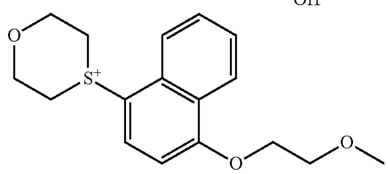
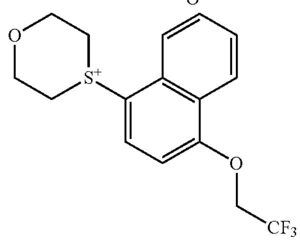
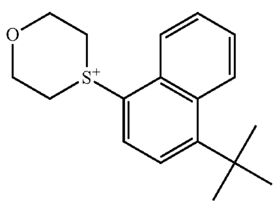
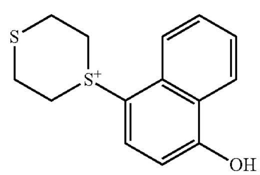
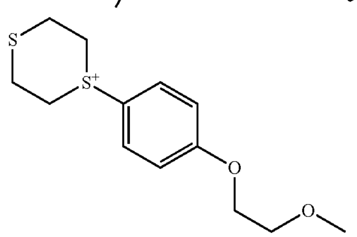
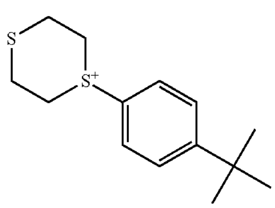
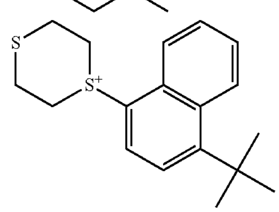
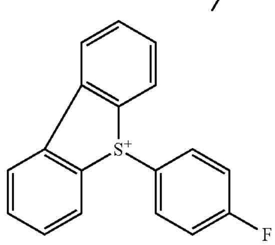
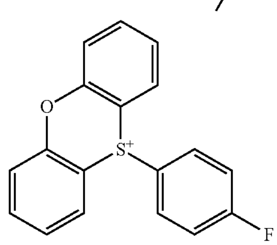
-continued
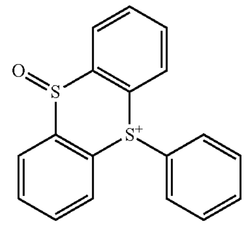
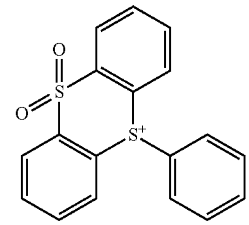
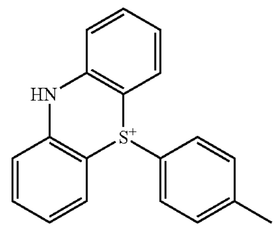
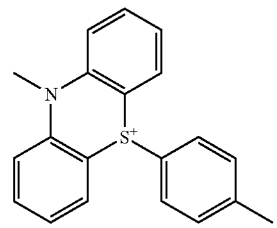
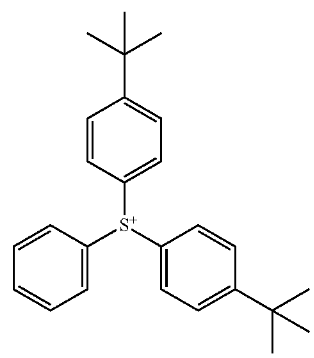
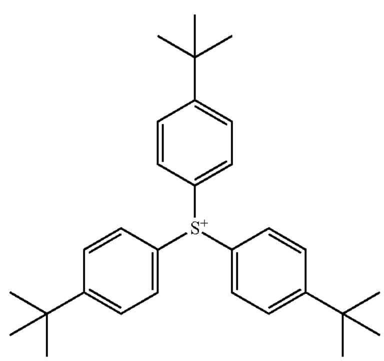
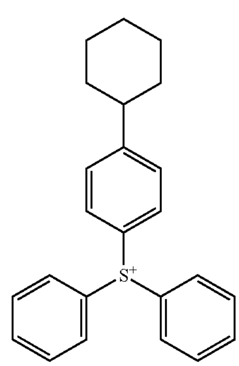

-continued
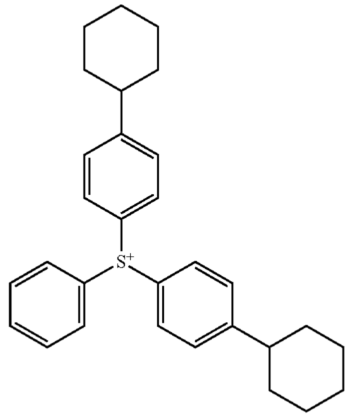
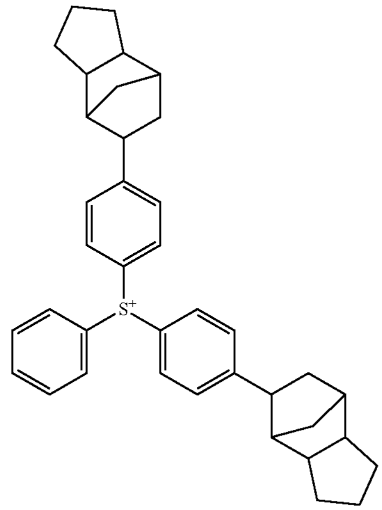
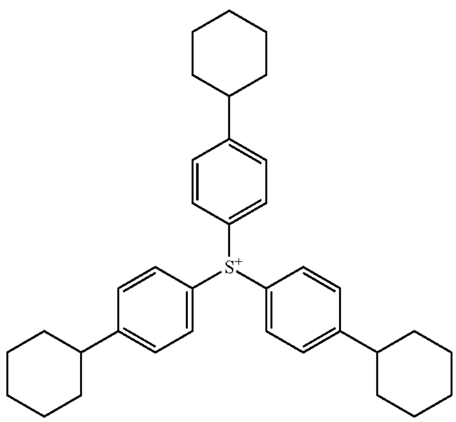
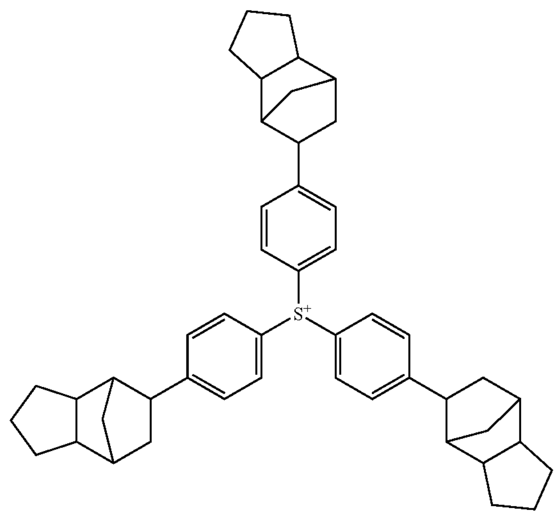
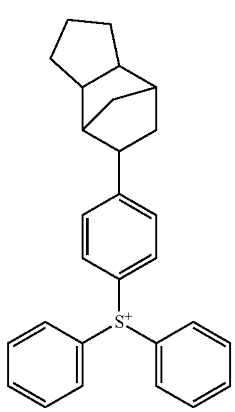
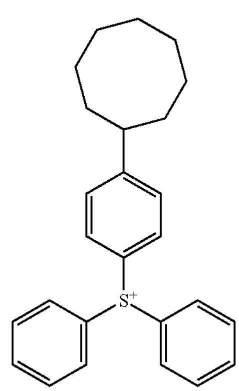

-continued
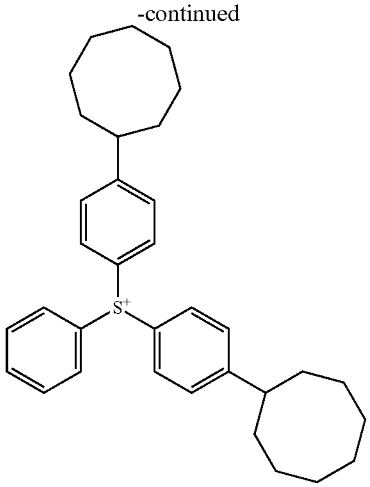
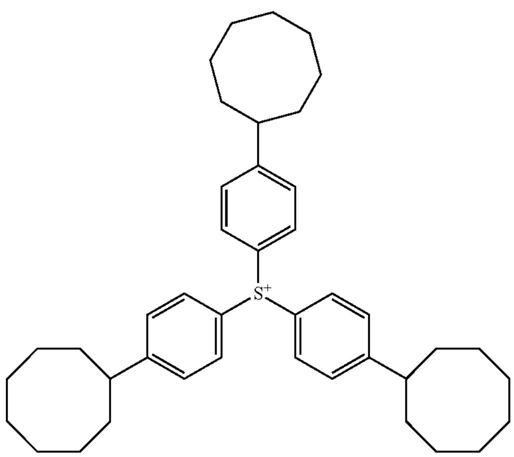
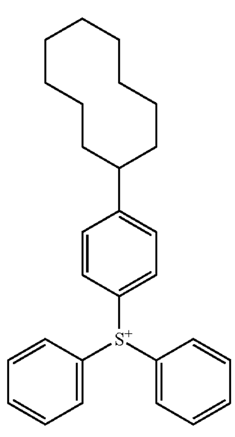
-continued
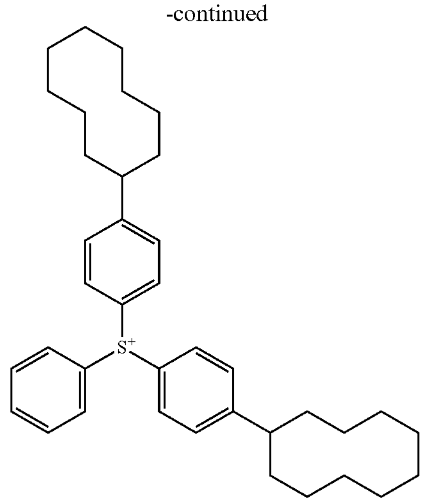
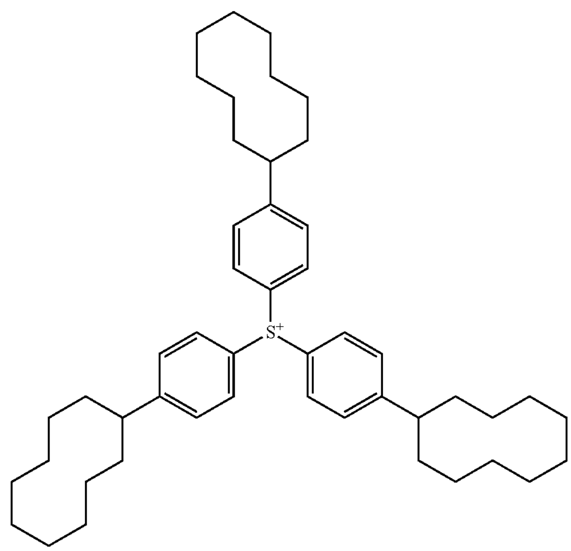
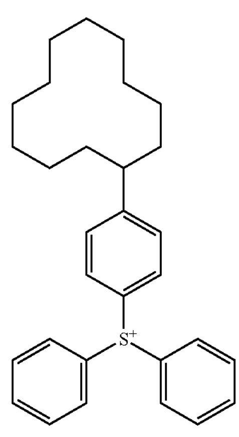

-continued
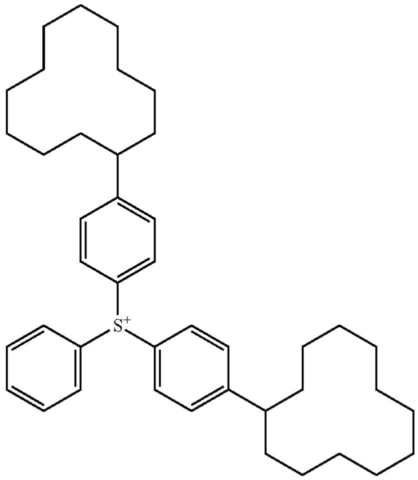
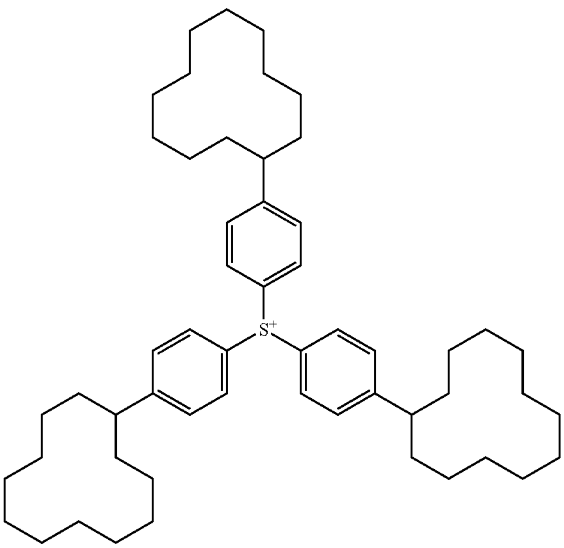
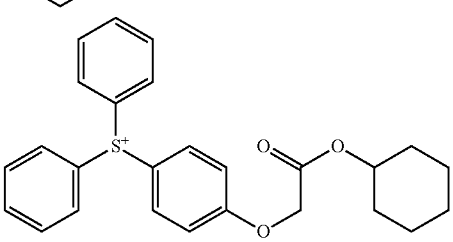
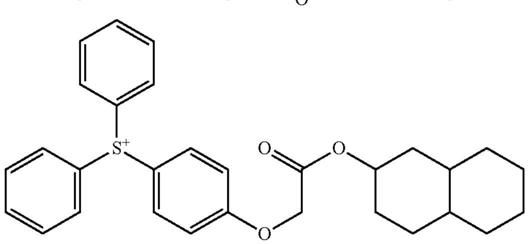
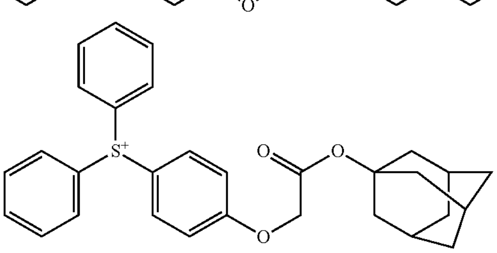
-continued
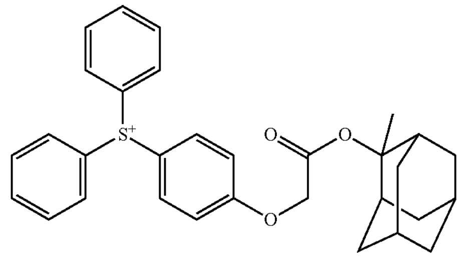
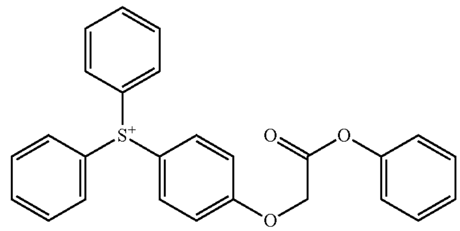
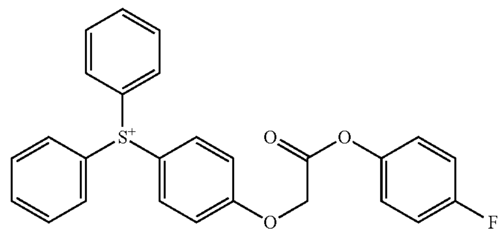
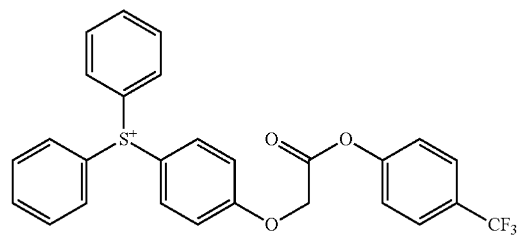
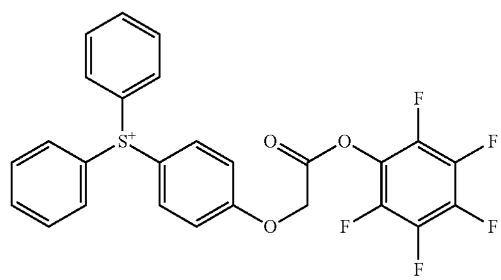
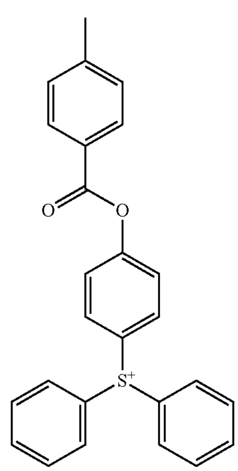
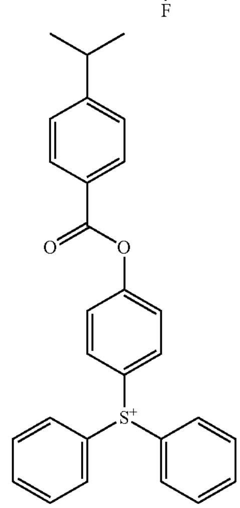

-continued
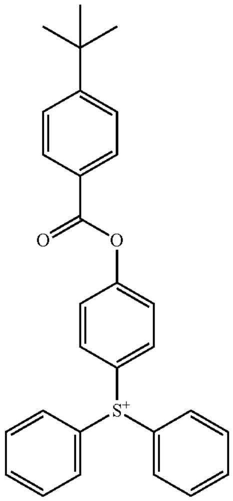
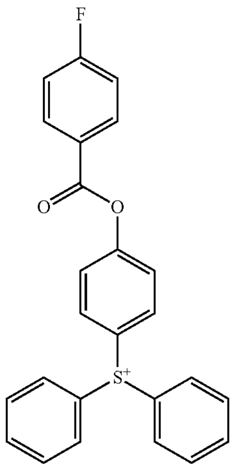
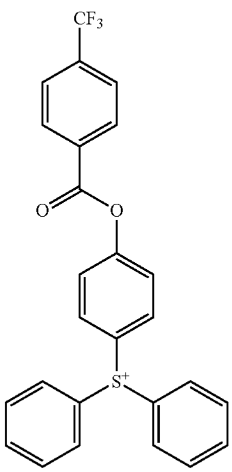
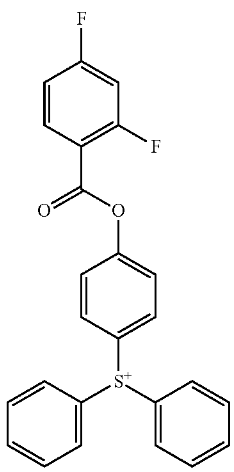
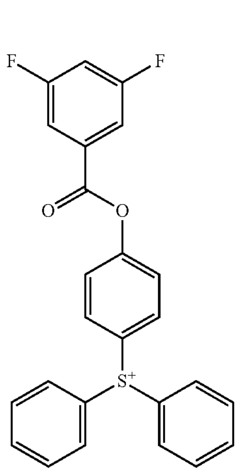
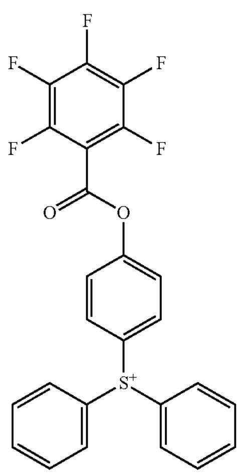
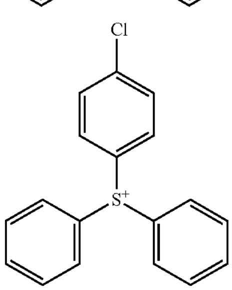
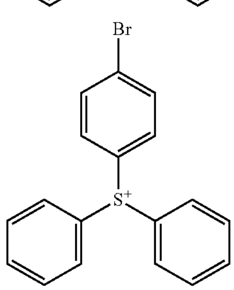
-continued
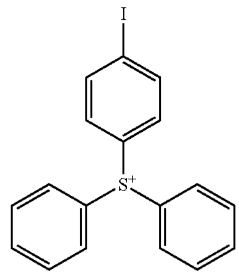
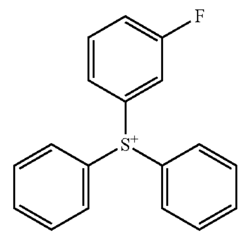
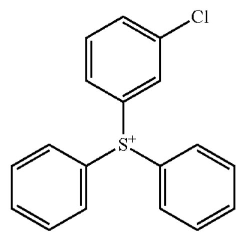
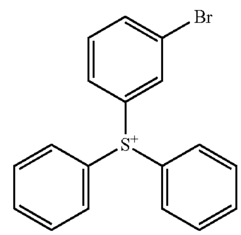
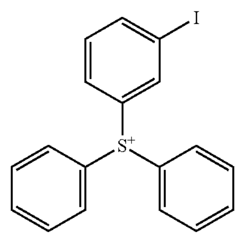
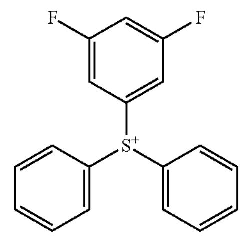
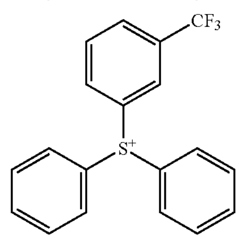
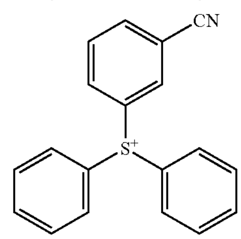
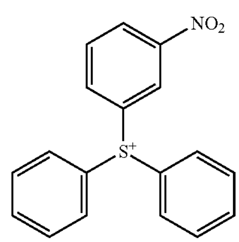
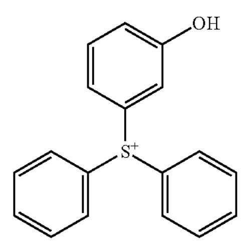
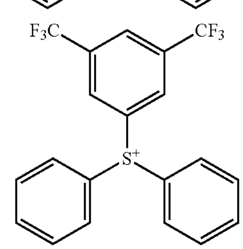
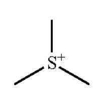
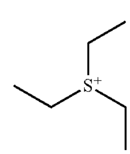
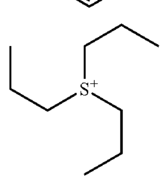
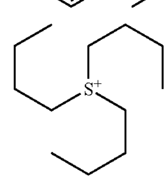
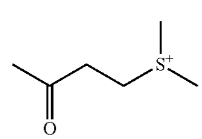
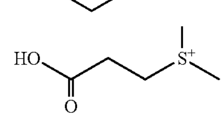

-continued

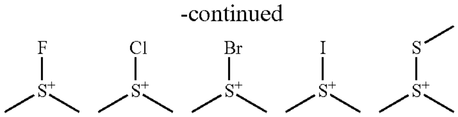

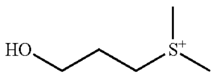

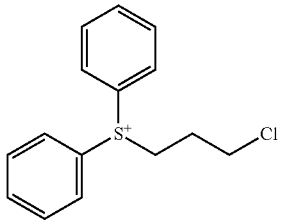

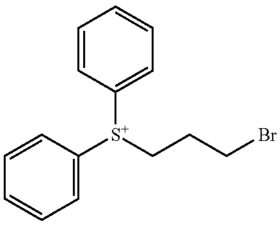

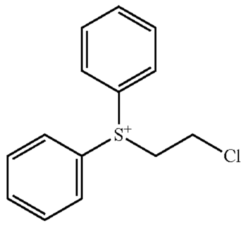

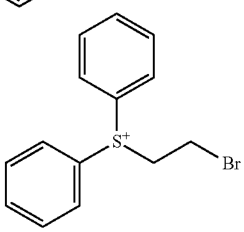

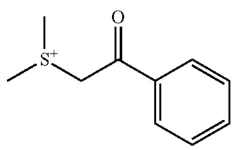

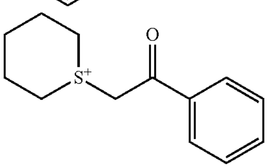

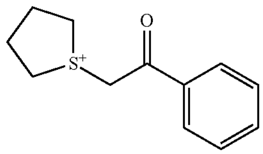

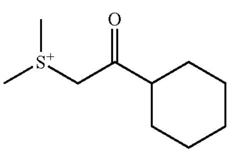

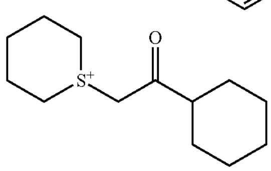

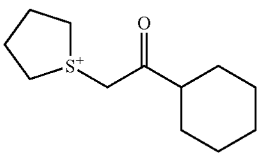

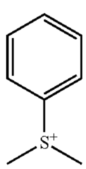

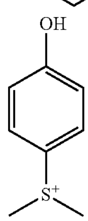

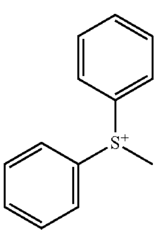

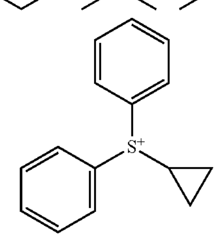

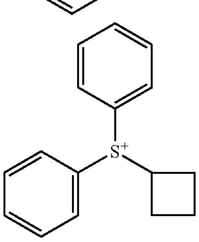

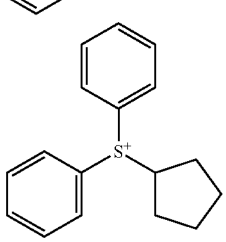

-continued

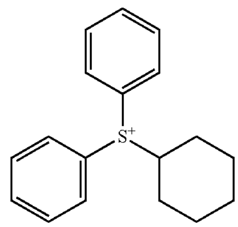

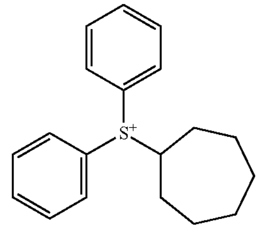

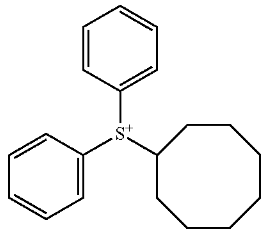

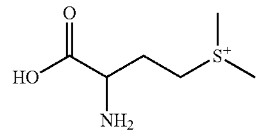

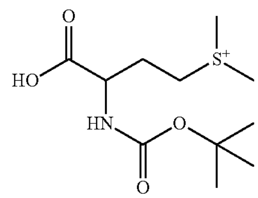

In formula (3), $Xa^-$ is an anion of the following formula (3A), (3B), (3C) or (3D).

$$R^{fa}—CF_2—SO_3^- \quad (3A)$$

$$\begin{matrix} R^{fb1}—CF_2—SO_2 \\ R^{fb2}—CF_2—SO_2 \end{matrix} \Big\rangle N^- \quad (3B)$$

(3C)

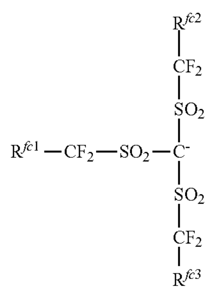

(3D)

$$R^{fd}—\overset{O}{\overset{\|}{C}}—O—\underset{CF_3}{\overset{CF_3}{C}}—CH_2—SO_3^-$$

In formula (3A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified later for hydrocarbyl group $R^{111}$ in formula (3A').

Of the anions of formula (3A), a structure having formula (3A') is preferred.

(3A')

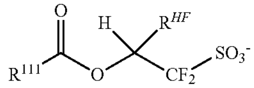

In formula (3A'), $R^{HF}$ is hydrogen or trifluoromethyl, preferably trifluoromethyl.

$R^{111}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation. The hydrocarbyl group $R^{111}$ may be saturated or unsaturated and straight, branched or cyclic. Suitable hydrocarbyl groups include $C_1$-$C_{38}$ alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl; $C_3$-$C_{32}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{38}$ unsaturated aliphatic hydrocarbyl groups such as allyl and 3-cyclohexenyl; $C_6$-$C_{38}$ aryl groups such as phenyl, 1-naphthyl, 2-naphthyl; $C_7$-$C_{32}$ aralkyl groups such as benzyl and diphenylmethyl; and combinations thereof.

In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy, cyano, carbonyl, ether bond, ester bond, sulfonic acid ester bond, carbonate, lactone ring, sultone ring, carboxylic anhydride or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (3A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (3A) are shown below, but not limited thereto.

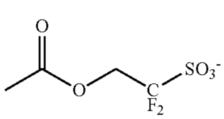

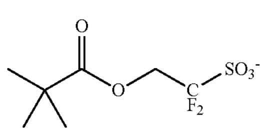

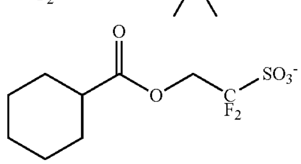

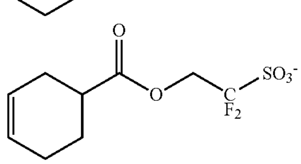

-continued

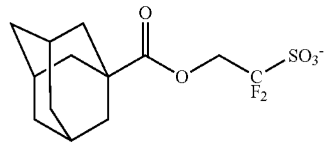

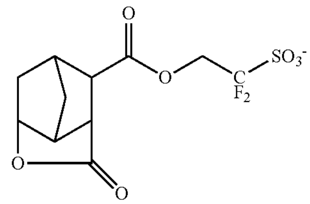

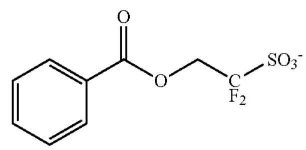

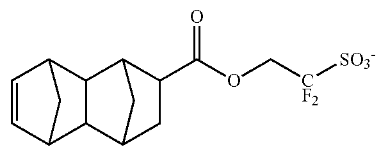

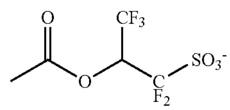

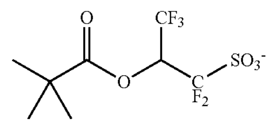

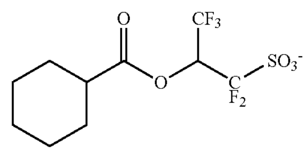

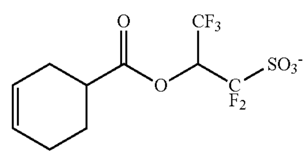

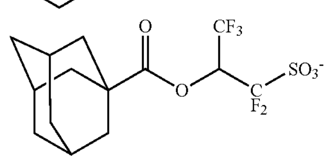

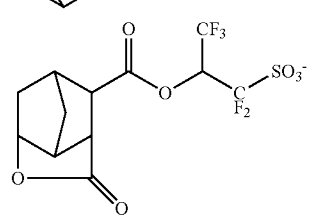

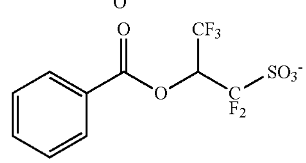

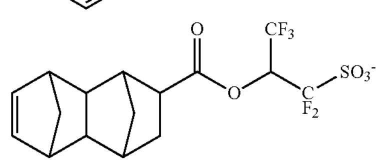

-continued
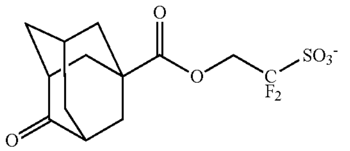
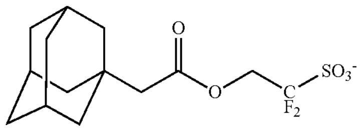
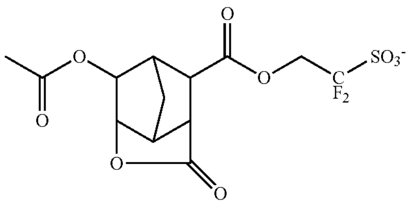
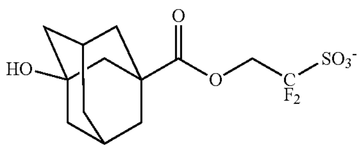
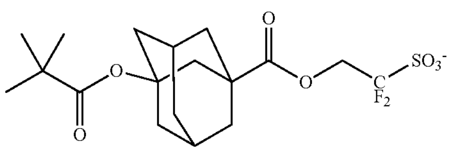
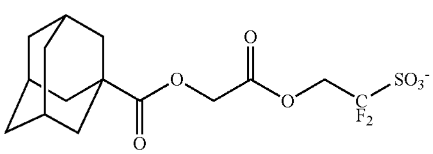
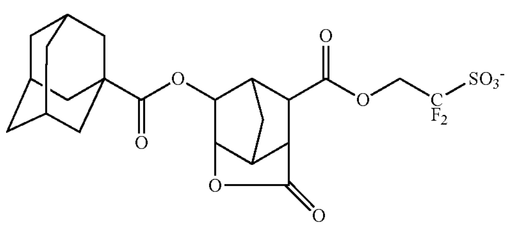
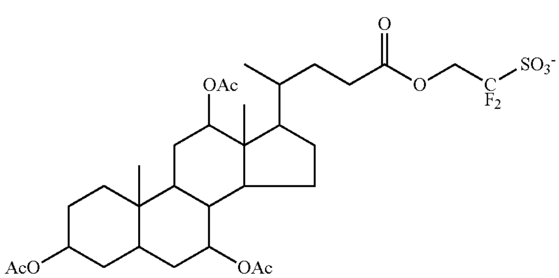
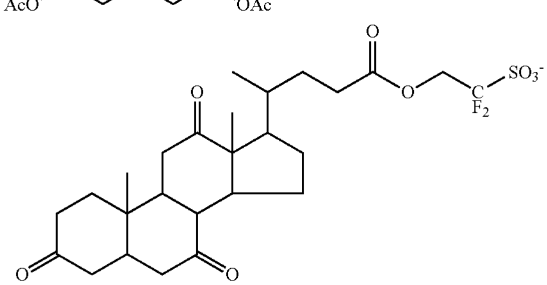
-continued
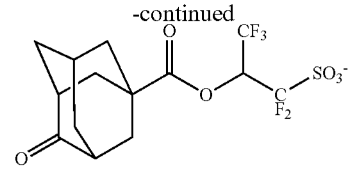
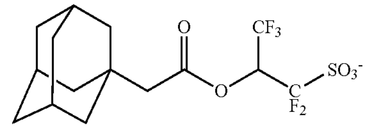
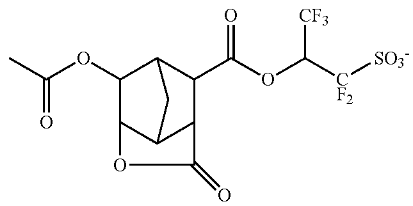
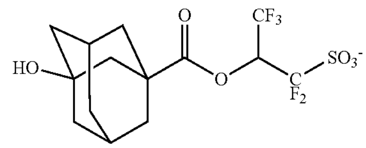
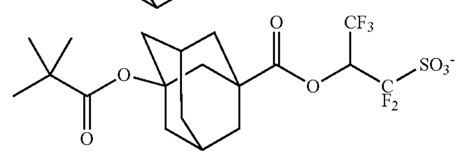
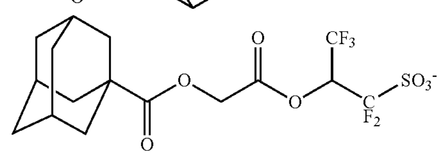
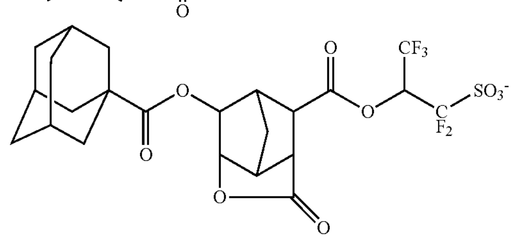
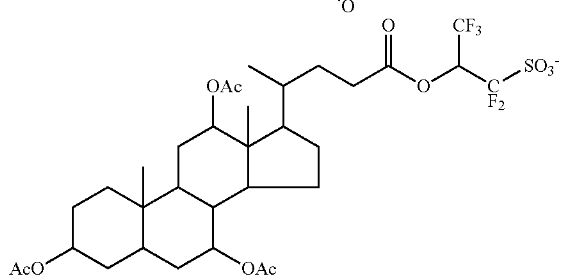
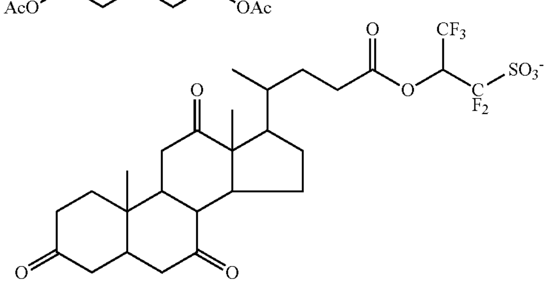
In formula (3B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (3A'). Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage ($—CF_2—SO_2—N^-—SO_2—CF_2—$) to which they are attached, and the ring-forming pair is preferably a fluorinated ethylene or fluorinated propylene group.

In formula (3C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (3A'). Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage ($—CF_2—SO_2—C^-—SO_2—CF_2—$) to which they are attached, and the ring-forming pair is preferably a fluorinated ethylene or fluorinated propylene group.

In formula (3D), $R^{fd}$ is a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$.

With respect to the synthesis of the sulfonium salt having an anion of formula (3D), reference is made to JP-A 2010-215608 and JP-A 2014-133723.

Examples of the anion having formula (3D) are shown below, but not limited thereto.

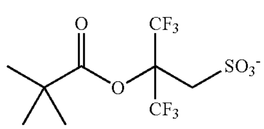
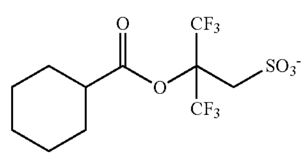
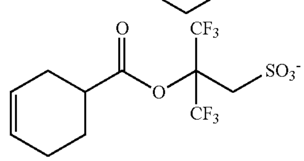
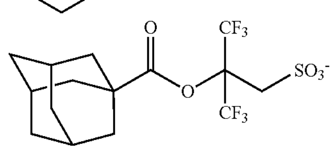
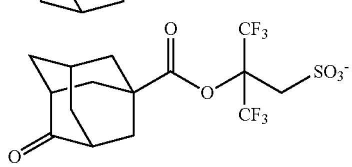
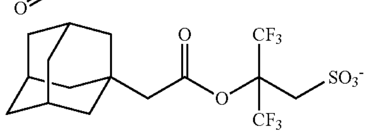
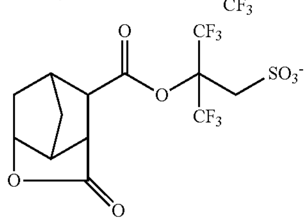

-continued

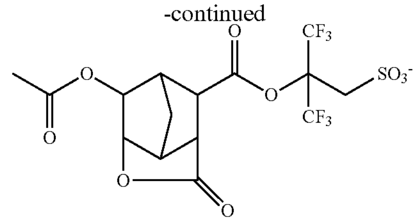
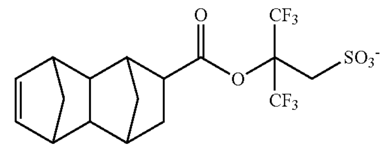
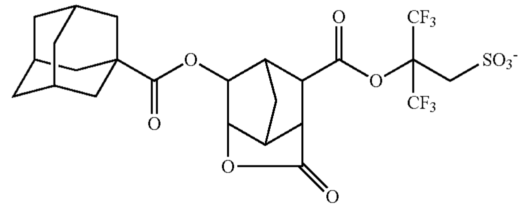
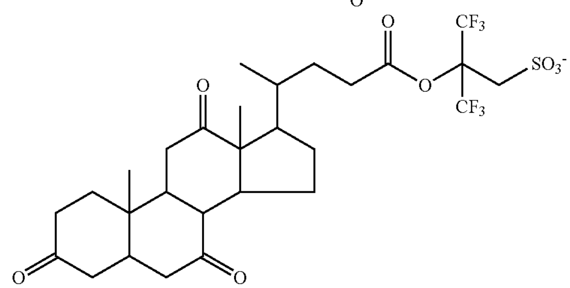

The compound having the anion of formula (3D) has a sufficient acid strength to cleave acid labile groups in the base polymer because it is free of fluorine at α-position of sulfo group, but has two trifluoromethyl groups at β-position. Thus the compound is a useful PAG.

Also compounds having the formula (4) are useful as the PAG.

$$R^{201}—\underset{\underset{R^{202}}{|}}{S^+}—R^{203}—L^A\left(\begin{matrix}X^C\\ |\\ C\\ |\\ X^D\end{matrix}\right)_k\begin{matrix}X^A\\ |\\ C\\ |\\ X^B\end{matrix}—SO_3^- \quad (4)$$

In formula (4), $R^{201}$ and $R^{202}$ are each independently halogen or a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Exemplary rings are the same as described above for the ring that $R^{101}$ and $R^{102}$ in formula (3), taken together, form with the sulfur atom to which they are attached.

The hydrocarbyl groups $R^{201}$ and $R^{202}$ may be saturated or unsaturated and straight, branched or cyclic. Examples thereof include $C_1$-$C_{30}$ alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.$1.0^{2,6}$]decanyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propy naphthyl, isopropylnaphthyl, n-butylnaphthyl, isobutylnaphthyl, sec-butylnaphthyl, tert-butylnaphthyl, and anthracenyl; and combinations thereof. In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy, cyano, carbonyl, ether bond, ester bond, sulfonic acid ester bond, carbonate moiety, lactone ring, sultone ring, carboxylic anhydride or haloalkyl moiety.

The hydrocarbylene group $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,1l-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{30}$ cyclic saturated hydrocarbylene groups such as cyclopentanediyl, cyclohexanediyl, norbornanediyl and adamantanediyl; $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene and tert-butylnaphthylene; and combinations thereof. In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxy, cyano, carbonyl, ether bond, ester bond, sulfonic acid ester bond, carbonate, lactone ring, sultone ring, carboxylic anhydride or haloalkyl moiety. Of the heteroatoms, oxygen is preferred.

In formula (4), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (4), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

In formula (4), k is an integer of 0 to 3.

Of the PAGs having formula (4), those having formula (4') are preferred.

(4')

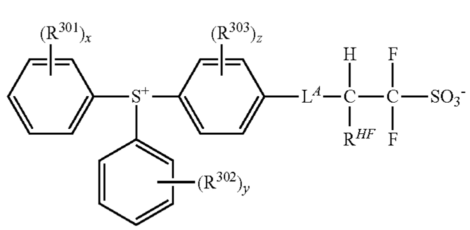

In formula (4'), $L^A$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{111}$ in formula (3A). The subscripts x and y are each independently an integer of 0 to 5, and z is an integer of 0 to 4.

Examples of the PAG having formula (4) are as exemplified for the PAG having formula (2) in JP-A 2017-026980.

Of the foregoing PAGs, those having an anion of formula (3A') or (3D) are especially preferred because of reduced acid diffusion and high solubility in the solvent. Also those having an anion of formula (4') are especially preferred because of extremely reduced acid diffusion.

Also a sulfonium or iodonium salt having an anion containing an iodized or brominated aromatic ring may be used as the PAG. Suitable are sulfonium and iodonium salts having the formulae (5-1) and (5-2).

(5-1)

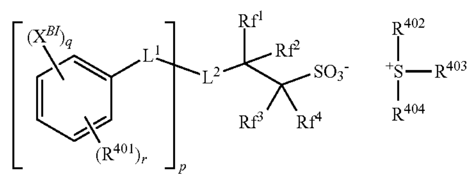

(5-2)

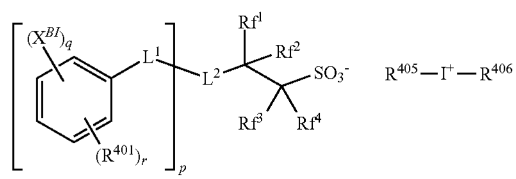

In formulae (5-1) and (5-2), p is an integer of 1 to 3, q is an integer of 1 to 5, r is an integer of 0 to 3, and $1 \leq q+r \leq 5$. Preferably, q is 1, 2 or 3, more preferably 2 or 3, and r is 0, 1 or 2.

In formulae (5-1) and (5-2), $X^{BI}$ is iodine or bromine, and may be the same or different when p and/or q is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when p is 1, and a $C_1$-$C_{20}$ tri- or tetravalent linking group which may contain oxygen, sulfur or nitrogen when p is 2 or 3.

$R^{401}$ is a hydroxy group, carboxy group, fluorine, chlorine, bromine, amino group, or a $C_1$-$C_{20}$ saturated hydrocarbyl, $C_1$-$C_{20}$ saturated hydrocarbyloxy, $C_2$-$C_{20}$ saturated hydrocarbylcarbonyl, $C_2$-$C_{20}$ saturated hydrocarbyloxycarbonyl, $C_2$-$C_{20}$ saturated hydrocarbylcarbonyloxy or $C_1$-$C_{20}$ saturated hydrocarbylsulfonyloxy group, which may contain fluorine, chlorine, bromine, hydroxy, amino or ether bond, or —N($R^{401A}$)($R^{401B}$), —N($R^{401C}$)—C(═O)—$R^{401D}$ or —N($R^{401C}$)—C(═O)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401D}$ is a $C_1$-$C_{16}$ aliphatic hydrocarbyl group, $C_6$-$C_{14}$ aryl group or $C_7$-$C_{15}$ aralkyl group, which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be the same or different when p and/or r is 2 or more. Of these, $R^{401}$ is preferably hydroxy. —N($R^{401C}$)—C(=O)—$R^{401D}$, —N($R^{401C}$)—C(=O)—O—$R^{401D}$, fluorine, chlorine, bromine, methyl or methoxy.

In formulae (5-1) and (5-2), $Rf^1$ to $Rf^4$ are each independently hydrogen, fluorine or trifluoromethyl, at least one of $Rf^1$ to $Rf^4$ is fluorine or trifluoromethyl. $Rf^1$ and $Rf^2$, taken together, may form a carbonyl group. Preferably, both $Rf^3$ and $Rf^4$ are fluorine.

$R^{402}$ to $R^{406}$ are each independently halogen or a $C_1$-$C_{20}$ hydrocarbyl group which may contain a heteroatom. The hydrocarbyl group may be saturated or unsaturated and straight, branched or cyclic. Examples thereof include those exemplified above for the hydrocarbyl groups $R^{101}$ to $R^{103}$ in formula (3). In these groups, some or all of the hydrogen atoms may be substituted by hydroxy, carboxy, halogen, cyano, nitro, mercapto, sultone, sulfone, or sulfonium salt-containing moieties, and some carbon may be replaced by an ether bond, ester bond, carbonyl moiety, amide bond, carbonate moiety or sulfonic acid ester bond. $R^{402}$ and $R^{403}$ may bond together to form a ring with the sulfur atom to which they are attached. Exemplary rings are the same as described above for the ring that $R^{101}$ and $R^{102}$ in formula (3), taken together, form with the sulfur atom to which they are attached.

Examples of the cation in the sulfonium salt having formula (5-1) include those exemplified above as the cation in the sulfonium salt having formula (3). Examples of the cation in the iodonium salt having formula (5-2) are shown below, but not limited thereto.

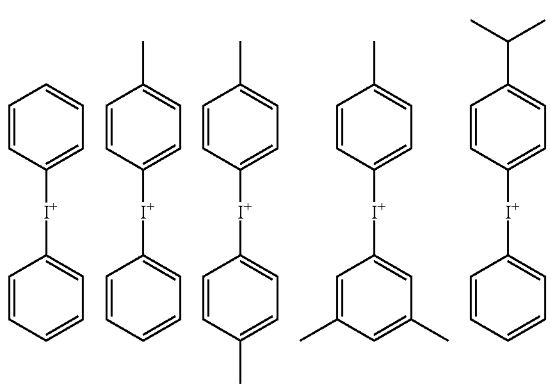

-continued

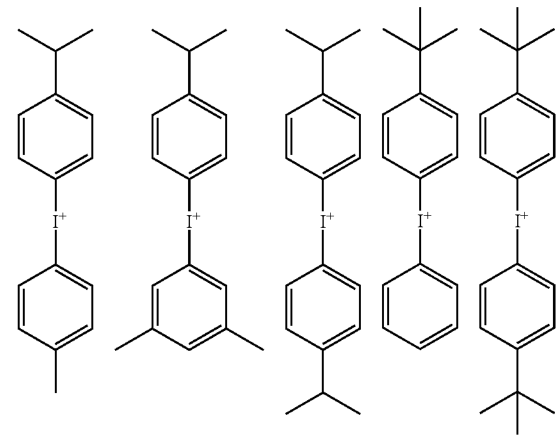

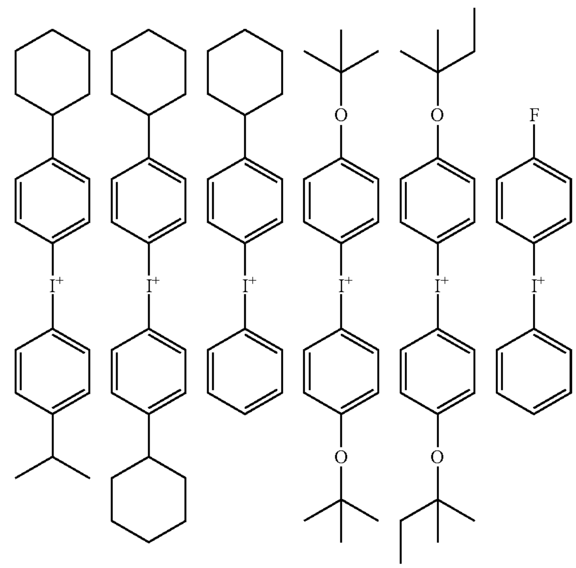

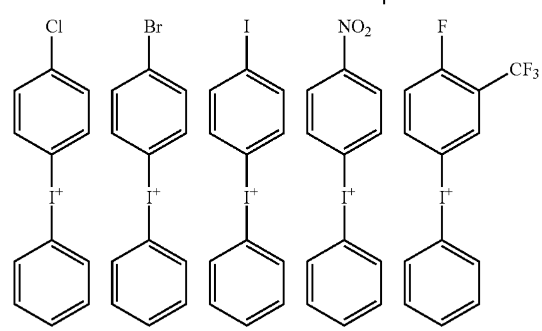

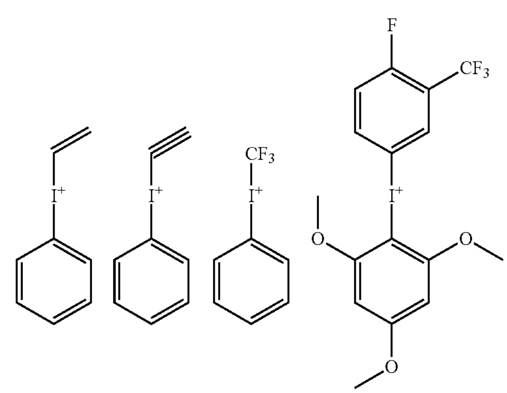

-continued
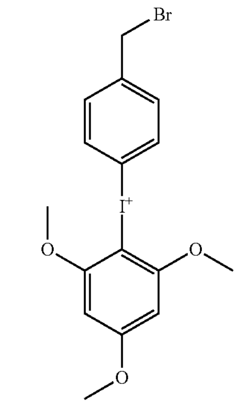
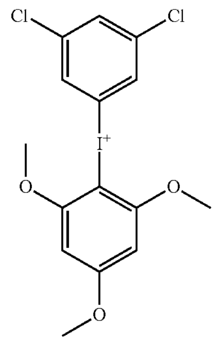
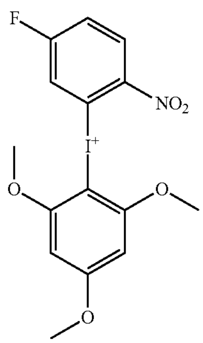
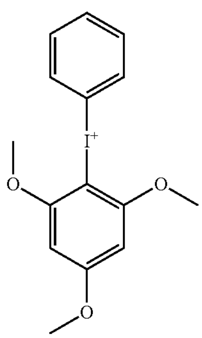
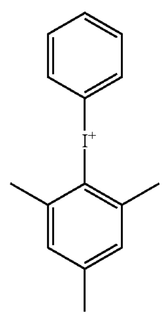
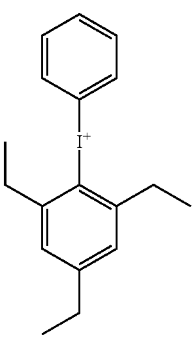
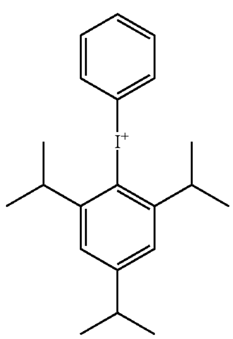
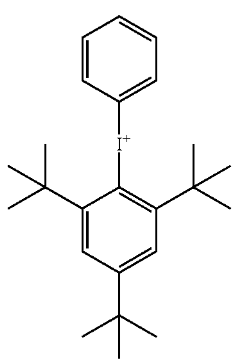
Examples of the anion in the onium salts having formulae (5-1) and (5-2) are shown below, but not limited thereto. Herein $X^{BI}$ is as defined above.
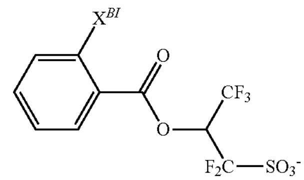
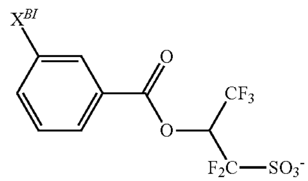
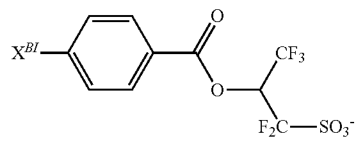
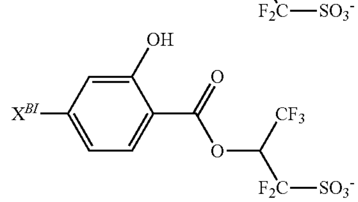
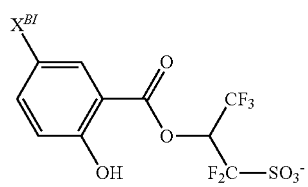
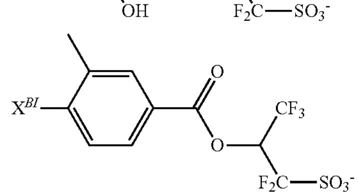
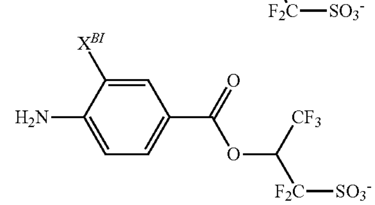
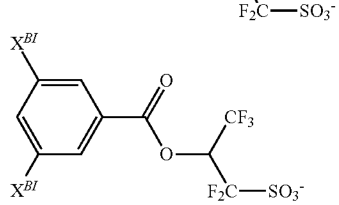
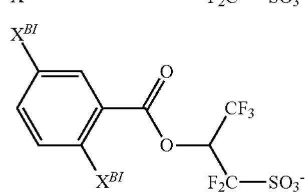
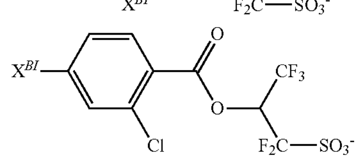

-continued
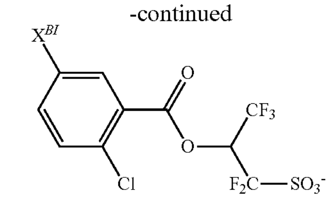
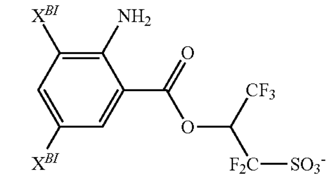
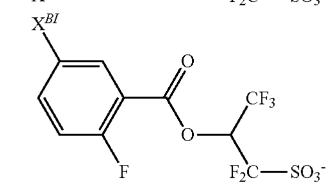
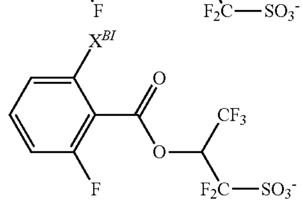
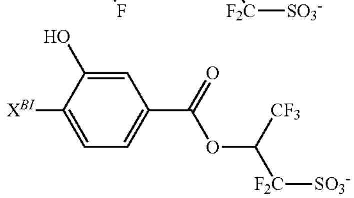
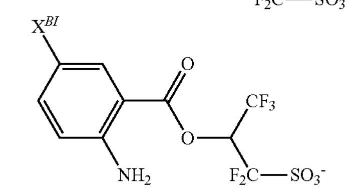
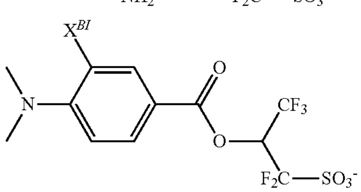
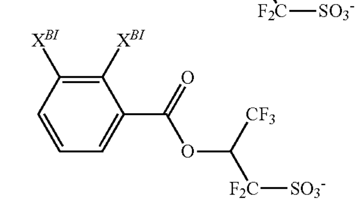
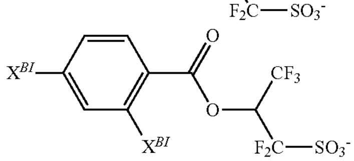
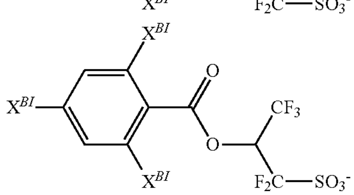
-continued
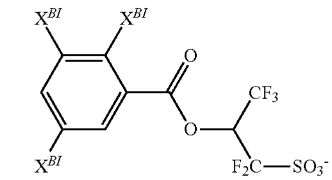
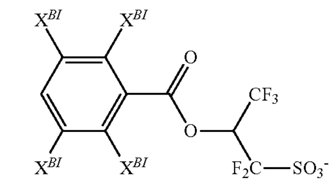
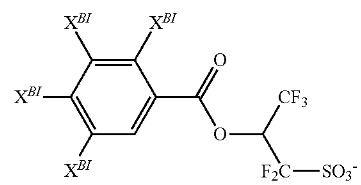
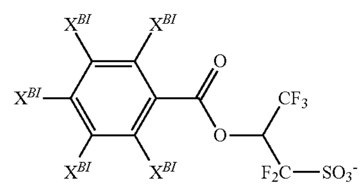
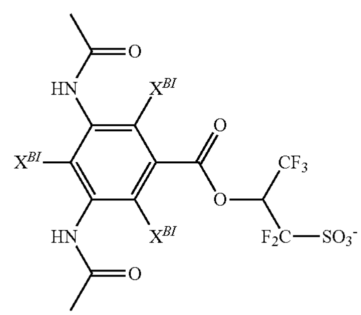
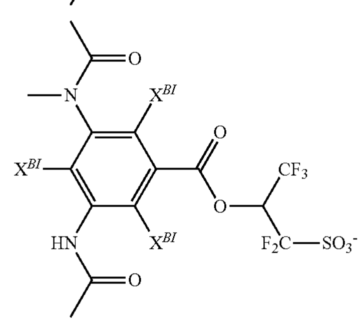
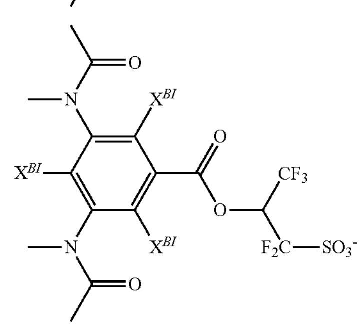

-continued
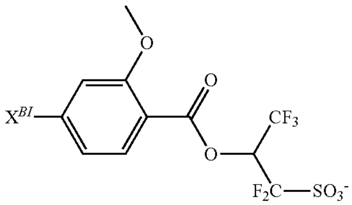
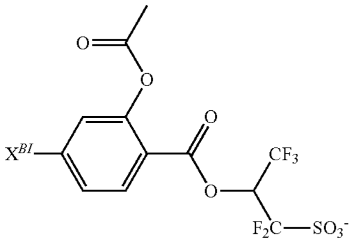
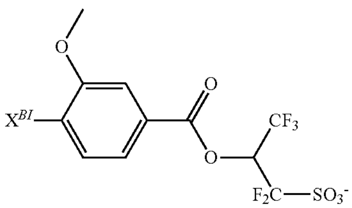
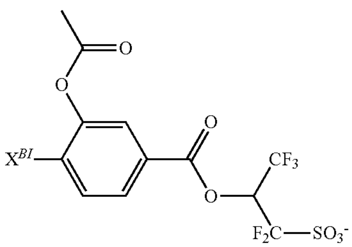
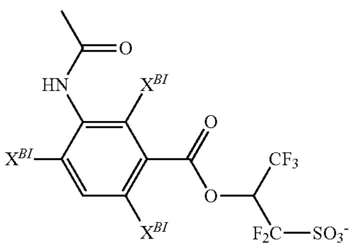
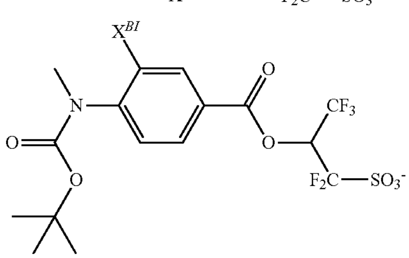
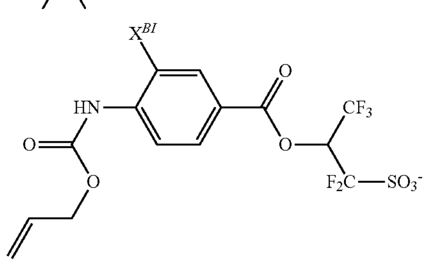
-continued
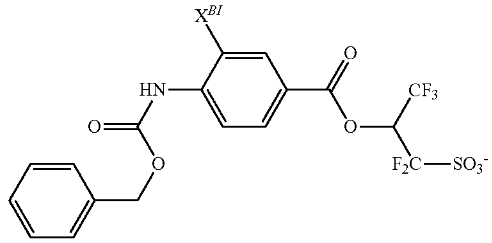
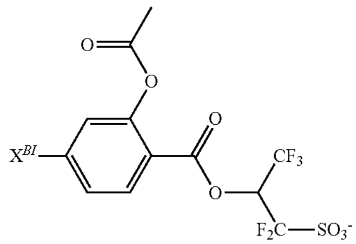
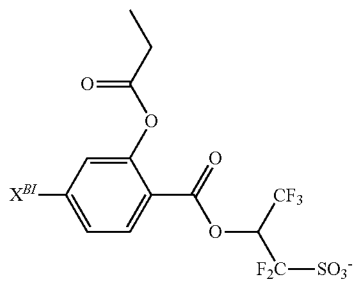
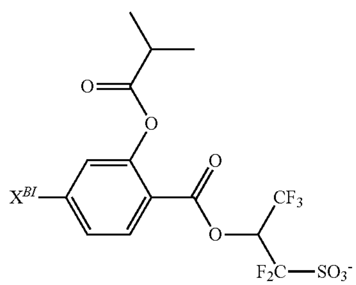
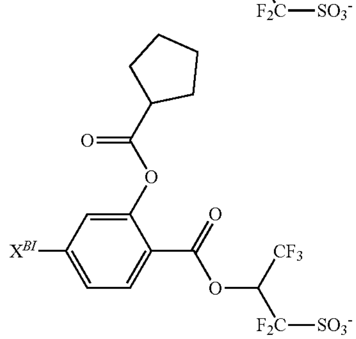
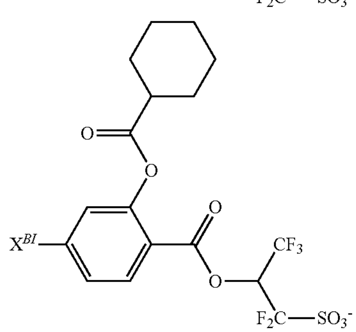

-continued
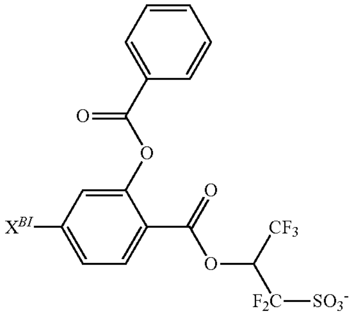
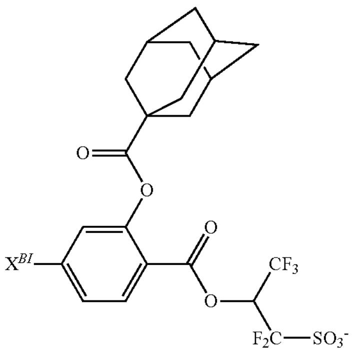
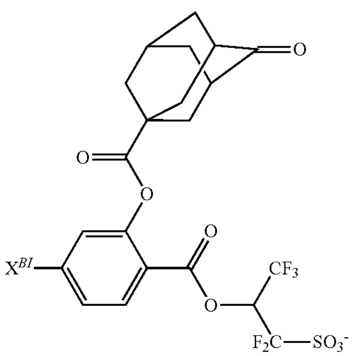
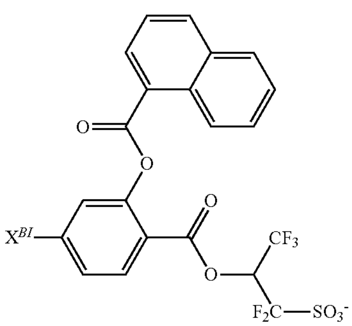
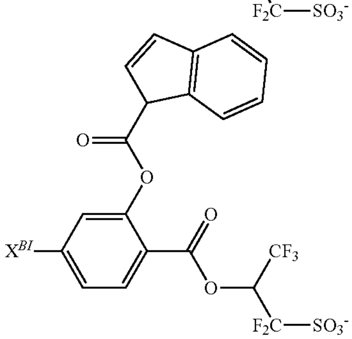
-continued
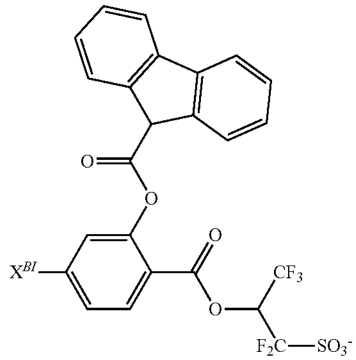
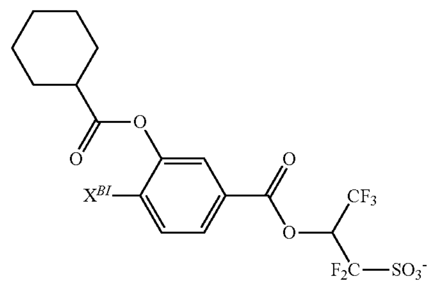
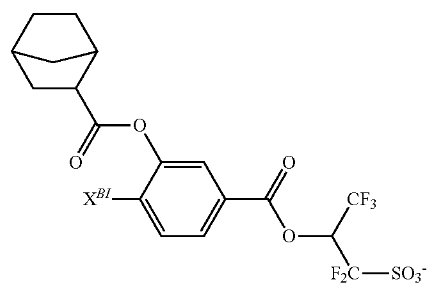
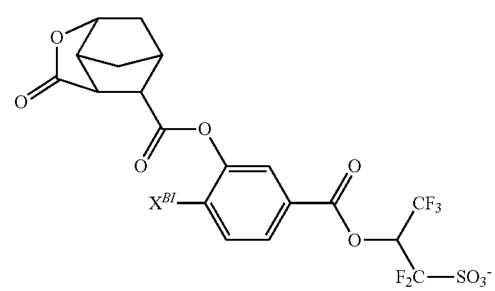
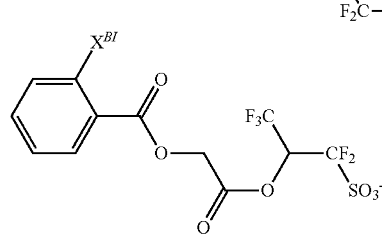
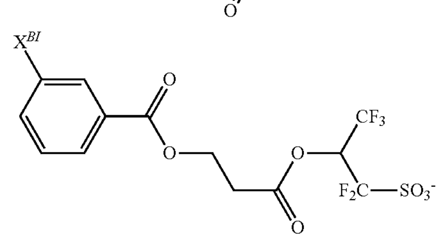

-continued
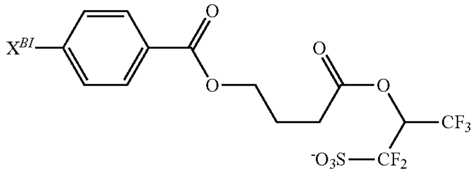
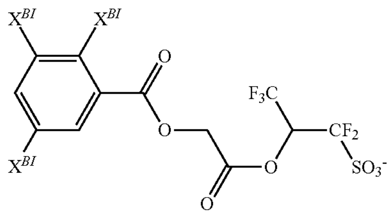
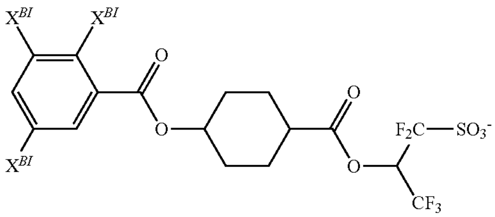
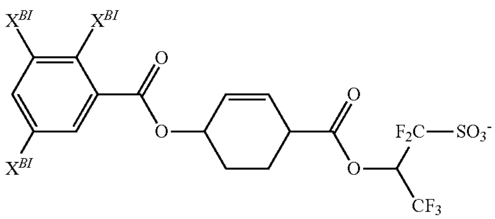
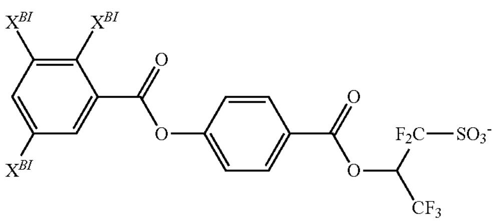
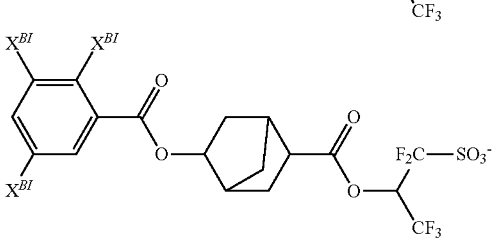
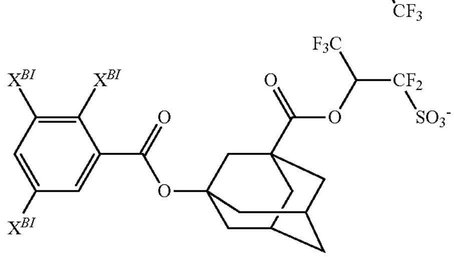
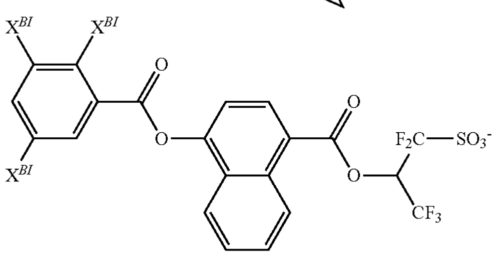
-continued
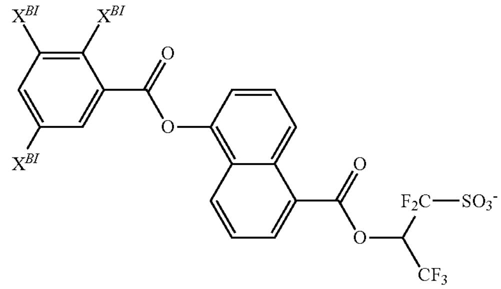
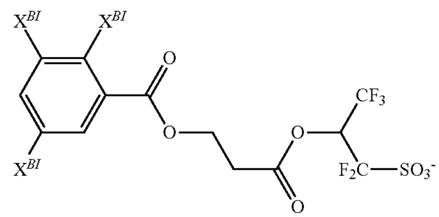
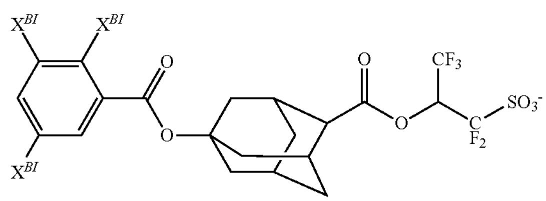
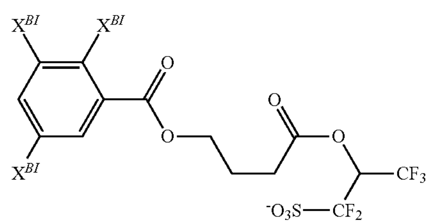
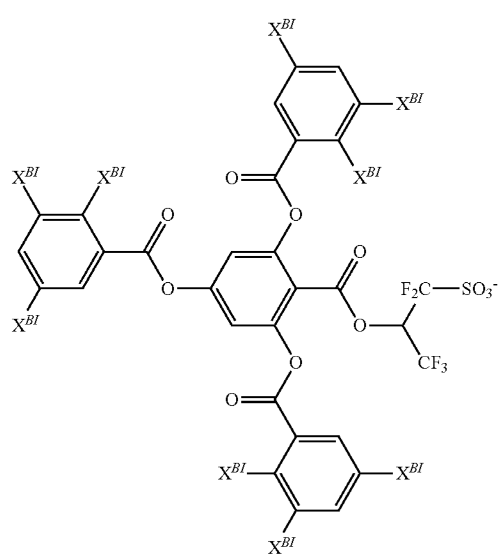

-continued
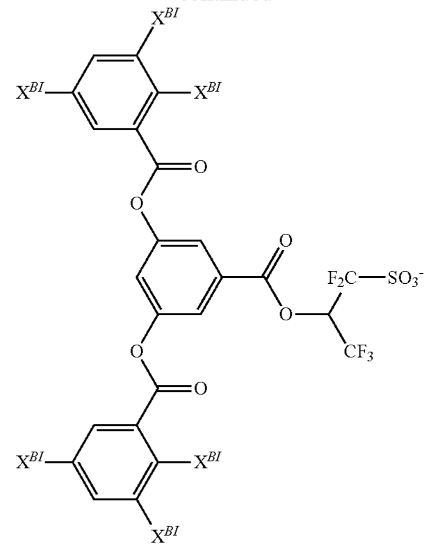
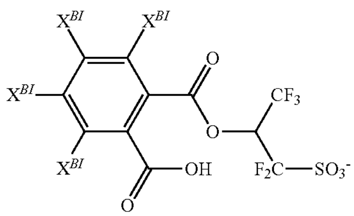
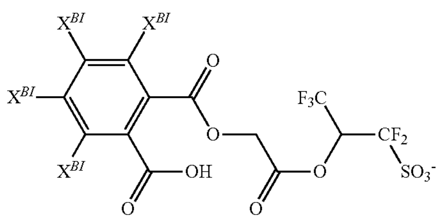
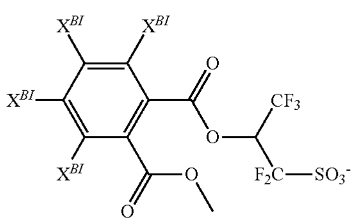
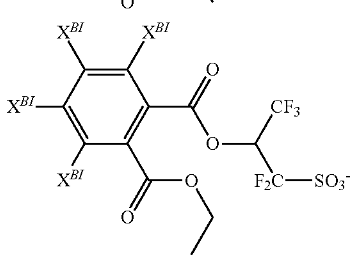
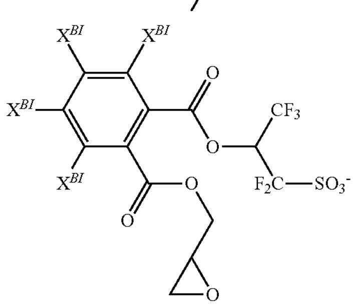
-continued
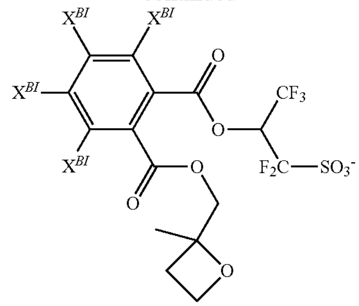
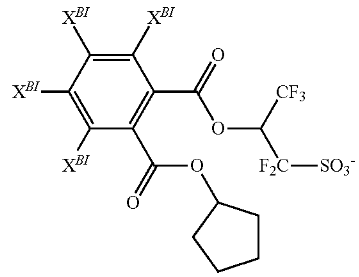
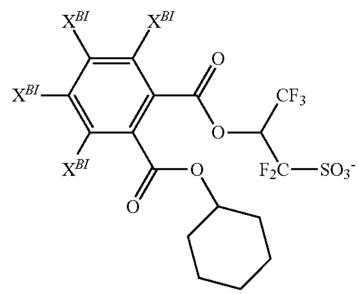
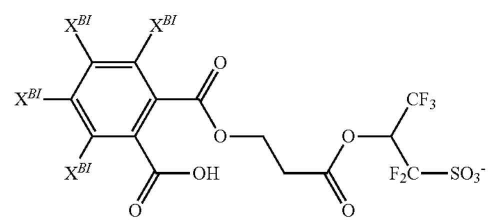
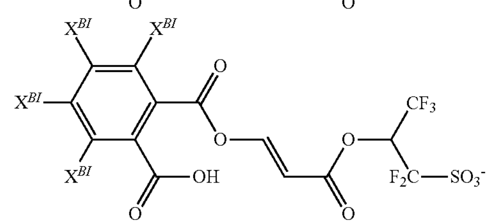
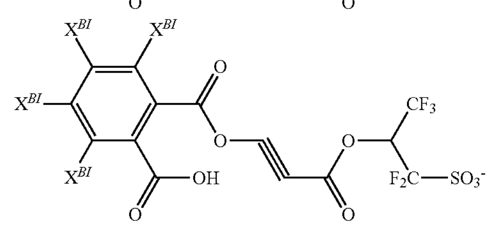
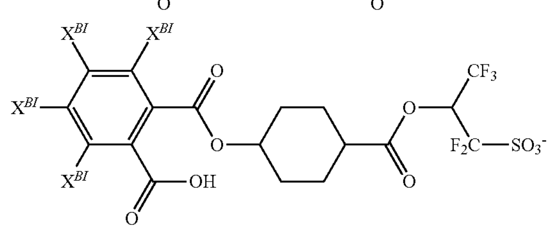

-continued
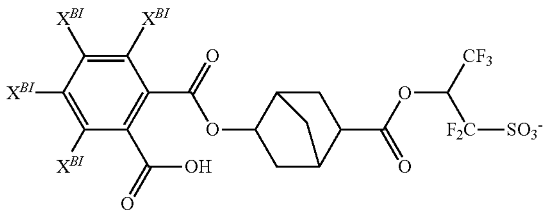
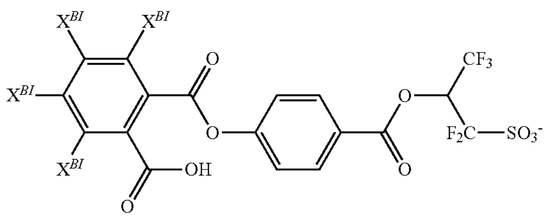
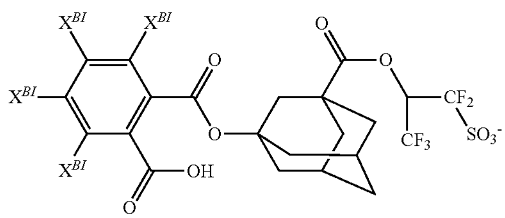
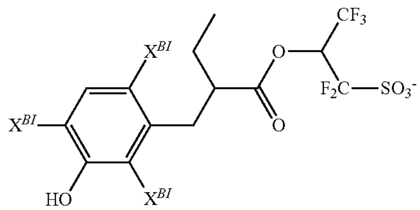
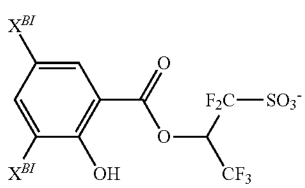
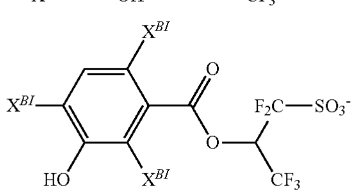
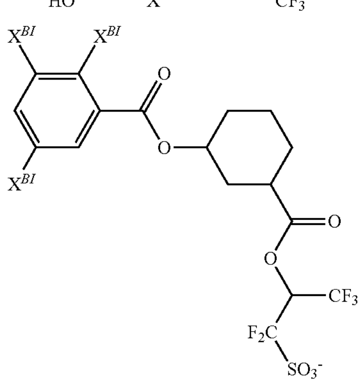
-continued
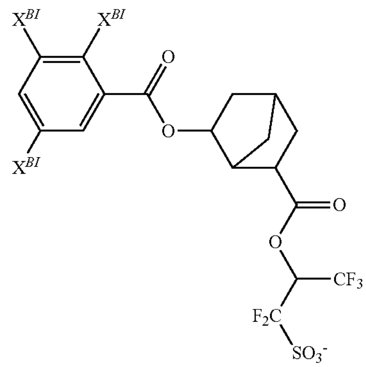
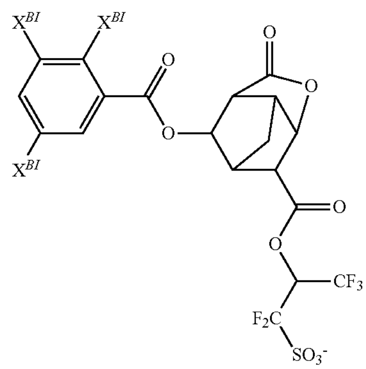
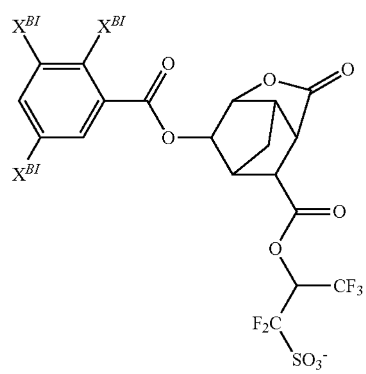
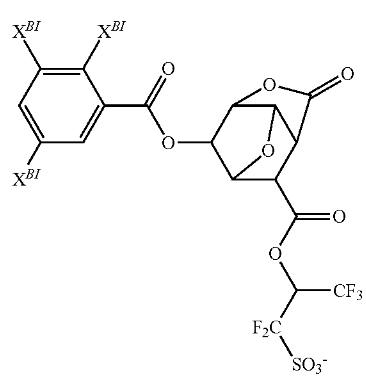

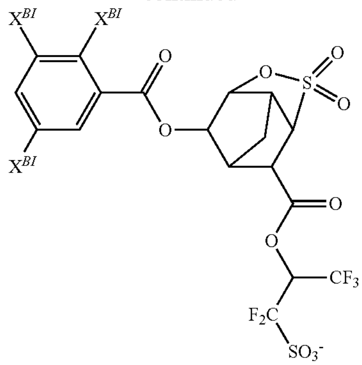
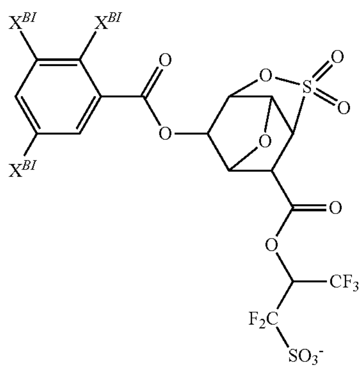
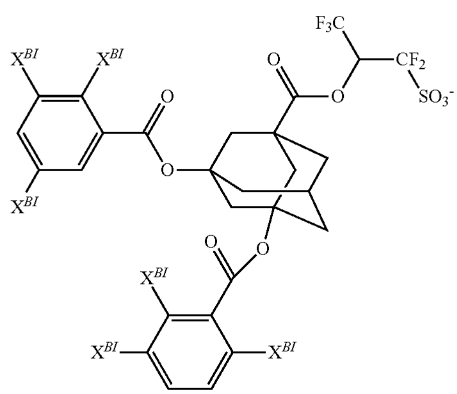
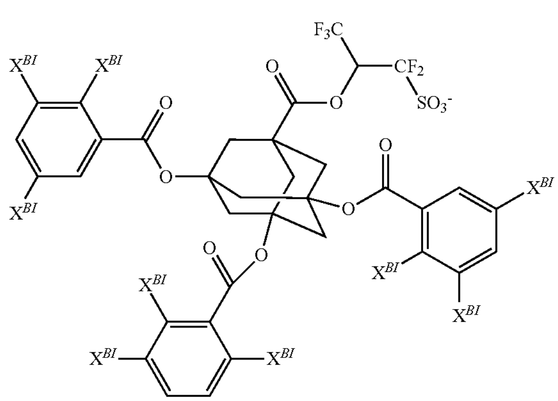
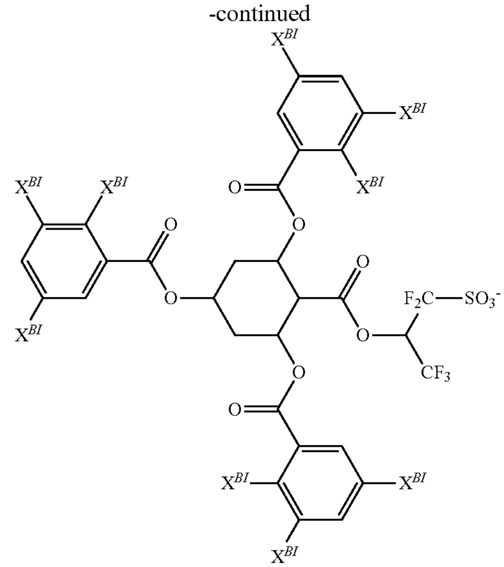
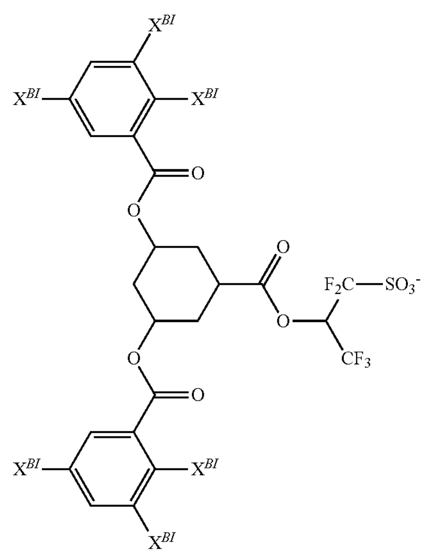
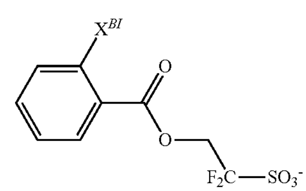
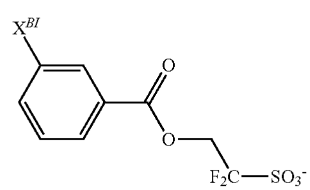
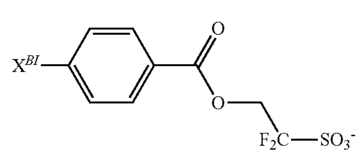

-continued
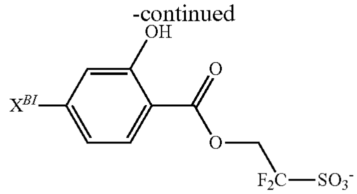
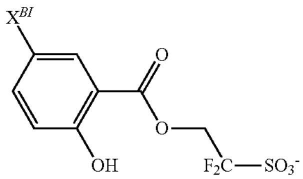
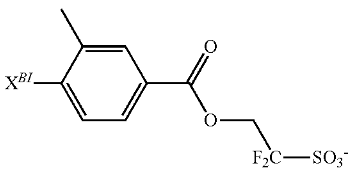
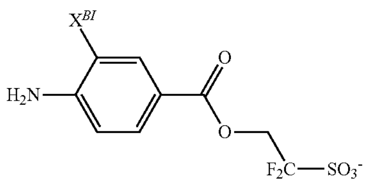
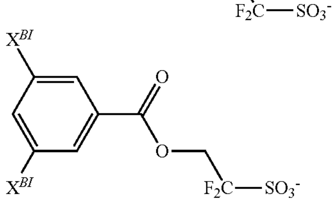
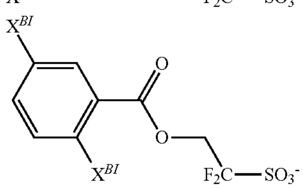
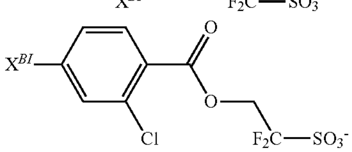
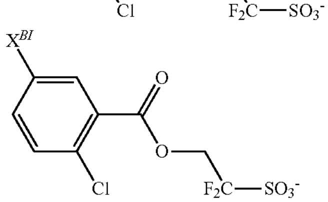
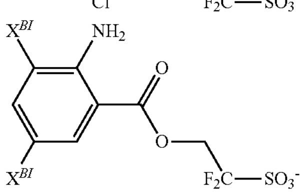
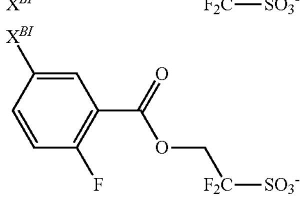
-continued
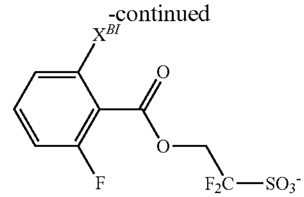
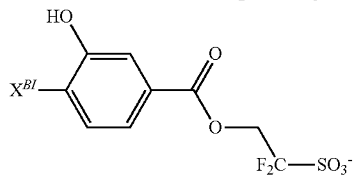
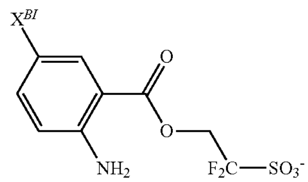
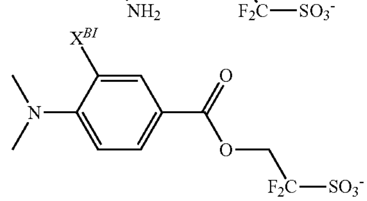
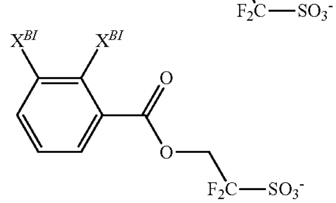
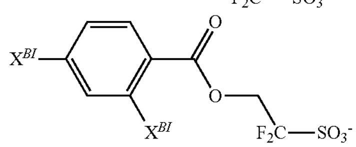
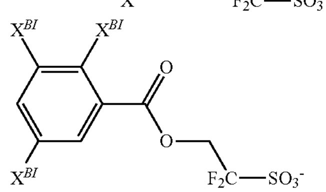
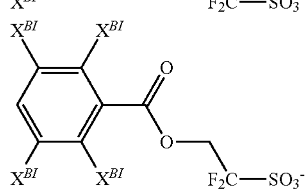
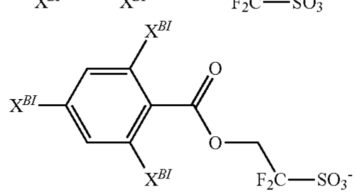
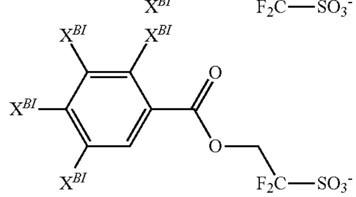

-continued
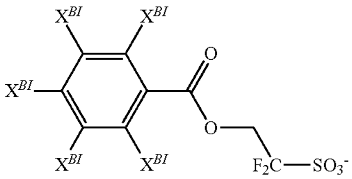
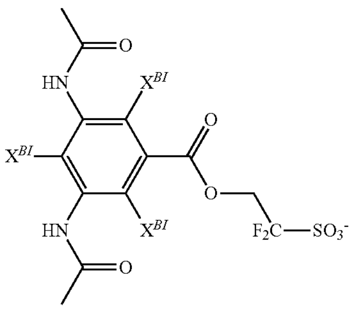
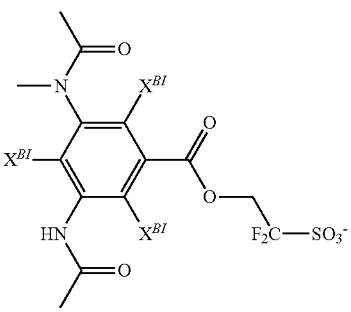
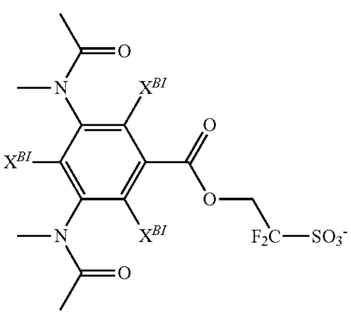
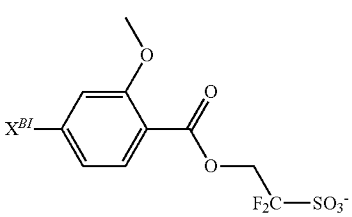
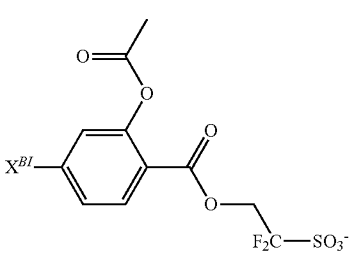
-continued
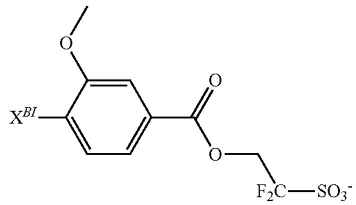
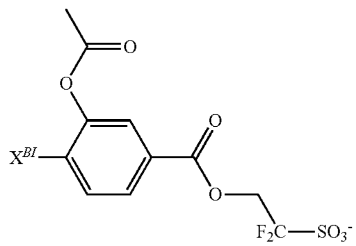
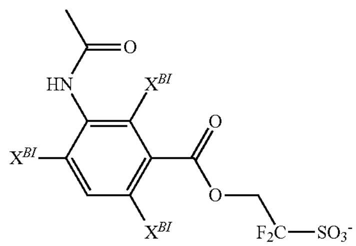
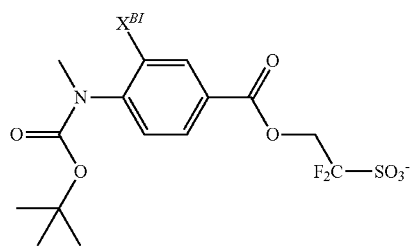
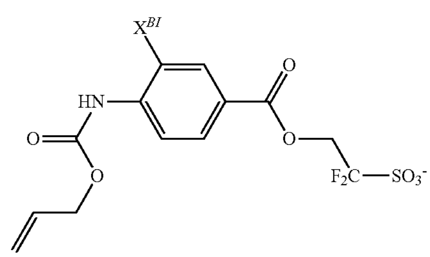
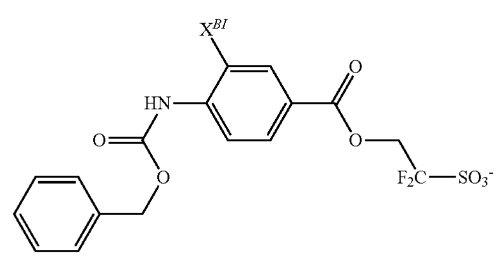

-continued
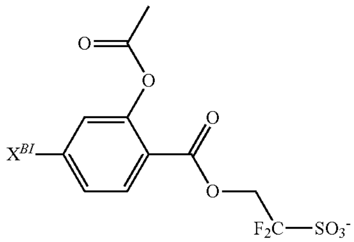
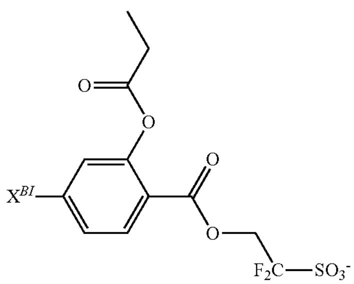
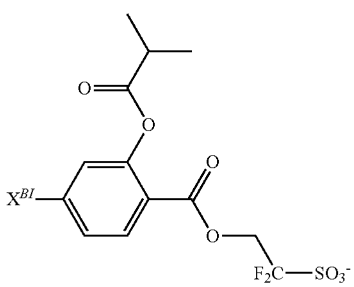
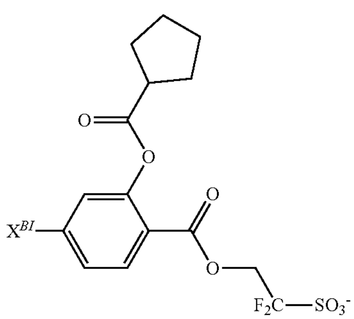
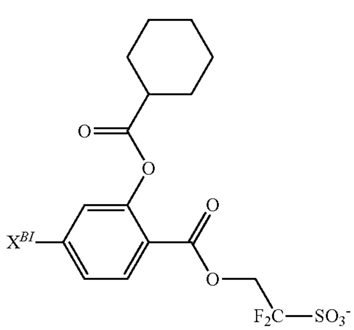
-continued
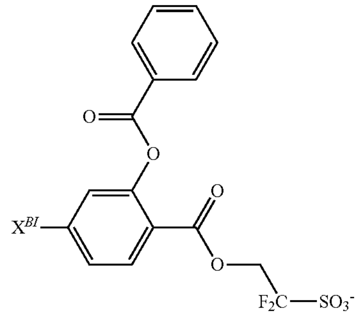
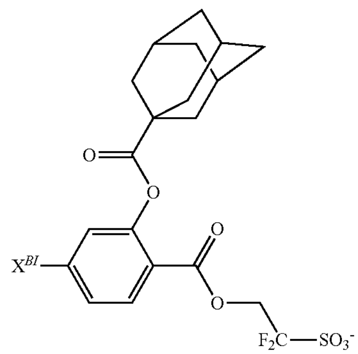
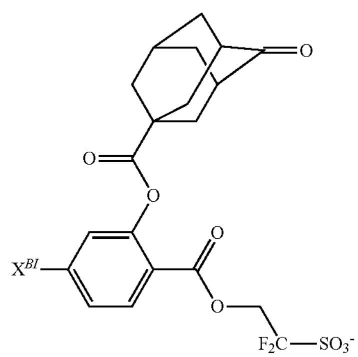
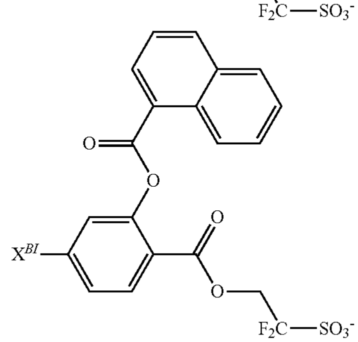
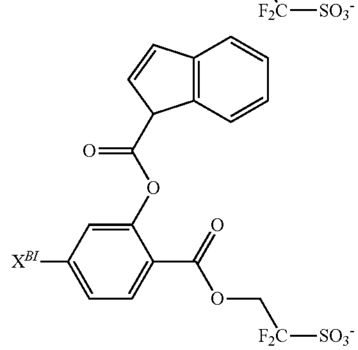

-continued
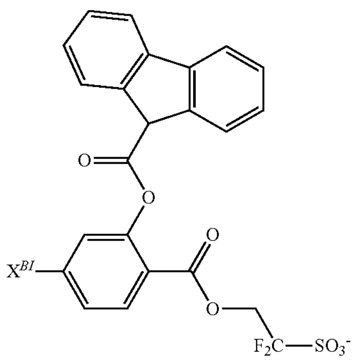
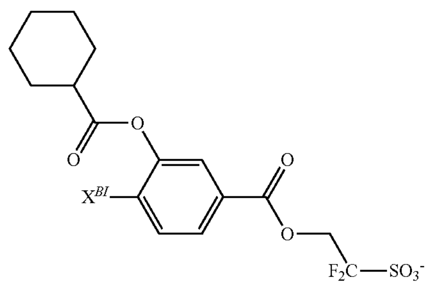
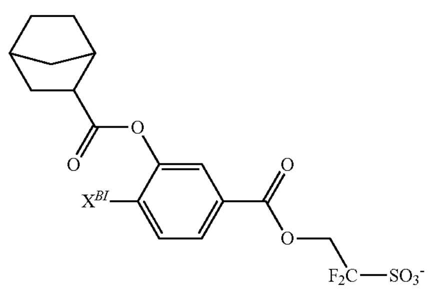
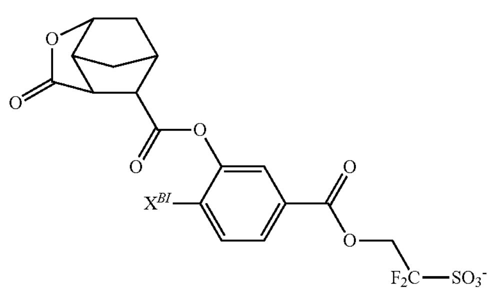
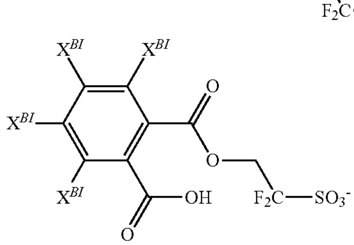
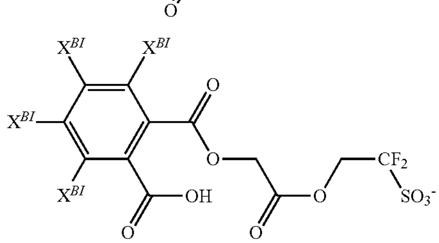
-continued
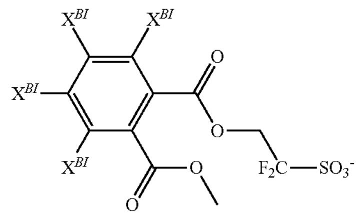
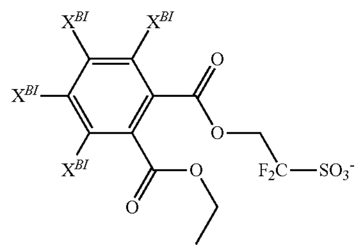
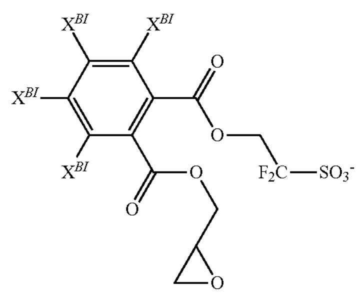
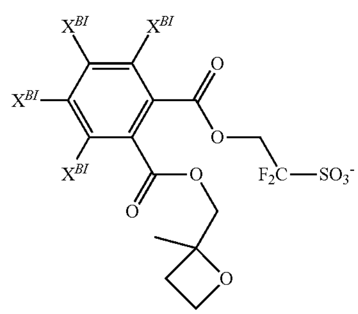
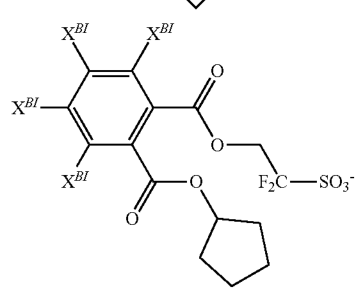
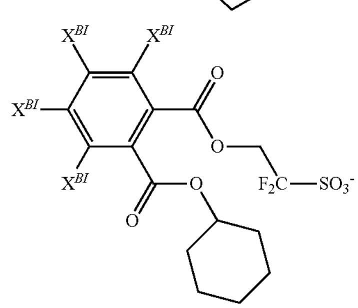

-continued
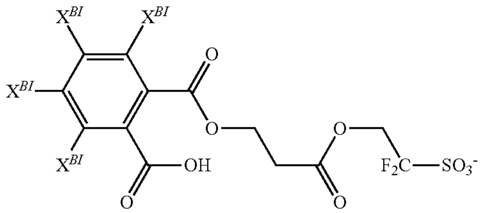
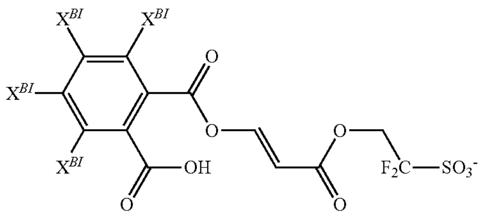
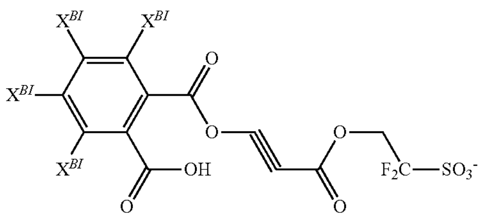
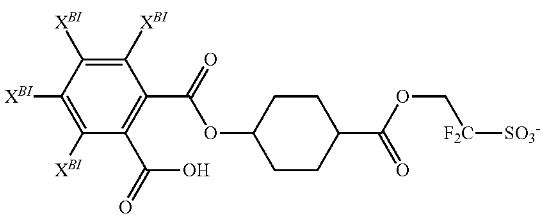
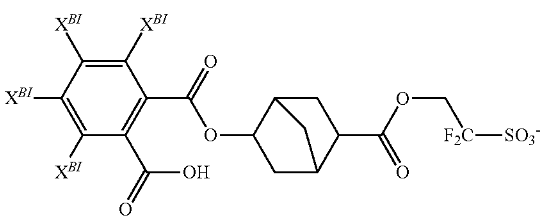
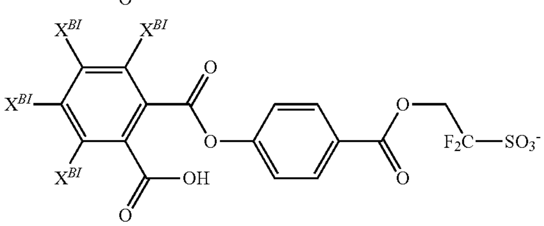
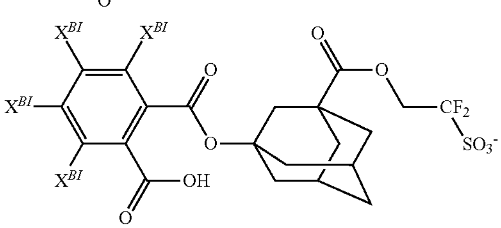
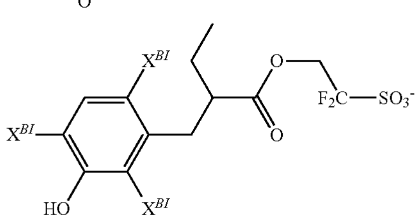
-continued
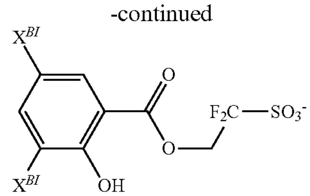
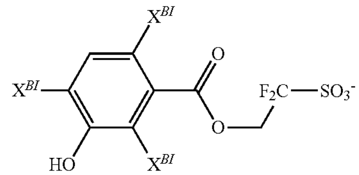
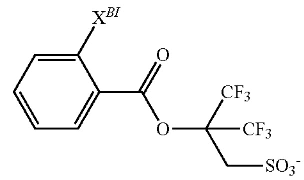
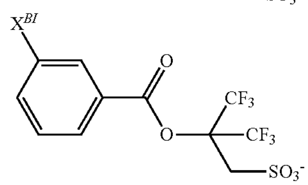
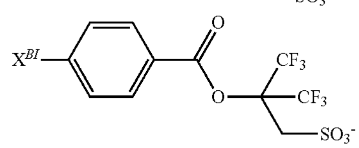
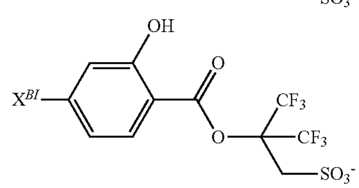
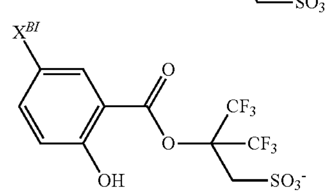
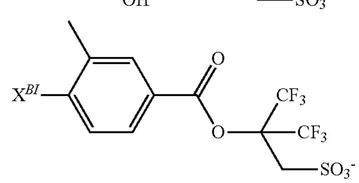
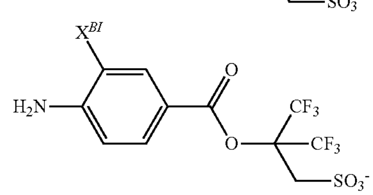
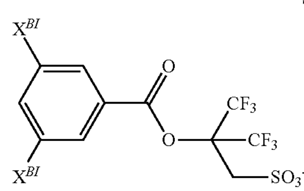

-continued
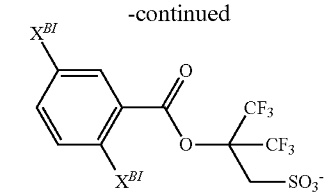
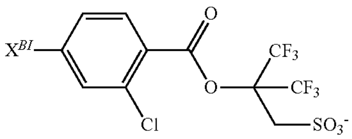
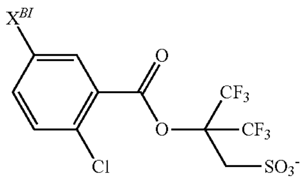
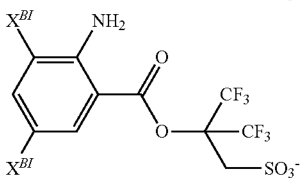
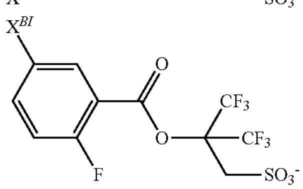
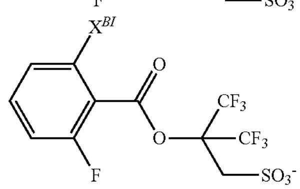
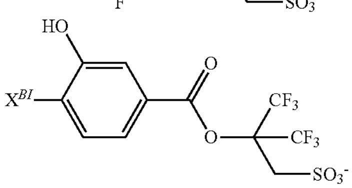
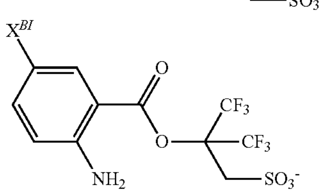
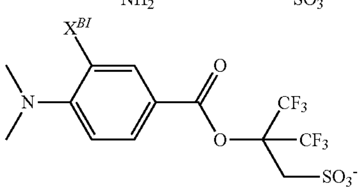
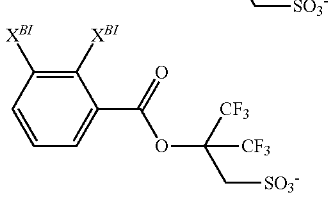
-continued
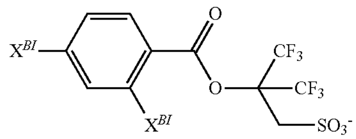
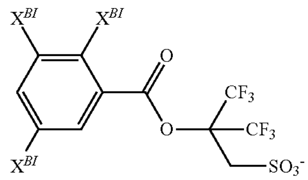
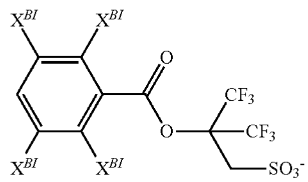
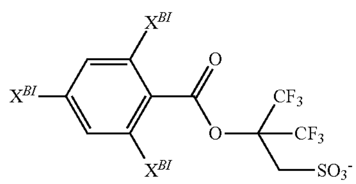
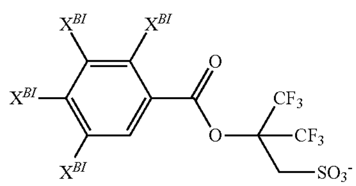
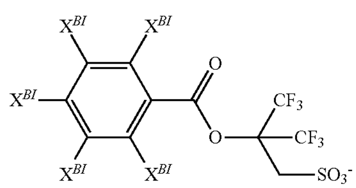
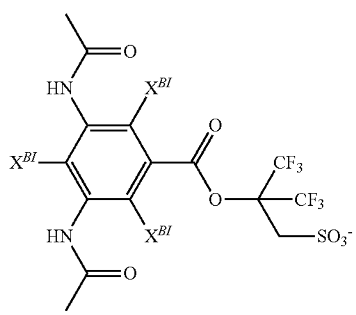
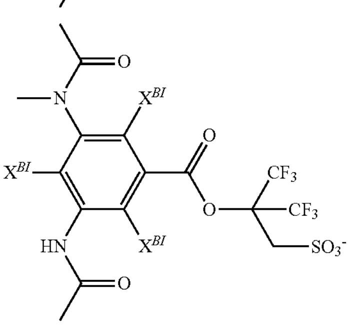

-continued
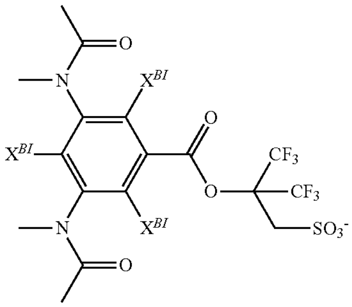
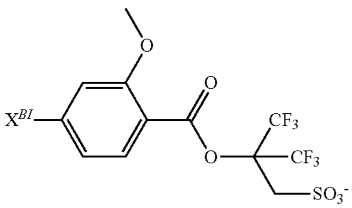
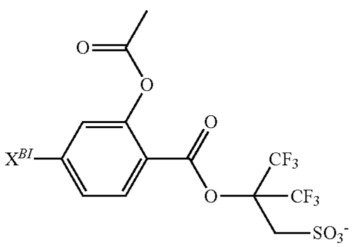
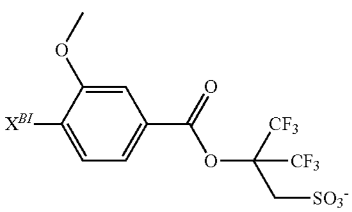
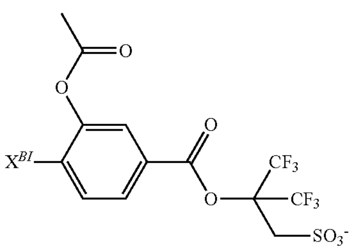
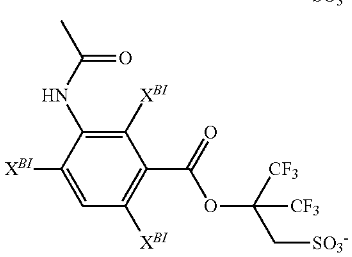
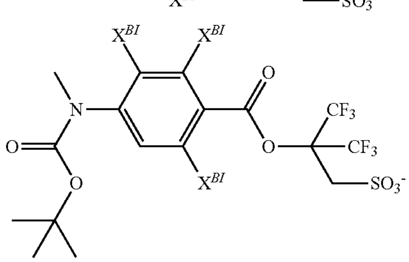
-continued
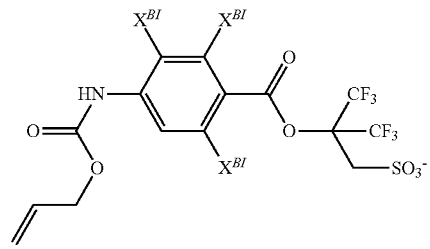
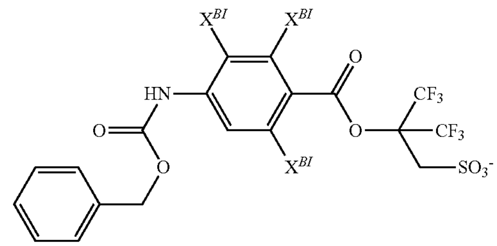
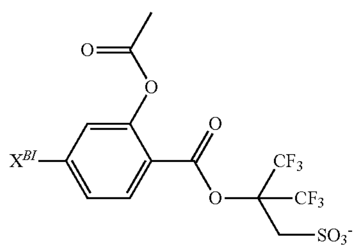
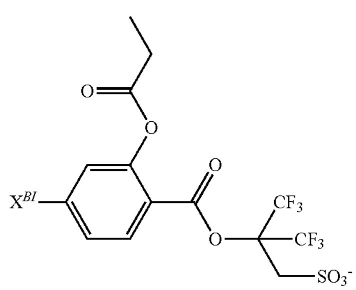
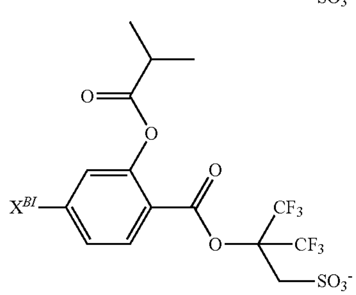
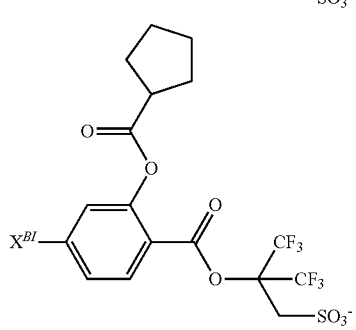

-continued
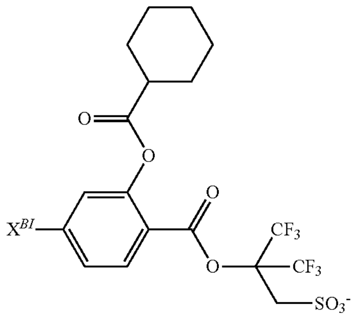
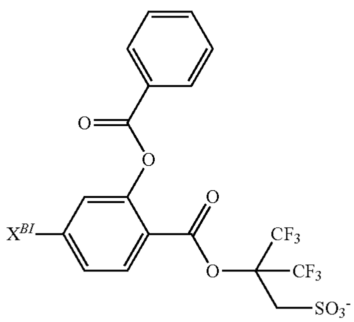
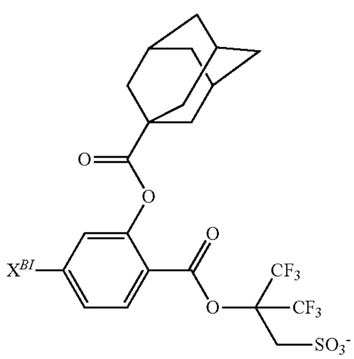
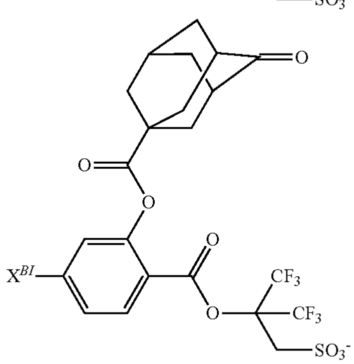
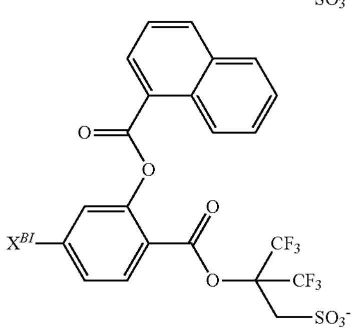
-continued
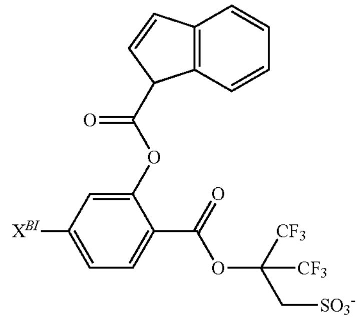
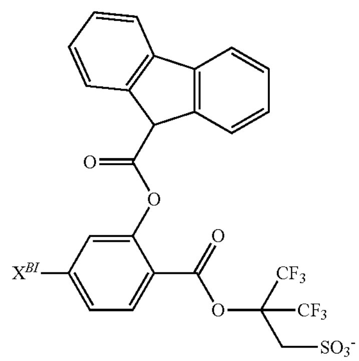
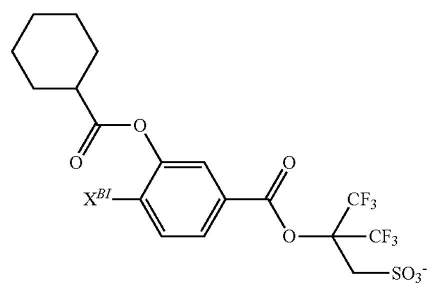
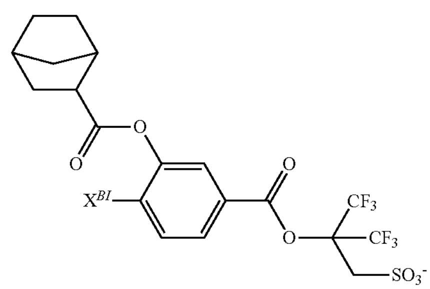
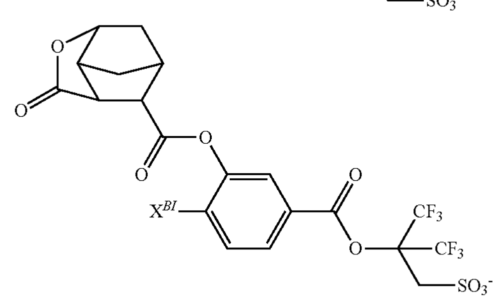
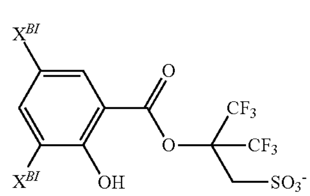

-continued
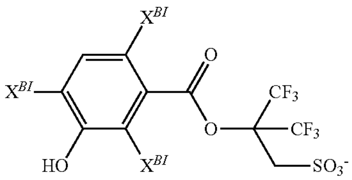
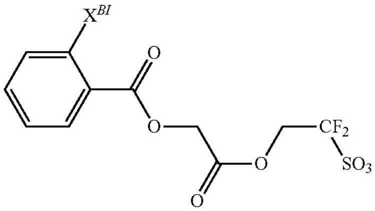
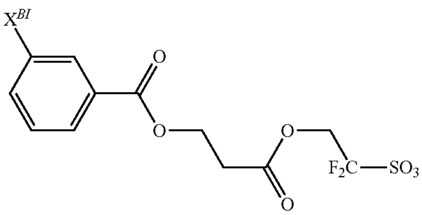
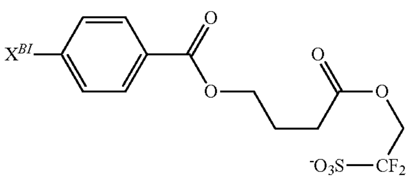
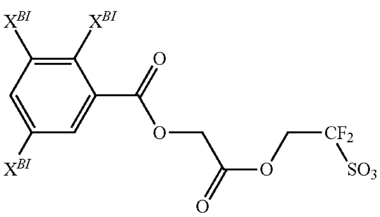
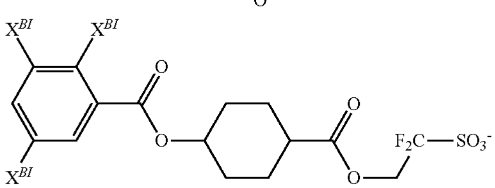
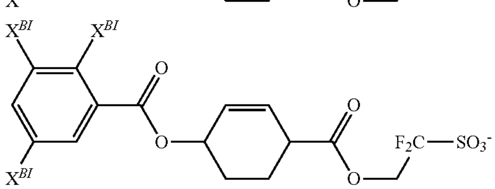
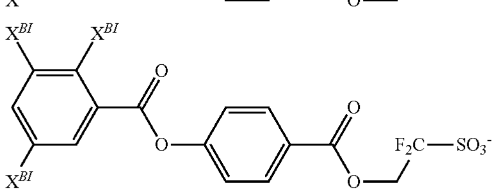
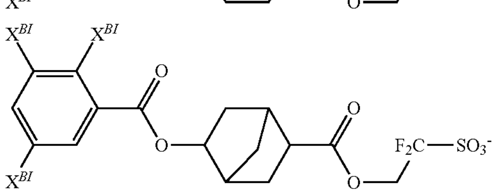
-continued
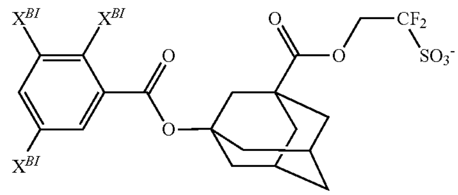
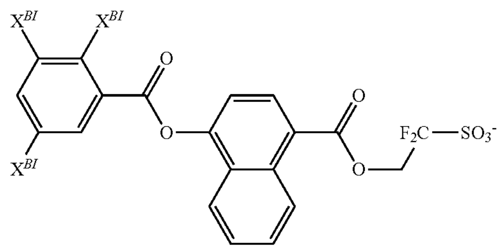
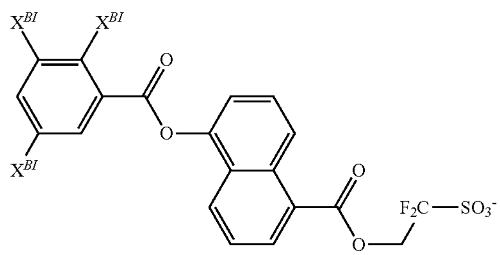
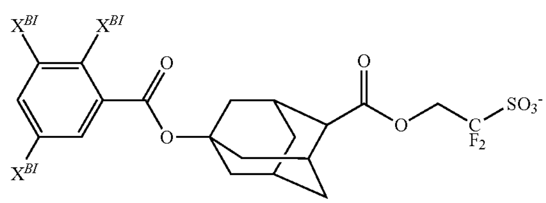
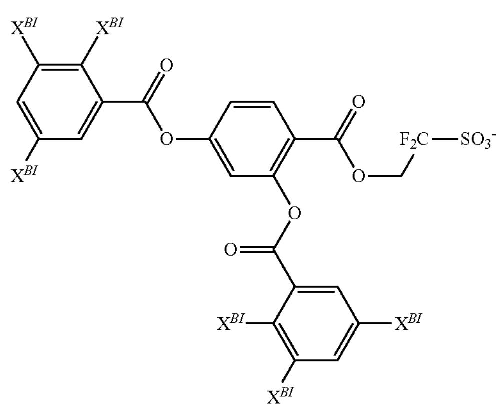

-continued
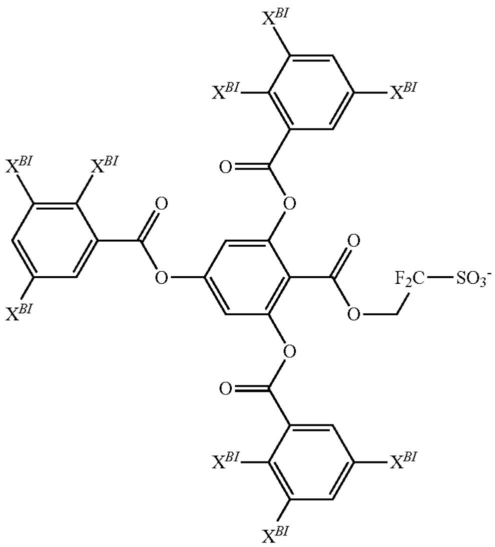
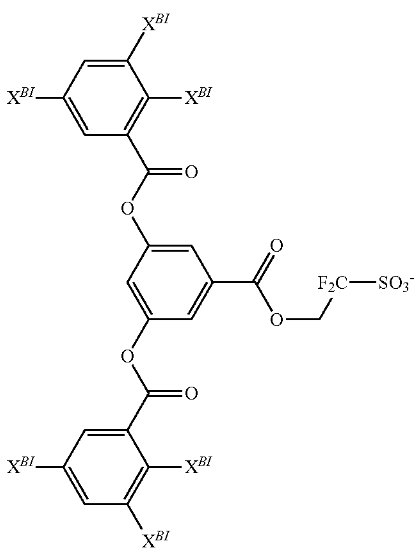
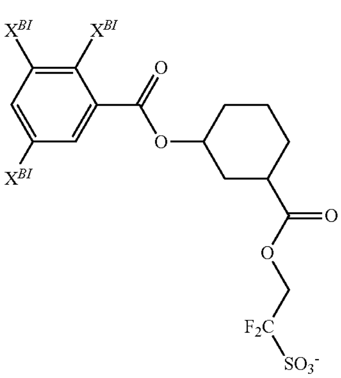
-continued
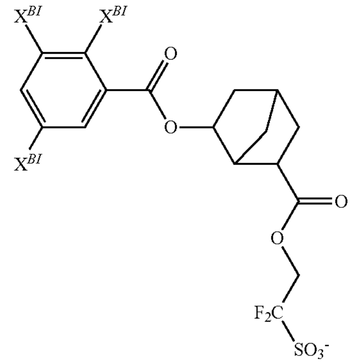
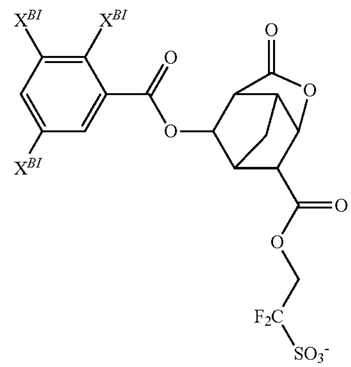
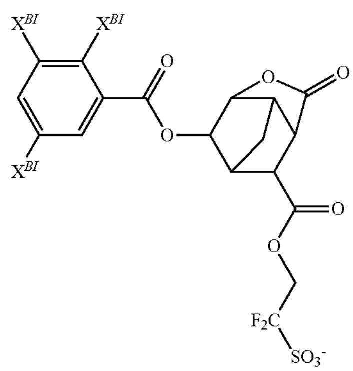
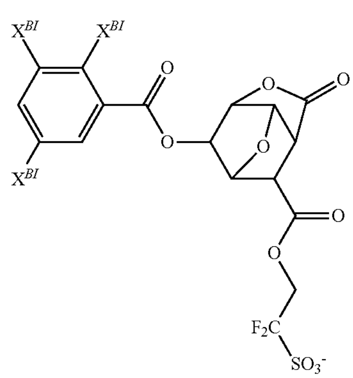

-continued
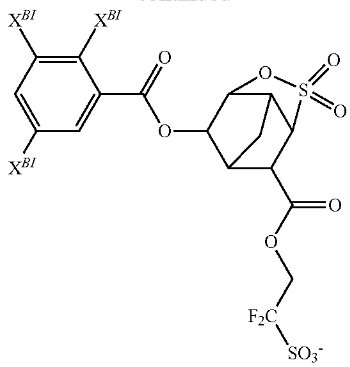
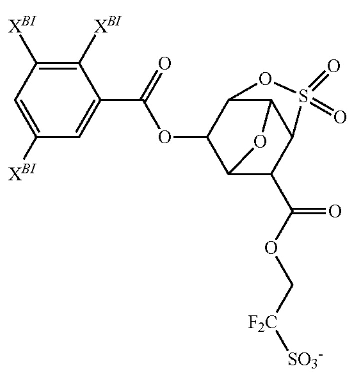
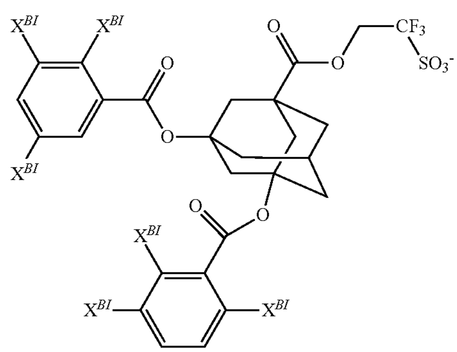
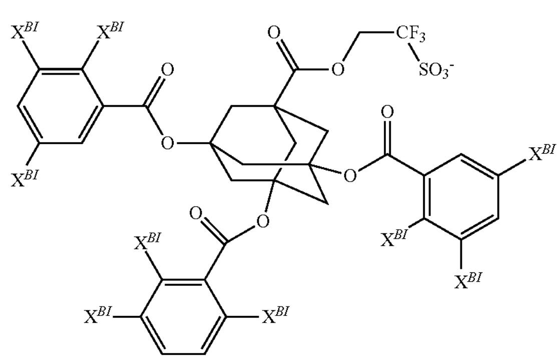
-continued
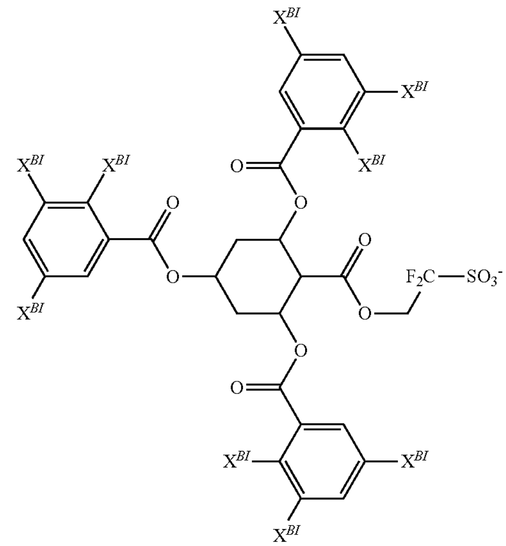
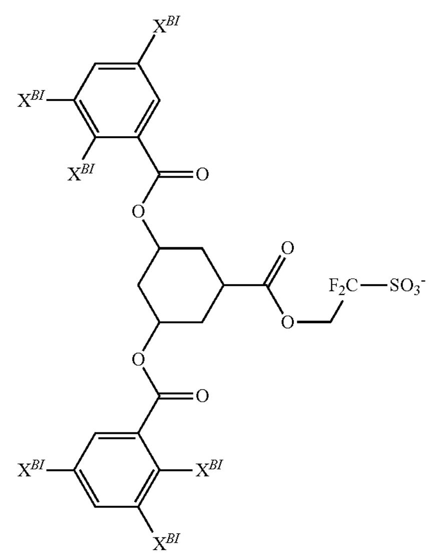
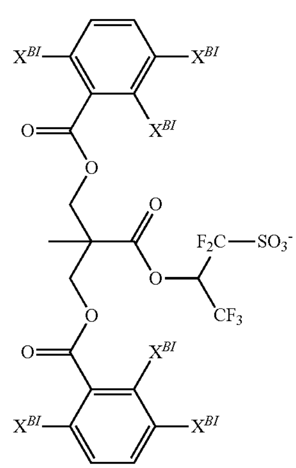
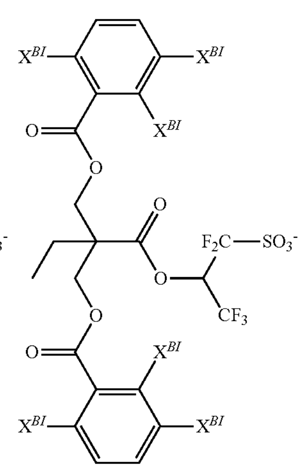

-continued
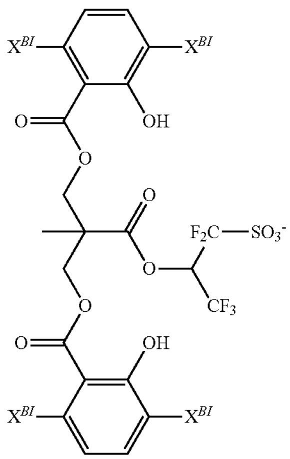
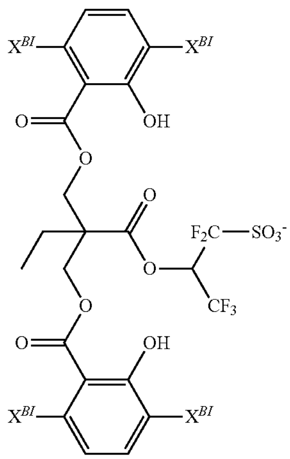
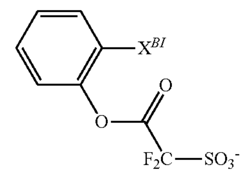
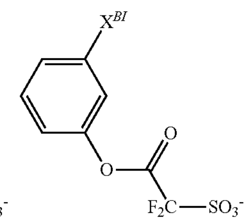
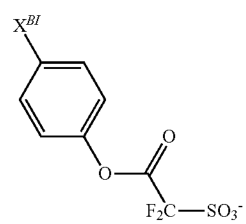
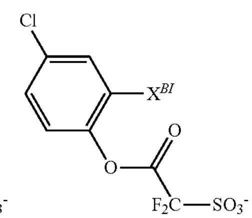
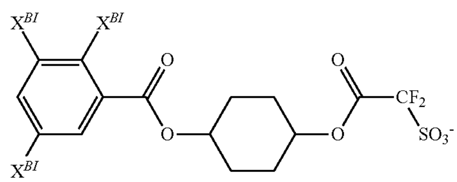
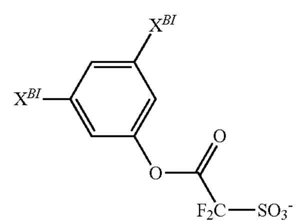
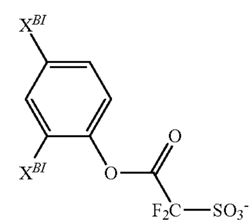
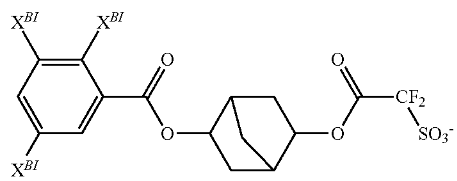
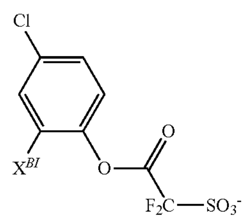
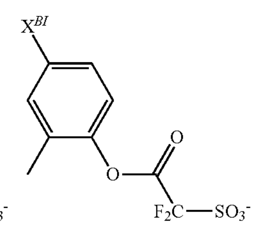
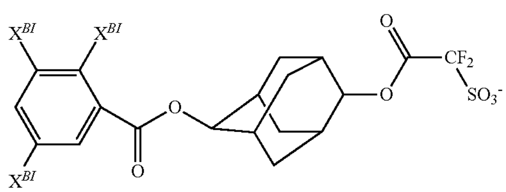
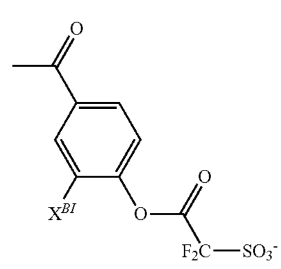
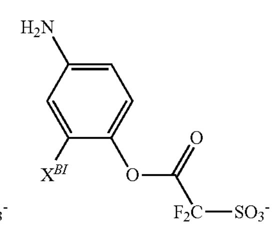
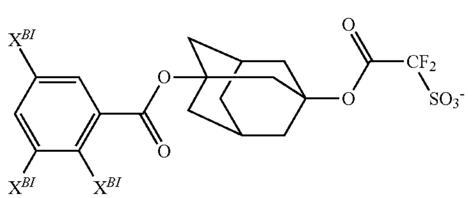
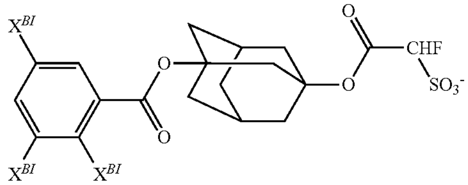
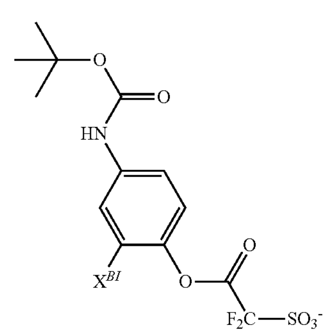
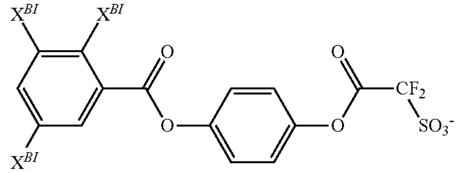

-continued
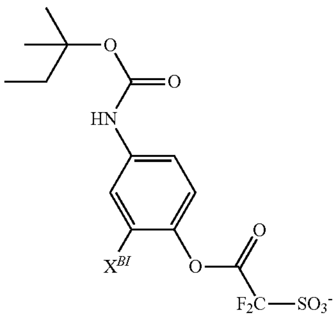
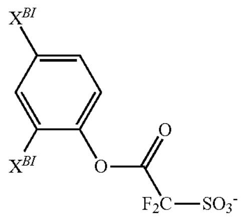
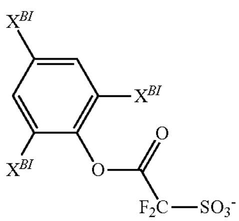
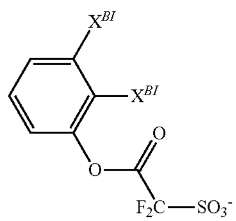
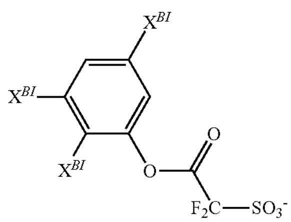
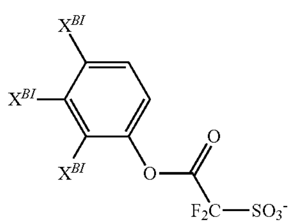
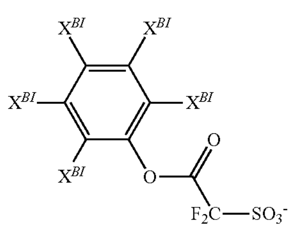
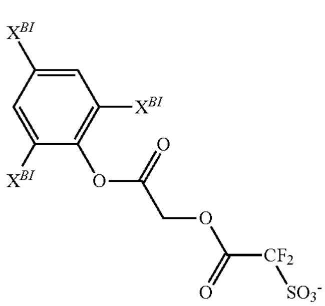
-continued
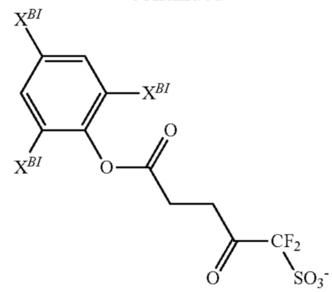
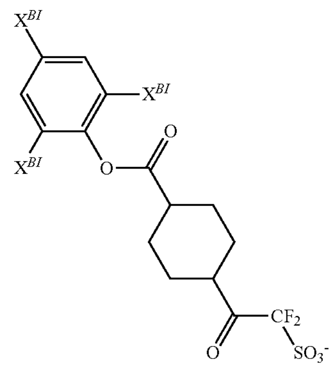
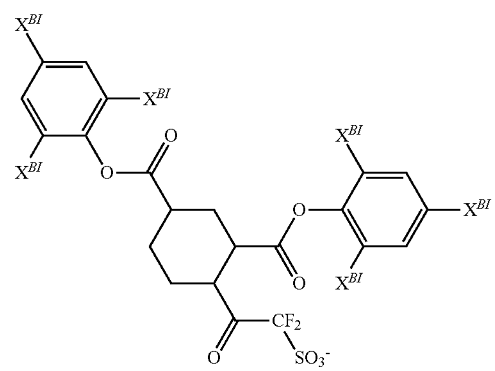
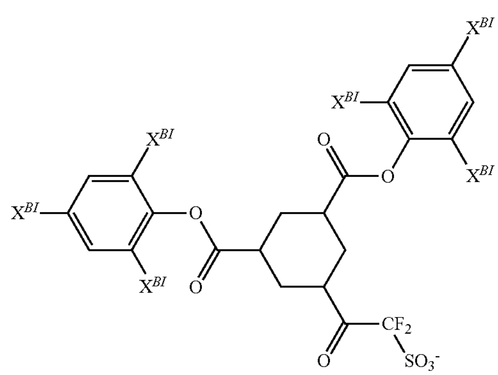
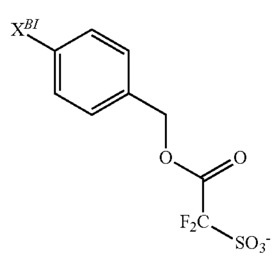
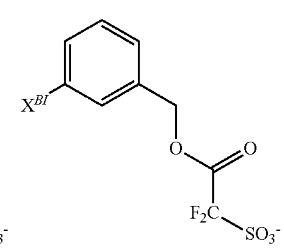

-continued
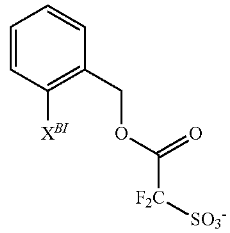
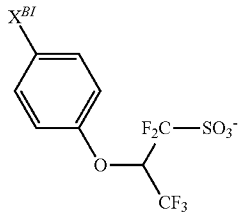
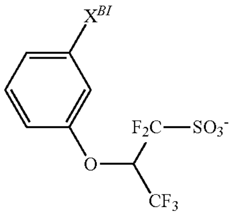
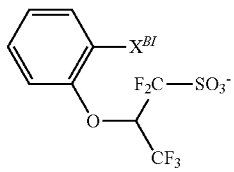
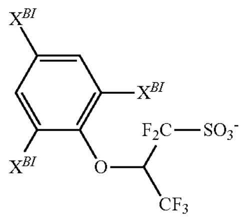
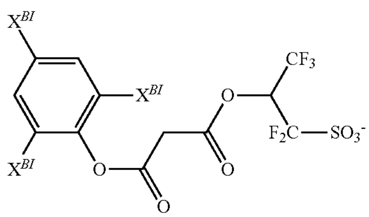
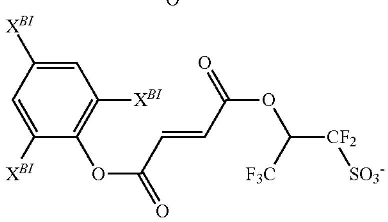
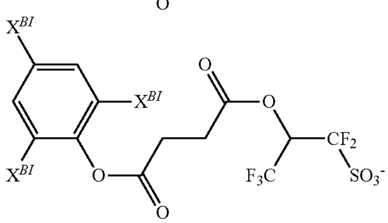
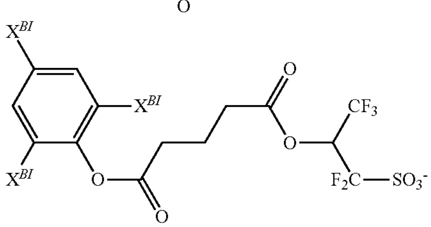
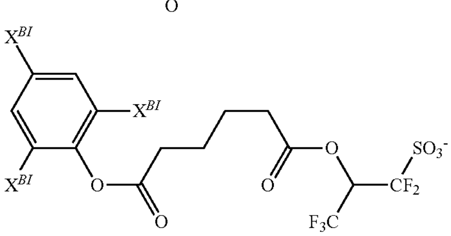
-continued
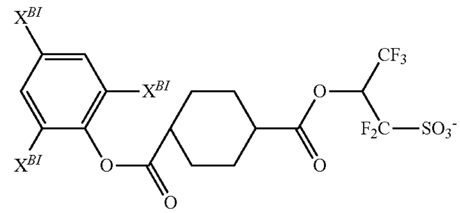
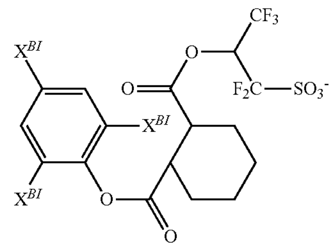
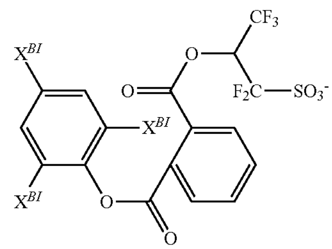
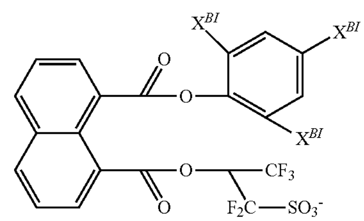
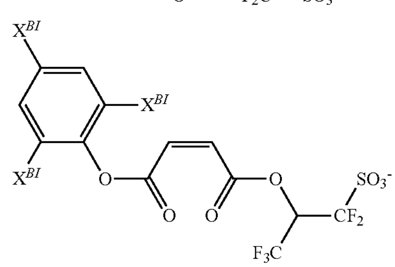
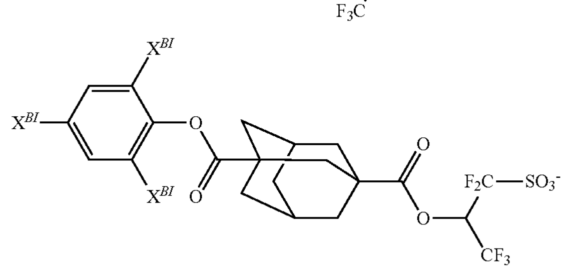
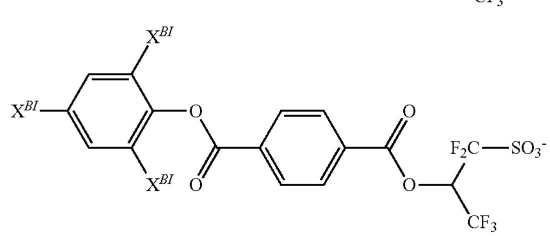

-continued
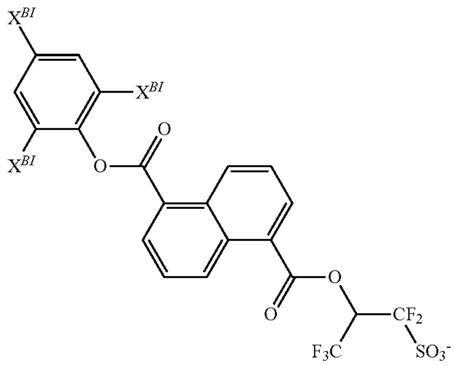
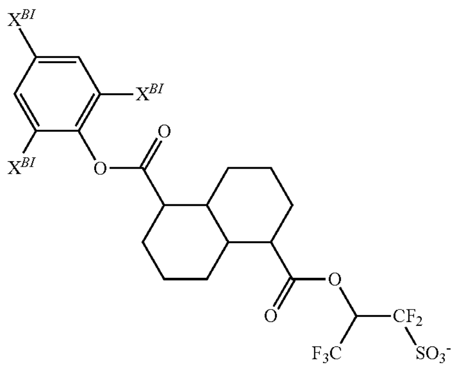
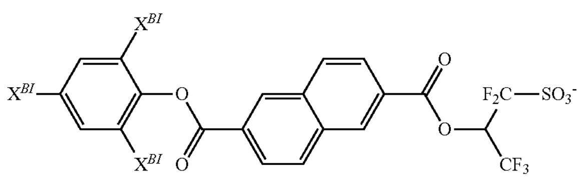
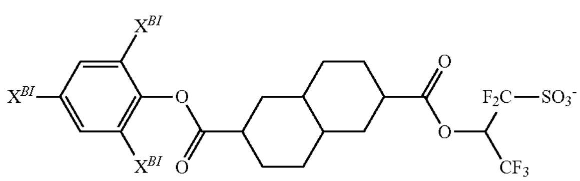
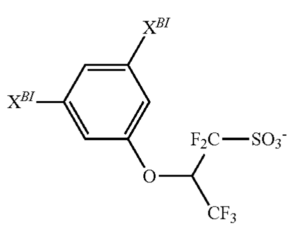
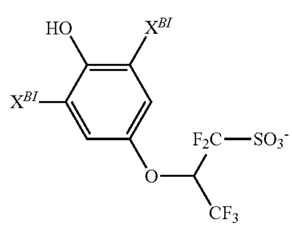
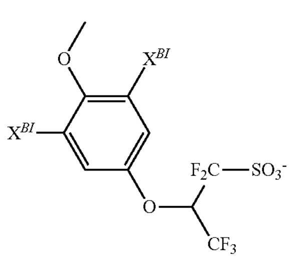
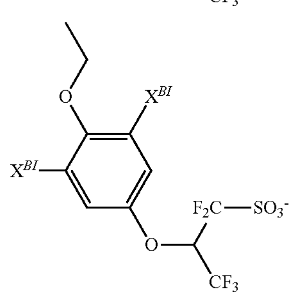
-continued
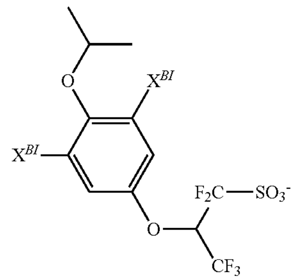
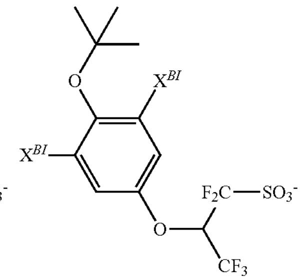
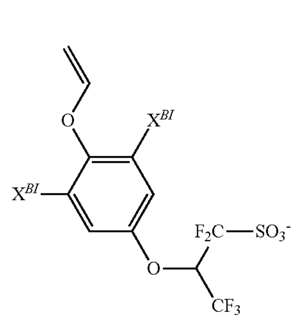
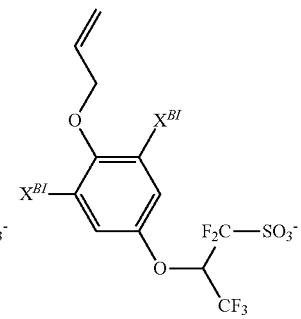
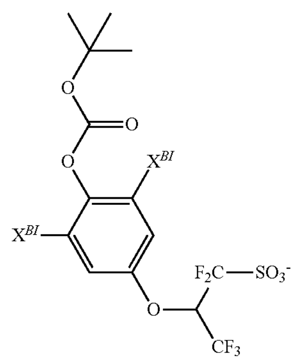
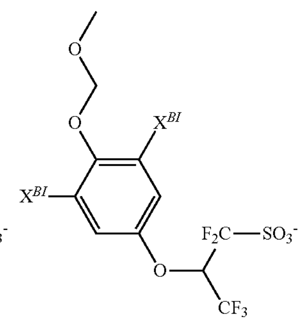
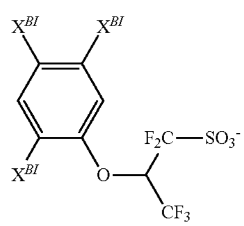
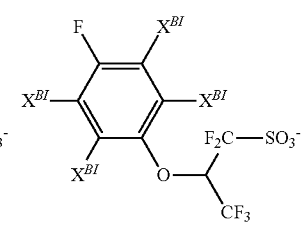
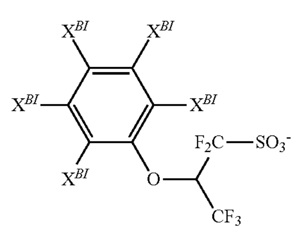
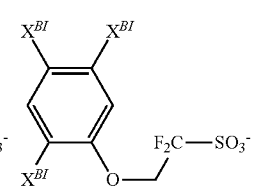
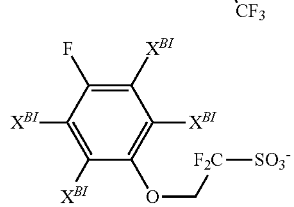
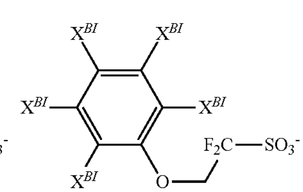

-continued
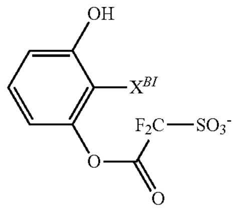
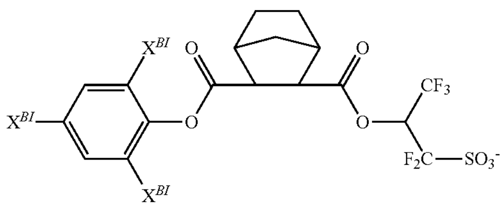
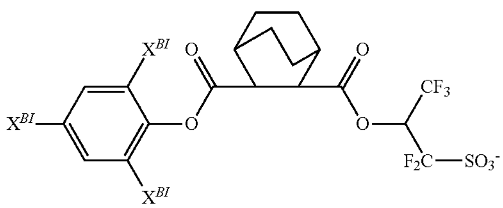
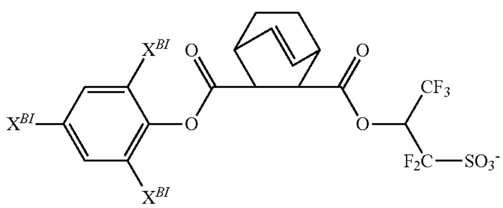
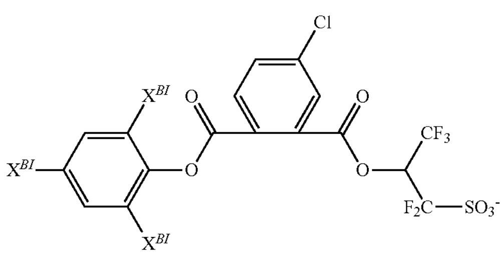
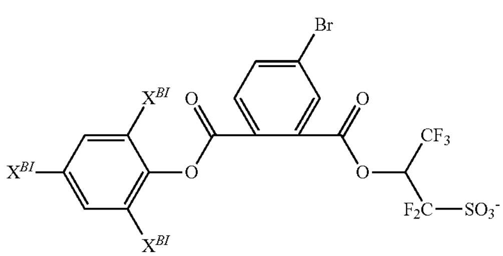
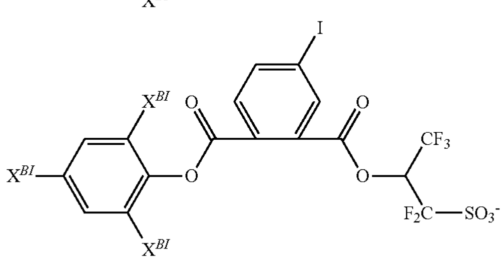
-continued
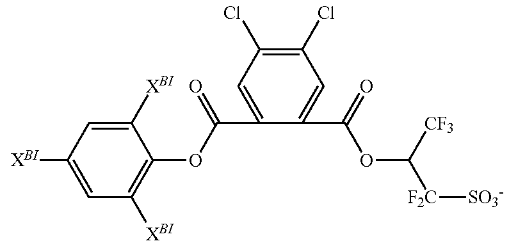
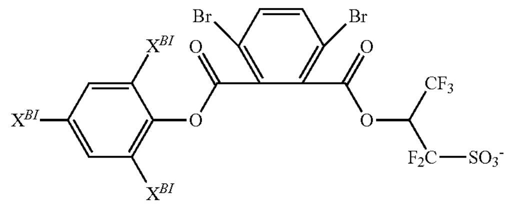
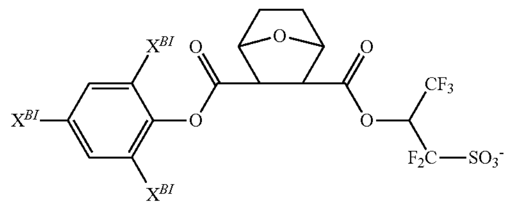
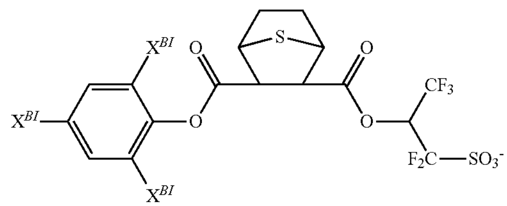
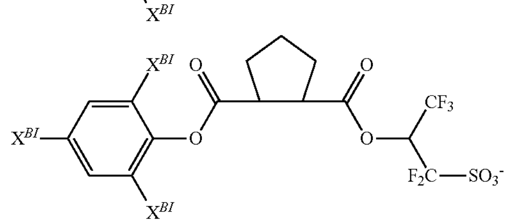
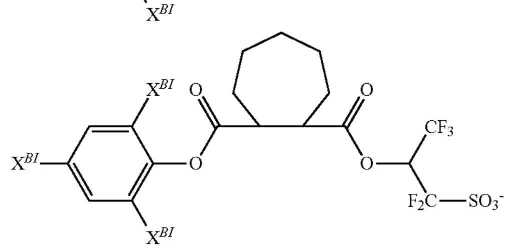
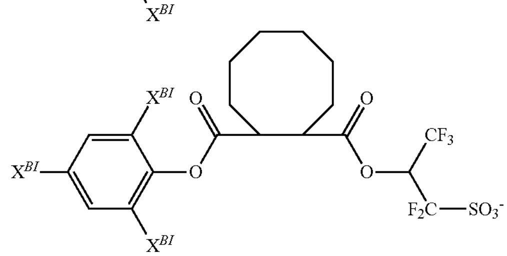
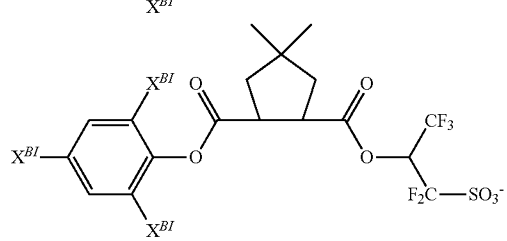

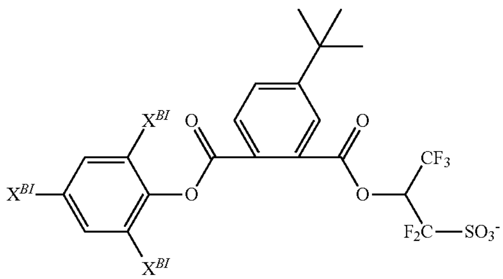
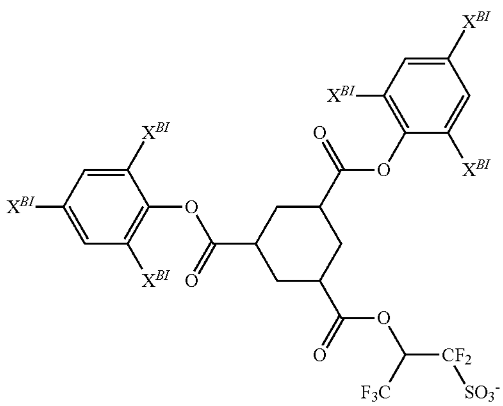
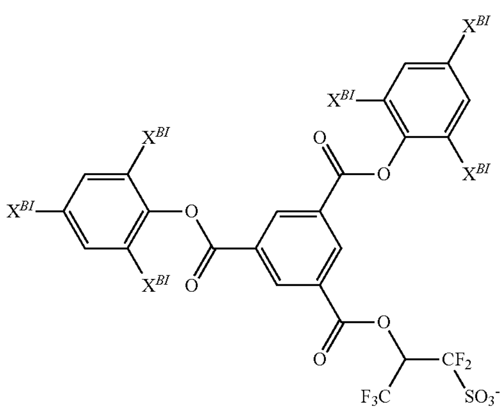
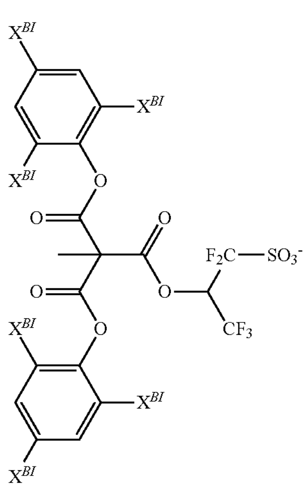
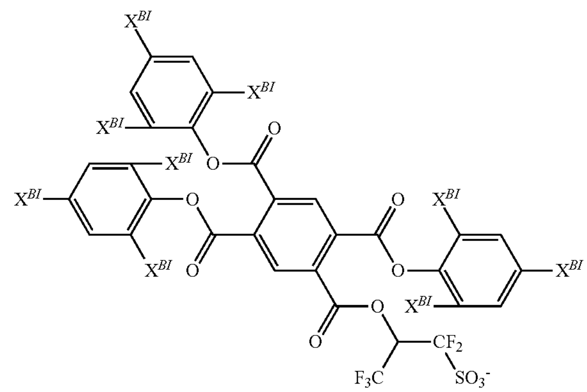
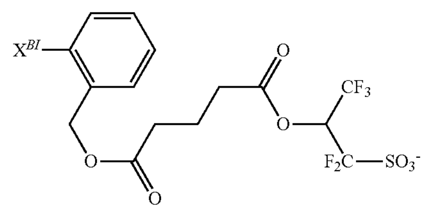
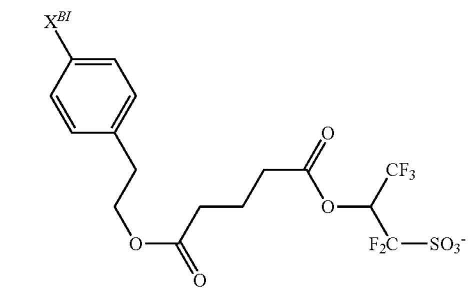
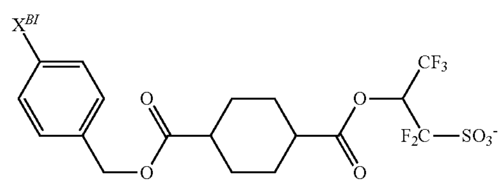
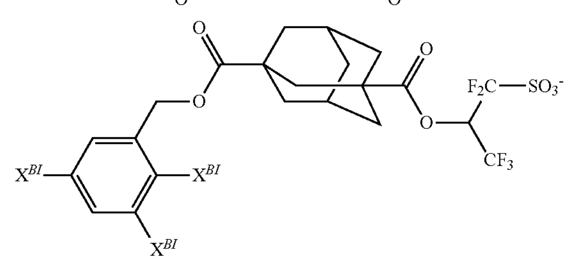
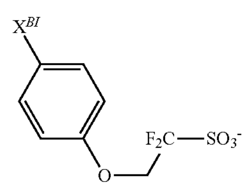
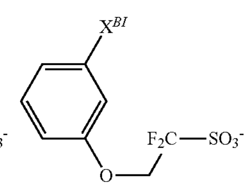
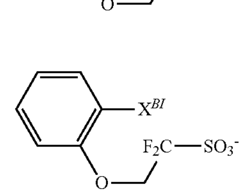
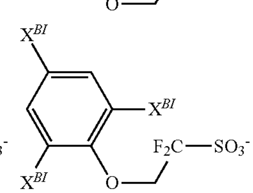

-continued
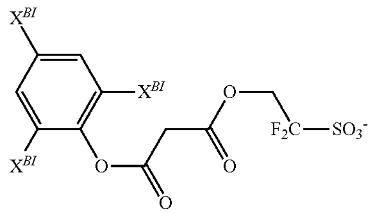
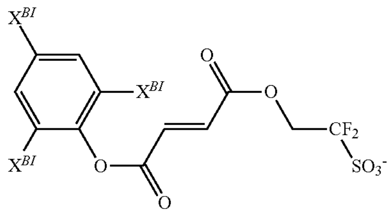
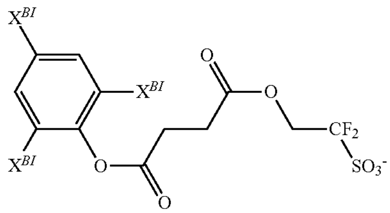
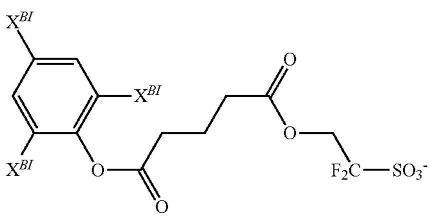
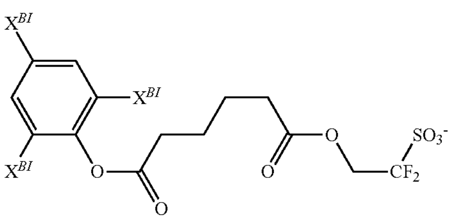
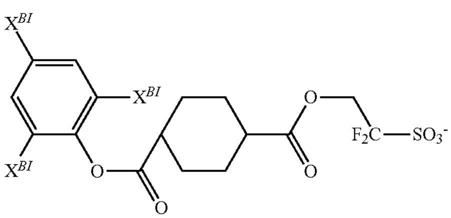
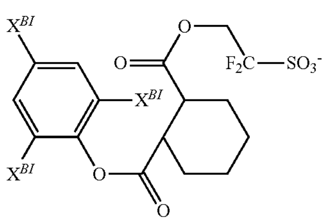
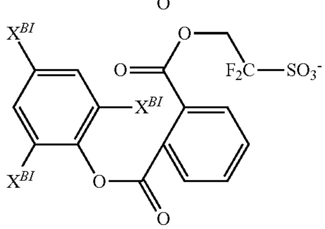
-continued
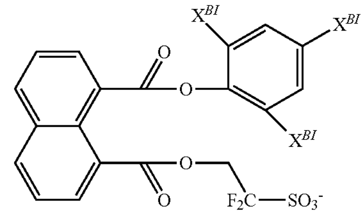
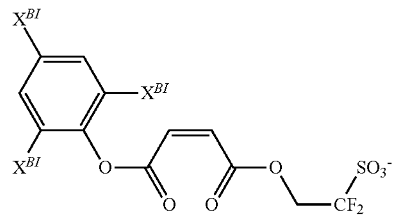
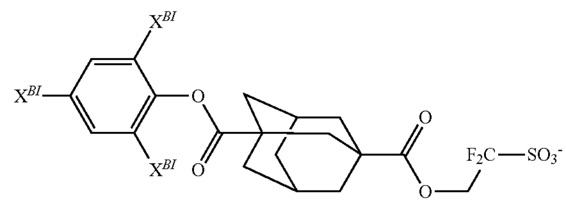
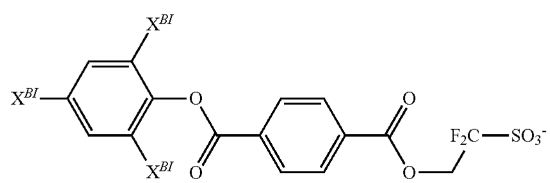
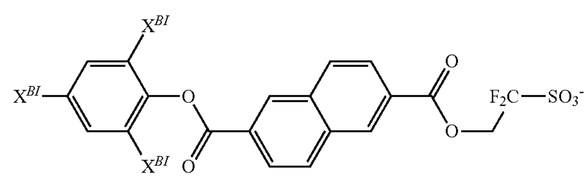
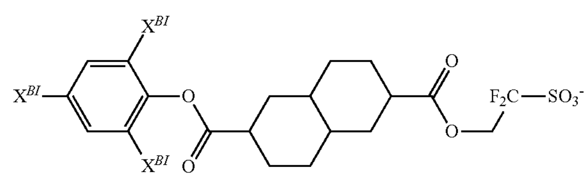
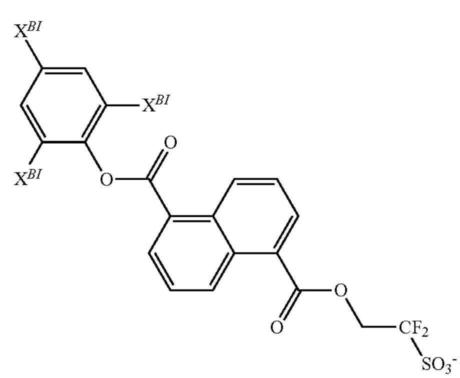

-continued
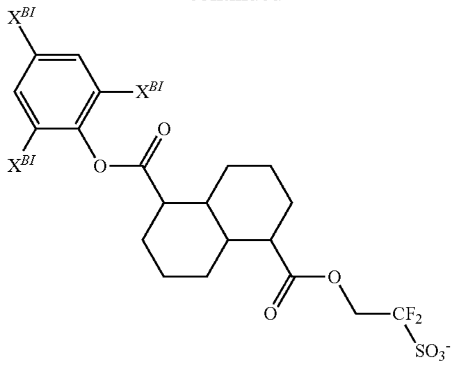
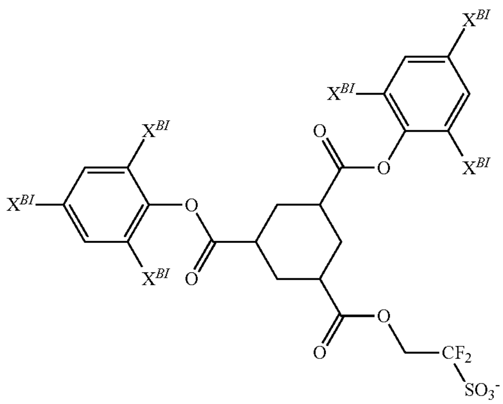
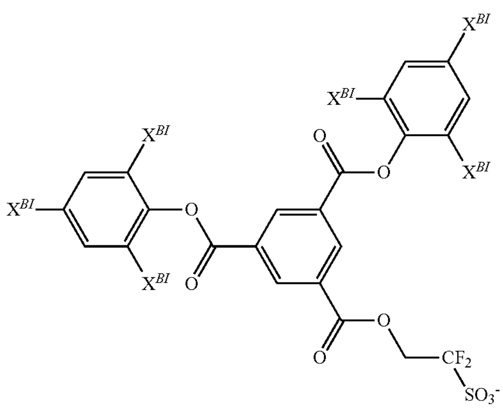
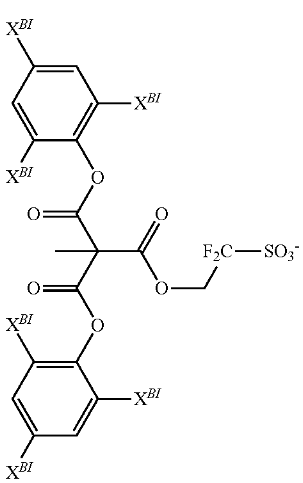
-continued
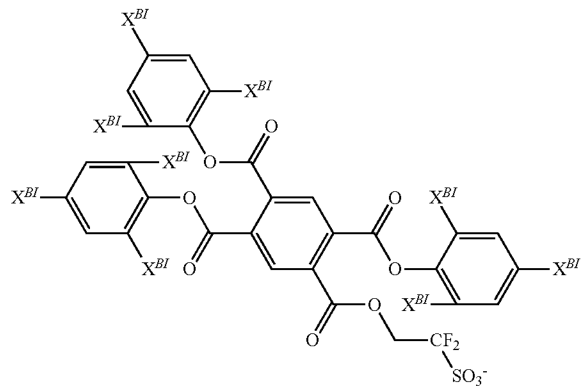
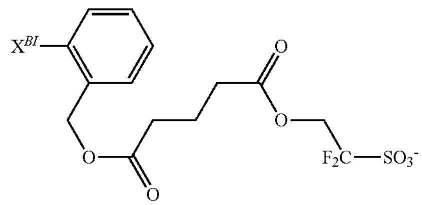
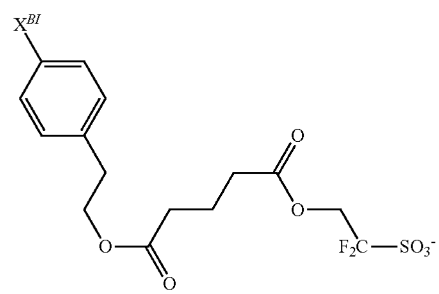
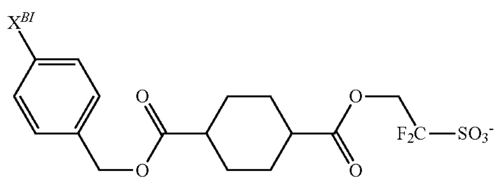
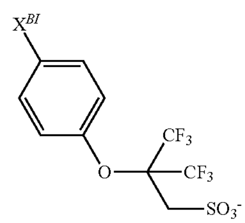
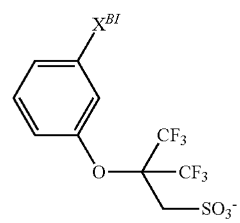
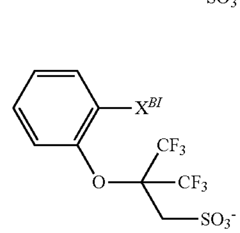
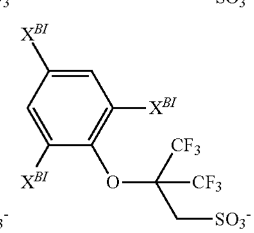
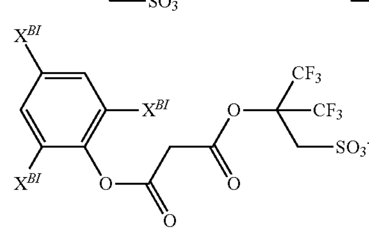

-continued
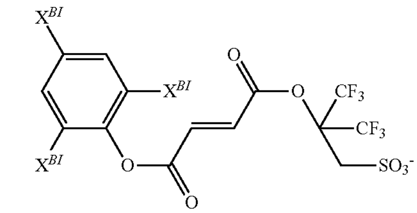
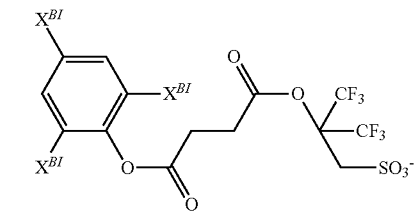
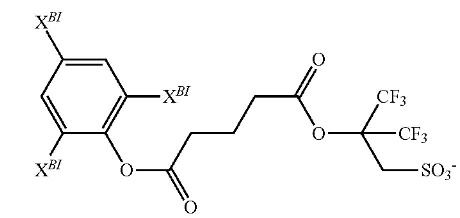
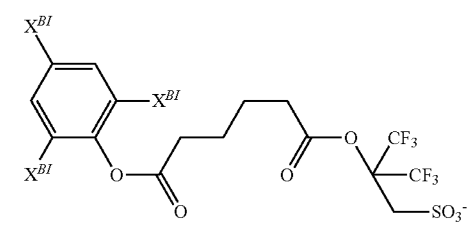
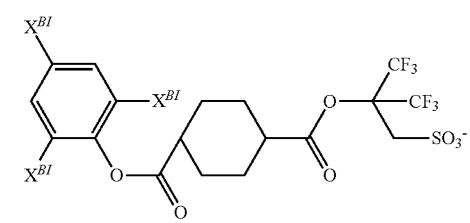
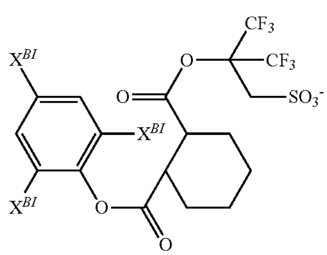
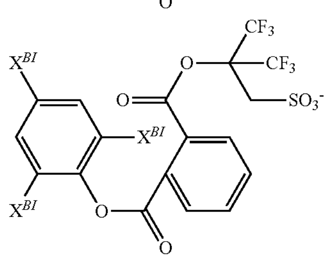
-continued
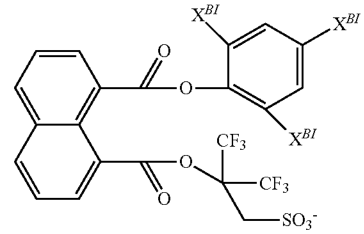
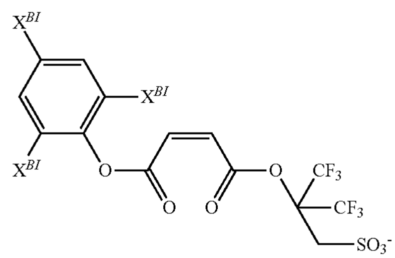
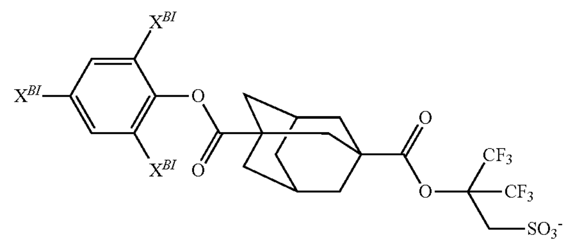
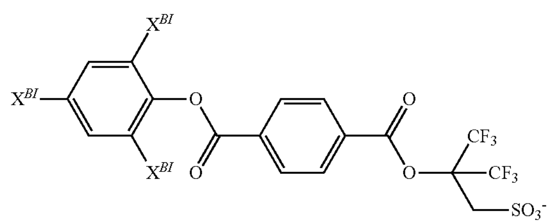
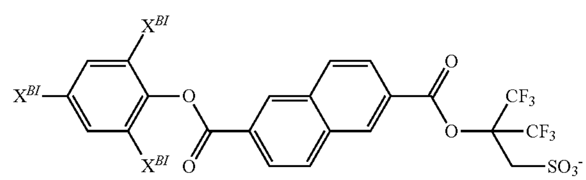
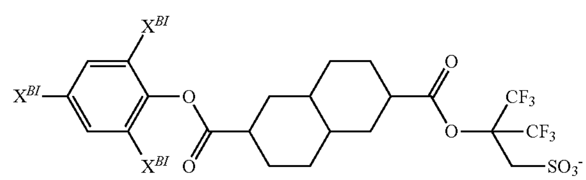
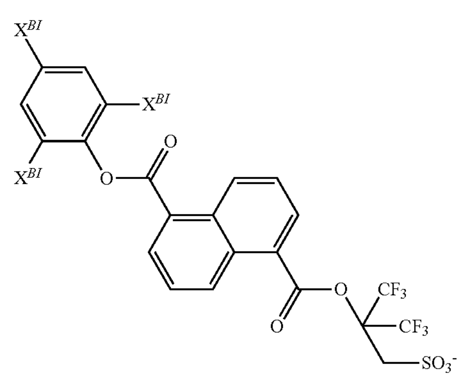

-continued

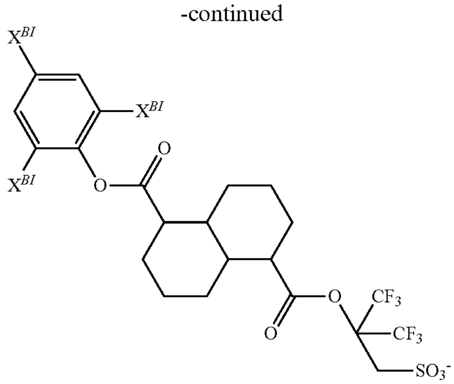

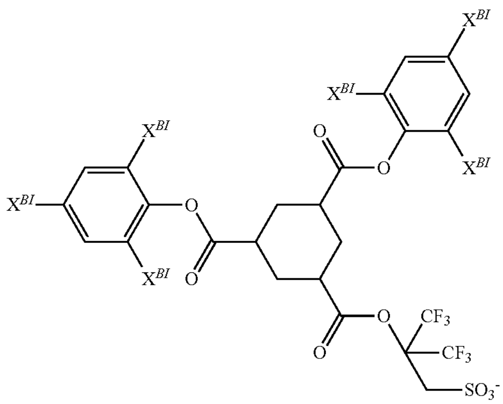

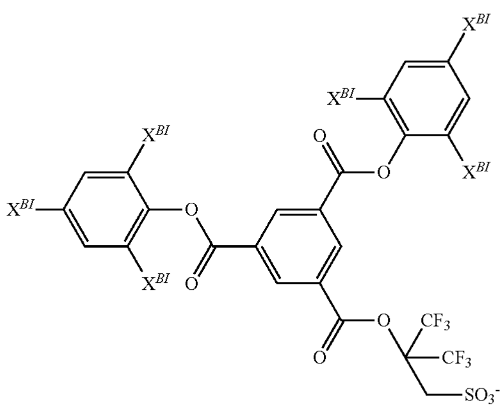

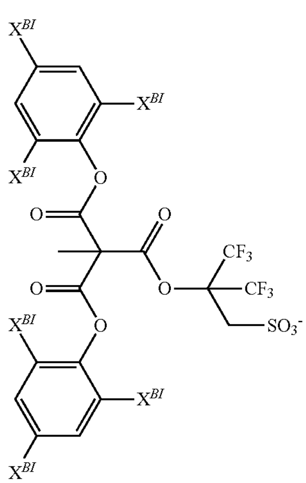

-continued

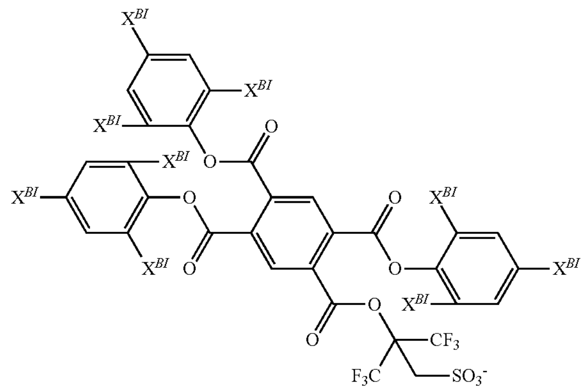

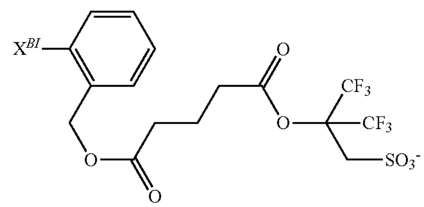

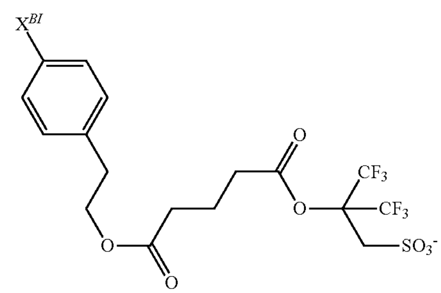

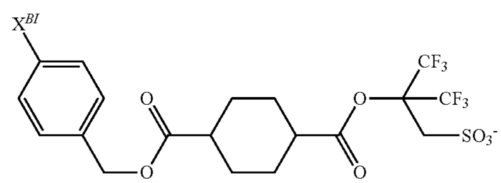

The acid generator of addition type is preferably added in an amount of 0.1 to 50 parts, and more preferably 1 to 40 parts by weight per 100 parts by weight of the base polymer.

When the acid generator has both the functions of acid generator and base polymer, it takes the form of a polymer preferably comprising repeat units derived from a compound capable of generating an acid in response to actinic ray or radiation. In this embodiment, the acid generator is preferably a base polymer essentially containing repeat units (f) as will be described later.

Base Polymer

In a preferred embodiment, the chemically amplified resist composition contains a base polymer. Where the resist composition is of positive tone, the base polymer comprises repeat units containing an acid labile group, preferably repeat units having the formula (a1) or repeat units having the formula (a2). These units are simply referred to as repeat units (a1) and (a2).

(a1)

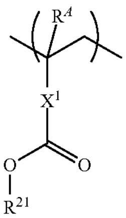

(a2)

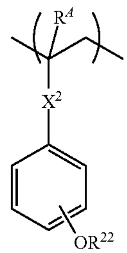

In formulae (a1) and (a2), $R^A$ is each independently hydrogen or methyl. $R^{21}$ and $R^{22}$ are each independently an acid labile group. When the base polymer contains both repeat units (a1) and (a2), $R^{21}$ and $R^{22}$ may be the same or different. $Y^1$ is a single bond, phenylene or naphthylene group, or $C_1$-$C_{12}$ linking group containing at least one moiety selected from ester bond and lactone ring. $Y^2$ is a single bond or ester bond.

Examples of the monomer from which the repeat units (a1) are derived are shown below, but not limited thereto. $R^A$ and $R^{21}$ are as defined above.

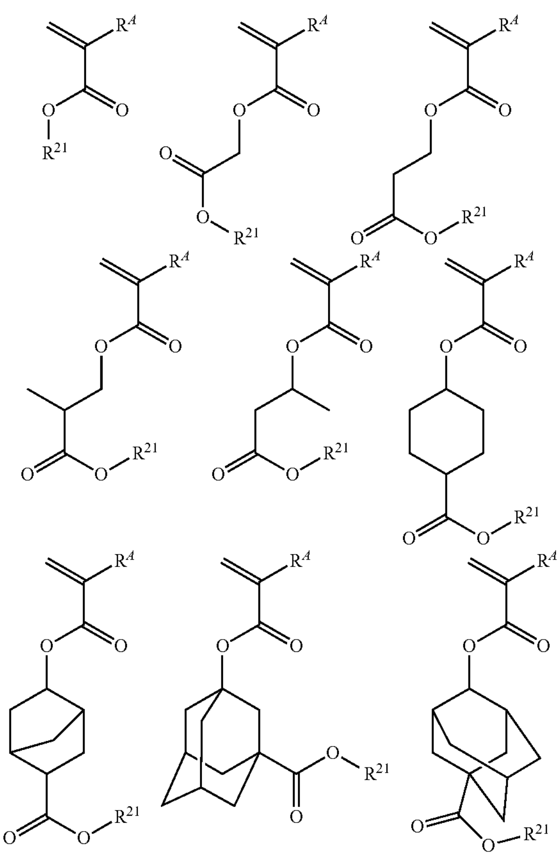

-continued

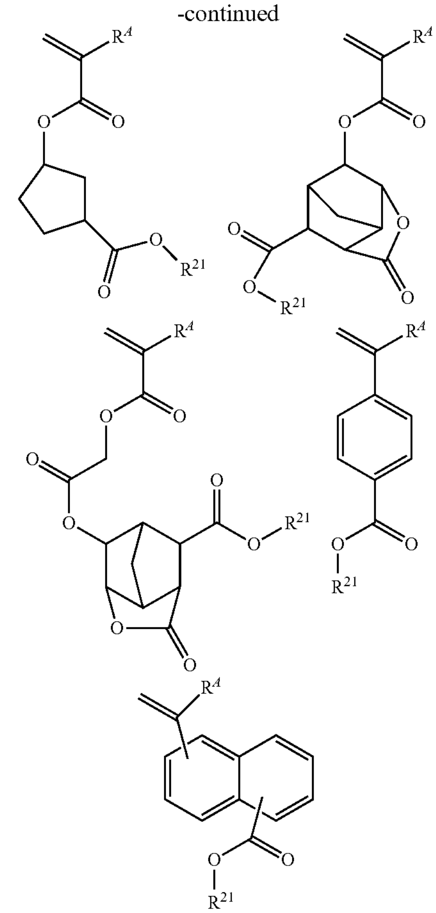

Examples of the monomer from which the repeat units (a2) are derived are shown below, but not limited thereto. $R^{21}$ and $R^{22}$ are as defined above.

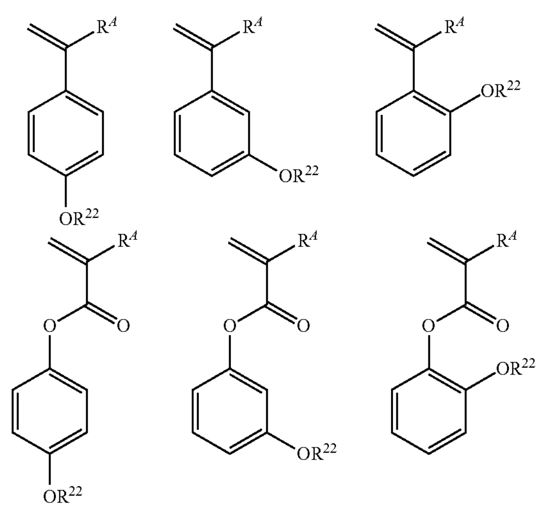

The acid labile groups represented by $R^{21}$ and $R^{22}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

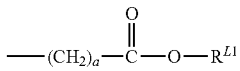

(AL-2)

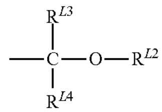

(AL-3)

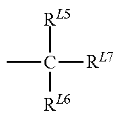

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{40}$ saturated hydrocarbyl groups are preferred, and $C_1$-$C_{20}$ saturated hydrocarbyl groups are more preferred.

In formula (AL-1), "a" is an integer of 0 to 10, preferably 1 to 5.

In formula (AL-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{20}$ saturated hydrocarbyl groups are preferred. Any two of $R^{L2}$, $R^{L3}$ and $R^{L4}$ may bond together to form a $C_3$-$C_{20}$ ring with the carbon atom or carbon and oxygen atoms to which they are attached. The ring preferably contains 4 to 16 carbon atoms and is typically alicyclic.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Inter alia, $C_1$-$C_{20}$ saturated hydrocarbyl groups are preferred. Any two of $R^{L5}$, $R^{L6}$ and $R^{L7}$ may bond together to form a $C_3$-$C_{20}$ ring with the carbon atom to which they are attached. The ring preferably contains 4 to 16 carbon atoms and is typically alicyclic.

The base polymer may further comprise repeat units (b) having a phenolic hydroxy group as an adhesive group. Examples of suitable monomers from which repeat units (b) are derived are given below, but not limited thereto. Herein $R^A$ is as defined above.

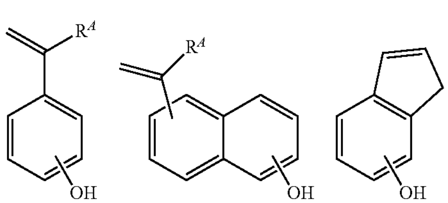

-continued

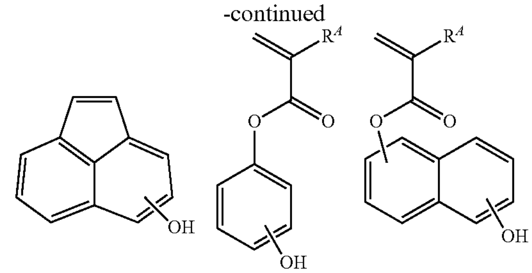

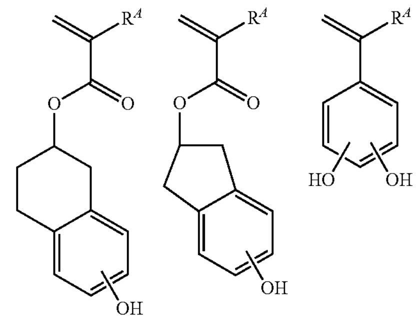

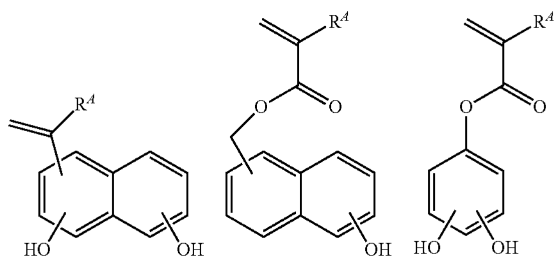

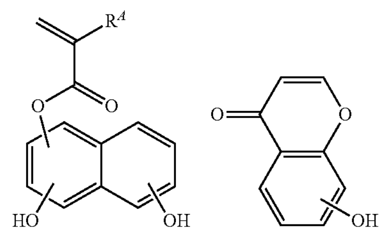

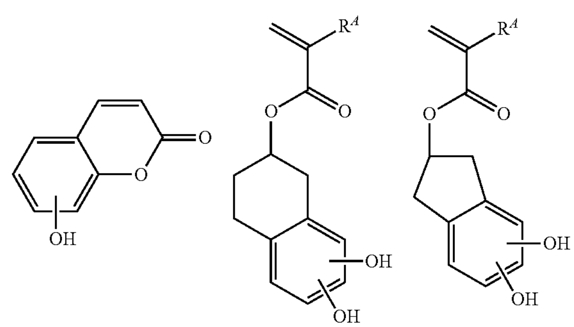

Further, repeat units (c) having another adhesive group selected from hydroxy group (other than the foregoing phenolic hydroxy), lactone ring, sultone ring, ether bond, ester bond, sulfonate bond, carbonyl group, sulfonyl group, cyano group, and carboxy group may also be incorporated in the base polymer. Examples of suitable monomer from which repeat units (c) are derived are given below, but not limited thereto. Herein $R^A$ is as defined above.

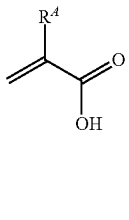
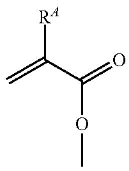
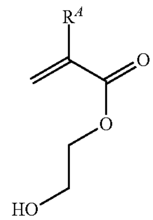
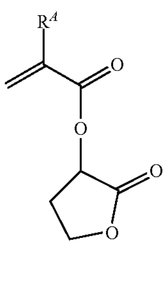
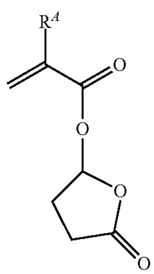
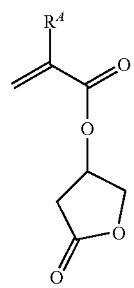
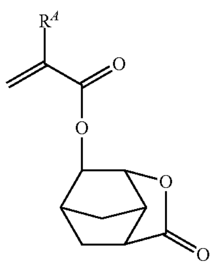
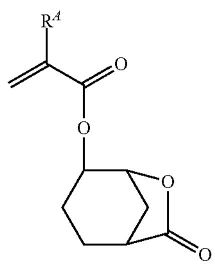
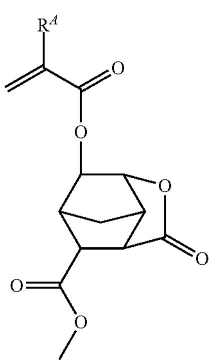
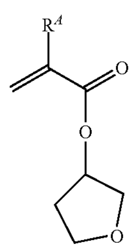
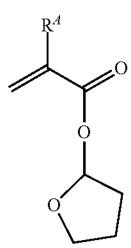
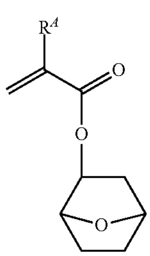
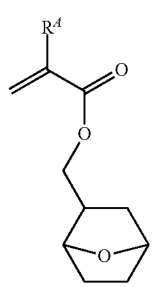
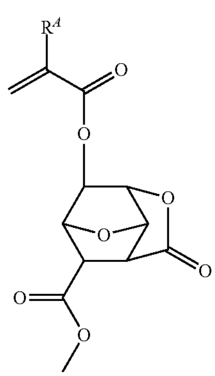
-continued
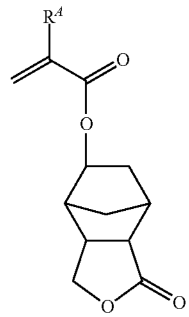
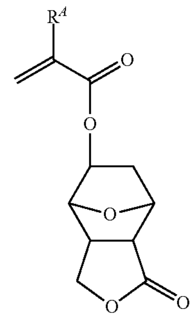
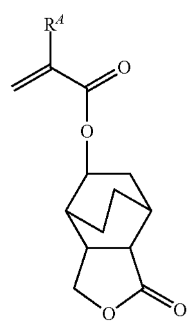
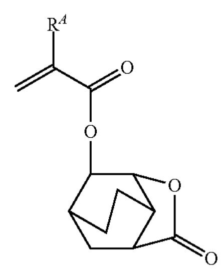
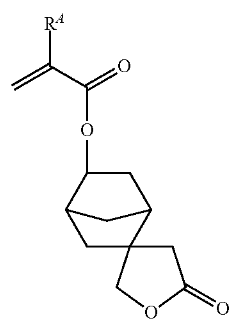
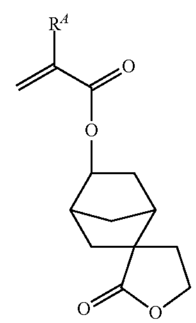
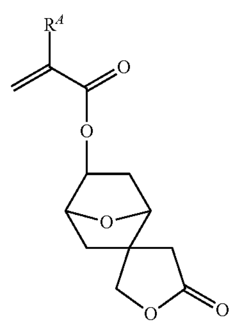
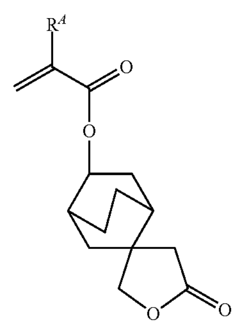
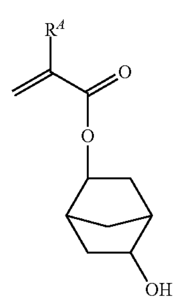
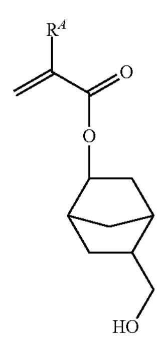

-continued
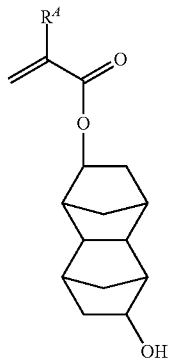
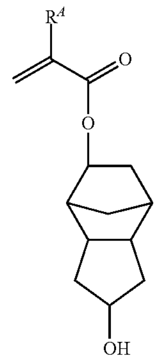
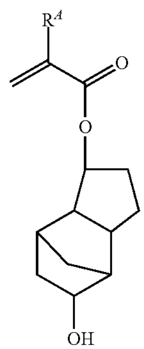
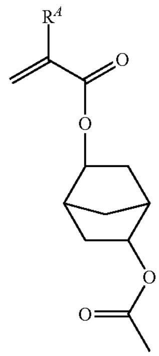
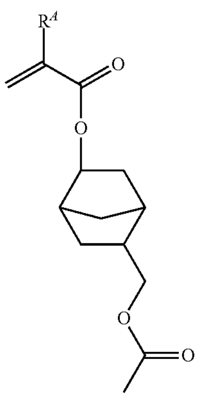
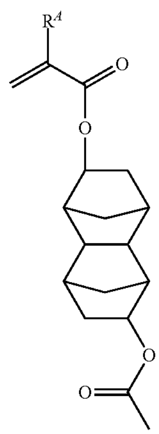
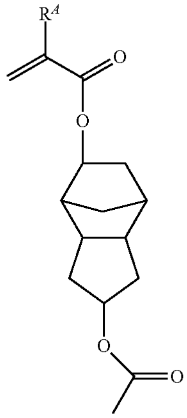
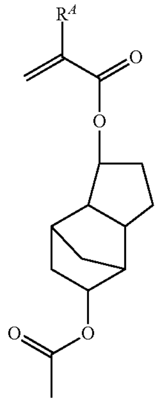
-continued
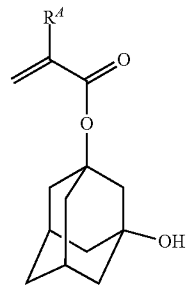
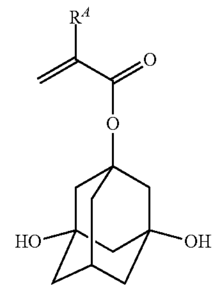
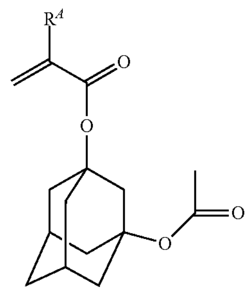
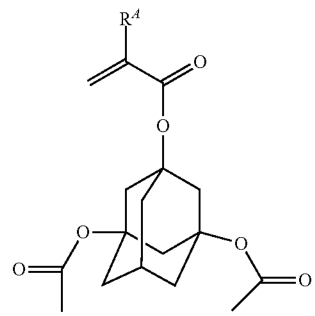
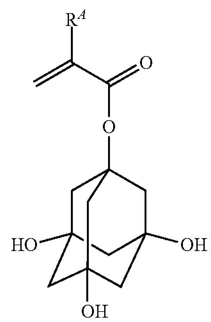
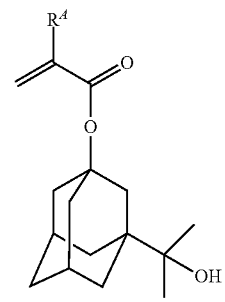
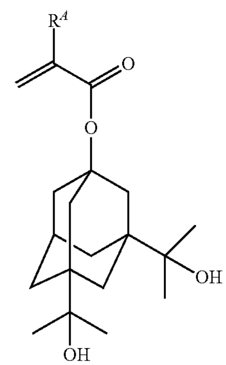
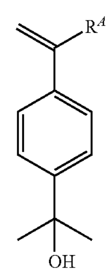
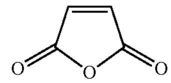
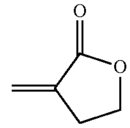
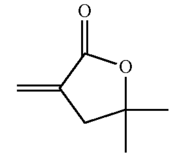
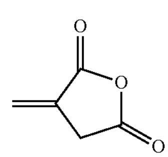
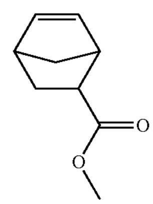
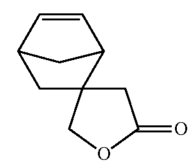

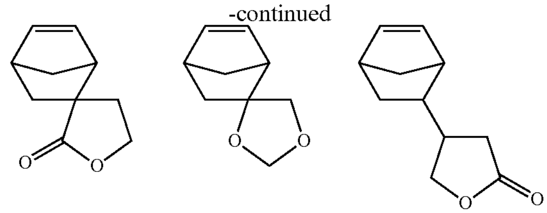
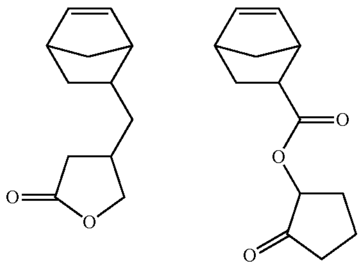
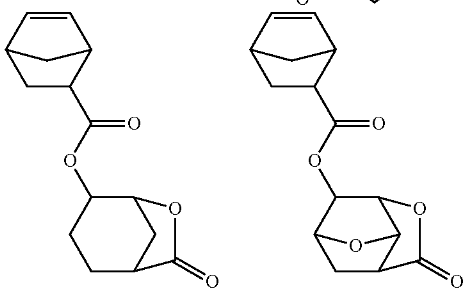
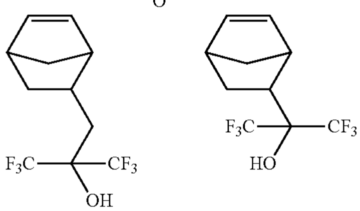
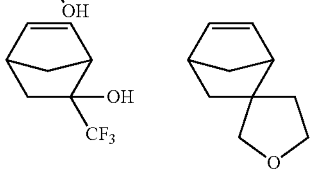
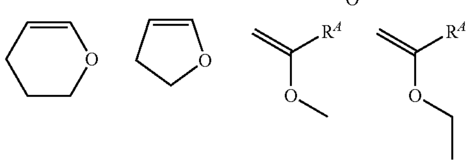
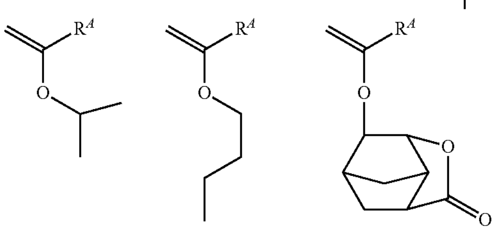
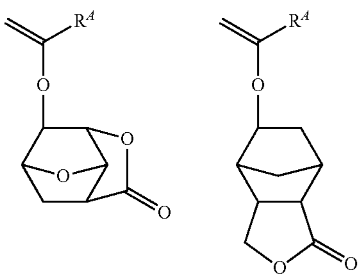
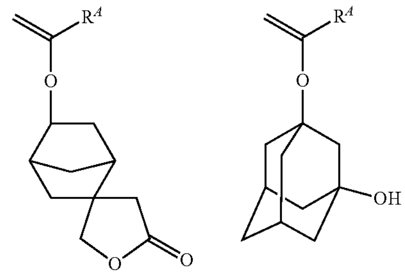
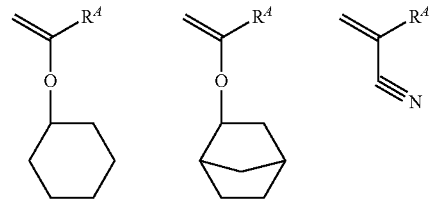
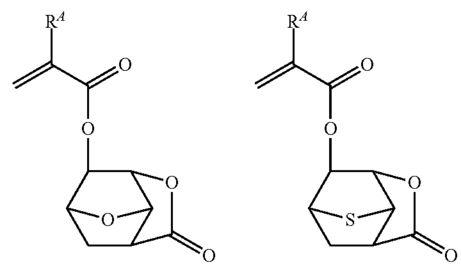
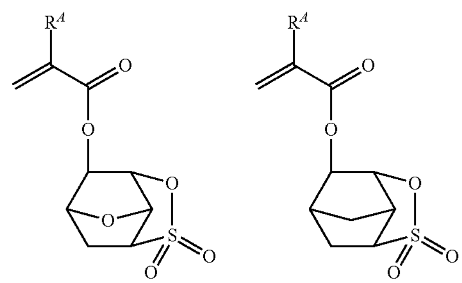
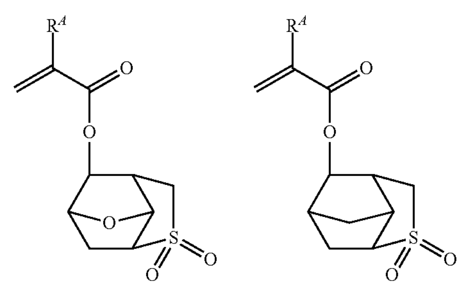
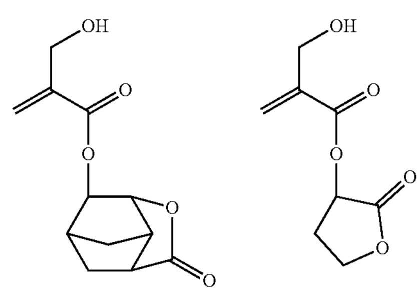

-continued
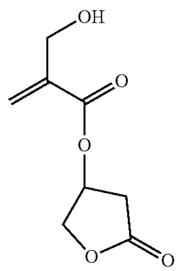
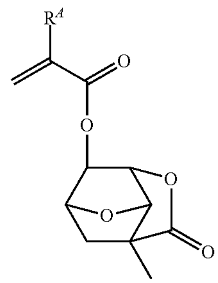
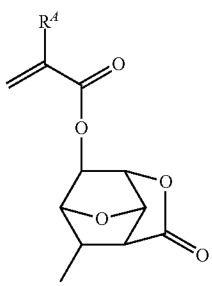
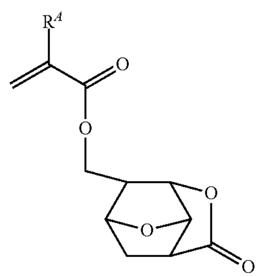
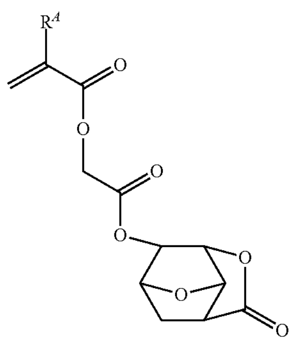
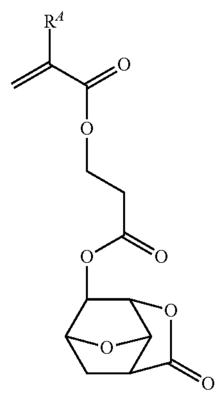
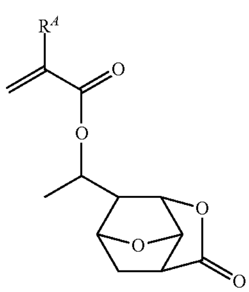
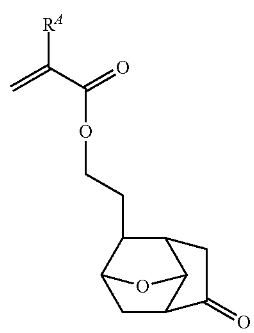
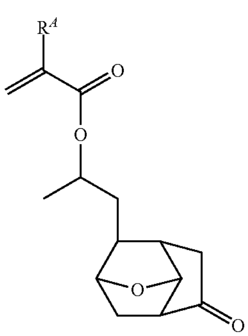
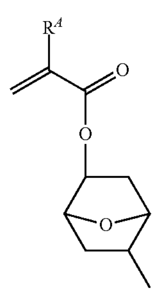
-continued
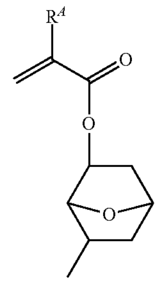
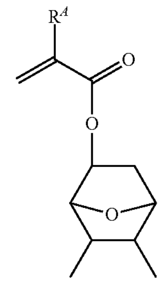
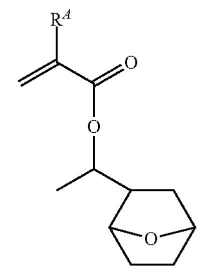
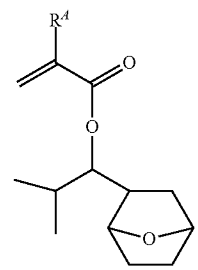
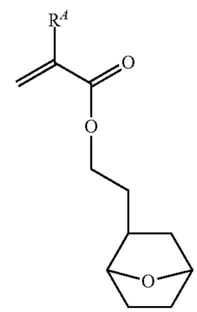
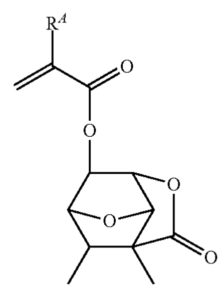
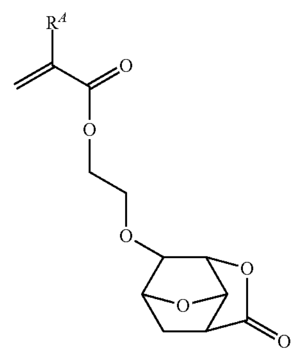
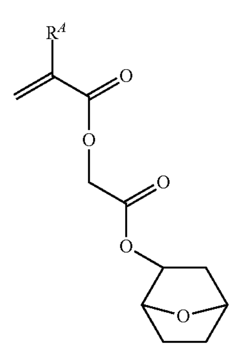
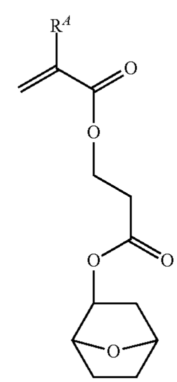

-continued
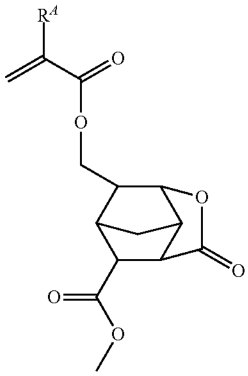
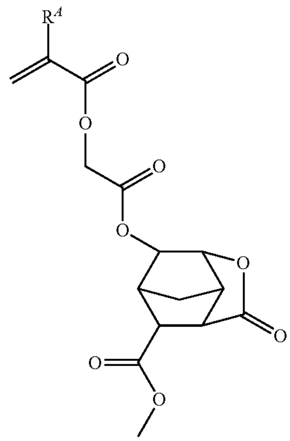
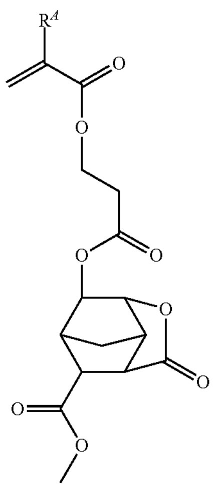
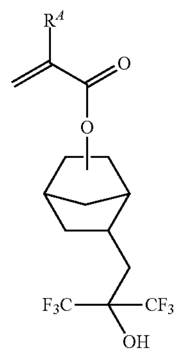
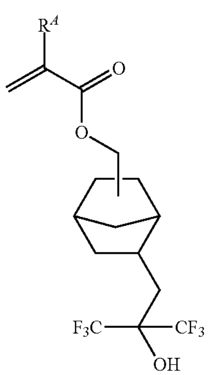
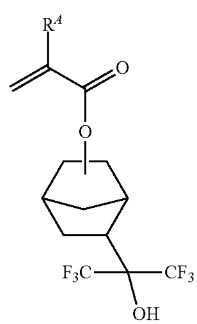
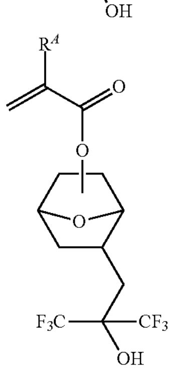
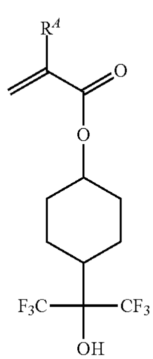
-continued
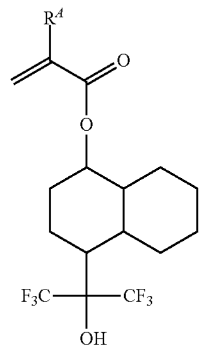
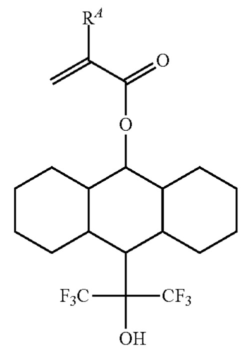
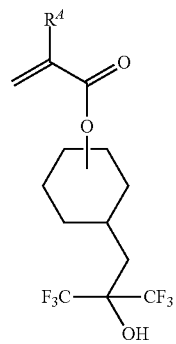
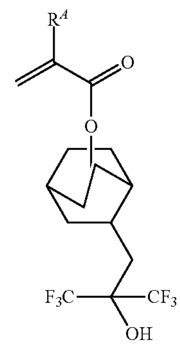
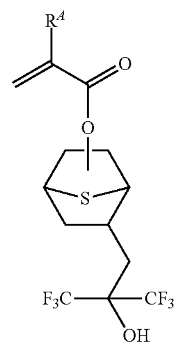
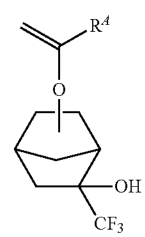
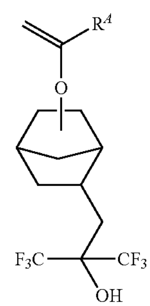
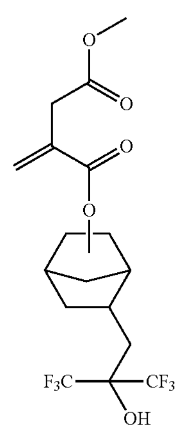
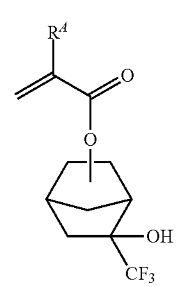
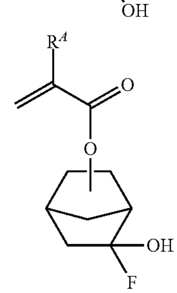

-continued
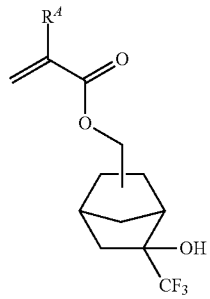
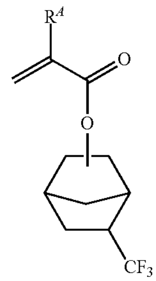
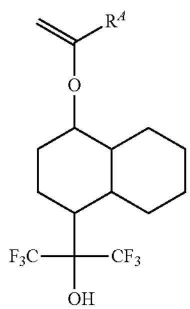
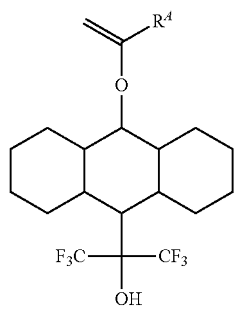
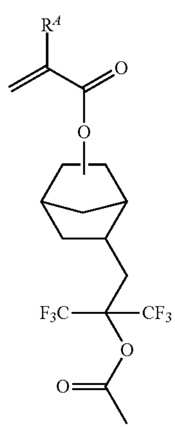
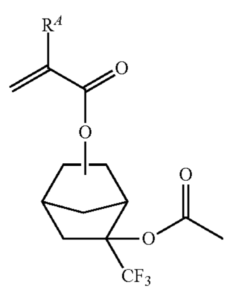
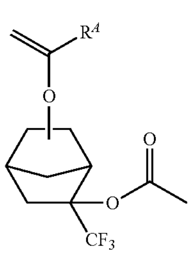
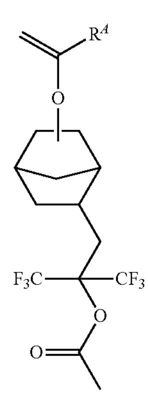
-continued
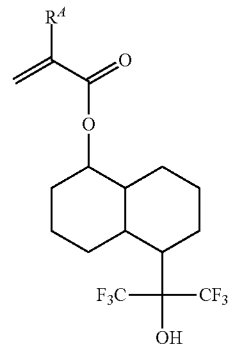
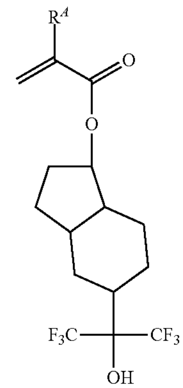
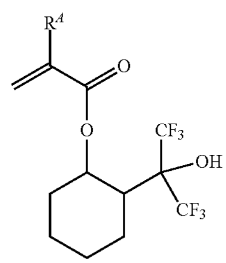
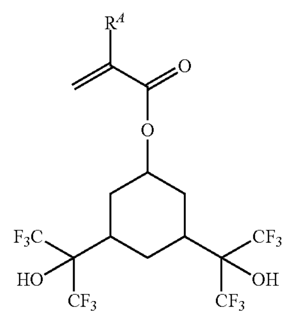
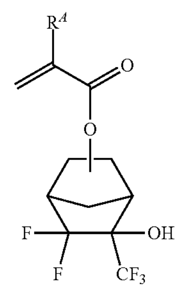
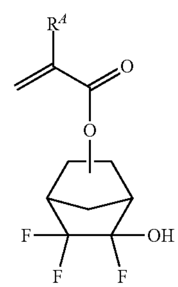
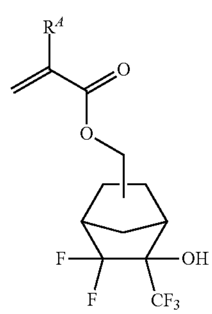
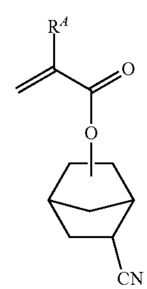
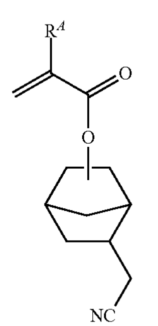
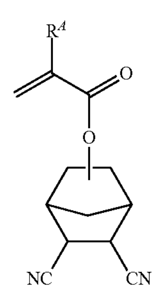

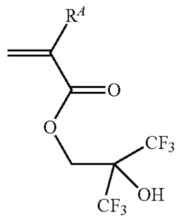
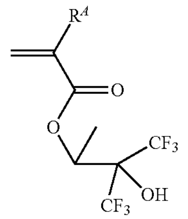
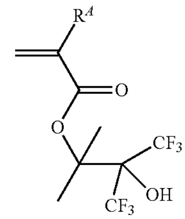
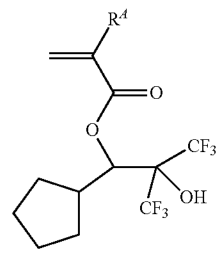
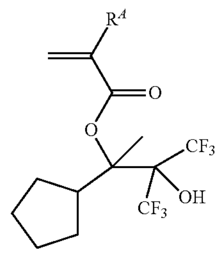
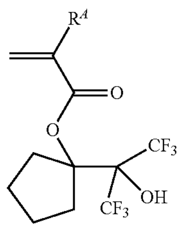
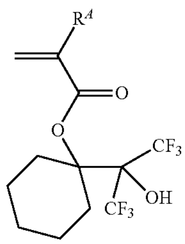
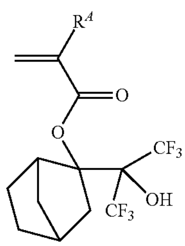
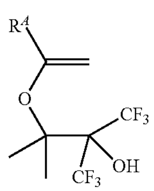
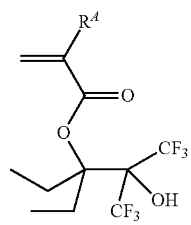
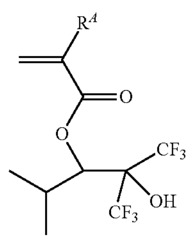
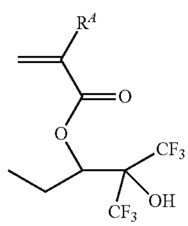
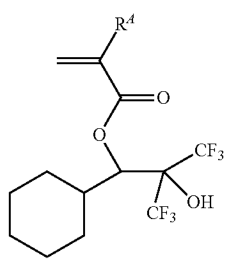
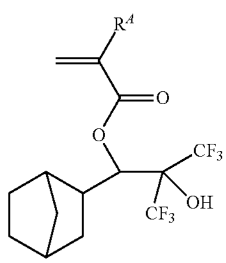
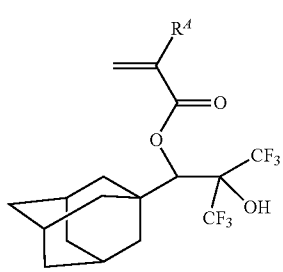
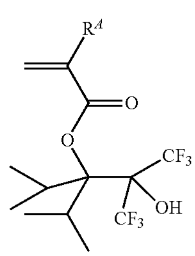
-continued
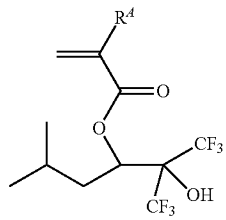
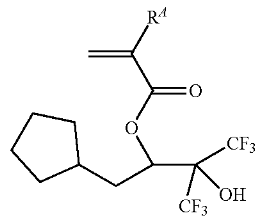
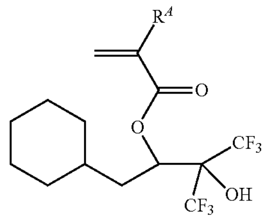
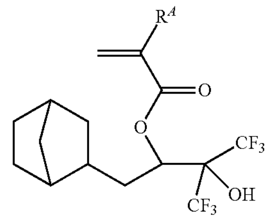
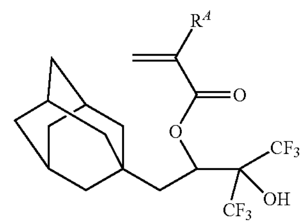
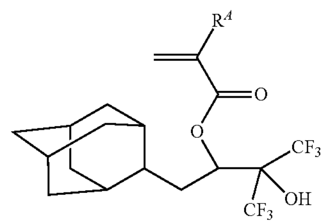
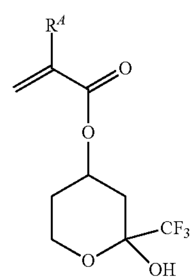
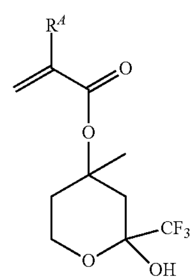
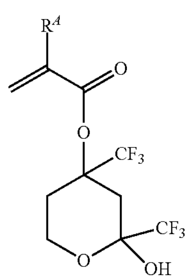
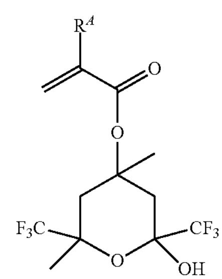
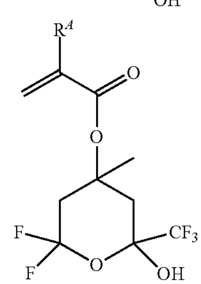
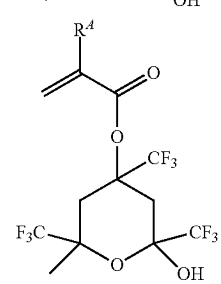

-continued
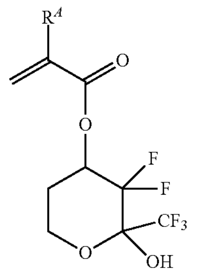
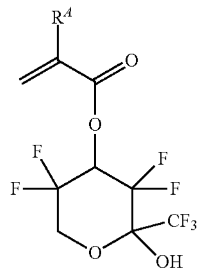
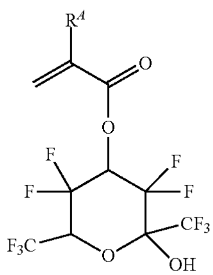
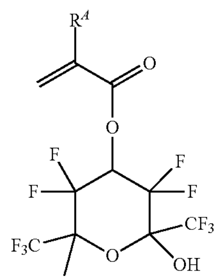
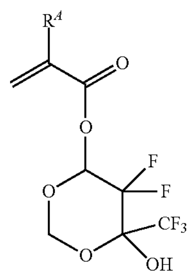
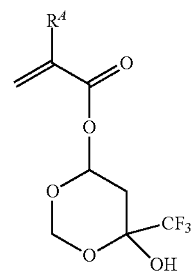
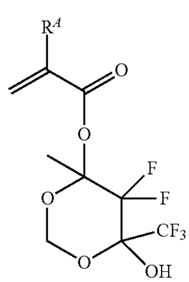
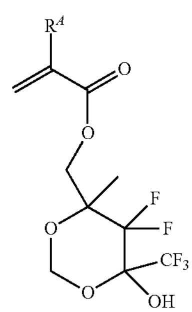
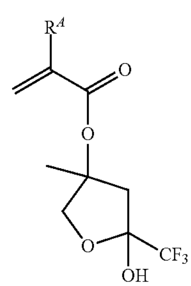
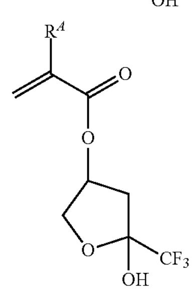
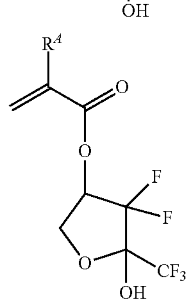
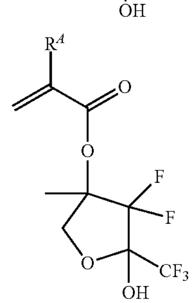
-continued
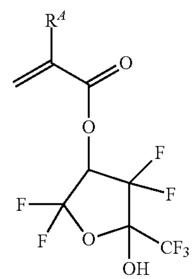
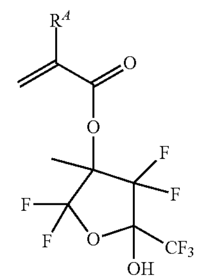
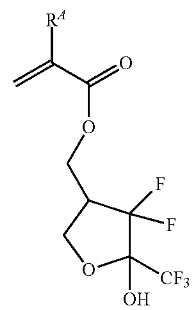
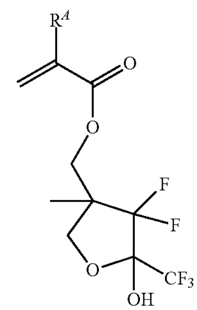
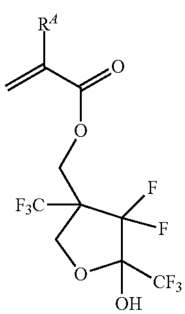
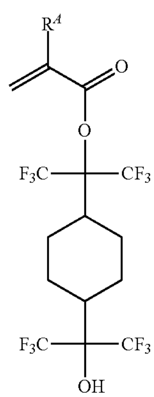
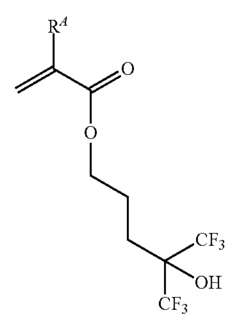
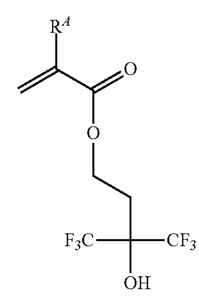
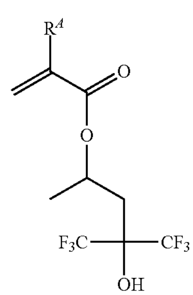
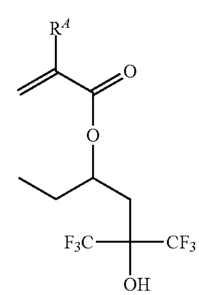

-continued
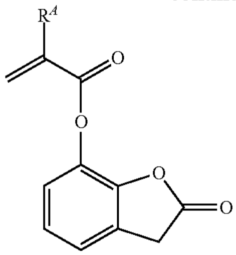
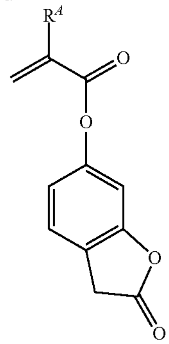
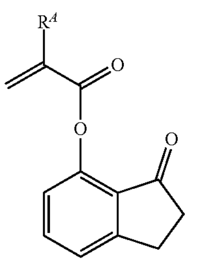
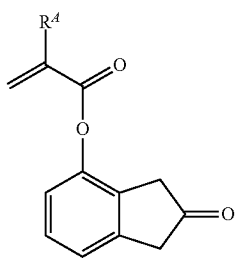
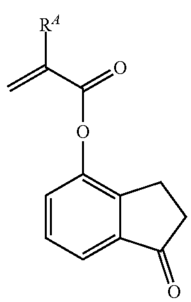
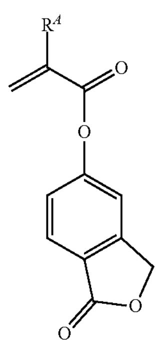
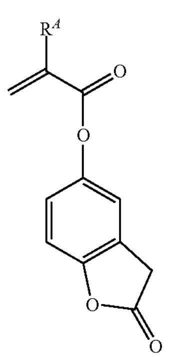
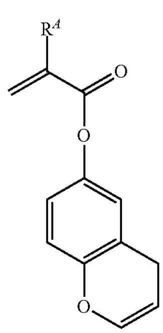
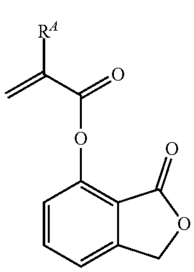
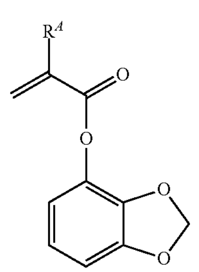
-continued
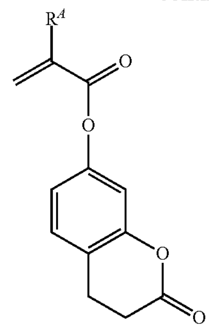
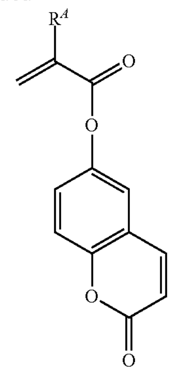
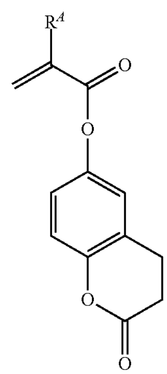
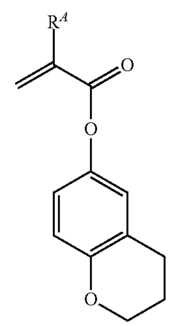
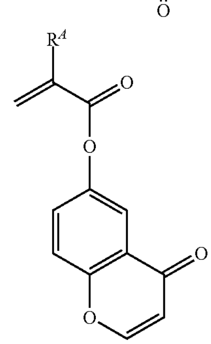
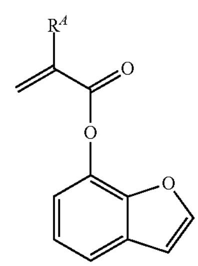
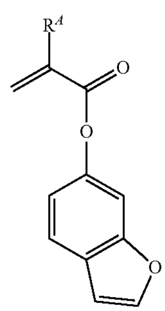
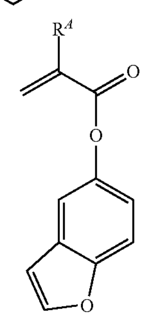
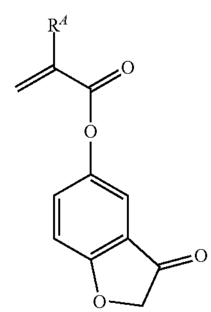
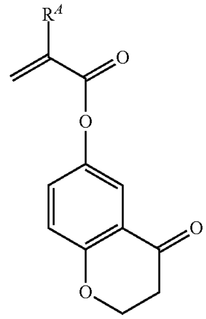
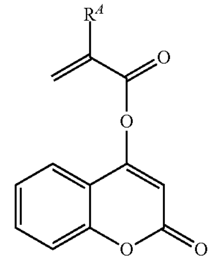

-continued
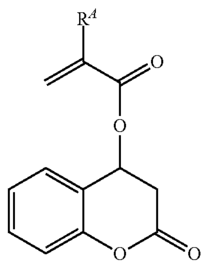
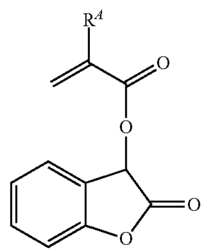
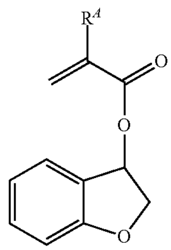
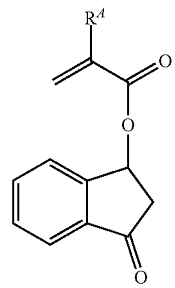
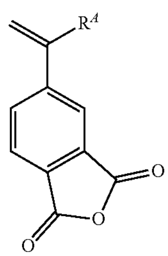
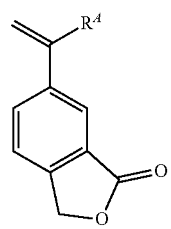
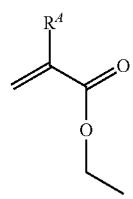
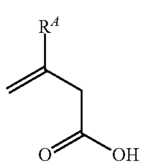
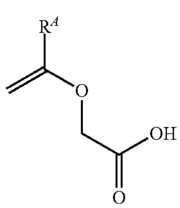
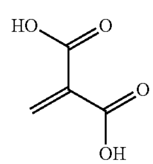
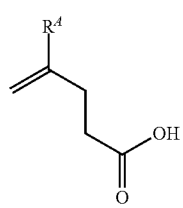
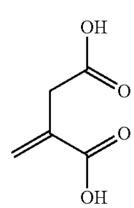
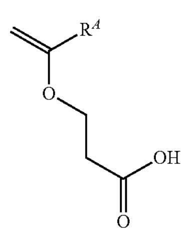
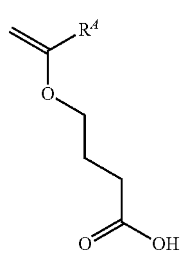
-continued
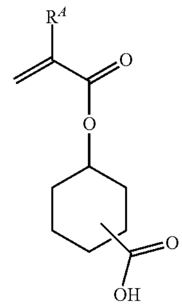
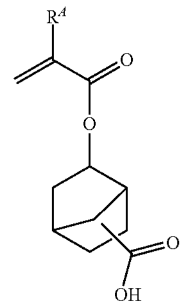
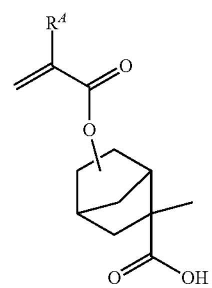
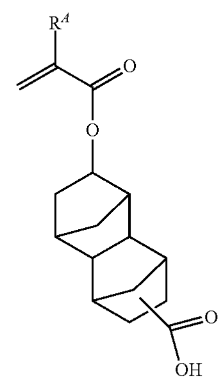
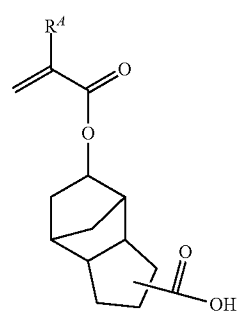
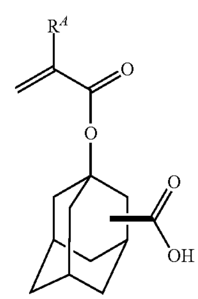
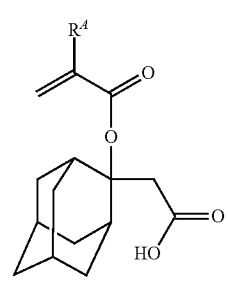
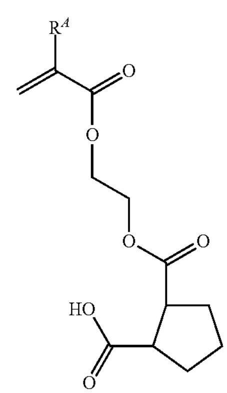

-continued

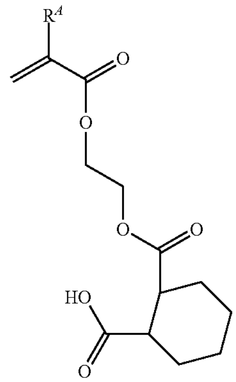
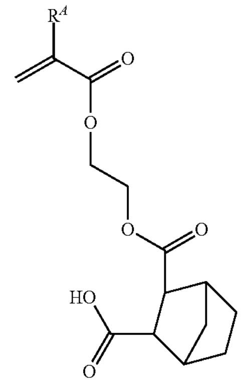
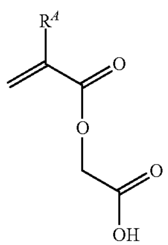
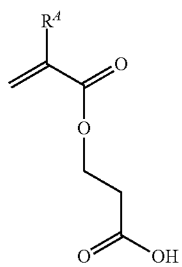
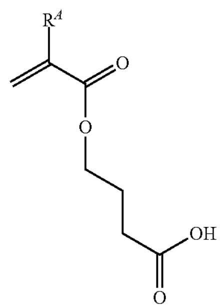
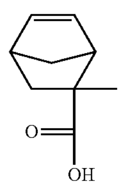
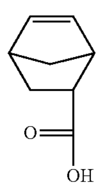
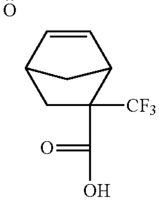
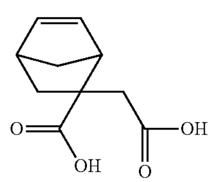
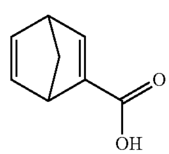
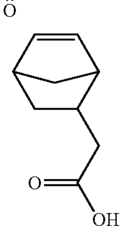

In another preferred embodiment, the base polymer may further comprise repeat units (d) derived from indene, benzofuran, benzothiophene, acenaphthylene, chromone, coumarin, and norbornadiene, or derivatives thereof. Suitable monomers are exemplified below.

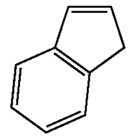
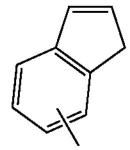
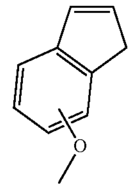
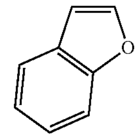
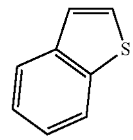
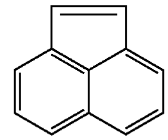
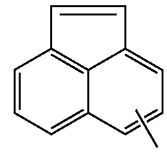
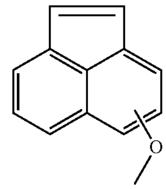
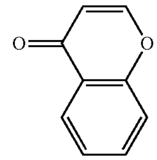
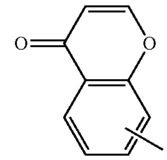
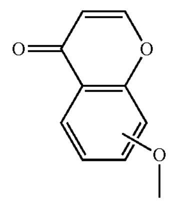
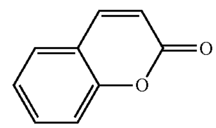
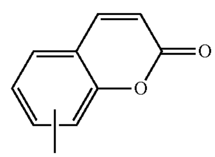
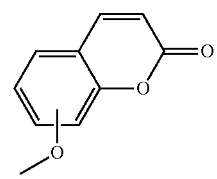
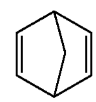
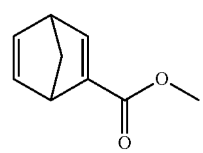

Furthermore, repeat units (e) may be incorporated in the base polymer, which are derived from styrene, vinylnaphthalene, vinylanthracene, vinylpyrene, methyleneindene, vinylpyridine, or vinylcarbazole.

In a further embodiment, repeat units (f) derived from an onium salt having a polymerizable unsaturated bond may be incorporated in the base polymer. Specifically, the base polymer may comprise repeat units of at least one type selected from repeat units having formulae (f1), (f2) and (f3). These units are simply referred to as repeat units (f1), (f2) and (f3), which may be used alone or in combination of two or more types.

(f1)

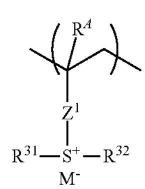

-continued (f2)

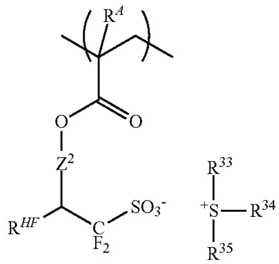

(f3)

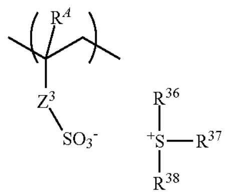

In formulae (f1) to (f3), $R^A$ is independently hydrogen or methyl. $Z^1$ is a single bond, $C_1$-$C_6$ aliphatic hydrocarbylene group, phenylene group, naphthylene group, or $C_7$-$C_{18}$ group obtained by combining the foregoing, —O—$Z^{11}$—, —C(═O)—O—$Z^{11}$—, or —C(═O)—NH—$Z^{11}$—. $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety. $Z^2$ is a single bond, —$Z^{21}$—C(═O)—O—, —$Z^{21}$—O— or —$Z^{21}$—O—C(═O)—. $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —O—$Z^{31}$—, —C(═O)—O—$Z^{31}$—, or —C(═O)—NH—$Z^{31}$—. $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety. The aliphatic hydrocarbylene groups $Z^{11}$ and $Z^{31}$ may be saturated or unsaturated and straight, branched or cyclic. The saturated hydrocarbylene group $Z^{21}$ may be straight, branched or cyclic.

In formulae (f1) to (f3), $R^{31}$ to $R^{38}$ are each independently halogen or a $C_1$-$C_{20}$ hydrocarbyl group which may contain a heteroatom. The hydrocarbyl group may be saturated or unsaturated and straight, branched or cyclic. Examples thereof are as exemplified above for $R^{101}$ to $R^{103}$ in formula (3). In these groups, some or all of the hydrogen atoms may be substituted by a moiety containing a heteroatom such as oxygen, sulfur, nitrogen or halogen and some carbon may be replaced by a moiety containing a heteroatom such as oxygen, sulfur or nitrogen, so that the group may contain a hydroxy moiety, cyano moiety, nitro moiety, mercapto moiety, carbonyl moiety, ether bond, ester bond, sulfonate bond, carbonate moiety, lactone ring, sultone ring, carboxylic anhydride, or haloalkyl moiety.

A pair of $R^{33}$ and $R^{34}$, or $R^{36}$ and $R^{37}$ may bond together to form a ring with the sulfur atom to which they are attached. Examples of the ring are as exemplified above for the ring that $R^{101}$ and $R^{102}$ in formula (3), taken together, form with the sulfur atom to which they are attached.

In formula (2), $R^{HF}$ is hydrogen or trifluoromethyl.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfiorobutylsulfonyl)imide; methide ions such as tris(trifluoromethylsulfonyl)methide and tris(perfluoroethysulfonyl)methide.

Also included are sulfonate ions having fluorine substituted at α-position as represented by the formula (f1-1) and sulfonate ions having fluorine substituted at α-position and trifluoromethyl at β-position as represented by the formula (f1-2).

$$R^{41}—CF_2—SO_3^- \quad (f1\text{-}1)$$

(f1-2)

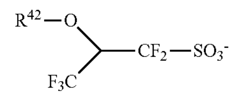

In formula (f1-1), $R^{41}$ is hydrogen, or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples of the hydrocarbyl group are as exemplified above for $R^{111}$ in formula (3A').

In formula (f1-2), $R^{42}$ is hydrogen, or a $C_1$-$C_{30}$ hydrocarbyl group or $C_2$-$C_{30}$ hydrocarbylcarbonyl group, which may contain an ether bond, ester bond, carbonyl moiety or lactone ring. The hydrocarbyl group and hydrocarbyl moiety in the hydrocarbylcarbonyl group may be saturated or unsaturated and straight, branched or cyclic. Examples of the hydrocarbyl group are as exemplified above for $R^{111}$ in in formula (3A').

Examples of the cation in the monomer from which repeat unit (f1) is derived are shown below, but not limited thereto. $R^A$ is as defined above.

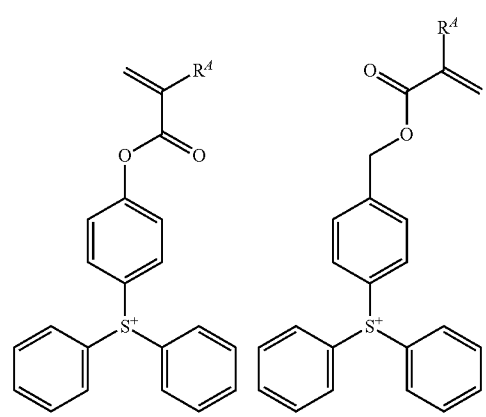

-continued
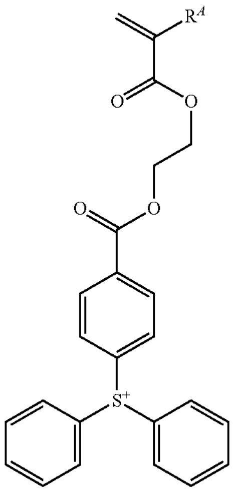
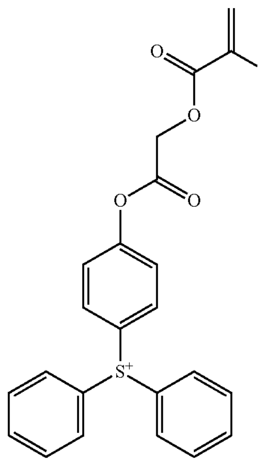
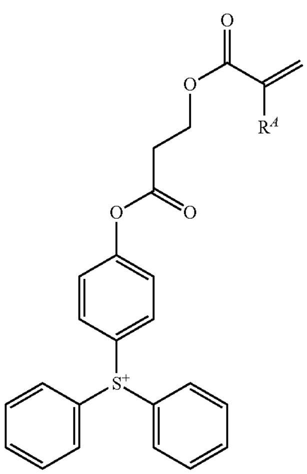
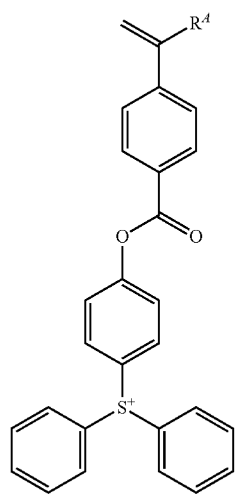
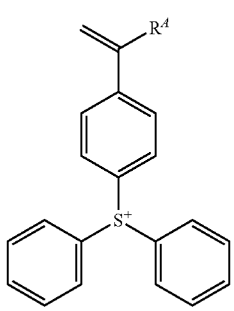
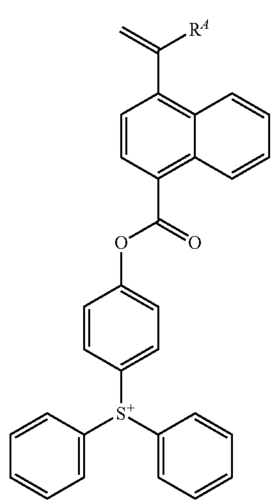
-continued
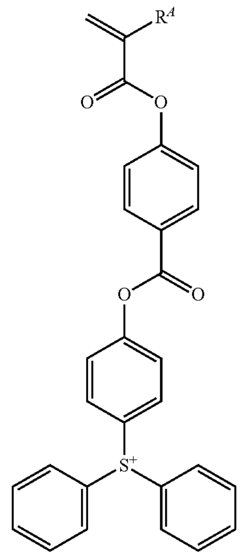
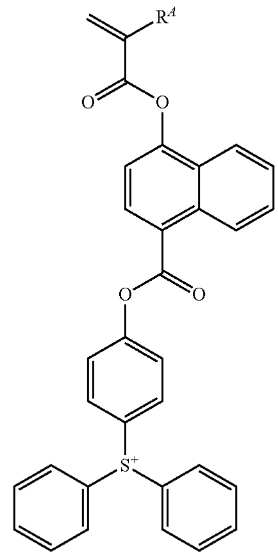
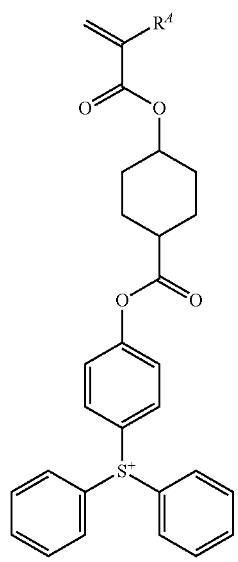
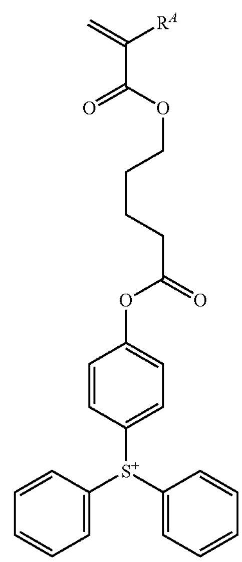
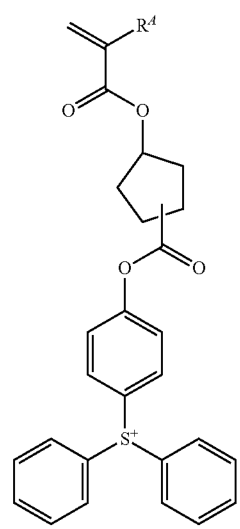

-continued
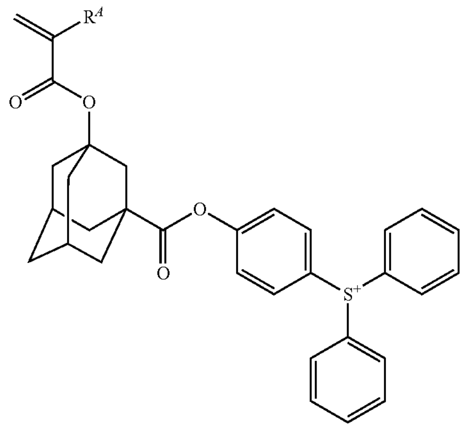
Examples of the cation in the monomer from which repeat unit (2) or (f3) is derived are as exemplified above for the cation in the sulfonium salt having formula (3).
Examples of the anion in the monomer from which repeat unit (f2) is derived are shown below, but not limited thereto. $R^A$ is as defined above.
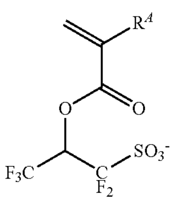
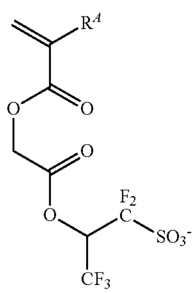
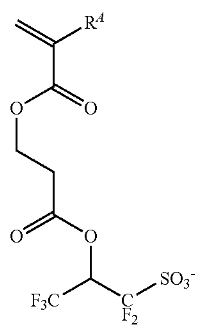
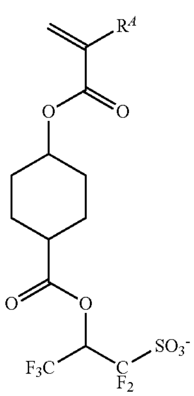
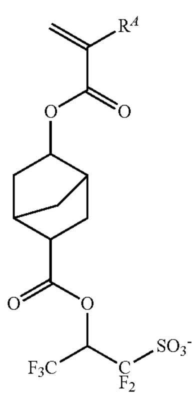
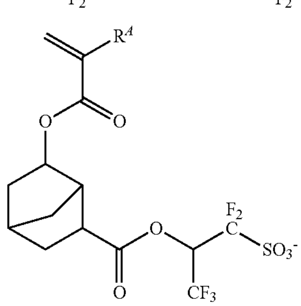
-continued
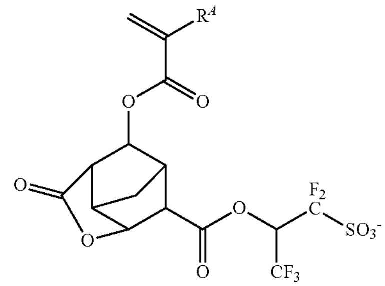
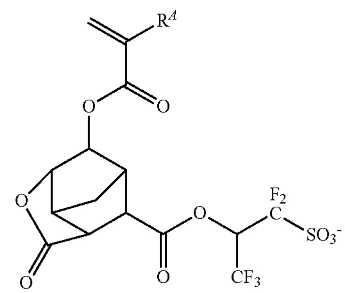
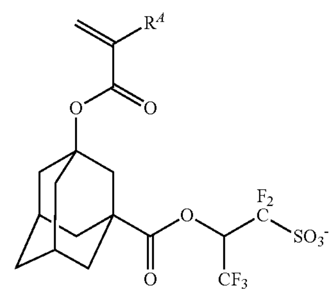
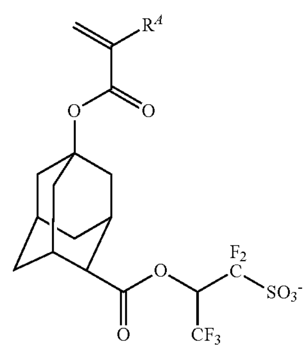
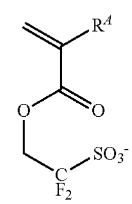
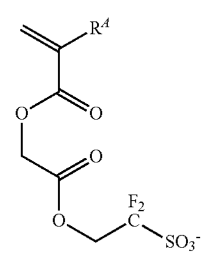
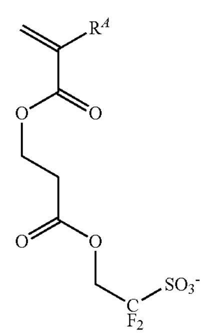

-continued
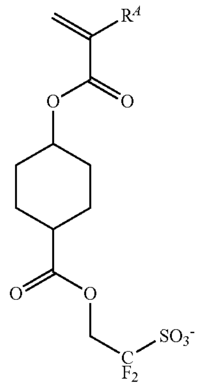
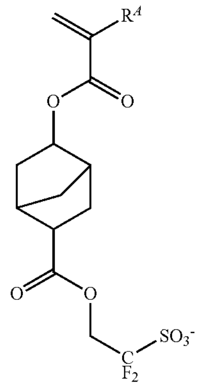
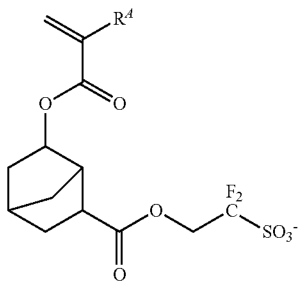
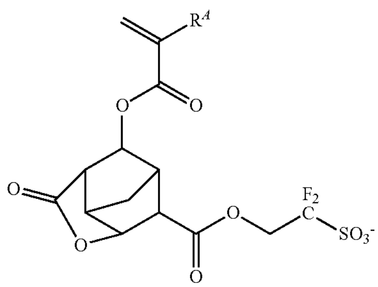
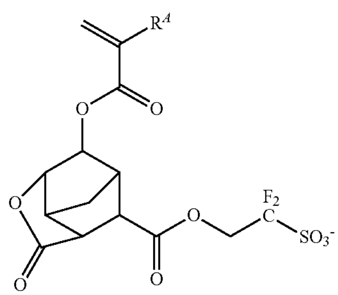
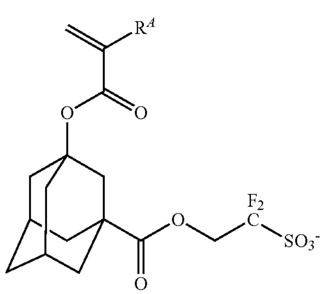
-continued
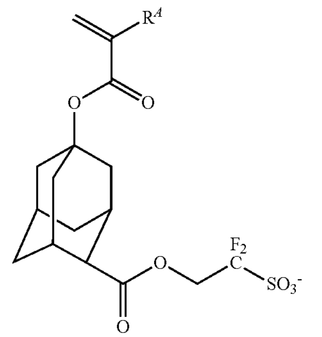
Examples of the anion in the monomer from which repeat unit (f3) is derived are shown below, but not limited thereto. $R^A$ is as defined above.
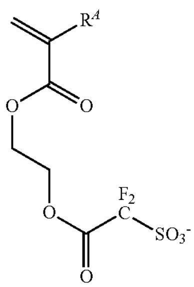
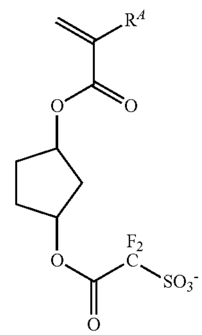
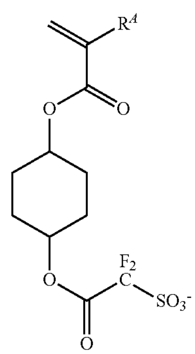
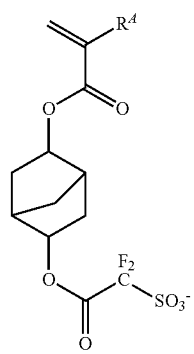
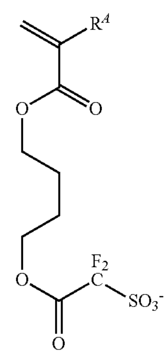
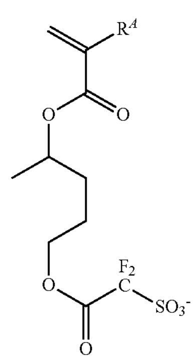
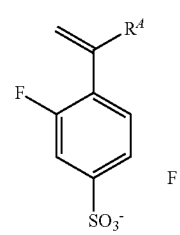
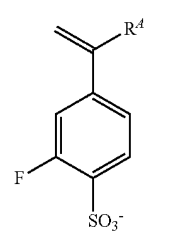

-continued

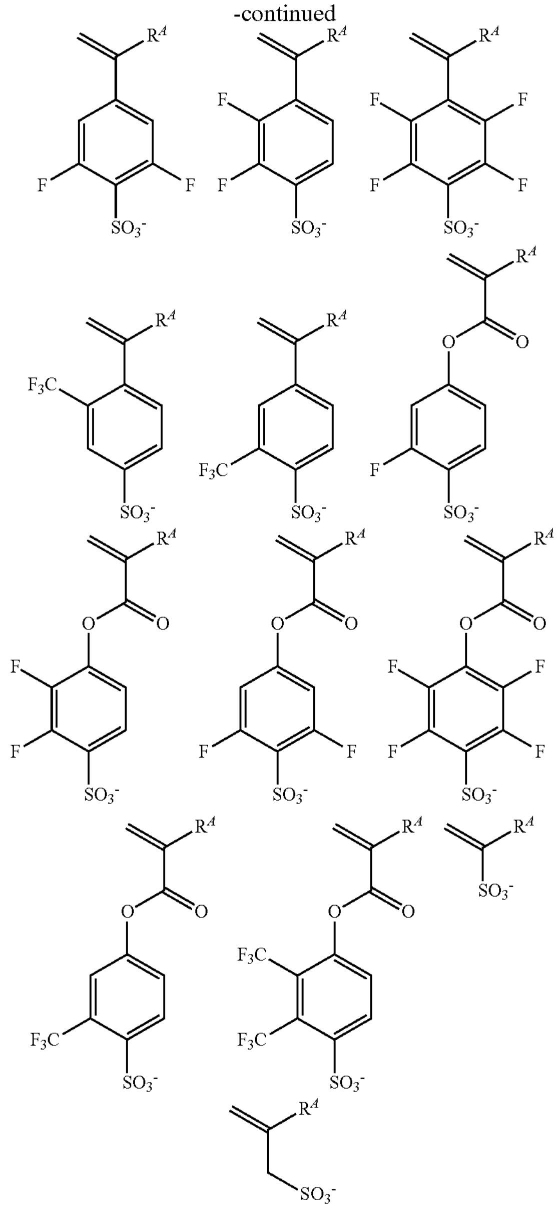

The attachment of an acid generator to the polymer main chain is effective in restraining acid diffusion, thereby preventing a reduction of resolution due to blur by acid diffusion. Also, LWR or CDU is improved since the acid generator is uniformly distributed.

When the base polymer contains repeat units (f), the polymer also functions as an acid generator. In this embodiment wherein the base polymer is integrated with the acid generator, known as polymer-bound acid generator, the chemically amplified resist composition mayor may not contain an acid generator of addition type.

The base polymer for formulating the chemically amplified positive resist composition comprises repeat units (a1) or (a2) having an acid labile group as essential component and additional repeat units (b), (c), (d), (e), and (f) as optional components. A fraction of units (a1), (a2), (b), (c), (d), (e), and (f) is: preferably $0\leq a1<1.0$, $0\leq a2<1.0$, $0<a1+a2<1.0$, $0\leq b\leq 0.9$, $0\leq c\leq 0.9$, $0\leq d\leq 0.8$, $0\leq e\leq 0.8$, and $0\leq f\leq 0.5$; more preferably $0\leq a1\leq 0.9$, $0\leq a2\leq 0.9$, $0.1\leq a1+a2\leq 0.9$, $0\leq b\leq 0.8$, $0\leq c\leq 0.8$, $0\leq d\leq 0.7$, $0\leq e\leq 0.7$, and $0\leq f\leq 0.4$; and even more preferably $0\leq a1\leq 0.8$, $0\leq a2\leq 0.8$, $0.1\leq a1+a2\leq 0.8$, $0\leq b\leq 0.75$, $0\leq c\leq 0.75$, $0\leq d\leq 0.6$, $0\leq e\leq 0.6$, and $0\leq f\leq 0.3$. In the case of a polymer-bound acid generator, a fraction of repeat unit (f) is preferably $0<f\leq 0.5$, more preferably $0.01\leq f\leq 0.4$, even mom preferably $0.02\leq f\leq 0.3$. Notably, $f=f1+f2+f3$, meaning that unit (f) is at least one of units (f1) to (f3), and $a1+a2+b+c+d+e+f=1.0$.

For the base polymer for formulating the chemically amplified negative resist composition, an acid labile group is not necessarily essential. The base polymer comprises repeat units (b), and optionally repeat units (c), (d), (e), and/or (f). A fraction of these units is: preferably $0<b\leq 1.0$, $0\leq c\leq 0.9$, $0\leq d\leq 0.8$, $0\leq e\leq 0.8$, and $0\leq f\leq 0.5$; more preferably $0.2\leq b\leq 1.0$, $0\leq c\leq 0.8$, $0\leq d\leq 0.7$, $0\leq e\leq 0.7$, and $0\leq f\leq 0.4$; and even more preferably $0.3\leq b\leq 1.0$, $0\leq c\leq 0.75$, $0\leq d\leq 0.6$, $0\leq e\leq 0.6$, and $0\leq f\leq 0.3$. In the case of a polymer-bound acid generator, a fraction of repeat unit (f) is preferably $0<f\leq 0.5$, more preferably $0.01\leq f\leq 0.4$, even more preferably $0.02\leq f\leq 0.3$. Notably, $f=f1+f2+f3$, meaning that unit (1) is at least one of units (f1) to (f3), and $b+c+d+e+f=1.0$.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the reaction temperature is 50 to 80° C. and the reaction time is 2 to 100 hours, more preferably 5 to 20 hours.

Where a monomer having a hydroxy group is copolymerized, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

A blend of two or more base polymers which differ in compositional ratio, Mw or Mw/Mn is acceptable.

Other Components

With the foregoing components, other components such as an organic solvent, surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol (DAA): ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10.000 parts, and more preferably 200 to 8,000 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. While the surfactant may be used alone or in admixture, it is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxy or carboxy group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer. The dissolution inhibitor may be used alone or in admixture.

In the case of negative resist compositions, a negative pattern may be formed by adding a crosslinker to reduce the dissolution rate of a resist film in exposed area. Suitable crosslinkers include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyloxy group. These compounds may be used as an additive or introduced into a polymer side chain as a pendant. Hydroxy-containing compounds may also be used as the crosslinker.

Examples of the epoxy compound include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethylurea, tetramethylolurea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyauate and cyclohexane diisocyanate. Suitable azide compounds include 1,1'-biphenyl-4,4'-bisazide, 4,4'-methylidenebisazide, and 4,4'-oxybisazide. Examples of the alkenyloxy group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer. The crosslinker may be used alone or in admixture.

To the resist composition, a water repellency improver may also be added for improving the water repellency on surface of a resist film. The water repellency improver may be used in the top coatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as repeat units may serve as the water repellent additive and is effective for preventing evaporation of acid during PEB, thus preventing any hole pattern opening failure after development. An appropriate amount of the water repellency improver is 0 to 20 parts, more preferably 0.5 to 10 parts by weight per 100 parts by weight of the base polymer. The water repellency improver may be used alone or in admixture.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 pals by weight per 100 parts by weight of the base polymer. The acetylene alcohol may be used alone or in admixture.

Pattern Forming Process

The chemically amplified resist composition is used in the fabrication of various integrated circuits. Pattern formation using the resist composition may be performed by well-known lithography processes. The process generally involves the steps of applying the resist composition to form a resist film on a substrate, exposing the resist film to high-energy radiation, and developing the exposed resist film in a developer. If necessary, any additional steps may be added.

Specifically, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.1 to 2 μm thick.

The resist film is then exposed to a desired pattern of high-energy radiation such as UV, deep-UV, EB, EUV of wavelength 3 to 15 nm, x-ray, soft x-ray, excimer laser light, γ-ray or synchrotron radiation. When UV, deep-UV. EUV, x-ray, soft x-ray, excimer laser light, γ-ray or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the inventive resist composition is suited in micropatterning using i-line of wavelength 365 nm, KrF excimer laser, ArF excimer laser, EB, EUV, x-ray, soft x-ray, γ-ray or synchrotron radiation.

Besides the standard exposure, the immersion lithography technique of exposing the resist film while interposing a liquid having a refractive index of at least 1.0, typically water, between the resist film and a projection lens is also applicable. In this case, a water-insoluble protective film may be formed on the resist film.

After the exposure, the resist film may be baked (PEB) on a hot plate or in an oven at 60 to 150° C. for 10 seconds to 30 minutes, preferably at 80 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). In the case of positive resist, the resist film in the exposed area is dissolved in the developer whereas the resist film in the unexposed area is not dissolved. In this way, the desired positive pattern is formed on the substrate. Inversely in the case of negative resist, the exposed area of resist film is insolubilized whereas the unexposed area is dissolved in the developer.

In an alternative embodiment, a negative pattern may be formed via organic solvent development or negative tone development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol. 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, disec-pentyl ether, di-tert-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, tert-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Quenchers Q-1 to Q-51 used in resist compositions have the structure shown below.

Q-1

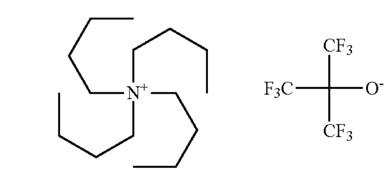

Q-2

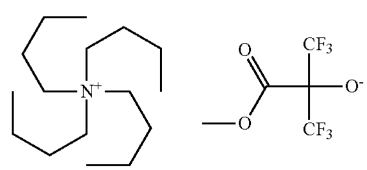

Q-3

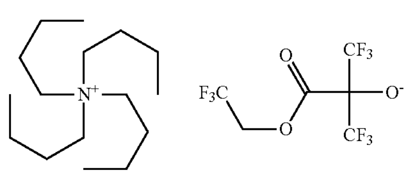

Q-4

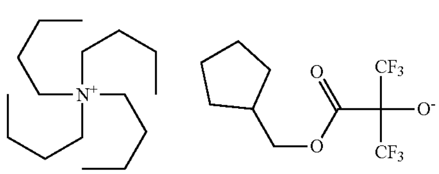

-continued

Q-5

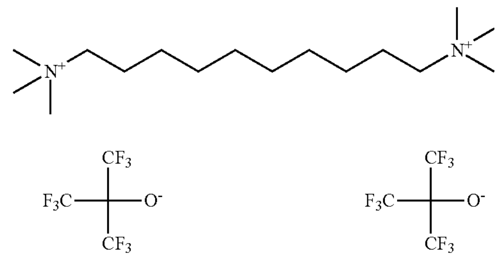

Q-6

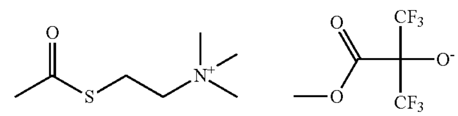

Q-7

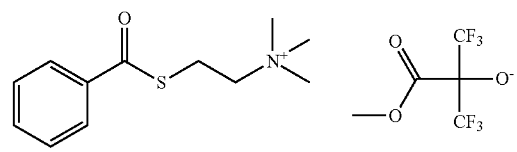

Q-8

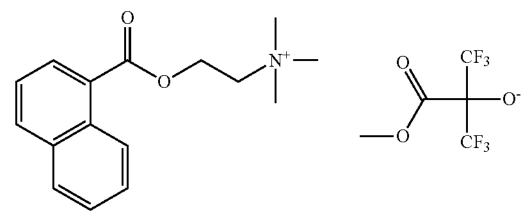

Q-9

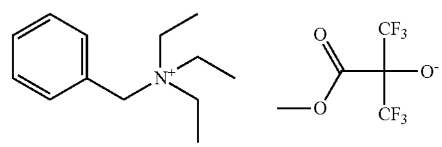

Q-10

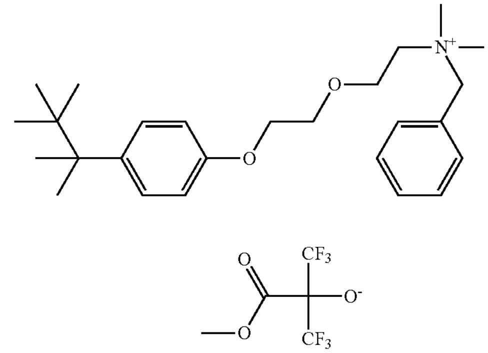

Q-11

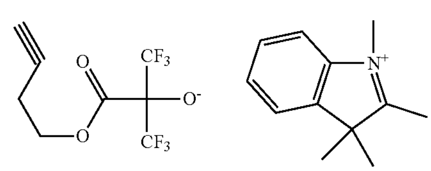

-continued
Q-12
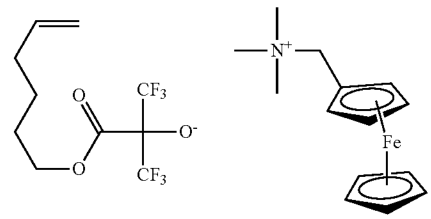
Q-13
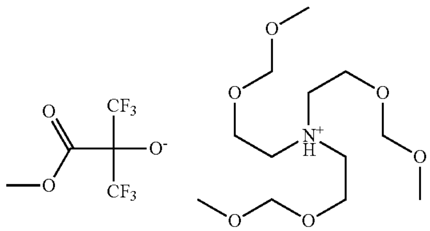
Q-14
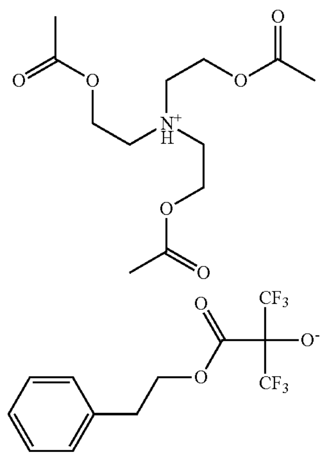
Q-15
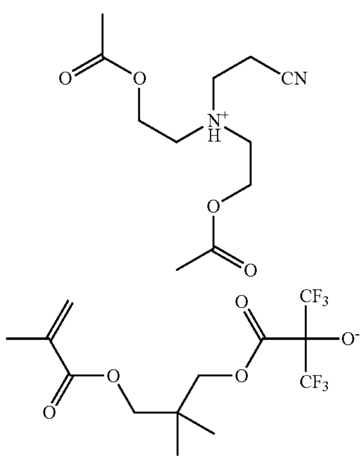
Q-16
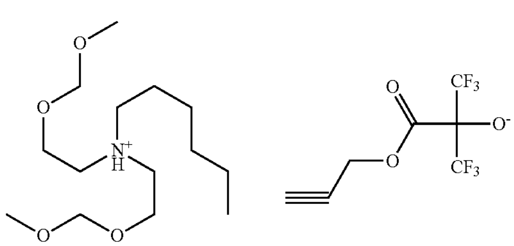
-continued
Q-17
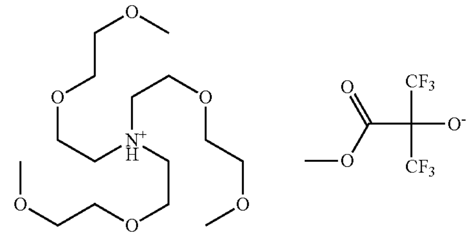
Q-18
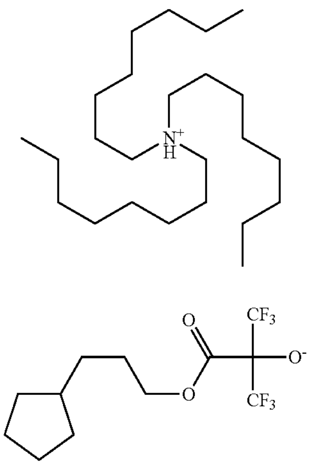
Q-19
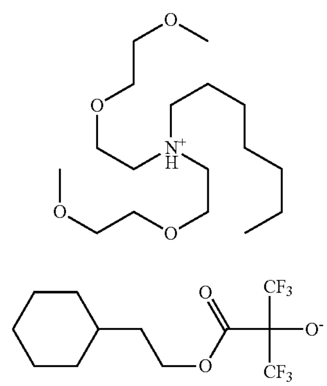
Q-20
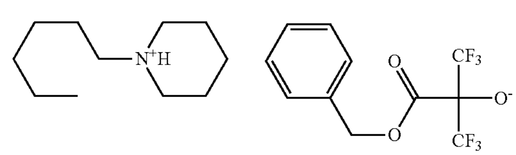
Q-21
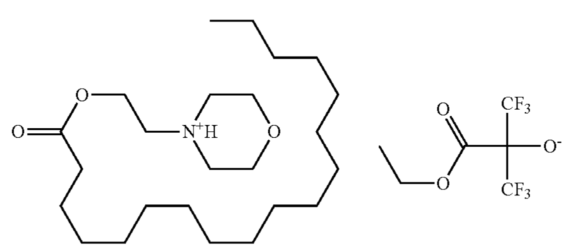

-continued
Q-22
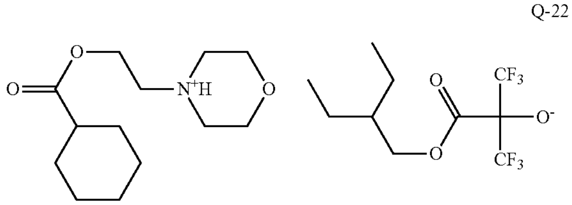
Q-23
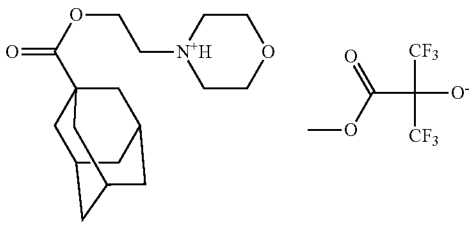
Q-24
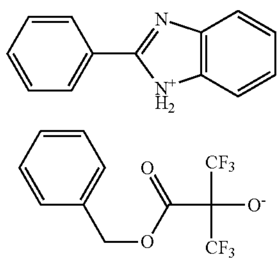
Q-25
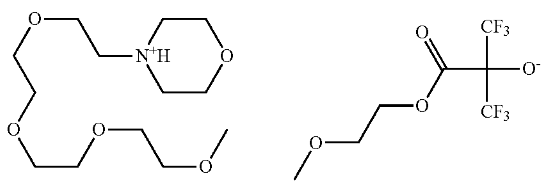
Q-26
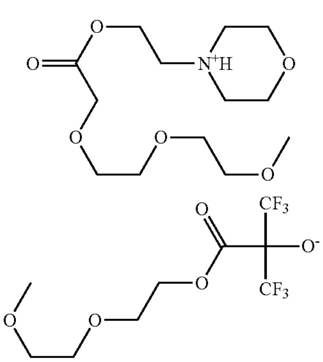
Q-27
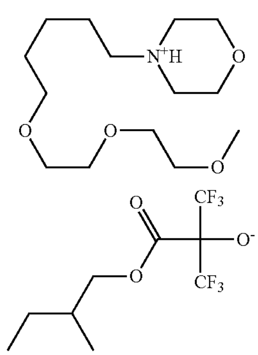
-continued
Q-28
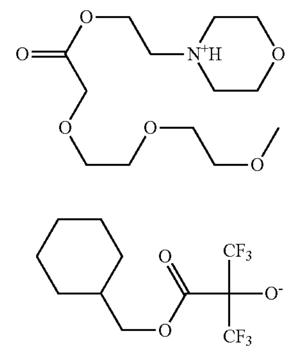
Q-29
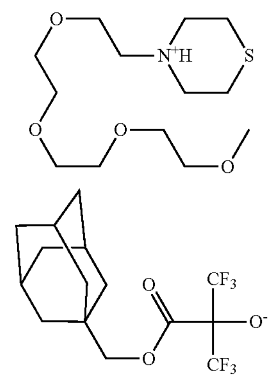
Q-30
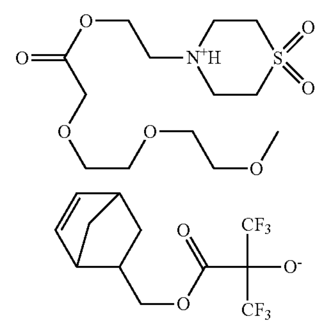
Q-31
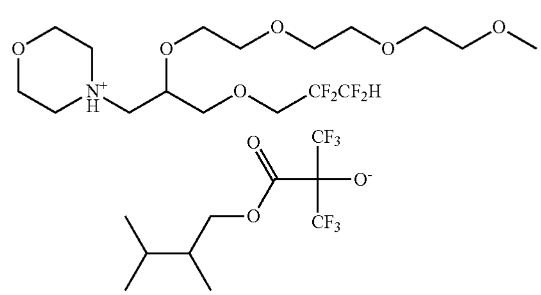
Q-32
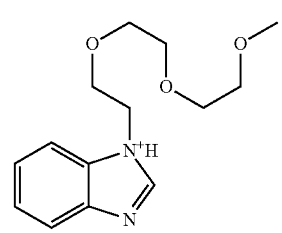

-continued
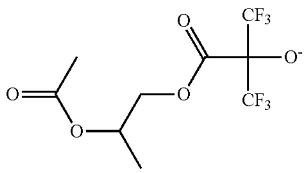
Q-33
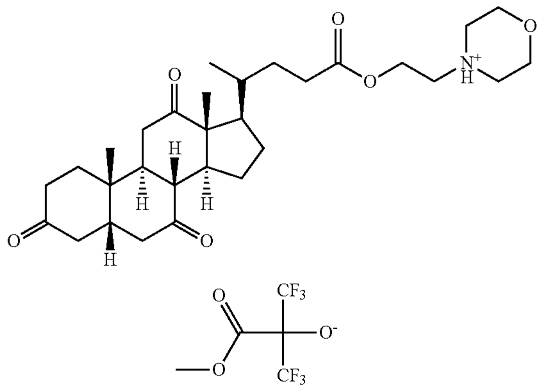
Q-34
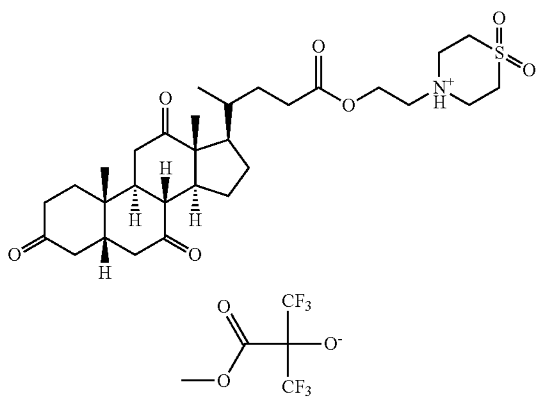
Q-35
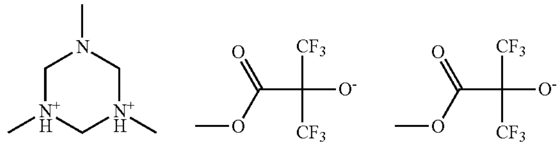
Q-36
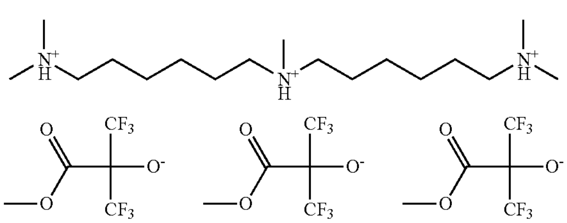
Q-37
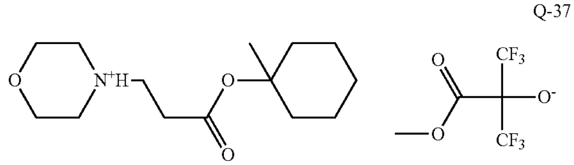
-continued
Q-38
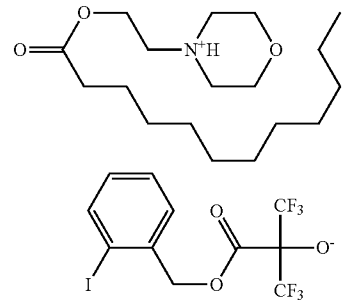
Q-39
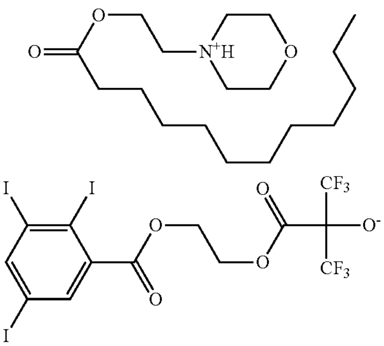
Q-40
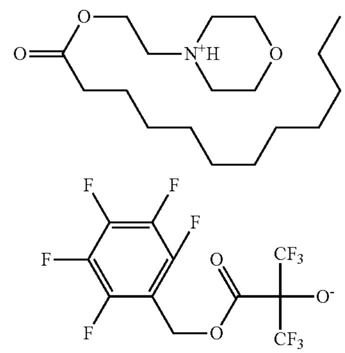
Q-41
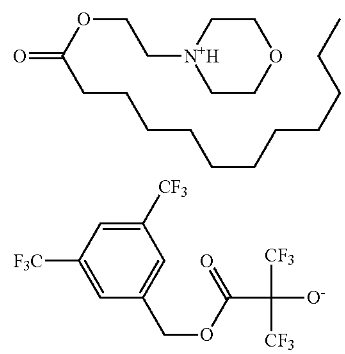
Q-42
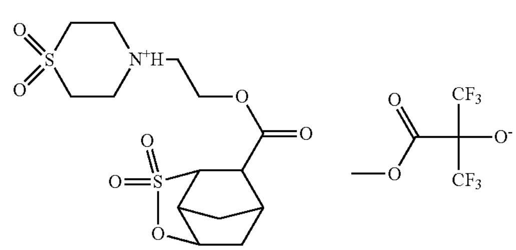

-continued
Q-43
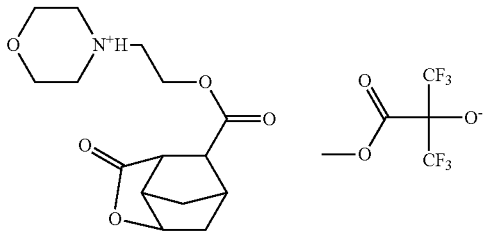
Q-44
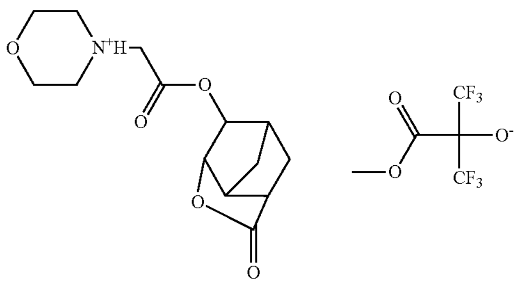
Q-45
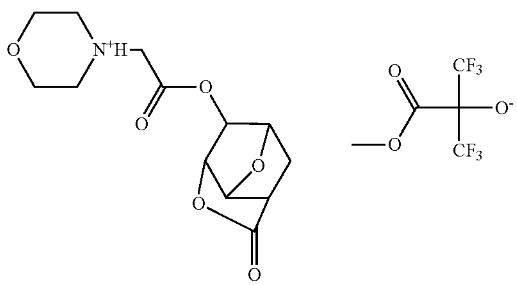
Q-46
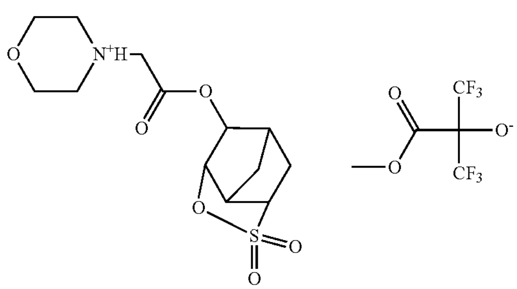
Q-47
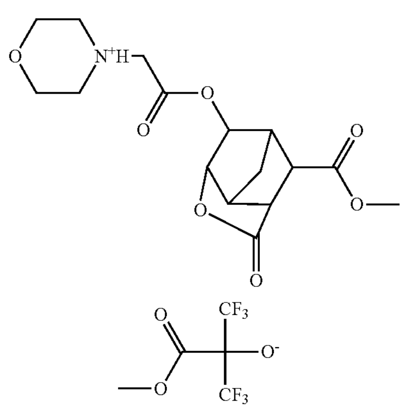
-continued
Q-48
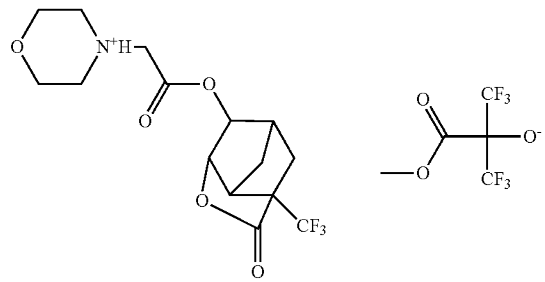
Q-49
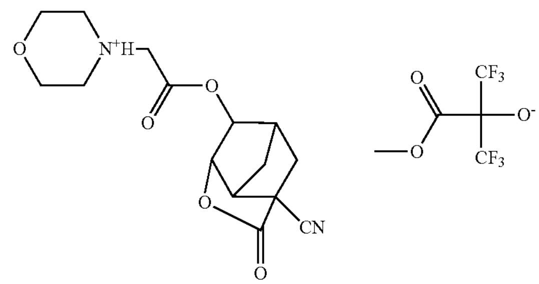
Q-50
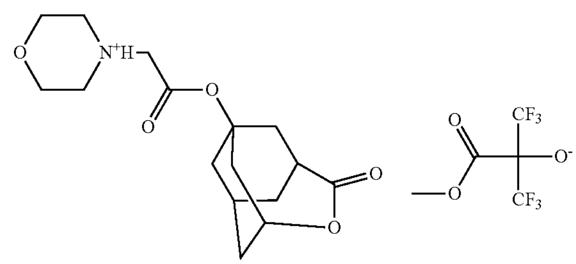
Q-51
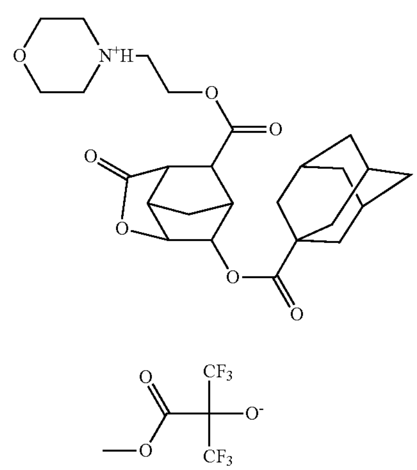
An amine compound (designated Amine-1) and a compound having a 1,1,1,3,3,3-hexafluoro-2-propanol (HFA) group (designated HFA-1) have the structure shown below.

Amine-1

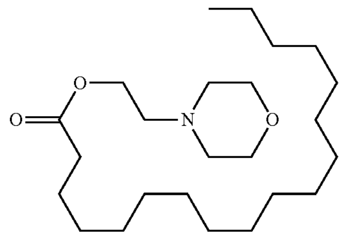

HFA-1

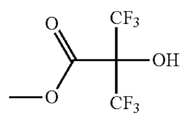

Synthesis Example

Synthesis of Base Polymer P-1

A base polymer P-1 was prepared by combining suitable monomers, effecting copolymerization reaction thereof in tetrahydrofuran (THF) solvent, pouring the reaction solution into methanol for crystallization, repeatedly washing the precipitate with hexane, isolation, and drying. The resulting polymer was analyzed for composition by $^{1}$H-NMR spectroscopy, and for Mw and Mw/Mn by GPC versus polystyrene standards using THF solvent.

P-1

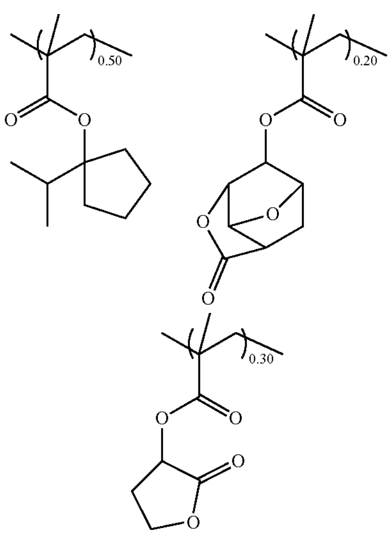

Mw = 8,300
Mw/Mn = 1.70

Examples 1 to 54 and Comparative Examples 1 to 6

(1) Preparation of Resist Compositions

Resist compositions were prepared by dissolving various components in a solvent in accordance with the recipe shown in Tables 1 to 4, and filtering through a filter having a pore size of 0.2 μm. The solvent contained 100 ppm of surfactant Polyfox PF-636 (Omnova Solutions Inc.).

The components in Tables 1 to 4 are as identified below.

Organic Solvent:

PGMEA (propylene glycol monomethyl ether acetate)

Acid generator. PAG-1 of the following structural formula

PAG-1

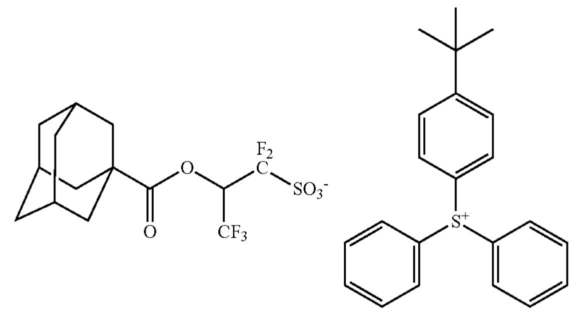

Water repellency improver: FP-1 of the following structural formula

FP-1

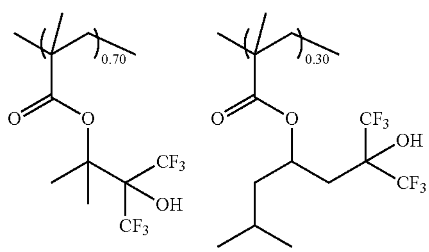

Mw = 10,200
Mw/Mn = 1.67

Comparative Quenchers cQ-1 to cQ-6 of the following structural formulae cQ-1

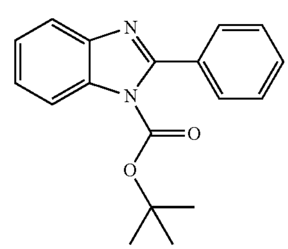

cQ-2

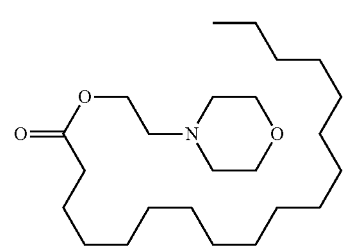

-continued cQ-3

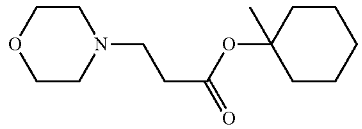

cQ-4

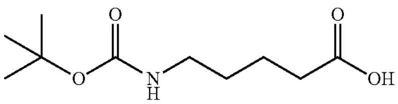

cQ-5

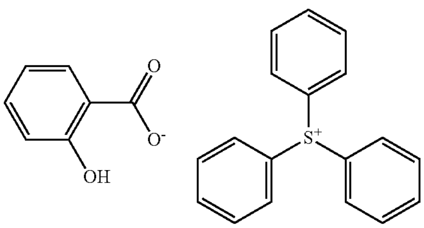

cQ-6

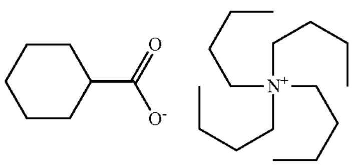

Blend Quenchers bQ-1 and bQ-2 of the following structural formulae bQ-1

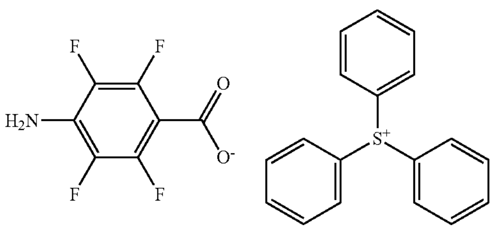

-continued bQ-2

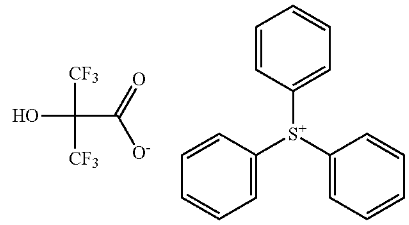

(2) Evaluation by ArF Immersion Lithography

Each of the resist compositions in Tables 1 to 4 was spin coated on a silicon wafer having an antireflective coating of 78 nm thick (ARC-29A by Nissan Chemical Corp.), and baked on a hotplate at 100° C. for 60 seconds to forma resist film of 170 nm thick. Using an ArF excimer laser immersion lithography scanner NSR-S610C (Nikon Corp., NA 1.10. σ 0.98/0.78, 35° dipole illumination), the resist film was exposed to ArF radiation through a 6% halftone phase shift mask bearing a 1:1 line-and-space (LS) pattern with a size of 60 nm (on-wafer size). Water was used as the immersion liquid. The resist film was baked (PEB) at the temperature shown in Tables 1 to 4 for 60 seconds and developed in a 2.38 wt % tetramethylammonium hydroxide aqueous solution, yielding a 1:1 LS pattern with a size of 60 nm.

The LS pattern was observed under CD-SEM (CG6300 by Hitachi High-Technologies Corp.). The exposure dose (mJ/cm$^2$) to form a 1:1 LS pattern with a size of 60 nm was determined and reported as sensitivity. The LWR of the pattern was also measured. The results are also shown in Tables 1 to 4.

TABLE 1

| | | Polymer (pbw) | Acid generator (pbw) | Quencher (pbw) | Water repellency improver (pbw) | Organic solvent (pbw) | PEB temp. (° C.) | Sensitivity (mJ/cm$^2$) | LWR (nm) |
|---|---|---|---|---|---|---|---|---|---|
| Example | 1 | P-1 (100) | PAG-1 (6.0) | Q-1 (2.38) | FP-1 (4.0) | PGMEA (1,500) | 90 | 40 | 2.2 |
| | 2 | P-1 (100) | PAG-1 (6,0) | Q-2 (2.33) | FP-1 (4.0) | PGMEA (1,500) | 90 | 39 | 2.1 |
| | 3 | P-1 (100) | PAG-1 (6,0) | Q-3 (2.68) | FP-1 (4.0) | PGMEA (1,500) | 90 | 40 | 2.1 |
| | 4 | P-1 (100) | PAG-1 (6.0) | Q-4 (2.68) | FP-1 (4.0) | PGMEA (1,500) | 90 | 41 | 2.5 |
| | 5 | P-1 (100) | PAG-1 (6.0) | Q-5 (2.00) | FP-1 (4.0) | PGMEA (1,500) | 90 | 44 | 2.4 |
| | 6 | P-1 (100) | PAG-1 (6.0) | Q-6 (1.94) | FP-1 (4.0) | PGMEA (1,500) | 90 | 41 | 2.3 |
| | 7 | P-1 (100) | PAG-1 (6.0) | Q-7 (2.25) | FP-1 (4.0) | PGMEA (1,500) | 90 | 41 | 2.5 |
| | 8 | P-1 (100) | PAG-1 (6.0) | Q-8 (2.42) | FP-1 (4.0) | PGMEA (1,500) | 90 | 44 | 2.6 |
| | 9 | P-1 (100) | PAG-1 (6.0) | Q-9 (2.09) | FP-1 (4.0) | PGMEA (1,500) | 90 | 39 | 2.1 |
| | 10 | P-1 (100) | PAG-1 (6.0) | Q-10 (3.12) | FP-1 (4.0) | PGMEA (1,500) | 90 | 39 | 2.7 |
| | 11 | P-1 (100) | PAG-1 (6.0) | Q-11 (2.19) | FP-1 (4.0) | PGMEA (1,500) | 90 | 38 | 2.5 |

TABLE 1-continued

| | | Polymer (pbw) | Acid generator (pbw) | Quencher (pbw) | Water repellency improver (pbw) | Organic solvent (pbw) | PEB temp. (° C.) | Sensitivity (mJ/cm²) | LWR (nm) |
|---|---|---|---|---|---|---|---|---|---|
| | 12 | P-1 (100) | PAG-1 (6.0) | Q-12 (2.91) | FP-1 (4.0) | PGMEA (1,500) | 90 | 44 | 2.4 |
| | 13 | P-1 (100) | PAG-1 (6.0) | Q-1 3 (2.54) | FP-1 (4.0) | PGMEA (1,500) | 90 | 40 | 2.0 |
| | 14 | P-1 (100) | PAG-1 (6.0) | Q-14 (2.96) | FP-1 (4.0) | PGMEA (1,500) | 90 | 38 | 2.5 |
| | 15 | P-1 (100) | PAG-1 (6.0) | Q-15 (3.04) | FP-1 (4.0) | PGMEA (1,500) | 90 | 43 | 2.5 |
| | 16 | P-1 (100) | PAG-1 (6.0) | Q-16 (2.64) | FP-1 (4.0) | PGMEA (1,500) | 90 | 40 | 2.6 |
| | 17 | P-1 (100) | PAG-1 (6.0) | Q-17 (2.75) | FP-1 (4.0) | PGMEA (1,500) | 90 | 44 | 2.2 |
| | 18 | P-1 (100) | PAG-1 (6.0) | Q-18 (3.38) | FP-1 (4.0) | PGMEA (1,500) | 90 | 46 | 2.1 |
| | 19 | P-1 (100) | PAG-1 (6.0) | Q-19 (3.21) | FP-1 (4.0) | PGMEA (1,500) | 90 | 41 | 2.4 |
| | 20 | P-1 (100) | PAG-1 (6.0) | Q-20 (2.34) | FP-1 (4.0) | PGMEA (1,500) | 90 | 44 | 2.3 |
| | 21 | P-1 (100) | PAG-1 (6.0) | Q-21 (3.19) | FP-1 (4.0) | PGMEA (1,500) | 90 | 47 | 2.2 |
| | 22 | P-1 (100) | PAG-1 (6.0) | Q-22 (2.68) | FP-1 (4.0) | PGMEA (1,500) | 90 | 48 | 2.3 |
| | 23 | P-1 (100) | PAG-1 (6.0) | Q-23 (2.59) | FP-1 (4.0) | PGMEA (1,500) | 90 | 46 | 2.1 |
| | 24 | P-1 (100) | PAG-1 (6.0) | Q-24 (2.48) | FP-1 (4.0) | PGMEA (1,500) | 90 | 34 | 2.6 |
| | 25 | P-1 (100) | PAG-1 (6.0) | Q-25 (2.74) | FP-1 (4.0) | PGMEA (1,500) | 90 | 40 | 2.1 |

TABLE 2

| | | Polymer (pbw) | Acid generator (pbw) | Quencher (pbw) | Water repellency improver (pbw) | Organic solvent (pbw) | PEB temp. (° C.) | Sensitivity (mJ/cm²) | LWR (nm) |
|---|---|---|---|---|---|---|---|---|---|
| Example | 26 | P-1 (100) | PAG-1 (6.0) | Q-26 (3.03) | FP-1 (4.0) | PGMEA (1,500) | 90 | 39 | 2.6 |
| | 27 | P-1 (100) | PAG-1 (6.0) | Q-27 (178) | FP-1 (4.0) | PGMEA (1,500) | 90 | 39 | 2.6 |
| | 28 | P-1 (100) | PAG-1 (6.0) | Q-28 (2.99) | FP-1 (4.0) | PGMEA (1,500) | 90 | 38 | 2.7 |
| | 29 | P-1 (100) | PAG-1 (6.0) | Q-29 (3.27) | FP-1 (4.0) | PGMEA (1,500) | 90 | 42 | 2.3 |
| | 30 | P-1 (100) | PAG-1 (6.0) | Q-30 (3.29) | FP-1 (4.0) | PGMEA (1,500) | 90 | 42 | 2.7 |
| | 31 | P-1 (100) | PAG-1 (6.0) | Q-31 (3.58) | FP-1 (4.0) | PGMEA (1,500) | 90 | 41 | 2.5 |
| | 32 | P-1 (100) | PAG-1 (6.0) | Q-32 (2.88) | FP-1 (4.0) | PGMEA (1,500) | 90 | 42 | 2.4 |
| | 33 | P-1 (100) | PAG-1 (6.0) | Q-33 (3.70) | FP-1 (4.0) | PGMEA (1,500) | 90 | 44 | 2.3 |
| | 34 | P-1 (100) | PAG-1 (6.0) | Q-34 (3.94) | FP-1 (4.0) | PGMEA (1,500) | 90 | 46 | 2.5 |
| | 35 | P-1 (100) | PAG-1 (6.0) | Q-35 (3.77) | FP-1 (4.0) | PGMEA (1,500) | 90 | 34 | 2.7 |
| | 36 | P-1 (100) | PAG-1 (6.0) | Q-36 (1.93) | FP-1 (4.0) | PGMEA (1,500) | 90 | 34 | 2.8 |
| | 37 | P-1 (100) | PAG-1 (6.0) | Q-37 (2.41) | FP-1 (4.0) | PGMEA (1,500) | 90 | 38 | 2.7 |
| | 38 | P-1 (100) | PAG-1 (6.0) | Amine-1 (1.99) HFA-1 (1.13) | FP-1 (4.0) | PGMEA (1,500) | 90 | 32 | 3.7 |
| | 39 | P-1 (100) | PAG-1 (6.0) | bQ-1 (2.35) Q-26 (1.52) | FP-1 (4.0) | PGMEA (1,500) | 90 | 39 | 2.0 |

TABLE 2-continued

| | | Polymer (pbw) | Acid generator (pbw) | Quencher (pbw) | Water repellency improver (pbw) | Organic solvent (pbw) | PEB temp. (° C.) | Sensitivity (mJ/cm$^2$) | LWR (nm) |
|---|---|---|---|---|---|---|---|---|---|
| | 40 | P-1 (100) | PAG-1 (6.0) | bQ-2 (2.37) Q-21 (1.59) | FP-1 (4.0) | PGMEA (1,500) | 90 | 37 | 2.1 |

TABLE 3

| | | Polymer (pbw) | Acid generator (pbw) | Quencher (pbw) | Water repellency improver (pbw) | Organic solvent (pbw) | PEB temp. (° C.) | Sensitivity (mJ/cm$^2$) | LWR (nm) |
|---|---|---|---|---|---|---|---|---|---|
| Example | 41 | P-1 (100) | PAG-1 (6.0) | Q-38 (3.71) | FP-1 (4.0) | PGMEA (1,500) | 90 | 39 | 2.5 |
| | 42 | P-1 (100) | PAG-1 (6.0) | Q-39 (5.25) | FP-1 (4.0) | PGMEA (1,500) | 90 | 40 | 2.6 |
| | 43 | P-1 (100) | PAG-1 (6.0) | Q-40 (3.52) | FP-1 (4.0) | PGMEA (1,500) | 90 | 36 | 2.4 |
| | 44 | P-1 (100) | PAG-1 (6.0) | Q-41 (3.76) | FP-1 (4.0) | PGMEA (1,500) | 90 | 38 | 2.7 |
| | 45 | P-1 (100) | PAG-1 (6.0) | Q-42 (3.03) | FP-1 (4.0) | PGMEA (1,500) | 90 | 39 | 2.6 |
| | 46 | P-1 (100) | PAG-1 (6.0) | Q-43 (2.61) | FP-1 (4.0) | PGMEA (1,500) | 90 | 40 | 2.3 |
| | 47 | P-1 (100) | PAG-1 (6.0) | Q-44 (2.54) | FP-1 (4.0) | PGMEA (1,500) | 90 | 42 | 2.1 |
| | 48 | P-1 (100) | PAG-1 (6.0) | Q-45 (2.55) | FP-1 (4.0) | PGMEA (1,500) | 90 | 43 | 2.4 |
| | 49 | P-1 (100) | PAG-1 (6.0) | Q-46 (2.72) | FP-1 (4.0) | PGMEA (1,500) | 90 | 44 | 2.4 |
| | 50 | P-1 (100) | PAG-1 (6.0) | Q-47 (2.83) | FP-1 (4.0) | PGMEA (1,500) | 90 | 43 | 2.3 |
| | 51 | P-1 (100) | PAG-1 (6.0) | Q-48 (2.88) | FP-1 (4.0) | PGMEA (1,500) | 90 | 43 | 2.1 |
| | 52 | P-1 (100) | PAG-1 (6.0) | Q-49 (2.66) | FP-1 (4.0) | PGMEA (1,500) | 90 | 42 | 2.1 |
| | 53 | P-1 (100) | PAG-1 (6.0) | Q-50 (2.68) | FP-1 (4.0) | PGMEA (1,500) | 90 | 47 | 2.0 |
| | 54 | P-1 (100) | PAG-1 (6.0) | Q-51 (3.50) | FP-1 (4.0) | PGMEA (1,500) | 90 | 45 | 2.1 |

TABLE 4

| | | Polymer (pbw) | Acid generator (pbw) | Quencher (pbw) | Water repellency improver (pbw) | Organic solvent (pbw) | PEB temp. (° C.) | Sensitivity (mJ/cm$^2$) | LWR (nm) |
|---|---|---|---|---|---|---|---|---|---|
| Comparative Example | 1 | P-1 (100) | PAG-1 (6.0) | cQ-1 (1.47) | FP-1 (4.0) | PGMEA (1,500) | 90 | 42 | 3.8 |
| | 2 | P-1 (100) | PAG-1 (6.0) | cQ-2 (1.99) | FP-1 (4.0) | PGMEA (1,500) | 90 | 43 | 3.6 |
| | 3 | P-1 (100) | PAG-1 (6.0) | cQ-3 (1.28) | FP-1 (4.0) | PGMEA (1,500) | 90 | 42 | 3.8 |
| | 4 | P-1 (100) | PAG-1 (6.0) | cQ-4 (1.09) | FP-1 (4.0) | PGMEA (1,500) | 90 | 40 | 3.6 |
| | 5 | P-1 (100) | PAG-1 (6.0) | cQ-5 (2.00) | FP-1 (4.0) | PGMEA (1,500) | 90 | 38 | 3.1 |
| | 6 | P-1 (100) | PAG-1 (6.0) | cQ-6 (1.85) | FP-1 (4.0) | PGMEA (1,500) | 90 | 37 | 3.2 |

It is evident from Tables 1 to 4 that the inventive chemically amplified resist compositions comprising a salt compound consisting of a nitrogen-containing cation and a 1,1,1,3,3,3-hexafluoro-2-propoxide anion having a trifluoromethyl, hydrocarbylcarbonyl or hydrocarbyloxycarbonyl group bonded thereto exhibit reduced values of LWR.

Japanese Patent Application No. 2020-109847 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising a quencher and an acid generator, said quencher comprising a salt compound consisting of a nitrogen-containing cation and a 1,1,1,3,3,3-hexafluoro-2-propoxide anion having bonded thereto a group selected from trifluoromethyl, hydrocarbylcarbonyl and hydrocarbyloxycarbonyl.

2. The resist composition of claim 1 wherein the salt compound has the formula (1) or (2):

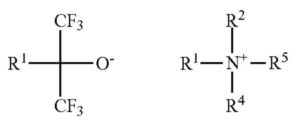

(1)

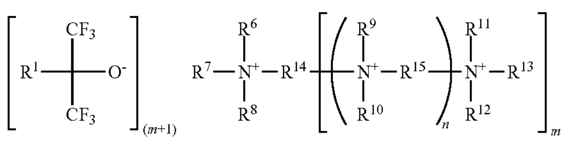

(2)

wherein m is an integer of 1 to 4, n is an integer of 0 to 4, $R^1$ is a trifluoromethyl, $C_2$-$C_{21}$ hydrocarbylcarbonyl or $C_2$-$C_{21}$ hydrocarbyloxycarbonyl group, the hydrocarbyl moiety in the hydrocarbylcarbonyl or hydrocarbyloxycarbonyl group may contain at least one moiety selected from ether bond, ester bond, thiol, cyano, nitro, hydroxy, sultone, sulfonate bond, amide bond and halogen, $R^2$ to $R^{13}$ are each independently hydrogen or a $C_1$-$C_{24}$ hydrocarbyl group which may contain a halogen atom, hydroxy, carboxy, ether bond, ester bond, thioether bond, thioester bond, thionoester bond, dithioester bond, amino, nitro, cyano, sulfone or ferrocenyl moiety, at least two of $R^2$ to $R^5$ or at least two of $R^6$ to $R^{13}$ may bond together to form a ring with the nitrogen atom to which they are attached or the nitrogen atom to which they are attached and an intervening atom, $R^2$ and $R^3$ may bond together to form $=C(R^{2A}(R^{3A})$, $R^{2A}$ and $R^{3A}$ are each independently hydrogen or a $C_1$-$C_{16}$ hydrocarbyl group which may contain oxygen, sulfur or nitrogen, $R^{2A}$ and $R^4$ may bond together to form a ring with the carbon and nitrogen atoms to which they are attached, the ring may contain a double bond, oxygen, sulfur or nitrogen, $R^{14}$ is a $C_1$-$C_{12}$ (m+1)-valent saturated hydrocarbon group when n is 0, and a $C_2$-$C_{12}$ saturated hydrocarbylene group when n is an integer of 1 to 4, the hydrocarbon and hydrocarbylene groups may contain an ether bond, ester bond, carboxy moiety, thioester bond, thionoester bond or dithioester bond, $R^{15}$ is a $C_2$-$C_{12}$ saturated hydrocarbylene group which may contain an ether bond, ester bond, carboxy moiety, thioester bond, thionoester bond or dithioester bond.

3. The resist composition of claim 1 wherein the acid generator generates a sulfonic acid, imide acid or methide acid.

4. The resist composition of claim 1, further comprising a base polymer.

5. The resist composition of claim 4 wherein the base polymer comprises repeat units having the formula (a1) or repeat units having the formula (a2):

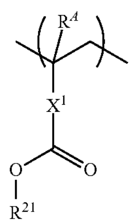

(a1)

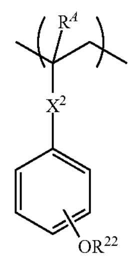

(a2)

wherein $R^A$ is each independently hydrogen or methyl, $R^{21}$ and $R^{22}$ are each independently an acid labile group, $X^1$ is a single bond, phenylene, naphthylene, or a $C_1$-$C_{12}$ linking group containing an ester bond and/or lactone ring, and $X^2$ is a single bond or ester bond.

6. The resist composition of claim 5 which is a chemically amplified positive resist composition.

7. The resist composition of claim 4 wherein the base polymer is free of an acid labile group.

8. The resist composition of claim 7 which is a chemically amplified negative resist composition.

9. The resist composition of claim 4 wherein the base polymer comprises repeat units of at least one type selected from repeat units having the formulae (f1) to (f3):

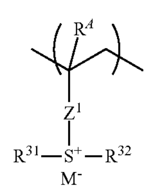

(f1)

-continued (f2)

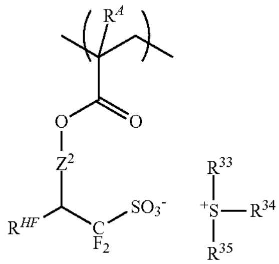

(f3)

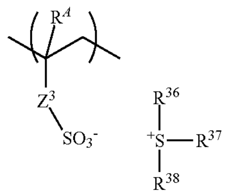

wherein $R^A$ is each independently hydrogen or methyl, $Z^1$ is a single bond, a $C_1$-$C_6$ aliphatic hydrocarbylene group, phenylene group, naphthylene group, or $C_7$-$C_{18}$ group obtained by combining the foregoing, or —O—$Z^{11}$—, —C(=O)—O—$Z^{11}$— or —C(=O)—NH—$Z^{11}$—, $Z^{11}$ is a $C_1$-$C_6$ aliphatic hydrocarbylene group, phenylene group, naphthylene group, or $C_7$-$C_{18}$ group obtained by combining the foregoing, which may contain a carbonyl moiety, ester bond, ether bond or hydroxy moiety, $Z^2$ is a single bond, —$Z^{21}$—C(=O)—O—, —$Z^{21}$—O— or —$Z^{21}$—O—C(=O)—, $Z^{21}$ is a $C_1$-$C_{12}$ saturated hydrocarbylene group which may contain a carbonyl moiety, ester bond or ether bond, $Z^3$ is a single bond, methylene, ethylene, phenylene, fluorinated phenylene, —O—$Z^{31}$—, —C(=O)—O—$Z^{31}$—, or —C(=O)—NH—$Z^{31}$—, $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxy moiety, $R^{31}$ to $R^{38}$ are each independently halogen or a $C_1$-$C_{20}$ hydrocarbyl group which may contain a heteroatom, a pair of $R^{33}$ and $R^{34}$ or $R^{36}$ and $R^{37}$ may bond together to form a ring with the sulfur atom to which they an attached, $R^{HF}$ is hydrogen or trifluoromethyl, and $M^-$ is a non-nucleophilic counter ion.

10. The resist composition of claim 1, further comprising an organic solvent.

11. The resist composition of claim 1, further comprising a surfactant.

12. A pattern forming process comprising the steps of applying the chemically amplified resist composition of claim 1 to form a resist film on a substrate, exposing the resist film to high-energy radiation, and developing the exposed resist film in a developer.

13. The process of claim 12 wherein the high-energy radiation is i-line of wavelength 365 nm, ArF excimer laser of wavelength 193 nm or KrF excimer laser of wavelength 248 nm.

14. The process of claim 12 wherein the high-energy radiation is EB or EUV of wavelength 3 to 15 nm.

* * * * *